US012114566B2

(12) United States Patent
Miyazaki

(10) Patent No.: US 12,114,566 B2
(45) Date of Patent: Oct. 8, 2024

(54) LIGHT EMITTING DEVICE AND POLYCYCLIC COMPOUND FOR LIGHT EMITTING DEVICE

(71) Applicant: Samsung Display Co., Ltd., Yongin-si (KR)

(72) Inventor: Yuuki Miyazaki, Yokohama (JP)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 661 days.

(21) Appl. No.: 17/332,481

(22) Filed: May 27, 2021

(65) Prior Publication Data

US 2022/0093874 A1 Mar. 24, 2022

(30) Foreign Application Priority Data

Sep. 18, 2020 (KR) ........................ 10-2020-0120264

(51) Int. Cl.

| | |
|---|---|
| ***H10K 85/40*** | (2023.01) |
| ***H10K 85/60*** | (2023.01) |
| *H10K 50/11* | (2023.01) |
| *H10K 101/10* | (2023.01) |

(52) U.S. Cl.

CPC ......... *H10K 85/6572* (2023.02); *H10K 85/40* (2023.02); *H10K 85/636* (2023.02); *H10K 85/6574* (2023.02); *H10K 85/6576* (2023.02); *H10K 50/11* (2023.02); *H10K 2101/10* (2023.02)

(58) Field of Classification Search

None

See application file for complete search history.

(56) References Cited

U.S. PATENT DOCUMENTS 10,374,166 B2 8/2019 Hatakeyama et al.
2019/0058124 A1 2/2019 Hatakeyama et al.
2019/0115537 A1 4/2019 Makishima et al.
2019/0115538 A1 4/2019 Lim et al.
2020/0176679 A1* 6/2020 Jeong ..................... C09K 11/06
2020/0190115 A1 6/2020 Hatakeyama et al.
2020/0203652 A1 6/2020 Duan et al.
2020/0212361 A1* 7/2020 Gao ..................... H10K 50/858
2021/0257552 A1* 8/2021 Choi ..................... H10K 85/322
2021/0277026 A1* 9/2021 Geum ................... C07B 59/004
2021/0317147 A1* 10/2021 Hong ..................... C09K 11/06
2021/0384436 A1* 12/2021 Yoon .................... H10K 85/626
2021/0391547 A1* 12/2021 Geum ................ H10K 85/6572
2022/0077410 A1* 3/2022 Geum .................... H10K 85/40
2022/0223790 A1* 7/2022 Suzaki ................... C09K 11/06
2023/0117271 A1* 4/2023 Chen .................... H10K 85/622 257/40
2023/0269997 A1* 8/2023 Pak ........................ C09K 11/06
2023/0276689 A1* 8/2023 Jung .................... H10K 85/322
2023/0309401 A1* 9/2023 Kim ........................ C07F 15/00
2023/0320215 A1* 10/2023 Pak ...................... H10K 85/346 257/40

FOREIGN PATENT DOCUMENTS

CN 106467553 3/2017
JP 6634838 1/2020
KR 10-1876763 7/2018
KR 10-2018-0108604 10/2018
KR 10-2019-0042791 4/2019
KR 10-2020-0026182 3/2020
KR 10-2091507 3/2020
WO 2015/102118 7/2015
WO 2017/195669 11/2017
WO 2018/212169 11/2018
WO 2019/062685 4/2019
WO 2019/128633 7/2019
WO 2019/132040 7/2019
WO 2019/163625 8/2019
WO 2020/022751 1/2020
WO 2020/042626 3/2020
WO WO-2021049889 A1 * 3/2021 ............. C07F 5/027

OTHER PUBLICATIONS

Machine translation of WO-2021049889-A1, translation generated Dec. 2023, 51 pages. (Year: 2023).*

* cited by examiner

*Primary Examiner* — Robert S Loewe

(74) *Attorney, Agent, or Firm* — KILE PARK REED & HOUTTEMAN PLLC

(57) ABSTRACT

A polycyclic compound of an embodiment is represented by Formula 1, which is defined in the disclosure. A light emitting device of an embodiment includes a first electrode, a second electrode disposed on the first electrode, and an emission layer disposed between the first electrode and the second electrode. The emission layer includes the polycyclic compound represented by Formula 1, and the light emitting device may show improved device characteristics.

[Formula 1]

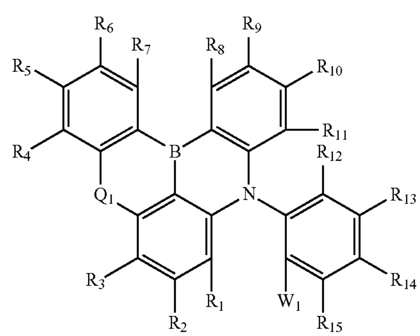

20 Claims, 6 Drawing Sheets

LIGHT EMITTING DEVICE AND POLYCYCLIC COMPOUND FOR LIGHT EMITTING DEVICE

CROSS-REFERENCE TO RELATED APPLICATION(S)

This application claims priority to and benefits of Korean Patent Application No. 10-2020-0120264 under 35 U.S.C. § 119, filed on Sep. 18, 2020 in the Korean Intellectual Property Office, the entire contents of which are incorporated herein by reference.

BACKGROUND

1. Technical Field

The disclosure relates to a light emitting device and a polycyclic compound used therein.

2. Description of the Related Art

Active development continues for an organic electroluminescence display as an image display. The organic electroluminescence display is different from a liquid crystal display and is a so-called self-luminescent display in which holes and electrons respectively injected from a first electrode and a second electrode recombine in an emission layer so that a light-emitting material including an organic compound in the emission layer emits light to achieve display.

In the application of an organic electroluminescence device to a display, there is an ongoing need for increasing the emission efficiency and the life of the organic electroluminescence device. Continuous development is required for materials for an organic electroluminescence device which stably achieves such characteristics.

In order to achieve high efficiency in an organic electroluminescence device, techniques on phosphorescence emission which uses energy in a triplet state, or delayed fluorescence emission which uses the generating phenomenon of singlet excitons by the collision of triplet excitons (triplet-triplet annihilation, TTA) are being developed, and development on a material for thermally activated delayed fluorescence (TADF) using delayed fluorescence phenomenon is being conducted.

SUMMARY

The disclosure provides a light emitting device showing excellent emission efficiency and improved device life.

The disclosure also provides a polycyclic compound which is a material for a light emitting device having excellent emission efficiency properties and improved life characteristics.

An embodiment provides a light emitting device that may include a first electrode, a second electrode disposed on the first electrode, and an emission layer disposed between the first electrode and the second electrode and including a polycyclic compound represented by Formula 1. The light emitting device may have an external quantum efficiency in a range of about 20% to about 30%.

[Formula 1]

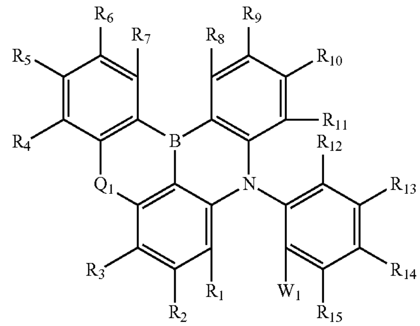

In Formula 1, $W_1$ may be a substituted or unsubstituted carbazole group, a substituted or unsubstituted dibenzofuran group, or a substituted or unsubstituted dibenzothiophene group, and $Q_1$ may be $NR_{16}$, O, or S. $R_1$ to $R_{16}$ may each independently be a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, a substituted or unsubstituted aryl group of 6 to 20 ring-forming carbon atoms, or a substituted or unsubstituted heteroaryl group of 2 to 20 ring-forming carbon atoms, or a group represented by Formula 2 may be bonded to adjacent groups of $R_1$ to $R_{16}$.

[Formula 2]

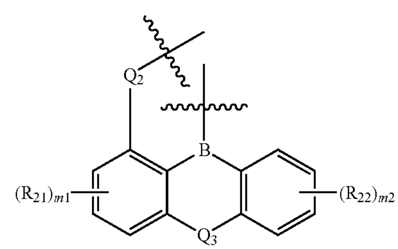

In Formula 2, $Q_2$ and $Q_3$ may each independently be $NR_{23}$, O, or S, m1 may be an integer from 1 to 3, m2 may be an integer from 1 to 4, $R_{21}$ to $R_{23}$ may each independently be a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, a substituted or unsubstituted aryl group of 6 to 20 ring-forming carbon atoms, or a substituted or unsubstituted heteroaryl group of 2 to 20 ring-forming carbon atoms, and

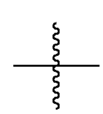

indicates a binding site to a neighboring atom.

Another embodiment provides a light emitting device that may include a first electrode, a hole transport region disposed on the first electrode, an emission layer disposed on the hole transport region and including a polycyclic compound represented by Formula 1, an electron transport region disposed on the emission layer, and a second electrode disposed on the electron transport region.

In an embodiment, Formula 1 may be represented by any one of Formula 1-A1 to Formula 1-A4 below.

[Formula 1-A1]

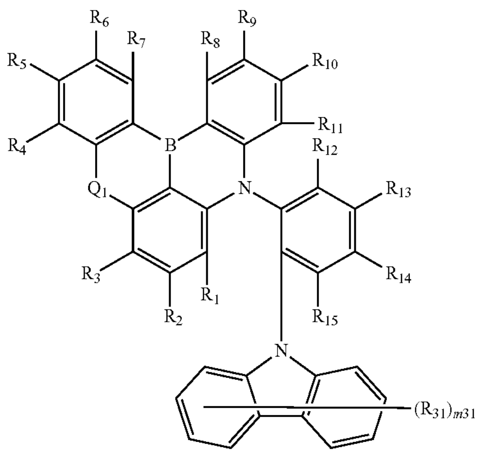

[Formula 1-A2]

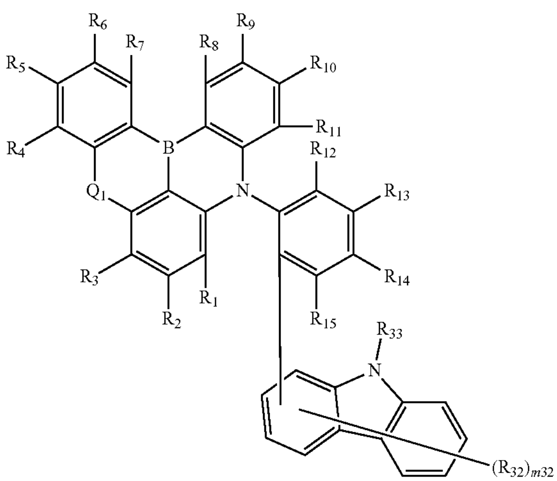

[Formula 1-A3]

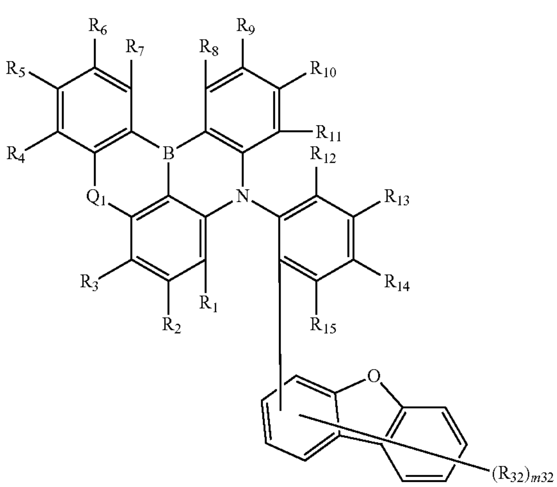

-continued

[Formula 1-A4]

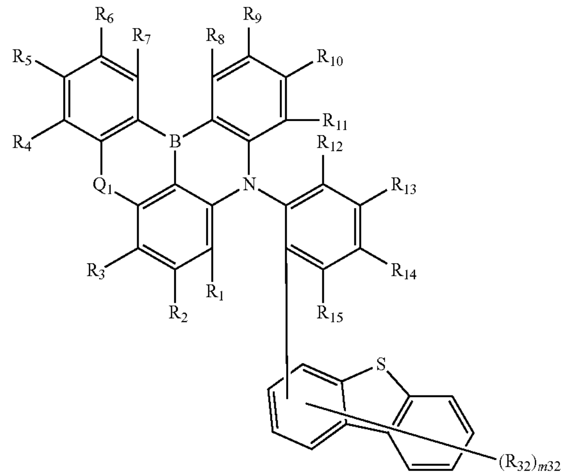

In Formula 1-A1 to Formula 1-A4, m31 may be an integer from 1 to 8, m32 may be an integer from 1 to 7, $R_{31}$ to $R_{33}$ may each independently be a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, or a substituted or unsubstituted aryl group of 6 to 20 ring-forming carbon atoms, and $Q_1$, and $R_1$ to $R_{15}$ may be the same as defined in connection with Formula 1 above.

In an embodiment, Formula 1 may be represented by Formula 1-B1 or Formula 1-B2 below.

[Formula 1-B1]

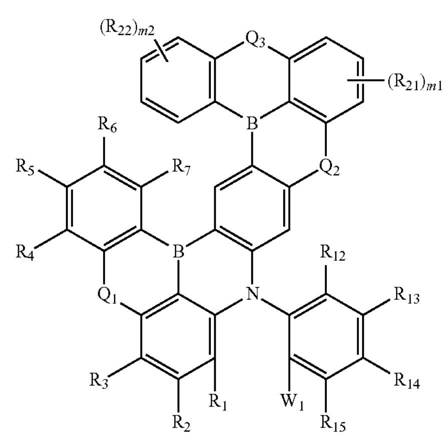

-continued
[Formula 1-B2]
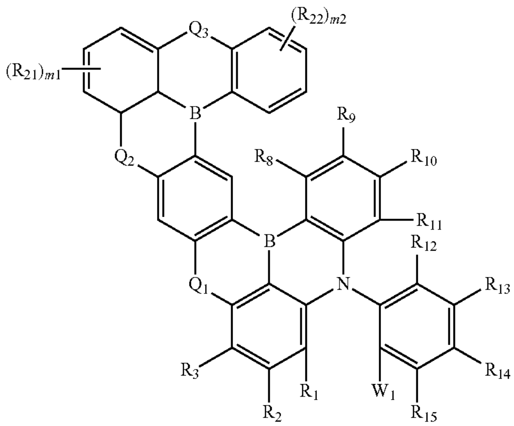
In Formula 1-B1 and Formula 1-B2, $Q_1$ to $Q_3$, $R_1$ to $R_{15}$, m1, m2, $R_{21}$, $R_{22}$, and $W_1$ may be the same as defined in connection with Formula 1 and Formula 2.
In an embodiment, at least one of $Q_1$ to $Q_3$ may be O, or S.
In an embodiment, Formula 1-B1 may be represented by any one of Formula 1-B1-1 to Formula 1-B1-4 below.
[Formula 1-B1-1]
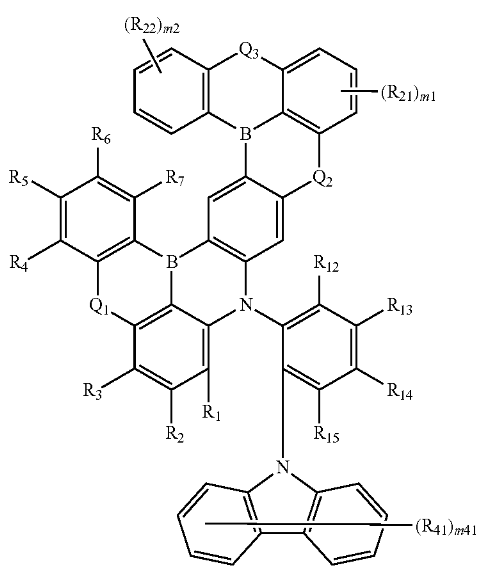
-continued
[Formula 1-B1-2]
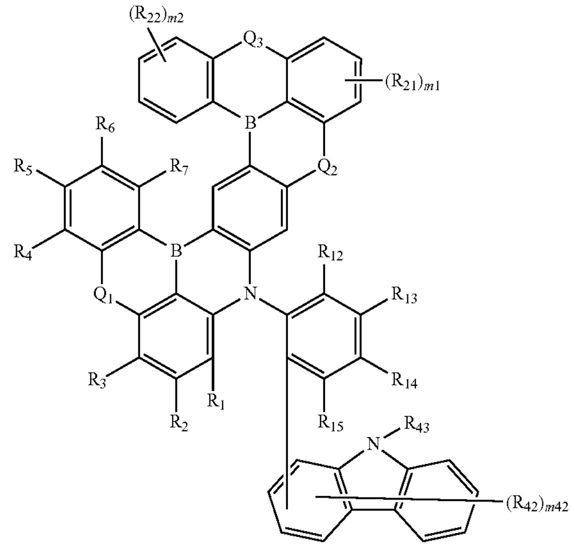
[Formula 1-B1-3]
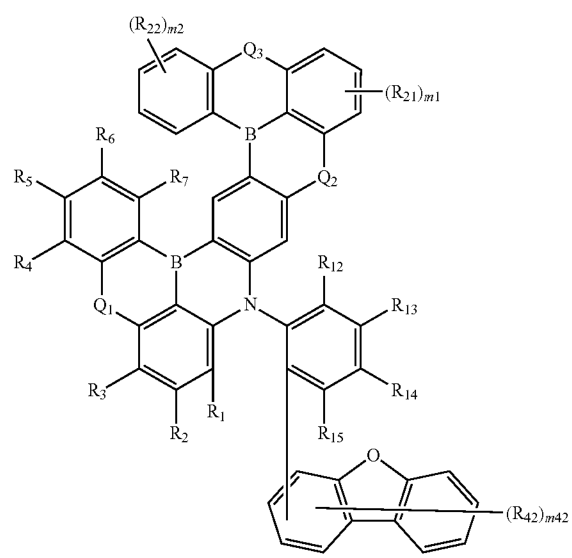

-continued

[Formula 1-B1-4]

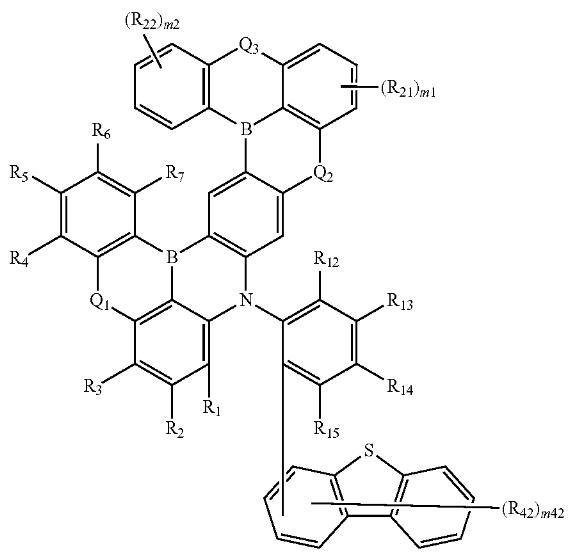

In Formula 1-B1-1 to Formula 1-B1-4, m41 may be an integer from 1 to 8, m42 may be an integer from 1 to 7, $R_{41}$ to $R_{43}$ may each independently be a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, or a substituted or unsubstituted aryl group of 6 to 20 ring-forming carbon atoms, and $Q_1$ to $Q_3$, $R_1$ to $R_7$, $R_{12}$ to $R_{15}$, m1, m2, $R_{21}$, and $R_{22}$ may be the same as defined in connection with Formula 1 and Formula 2.

In an embodiment, Formula 1-B2 may be represented by any one of Formula 1-B2-1 to Formula 1-B2-4 below.

[Formula 1-B2-1]

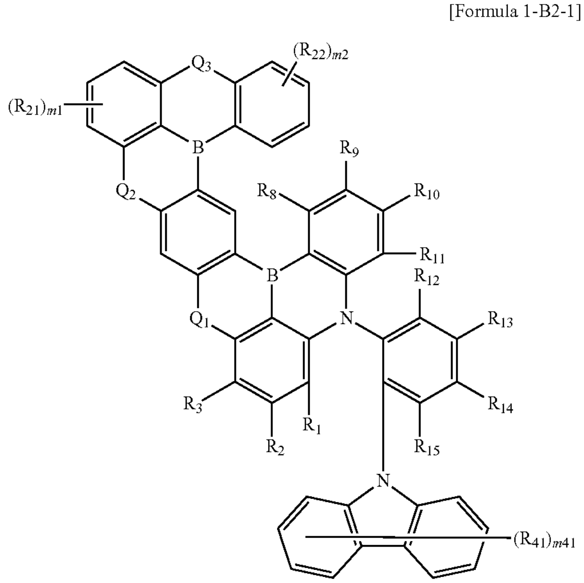

-continued

[Formula 1-B2-2]

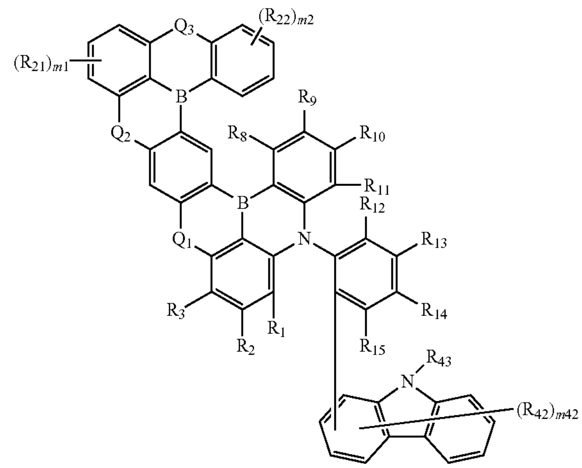

[Formula 1-B2-3]

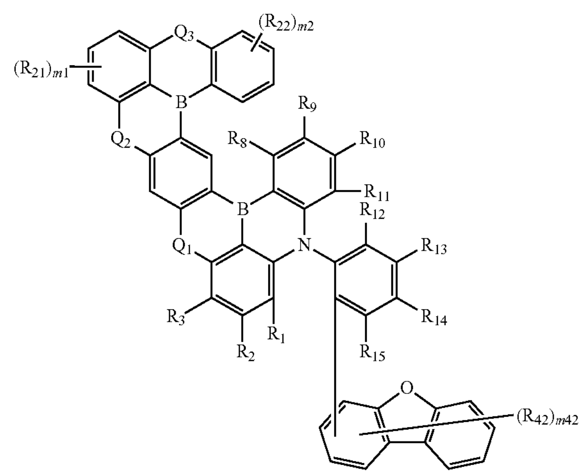

[Formula 1-B2-4]

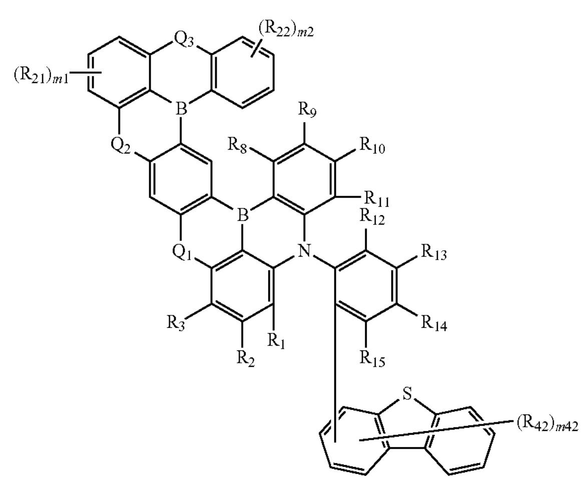

In Formula 1-B2-1 to Formula 1-B2-4, m41 may be an integer from 1 to 8, m42 may be an integer from 1 to 7, $R_{41}$ to $R_{43}$ may each independently be a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, a substituted or unsubstituted aryl group of 6 to 20 ring-forming carbon atoms, and $Q_1$ to $Q_3$, $R_1$ to $R_3$, $R_8$ to $R_{15}$, m1, m2, $R_{21}$, and $R_{22}$ may be the same as defined in connection with Formula 1 and Formula 2.

In an embodiment, Formula 1 may be represented by any one of Formula 1-C1 to Formula 1-C3 below.

[Formula 1-C1]

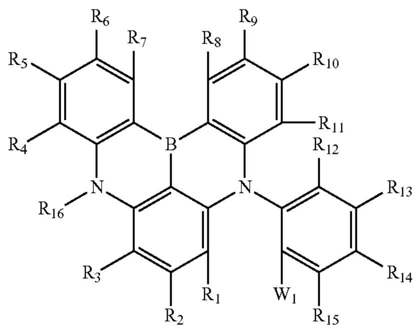

[Formula 1-C2]

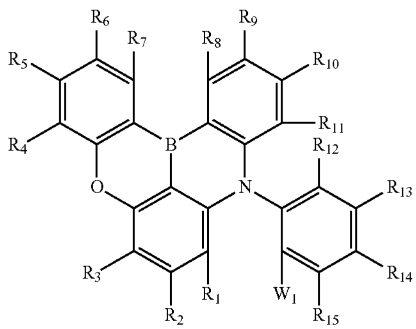

[Formula 1-C3]

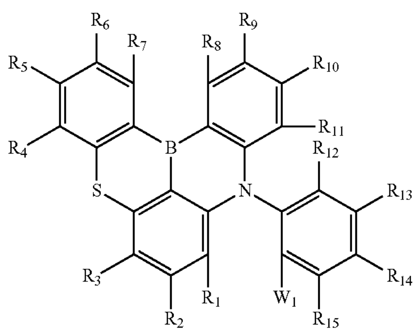

In Formula 1-C1 to Formula 1-C3, $W_1$ and $R_1$ to $R_{16}$ may be the same as defined in connection with Formula 1.

In an embodiment, the light emitting device may further include a capping layer disposed on the second electrode, and a refractive index of the capping layer may be equal to or greater than about 1.6.

In an embodiment, the hole transport region may include an amine compound represented by Formula H-1 below.

[Formula H-1]

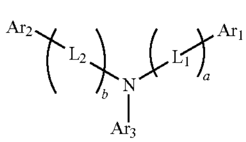

In Formula H-1, a and b may each independently be an integer from 0 to 10. In Formula H-1, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms, and $Ar_3$ may be a substituted or unsubstituted aryl group of 6 to 30 ring-forming carbon atoms.

Another embodiment provides a polycyclic compound represented by Formula 1 above.

In an embodiment, $R_{32}$ may be a hydrogen atom, a deuterium atom, a substituted or unsubstituted alkyl group of 1 to 10 carbon atoms, a substituted or unsubstituted phenyl group, an unsubstituted naphthyl group, an unsubstituted phenanthryl group, or an unsubstituted anthracenyl group.

In an embodiment, $R_2$ may be represented by any one of $R_{2-1}$ to $R_{2-5}$ below.

$R_{2-1}$

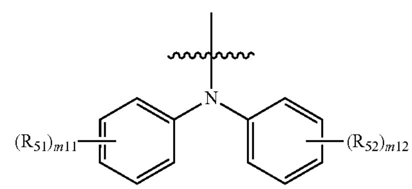

$R_{2-2}$

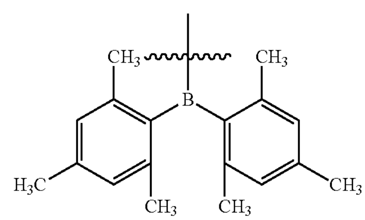

$R_{2-3}$

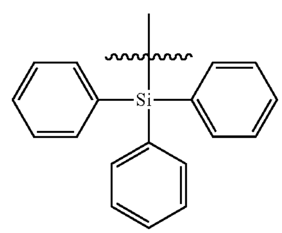

$R_{2-4}$

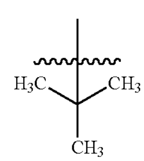

$R_{2-5}$

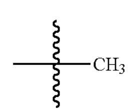

In $R_{2-1}$, m11 and m12 may each independently be an integer from 0 to 5, $R_{51}$ and $R_{52}$ may each independently be a methyl group, a phenyl group, a carbazole group, or a dibenzofuran group, and in $R_{2-1}$ to $R_{2-5}$,

indicates a binding site to a neighboring atom.

In an embodiment, the polycyclic compound represented by Formula 1 may be a material emitting thermally activated delayed fluorescence.

BRIEF DESCRIPTION OF THE DRAWINGS

The accompanying drawings are included to provide a further understanding of the embodiments and are incorporated in and constitute a part of this specification. The drawings illustrate embodiments of the disclosure, together with the description. In the drawings.

DETAILED DESCRIPTION OF THE EMBODIMENTS

Figure 1:
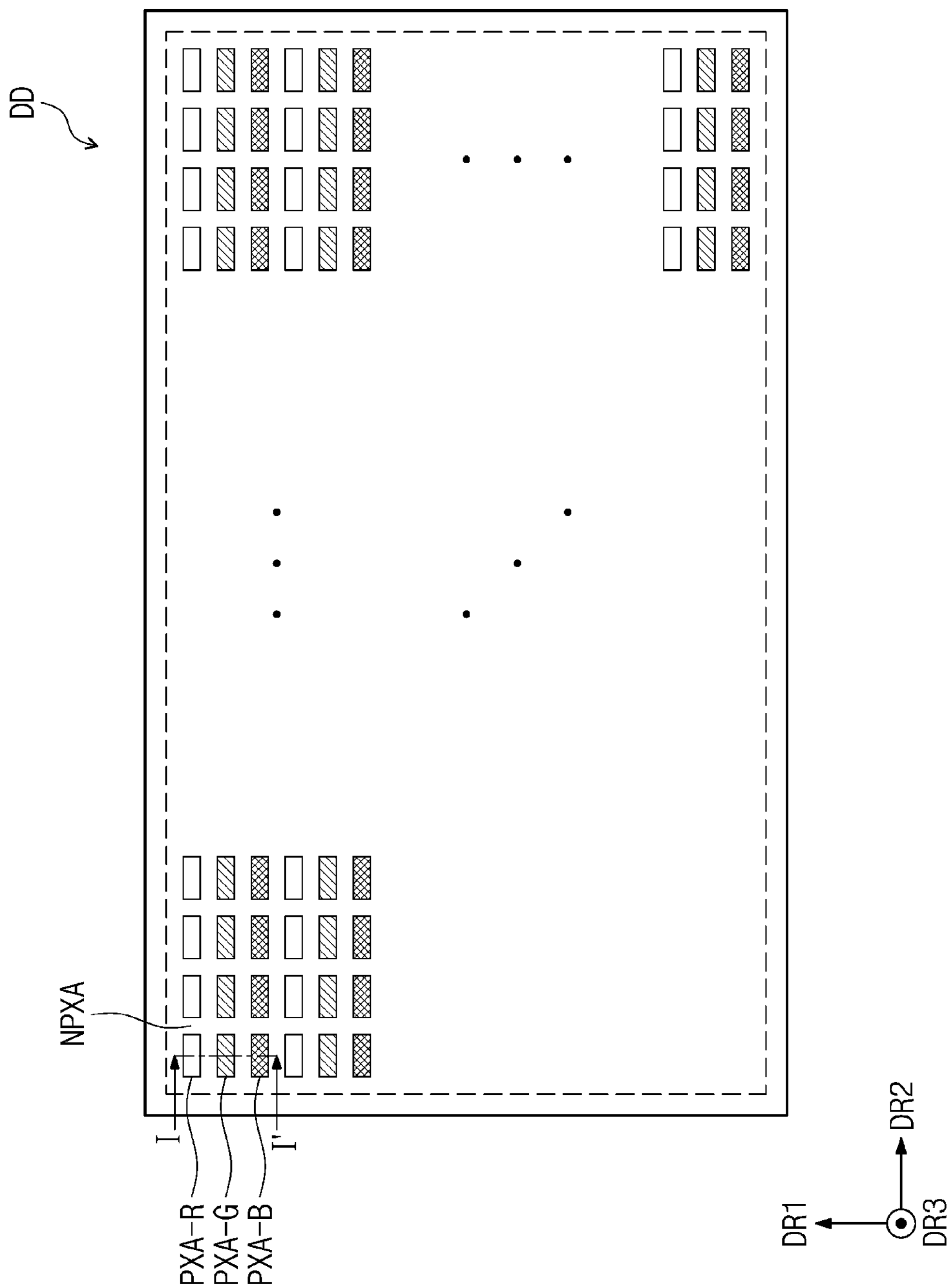
FIG. 1 is a plan view showing a display apparatus according to an embodiment.

The embodiments may have various modifications and may be embodied in different forms, and the embodiments will be explained with reference to the accompanying drawings. The embodiments of the disclosure may, however, be embodied in different forms and should not be construed as limited to the embodiments set forth herein. Rather, all modifications, equivalents, and substituents of the embodiments should be included in the spirit and technical scope of the disclosure. The embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the invention. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, a light emitting device according to an embodiment and a polycyclic compound of an embodiment included therein will be explained with reference to the drawings.

Figure 2:
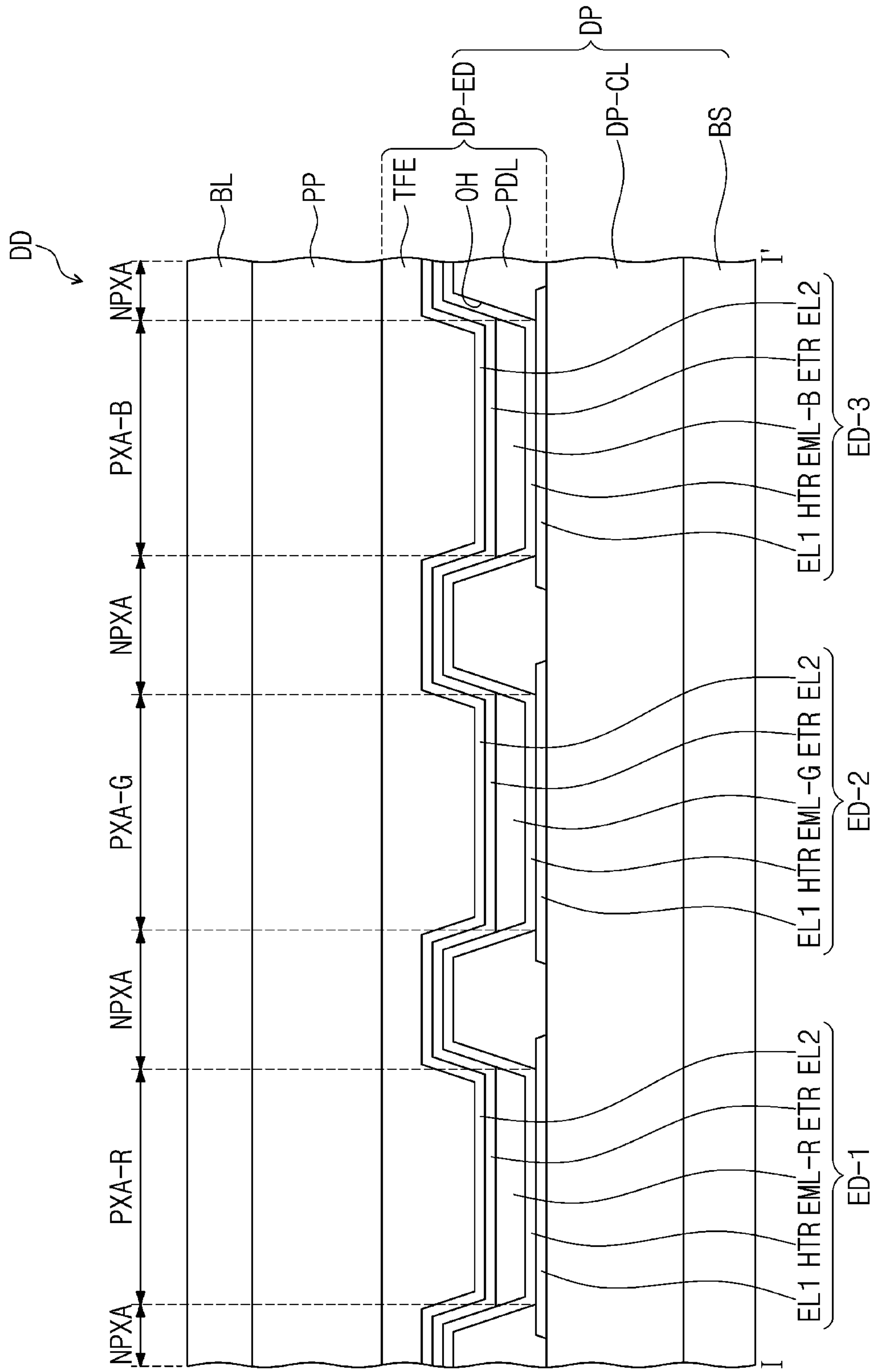
FIG. 2 is a schematic cross-sectional view showing a display apparatus according to an embodiment.

FIG. 1 is a plan view showing an embodiment of a display apparatus DD. FIG. 2 is a schematic cross-sectional view showing a display apparatus DD of an embodiment. FIG. 2 is a schematic cross-sectional view showing a part corresponding to line I-I' in FIG. 1. The display apparatuses DD and DD-TD of embodiments may include a light emitting device ED according to an embodiment. At least one among light emitting devices ED-1, ED-2, and ED-3, which will be explained later, may be the light emitting device ED according to an embodiment. At least one among light emitting devices ED-1, ED-2, and ED-3 may include a polycyclic compound of an embodiment. A light emitting device ED-BT (FIG. 8) with a tandem structure, which will be explained later, may include the polycyclic compound of an embodiment in at least one emission layer among multiple emission layers. The light emitting device ED including the polycyclic compound of an embodiment may have an external quantum efficiency in a range of about 20% to about 30%. The polycyclic compound of an embodiment will be explained in detail later.

The display apparatus DD according to an embodiment may be an apparatus activated by electrical signals. For example, the display apparatus DD may be a personal computer, a laptop computer, a personal digital terminal, a car navigation unit, a game console, a smart phone, a tablet, or a camera. These are only examples of embodiments, and others may be employed as long as they do not deviate from the disclosure.

The display apparatus DD may include a display panel DP and an optical layer PP disposed on the display panel DP. The display panel DP may include light emitting devices ED-1, ED-2, and ED-3. The display panel DP may include multiple light emitting devices ED-1, ED-2, and ED-3. The optical layer PP may be disposed on the display panel DP and control light reflected from an external light at the display panel DP. The optical layer PP may include, for example, a polarization layer or a color filter layer. Different from the drawings, the optical layer PP may be omitted in the display apparatus DD of an embodiment.

On the optical layer PP, a base substrate BL may be disposed. The base substrate BL may be a member providing a base surface for disposing the optical layer PP. The base substrate BL may be a glass substrate, a metal substrate, a plastic substrate, etc. However, an embodiment is not limited thereto. The base substrate BL may be an inorganic layer, an organic layer, or a composite material layer. In contrast to the drawings, the base substrate BL may be omitted in an embodiment.

The display apparatus DD according to an embodiment may further include a plugging layer (not shown). The plugging layer (not shown) may be disposed between a display device layer DP-ED and a base substrate BL. The plugging layer (not shown) may be an organic layer. The plugging layer (not shown) may include at least one of an acrylic resin, a silicon-based resin, and an epoxy-based resin.

The display panel DP may include a base layer BS, a circuit layer DP-CL provided on the base layer BS, and a display device layer DP-ED. The display device layer DP-ED may include a pixel definition layer PDL, light emitting devices ED-1, ED-2, and ED-3 disposed between the pixel definition layers PDL, and an encapsulating layer TFE disposed on the light emitting devices ED-1, ED-2, and ED-3.

The base layer BS may be a member providing a base surface where the display device layer DP-ED is disposed. The base layer BS may be a glass substrate, a metal substrate, a plastic substrate, etc. However, an embodiment is not limited thereto, and the base layer BS may be an inorganic layer, an organic layer, or a composite material layer.

In an embodiment, the circuit layer DP-CL is disposed on the base layer BS, and the circuit layer DP-CL may include multiple transistors (not shown). Each of the transistors (not shown) may include a control electrode, an input electrode, and an output electrode. For example, the circuit layer DP-CL may include switching transistors and driving transistors for driving the light emitting devices ED-1, ED-2, and ED-3 of the display device layer DP-ED.

Each of the light emitting devices ED-1, ED-2, and ED-3 may have the structure of a light emitting device ED of an embodiment according to FIG. 3 to FIG. 6, which will be explained later. Each of the light emitting devices ED-1, ED-2, and ED-3 may include a first electrode EL1, a hole transport region HTR, emission layers EML-R, EML-G, and EML-B, an electron transport region ETR, and a second electrode EL2.

In FIG. 2, shown is an embodiment where the emission layers EML-R, EML-G, and EML-B of the light emitting devices ED-1, ED-2, and ED-3, which are in opening parts OH defined in the pixel definition layer PDL, are disposed, and the hole transport region HTR, the electron transport region ETR, and the second electrode EL2 are provided as common layers in all light emitting devices ED-1, ED-2, and ED-3. However, an embodiment is not limited thereto. Different from FIG. 2, in another embodiment, the hole transport region HTR and the electron transport region ETR may be patterned and provided in the opening parts OH defined in the pixel definition layer PDL. For example, in an embodiment, the hole transport region HTR, the emission layers EML-R, EML-G, and EML-B, and the electron transport region ETR of the light emitting devices ED-1, ED-2, and ED-3 may be patterned by an ink jet printing method and provided.

The encapsulating layer TFE may cover the light emitting devices ED-1, ED-2, and ED-3. The encapsulating layer TFE may be disposed on the second electrode EL2 and may be disposed in an opening part OH. The encapsulating layer TFE may encapsulate the display device layer DP-ED. The encapsulating layer TFE may be a thin film encapsulating layer. The encapsulating layer TFE may be one layer or a stack of multiple layers. The encapsulating layer TFE may include at least one insulating layer. The encapsulating layer TFE according to an embodiment may include at least one inorganic layer (hereinafter, encapsulating inorganic layer). The encapsulating layer TFE according to an embodiment may include at least one organic layer (hereinafter, encapsulating organic layer) and at least one encapsulating inorganic layer.

The encapsulating inorganic layer protects the display device layer DP-ED from moisture/oxygen, and the encapsulating organic layer protects the display device layer DP-ED from foreign materials such as dust particles. The encapsulating inorganic layer may include a silicon nitride layer, a silicon oxy nitride layer, a silicon oxide layer, a titanium oxide layer, or an aluminum oxide layer, without specific limitation. The encapsulating organic layer may include an acrylic compound, an epoxy-based compound, etc. The encapsulating organic layer may include a photo-polymerizable organic material, without specific limitation.

Referring to FIG. 1 and FIG. 2, the display apparatus DD may include a non-luminous area NPXA and luminous areas PXA-R, PXA-G, and PXA-B. The luminous areas PXA-R, PXA-G, and PXA-B may be areas emitting light produced from the light emitting devices ED-1, ED-2, and ED-3, respectively. The luminous areas PXA-R, PXA-G, and PXA-B may be separated from each other on a plane.

The luminous areas PXA-R, PXA-G, and PXA-B may be areas separated by the pixel definition layer PDL. The non-luminous areas NPXA may be areas between neighboring luminous areas PXA-R, PXA-G, and PXA-B and may be areas corresponding to the pixel definition layer PDL. In the disclosure, each of the luminous areas PXA-R, PXA-G, and PXA-B may correspond to each pixel. The pixel definition layer PDL may divide the light emitting devices ED-1, ED-2, and ED-3. The emission layers EML-R, EML-G, and EML-B of the light emitting devices ED-1, ED-2, and ED-3 may be divided and disposed in the opening parts OH defined in the pixel definition layer PDL.

The luminous areas PXA-R, PXA-G, and PXA-B may be divided into numbers of groups according to the color of light produced from the light emitting devices ED-1, ED-2, and ED-3. In the display apparatus DD of an embodiment, shown in FIG. 1 and FIG. 2, three luminous areas PXA-R, PXA-G, and PXA-B emitting red light, green light and blue light are illustrated as an embodiment. For example, the display apparatus DD of an embodiment may include a red luminous area PXA-R, a green luminous area PXA-G, and a blue luminous area PXA-B, which are separated from each other.

In the display apparatus DD according to an embodiment, multiple light emitting devices ED-1, ED-2, and ED-3 may emit light having different wavelength regions. For example, in an embodiment, the display apparatus DD may include a first light emitting device ED-1 emitting red light, a second light emitting device ED-2 emitting green light, and a third light emitting device ED-3 emitting blue light. For example, each of the red luminous area PXA-R, the green luminous area PXA-G, and the blue luminous area PXA-B may respectively correspond to the first light emitting device ED-1, the second light emitting device ED-2, and the third light emitting device ED-3.

However, an embodiment is not limited thereto, and the first to third light emitting devices ED-1, ED-2, and ED-3 may emit light in a same wavelength region, or at least one thereof may emit light in a different wavelength region. For example, all of the first to third light emitting devices ED-1, ED-2, and ED-3 may emit blue light.

The luminous areas PXA-R, PXA-G, and PXA-B in the display apparatus DD according to an embodiment may be arranged in a stripe shape. Referring to FIG. 1, multiple red luminous areas PXA-R, multiple green luminous areas PXA-G, and multiple blue luminous areas PXA-B may be arranged along a second directional axis DR2. The red luminous area PXA-R, the green luminous area PXA-G, and the blue luminous area PXA-B may be arranged by turns along a first directional axis DR1.

In FIG. 1 and FIG. 2, the areas of the luminous areas PXA-R, PXA-G, and PXA-B are shown as having a similar size, but an embodiment is not limited thereto. The areas of the luminous areas PXA-R, PXA-G, and PXA-B may be different from each other according to the wavelength region of light emitted. The areas of the luminous areas PXA-R, PXA-G, and PXA-B may mean areas on a plane defined by the first directional axis DR1 and the second directional axis DR2.

The arrangement type of the luminous areas PXA-R, PXA-G, and PXA-B is not limited to the configuration shown in FIG. 1, and the arrangement order of the red luminous areas PXA-R, the green luminous areas PXA-G, and the blue luminous areas PXA-B may be provided in various combinations according to the properties of display quality required for the display apparatus DD. For example, the arrangement type of the luminous areas PXA-R, PXA-G, and PXA-B may be a PenTile® arrangement type, or a diamond arrangement type.

The areas of the luminous areas PXA-R, PXA-G, and PXA-B may be different from each other. For example, in an embodiment, the area of the green luminous area PXA-G may be smaller than the area of the blue luminous area PXA-B, but an embodiment is not limited thereto.

Hereinafter, FIG. 3 to FIG. 6 are schematic cross-sectional views each showing a light emitting device according to embodiments. The light emitting device ED according to an embodiment may include a first electrode EL1, a hole transport region HTR, an emission layer EML, an electron transport region ETR, and a second electrode EL2, stacked in that order.

Figure 3:
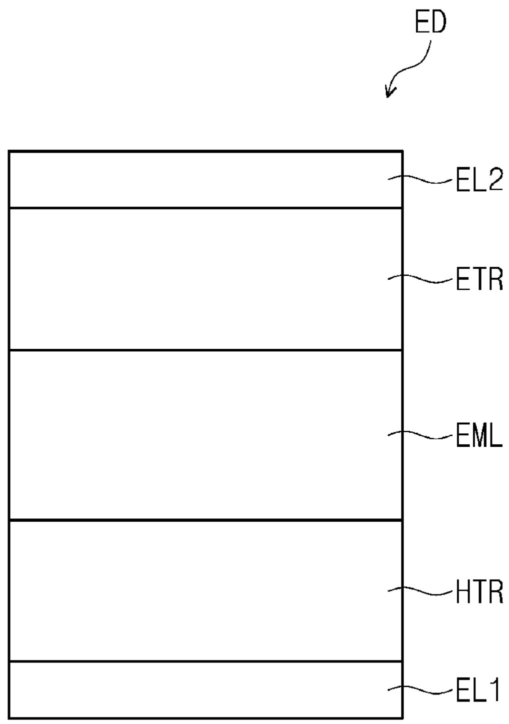
FIG. 3 is a schematic cross-sectional view showing a light emitting device of an embodiment.
Figure 4:
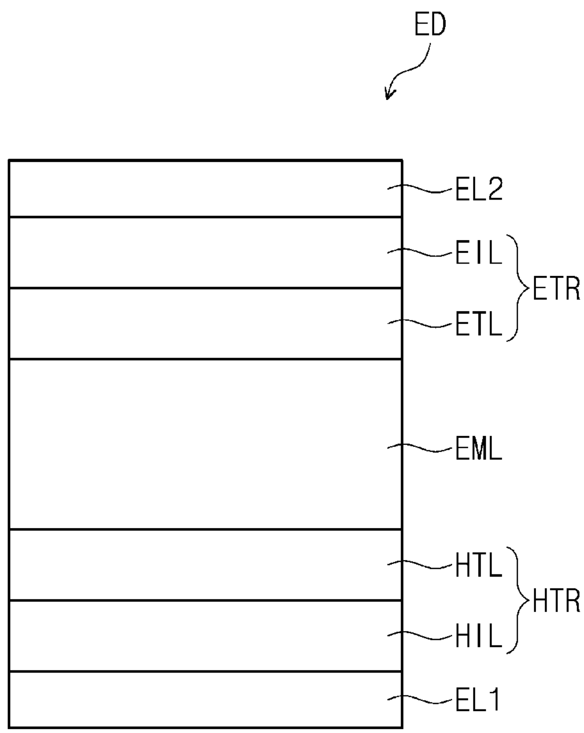
FIG. 4 is a schematic cross-sectional view showing a light emitting device of an embodiment.
Figure 5:
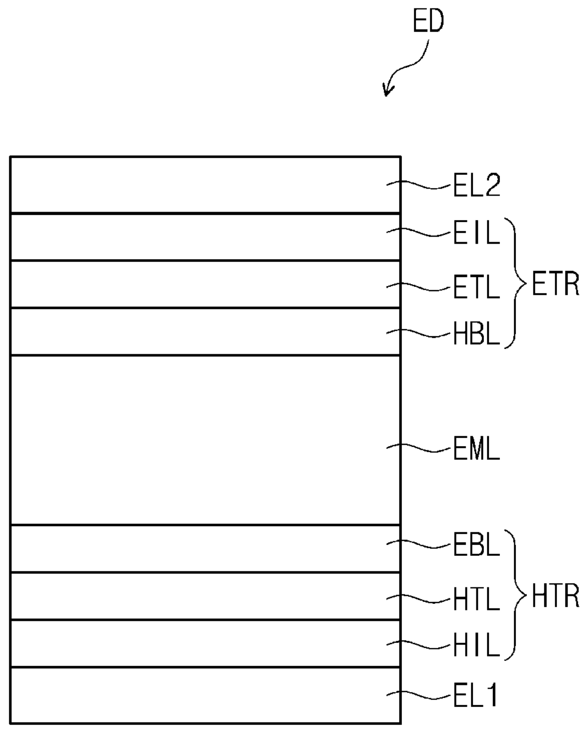
FIG. 5 is a schematic cross-sectional view showing a light emitting device of an embodiment.
Figure 6:
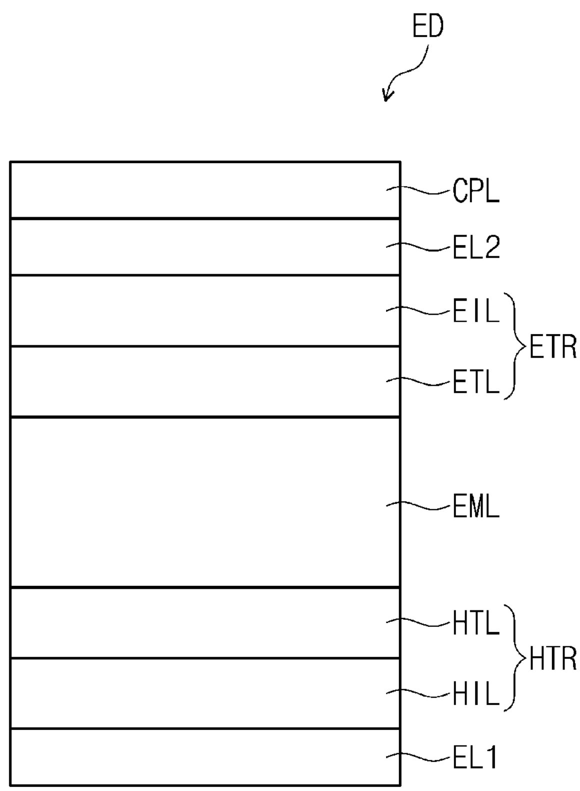
FIG. 6 is a schematic cross-sectional view showing a light emitting device of an embodiment.

When compared with FIG. 3, FIG. 4 shows the schematic cross-sectional view of a light emitting device ED of an embodiment, wherein a hole transport region HTR includes a hole injection layer HIL and a hole transport layer HTL, and an electron transport region ETR includes an electron injection layer EIL and an electron transport layer ETL. When compared with FIG. 3, FIG. 5 shows the schematic cross-sectional view of a light emitting device ED of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. When compared with FIG. 4, FIG. 6 shows the schematic cross-sectional view of a light emitting device ED of an embodiment, including a capping layer CPL disposed on the second electrode EL2.

The first electrode EL1 has conductivity. The first electrode EL1 may be formed using a metal material, a metal alloy, or a conductive compound. The first electrode EL1 may be an anode or a cathode. However, an embodiment is not limited thereto. The first electrode EL1 may be a pixel electrode. The first electrode EL1 may be a transmissive electrode, a transflective electrode, or a reflective electrode. If the first electrode EL1 is a transmissive electrode, the first electrode EL1 may be formed using a transparent metal oxide such as indium tin oxide (ITO), indium zinc oxide (IZO), zinc oxide (ZnO), and indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, compounds thereof, or mixtures thereof (for example, a mixture of Ag and Mg). The first electrode EL1 may have a structure including multiple layers including a reflective layer or a transflective layer formed using the above materials, and a transmissive conductive layer formed using ITO, IZO, ZnO, or ITZO. For example, the first electrode EL1 may include a three-layer structure of ITO/Ag/ITO. However, an embodiment is not limited thereto. The first electrode EL1 may include the aforementioned metal materials, combinations of two or more metal materials selected from the aforementioned metal materials, or oxides of the aforementioned metal materials, without limitation. A thickness of the first electrode EL1 may be in a range of about 700 Å to about 10,000 Å. For example, the thickness of the first electrode EL1 may be in a range of about 1,000 Å to about 3,000 Å.

The hole transport region HTR is provided on the first electrode ELL The hole transport region HTR may include at least one of a hole injection layer HIL, a hole transport layer HTL, a buffer layer, an emission auxiliary layer (not shown), and an electron blocking layer EBL. A thickness of the hole transport region HTR may be in a range of about 50 Å to about 15,000 Å.

The hole transport region HTR may have a single layer formed using a single material, a single layer formed using different materials, or a multilayer structure including multiple layers formed using different materials.

For example, the hole transport region HTR may have the structure of a single layer of a hole injection layer HIL or a hole transport layer HTL, and may have a structure of a single layer formed using a hole injection material and a hole transport material. In another example, the hole transport region HTR may have a structure of a single layer formed using different materials, or a structure stacked from the first electrode EL1 of hole injection layer HIL/hole transport layer HTL, hole injection layer HIL/hole transport layer HTL/buffer layer (not shown), hole injection layer HIL/buffer layer (not shown), hole transport layer HTL/buffer layer, or hole injection layer HIL/hole transport layer HTL/electron blocking layer EBL, without limitation.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

According to an embodiment, the hole transport region HTR may include a compound represented by Formula H-1 below.

[Formula H-1]

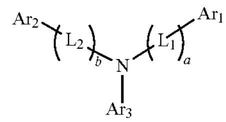

In Formula H-1, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. In Formula H-1, a and b may each independently be an integer from 0 to 10. If a or b is an integer of 2 or more, multiple $L_1$ and $L_2$ may each independently be a substituted or unsubstituted arylene group of 6 to 30 ring-forming carbon atoms, or a substituted or unsubstituted heteroarylene group of 2 to 30 ring-forming carbon atoms.

In Formula H-1, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. In Formula H-1, $Ar_3$ may be a substituted or unsubstituted aryl group of 6 to 30 ring-forming carbon atoms.

The compound represented by Formula H-1 may be a monoamine compound. Otherwise, the compound represented by Formula H-1 may be a diamine compound in which at least one of $Ar_1$ to $Ar_3$ includes an amine group as a substituent. In an embodiment, the compound represented by Formula H-1 may be a carbazole-based compound in which a substituted or unsubstituted carbazole group is included in at least one among $Ar_1$ and $Ar_2$, or a fluorene-based compound in which a substituted or unsubstituted fluorene group is included in at least one among $Ar_1$ and $Ar_2$.

The compound represented by Formula H-1 may be represented by any one of the compounds represented in Compound Group H below. However, the compounds illustrated in Compound Group H are embodiments, and the compound represented by Formula H-1 is not limited to those represented in Compound Group H below.

[Compound Group H]

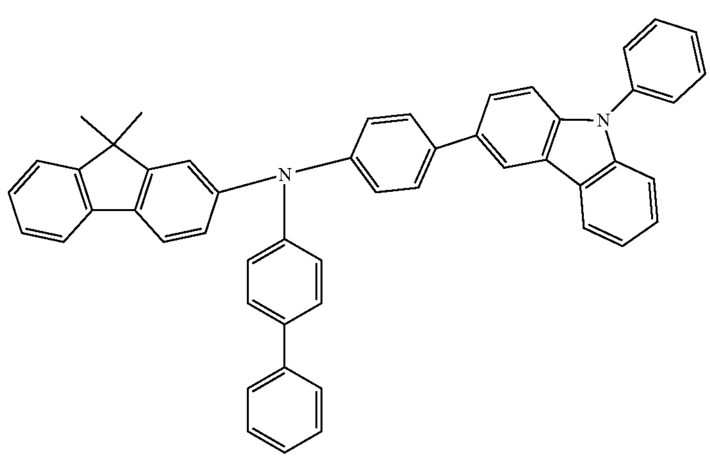

-continued
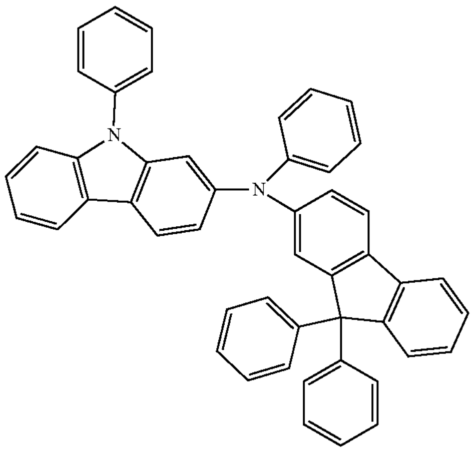
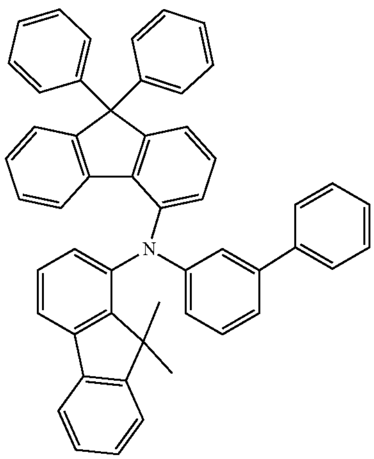
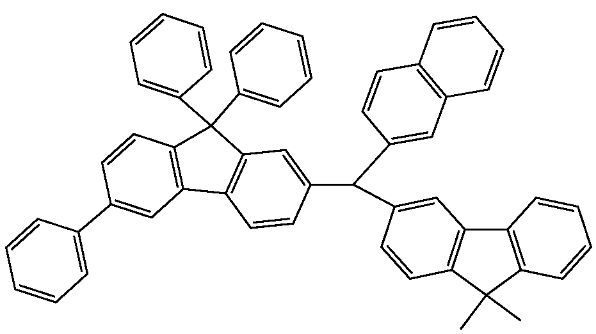
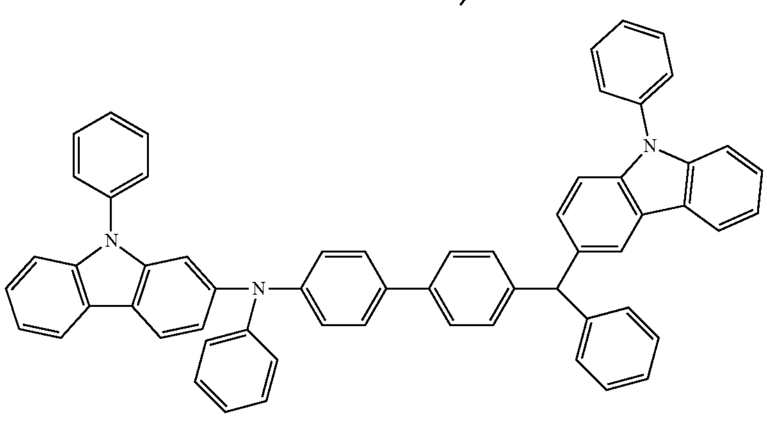

-continued
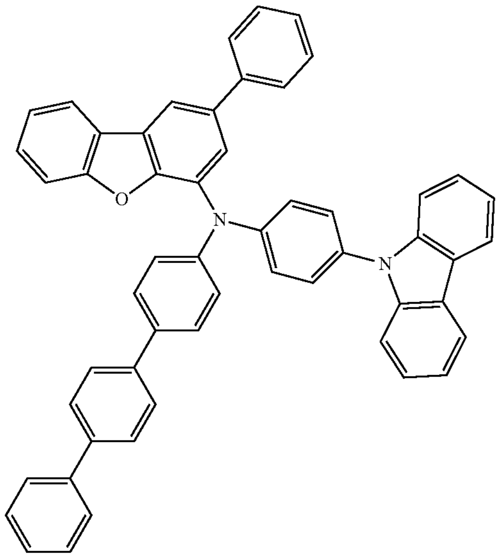
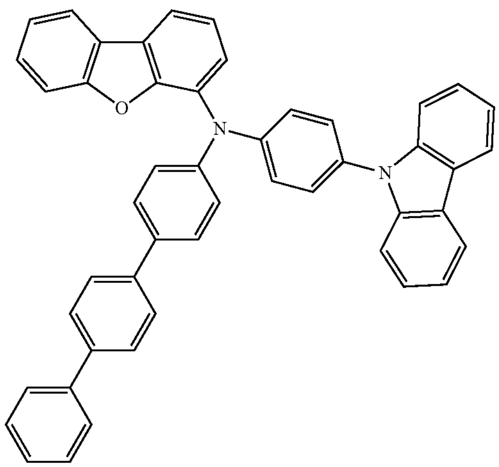
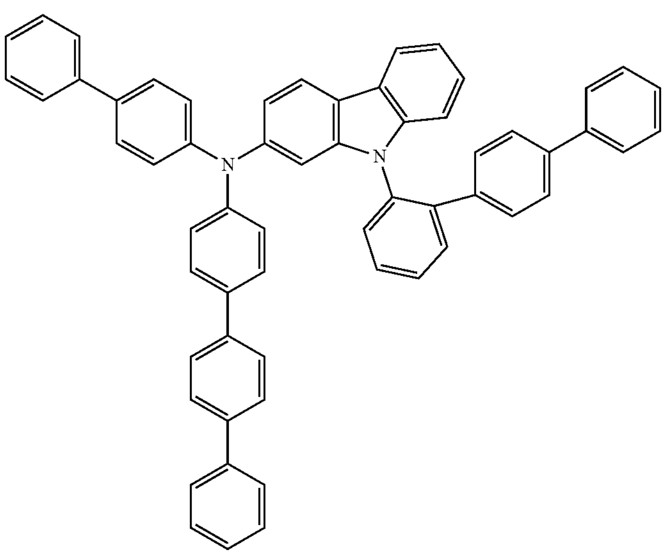

-continued
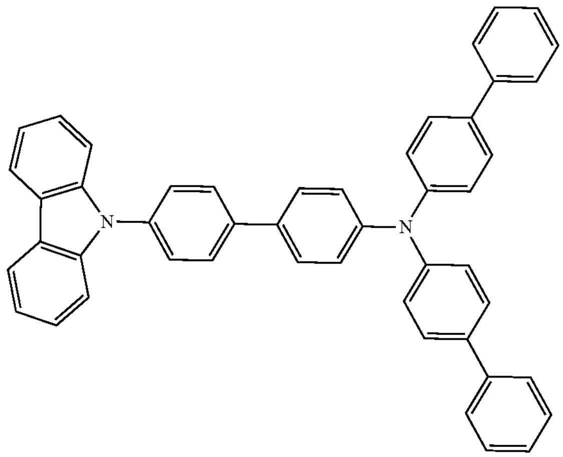
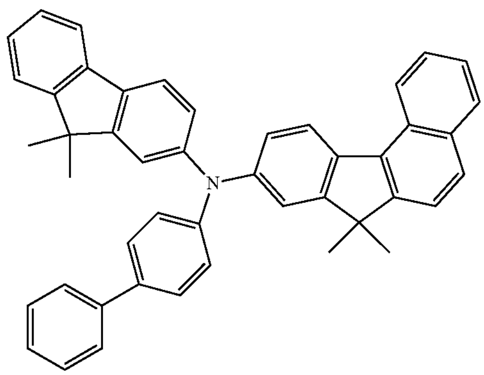
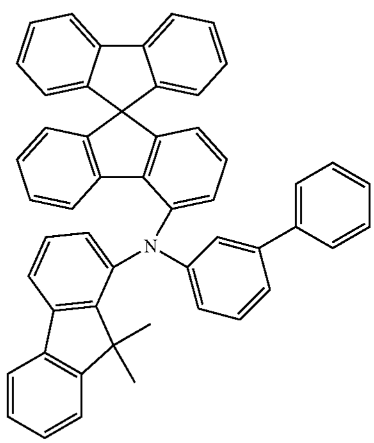
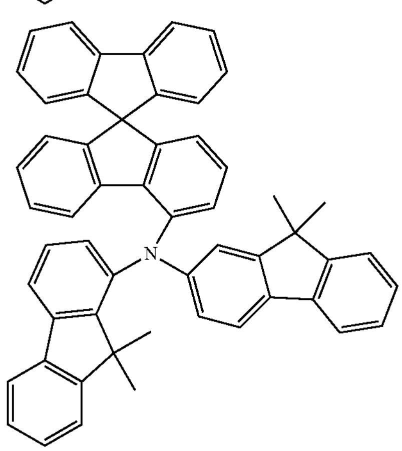

-continued
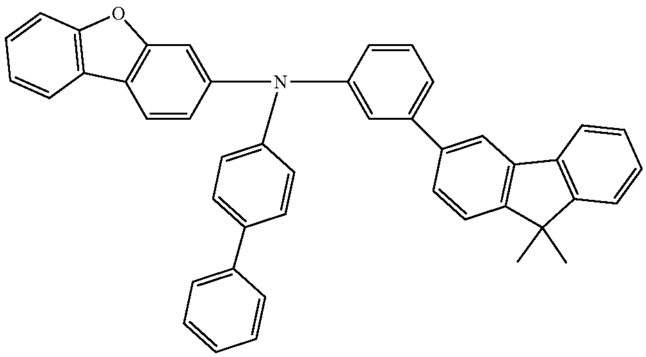
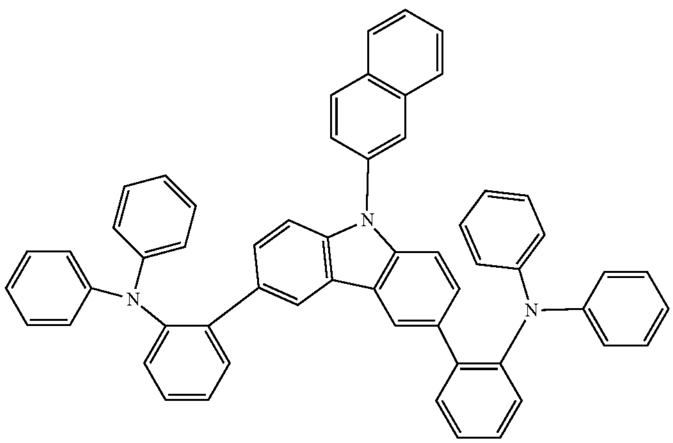
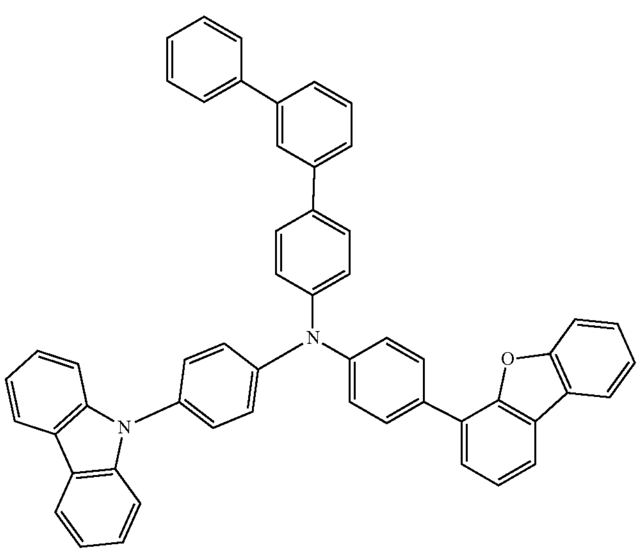

-continued
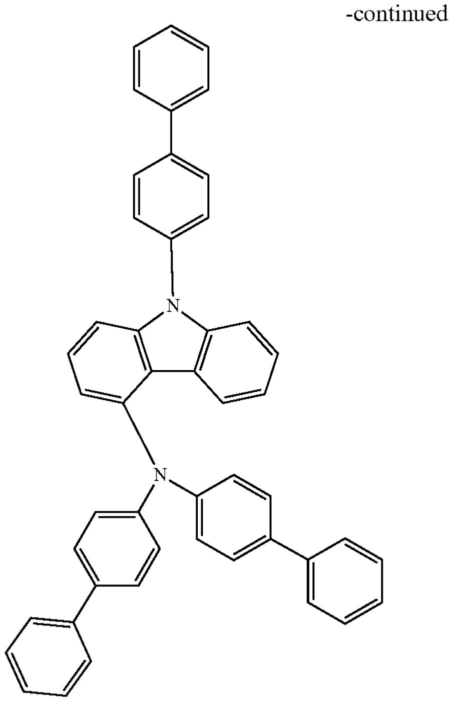
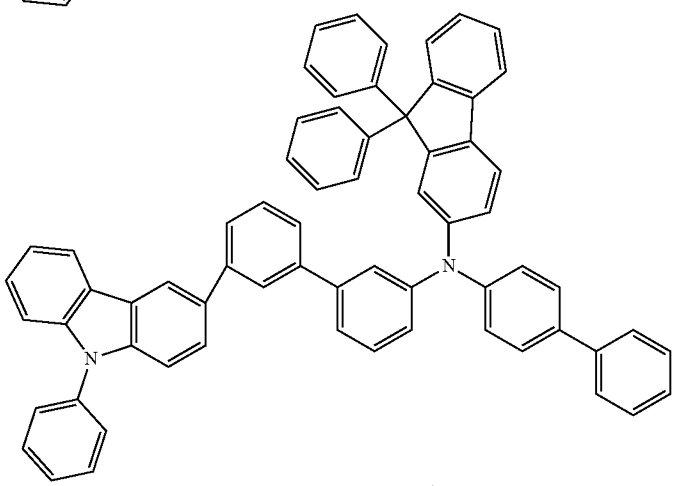
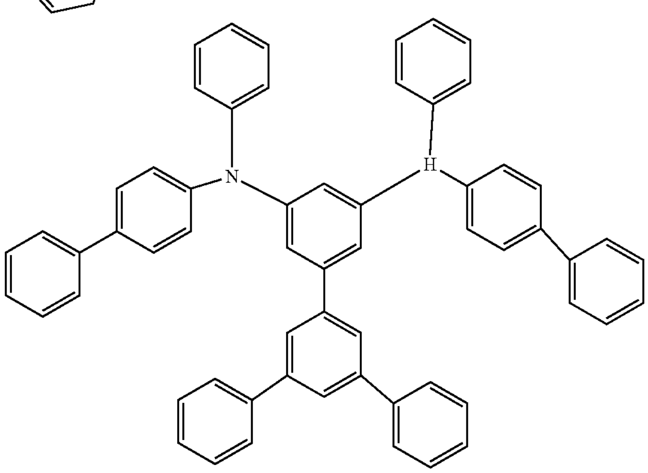
The hole transport region HTR may include, for example, a phthalocyanine compound such as copper phthalocyanine, $N^1,N^{1'}$-([1,1'-biphenyl]-4,4'-diyl)bis($N^1$-phenyl-$N^4,N^4$-di-m-tolylbenzene-1,4-diamine) (DNTPD), 4,4',4"-[tris(3-methylphenyl)phenylamino]triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], and dipyrazino[2,3-f:2',3'-h]quinoxaline-2,3,6,7,10,11-hexacarbonitrile (HAT-CN).

The hole transport region HTR may include carbazole derivatives such as N-phenyl carbazole and polyvinyl carbazole, fluorene-based derivatives, N,N'-bis(3-methylphenyl)-N,N'-diphenyl-[1,1'-biphenyl]-4,4'-diamine (TPD), triphenylamine-based derivatives such as 4,4',4"-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(-methylphenyl)benzeneamine (TAPC), 4,4'-bis [N,N'-(3-tolyl)amino]-3,3'-dimethylbiphenyl (HMTPD), 1,3-bis(N-carbazolyl)benzene (mCP), 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region in at least one of a hole injection layer HIL, a hole transport layer HTL, or an electron blocking layer EBL.

A thickness of the hole transport region HTR may be in a range of about 100 Å to about 10,000 Å. For example, the thickness of the hole transport region HTR may be in a range of about 100 Å to about 5,000 Å. In case where the hole transport region HTR includes a hole injection layer HIL, a thickness of the hole injection region HIL may be, for example, in a range of about 30 Å to about 1,000 Å. In case where the hole transport region HTR includes a hole transport layer HTL, a thickness of the hole transport layer HTL may be in a range of about 30 Å to about 1,000 Å. For example, in case where the hole transport region HTR includes an electron blocking layer EBL, a thickness of the electron blocking layer EBL may be in a range of about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be achieved without substantial increase of a driving voltage.

The hole transport region HTR may further include a charge generating material in addition to the above-described materials to increase conductivity. The charge generating material may be dispersed uniformly or non-uniformly in the hole transport region HTR. The charge generating material may be, for example, a p-dopant. The p-dopant may include at least one of halogenated metal compounds, quinone derivatives, metal oxides, and cyano group-containing compounds, without limitation. For example, the p-dopant may include halogenated metal compounds such as CuI and RbI, quinone derivatives such as tetracyanoquinodimethane (TCNQ) and 2,3,5,6-tetrafluoro-7,7',8,8-tetracyanoquinodimethane (F4-TCNQ), metal oxides such as tungsten oxide, and molybdenum oxide, cyano group-containing compounds such as dipyrazino[2,3-f: 2,3'-h]quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile, without limitation.

As described above, the hole transport region HTR may further include at least one of a buffer layer (now shown) or an electron blocking layer EBL in addition to the hole injection layer HIL and the hole transport layer HTL. The buffer layer (not shown) may compensate an optical resonance distance according to the wavelength of light emitted from an emission layer EML and may increase light emission efficiency. Materials which may be included in a hole transport region HTR may be used as materials included in a buffer layer (not shown). The electron blocking layer EBL is a layer that may prevent electron injection from the electron transport region ETR to the hole transport region HTR.

The emission layer EML is provided on the hole transport region HTR. In the light emitting device ED of an embodiment, the emission layer EML may include the polycyclic compound of an embodiment.

In the description, the term "substituted or unsubstituted" corresponds to substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents may be substituted or unsubstituted. For example, a biphenyl group may be interpreted as an aryl group or a phenyl group substituted with a phenyl group.

In the description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the description, the halogen atom may be a fluorine atom, a chlorine atom, a bromine atom, or an iodine atom.

In the description, the alkyl may be a linear, branched, or cyclic type. The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the aryl group means an optional functional group or substituent derived from an aromatic hydrocarbon ring. The aryl group may be a monocyclic aryl group or a polycyclic aryl group. The carbon number for forming rings in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the description, the heteroaryl group may include one or more among B, O, N, P, Si and S as heteroatoms. If the heteroaryl group includes two or more heteroatoms, two or more heteroatoms may be the same or different. The heteroaryl group may be a monocyclic heteroaryl group or polycyclic heteroaryl group. The carbon number for forming rings of the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofurane, phenanthroline, thiazole, isoxazole, oxazole, oxadiazole, thiadiazole, phenothiazine, dibenzosilole, dibenzofuran, etc., without limitation.

In the description, the carbon number of the amine group is not specifically limited, but may be 1 to 30. The amine group may include an alkyl amine group and an aryl amine group. Examples of the amine group include a methylamine group, a dimethylamine group, a phenylamine group, a diphenylamine group, a naphthylamine group, a 9-methyl-anthracenylamine group, a triphenylamine group, etc., without limitation.

In the description, the silyl group includes an alkyl silyl group and an aryl silyl group. Examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the description, the boryl group may mean the above-defined alkyl group or aryl group combined with a boron atom. The boryl group includes an alkyl boryl group and an aryl boryl group. Examples of the boryl group include a trimethylboryl group, a triethylboryl group, a t-butyldimethylboryl group, a triphenylboryl group, a diphenylboryl group, a phenylboryl group, etc., without limitation.

In the description,

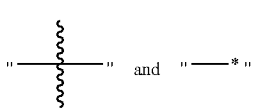

each indicate a binding site to a neighboring atom.

The emission layer EML of the light emitting device ED of an embodiment may include a polycyclic compound represented by Formula 1 below.

[Formula 1]

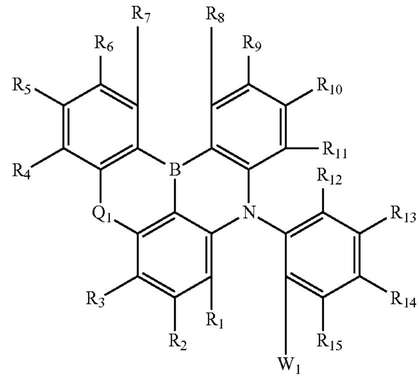

In Formula 1, $W_1$ may be a substituted or unsubstituted carbazole group, a substituted or unsubstituted dibenzofuran group, or a substituted or unsubstituted dibenzothiophene group. $W_1$ may be at an ortho position with respect to a nitrogen atom in a phenyl group including $R_{12}$ to $R_{15}$. For example, $W_1$ may be a carbazole group substituted with an alkyl group, or a carbazole group substituted with an aryl group. $W_1$ may be a dibenzofuran group substituted with an alkyl group, or a dibenzofuran group substituted with an aryl group. $W_1$ may be a dibenzothiophene group substituted with an aryl group. As another example, $W_1$ may be an unsubstituted carbazole group, an unsubstituted dibenzofuran group, or an unsubstituted dibenzothiophene group. However, these are only illustrations, and an embodiment is not limited thereto.

In Formula 1, $Q_1$ may be $NR_{16}$, O, or S. $R_1$ to $R_{16}$ may each independently be a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, a substituted or unsubstituted aryl group of 6 to 20 ring-forming carbon atoms, a substituted or unsubstituted heteroaryl group of 2 to 20 ring-forming carbon atoms, or a group represented by Formula 2 may be bonded to adjacent groups of $R_1$ to $R_{16}$. The substituted or unsubstituted alkyl group of 1 to 20 carbon atoms may be a linear chain or a branched chain.

For example, $R_{16}$ may be a substituted or unsubstituted phenyl group. For example, all of $R_{12}$ to $R_{15}$ may be hydrogen atoms. As another example, any one of $R_{12}$ to $R_{15}$ may be a fluorine atom or an unsubstituted phenyl group. However, these are only illustrations, and an embodiment is not limited thereto.

According to an embodiment, $R_2$ may be represented by any one of $R_{2-1}$ to $R_{2-5}$ below. $R_2$ may be a diphenylamine group, a dimesitylboryl group, a triphenylsilyl group, a t-butyl group, or a methyl group. In another embodiment, $R_2$ may be a hydrogen atom.

$R_{2-1}$

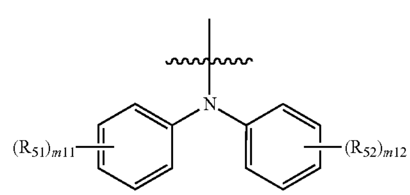

-continued

R2-2

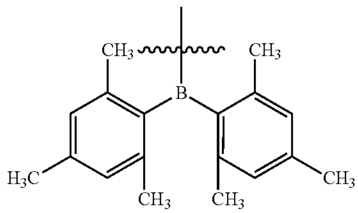

R2-3

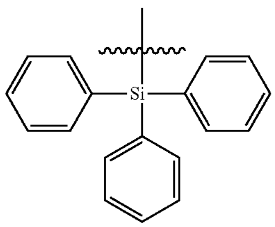

R2-4

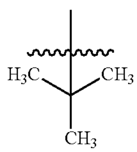

R2-5

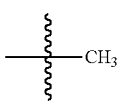

In $R_{2\text{-}1}$, m11 and m12 may each independently be an integer from 0 to 5. If m11 is an integer of 2 or more, $R_{51}$ may be the same or different. If m12 is an integer of 2 or more, $R_{52}$ may be the same or different. In $R_{2\text{-}1}$, $R_{51}$ and $R_{52}$ may each independently be a methyl group, a phenyl group, a carbazole group, or a dibenzofuran group. In $R_{2\text{-}1}$ to $R_{2\text{-}5}$,

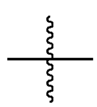

indicates a binding site to a neighboring atom.

Adjacent groups among $R_1$ to $R_{16}$ may be sterically adjacent. For example, groups bonded to the same benzene ring among $R_1$ to $R_{16}$ may be adjacent groups to each other. $R_2$ and $R_3$ may be adjacent groups to each other. $R_5$ and $R_6$ may be adjacent groups to each other. $R_9$ and $R_{10}$ may be adjacent groups to each other. A boron atom and $Q_2$ included in Formula 2 below may be bonded to any two adjacent groups among $R_1$ to $R_{16}$.

[Formula 2]

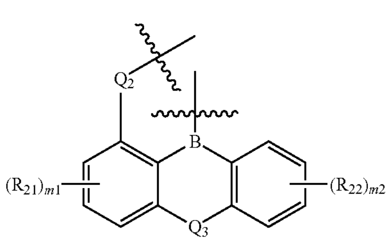

In Formula 2, $Q_2$ and $Q_3$ may each independently be $NR_{23}$, O, or S. In an embodiment, $Q_2$ and $Q_3$ may be the same. In another embodiment, $Q_2$ and $Q_3$ may be different from each other.

In Formula 2, m1 may be an integer from 1 to 3, and m2 may be an integer from 1 to 4. If m1 is an integer of 2 or more, multiple $R_{21}$ groups may be the same or different. If m2 is an integer of 2 or more, multiple $R_{22}$ groups may be the same or different.

In Formula 2, $R_{21}$ to $R_{23}$ may each independently be a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, a substituted or unsubstituted aryl group of 6 to 20 ring-forming carbon atoms, or a substituted or unsubstituted heteroaryl group of 2 to 20 ring-forming carbon atoms. For example, $R_{21}$ may be a t-butyl group, or a diphenylamine group. The phenyl group of the diphenylamine group may be substituted or unsubstituted. $R_{23}$ may be a substituted or unsubstituted phenyl group. However, these are only illustrations, and an embodiment is not limited thereto. In Formula 2,

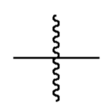

indicates a binding site to a neighboring atom.

According to an embodiment, Formula 1 may be represented by any one of Formula 1-A1 to Formula 1-A4 below. Formula 1-A1 and Formula 1-A2 represent cases where $W_1$ is a substituted or unsubstituted carbazole group. Formula 1-A3 represents a case where $W_1$ is a substituted or unsubstituted dibenzofuran group. Formula 1-A4 represents a case where $W_1$ is a substituted or unsubstituted dibenzothiophene group.

[Formula 1-A1]

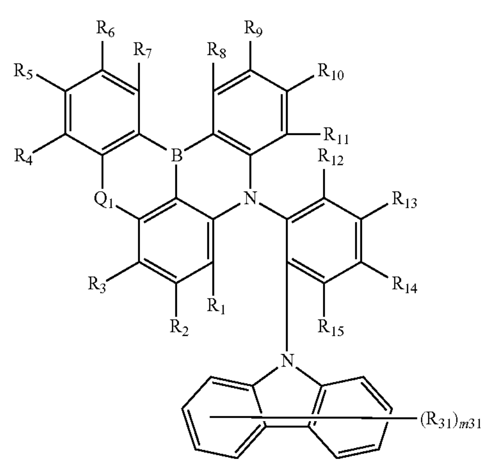

-continued

[Formula 1-A2]

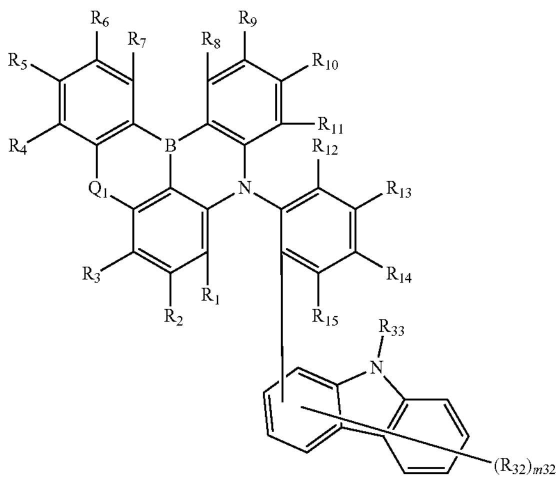

[Formula 1-A3]

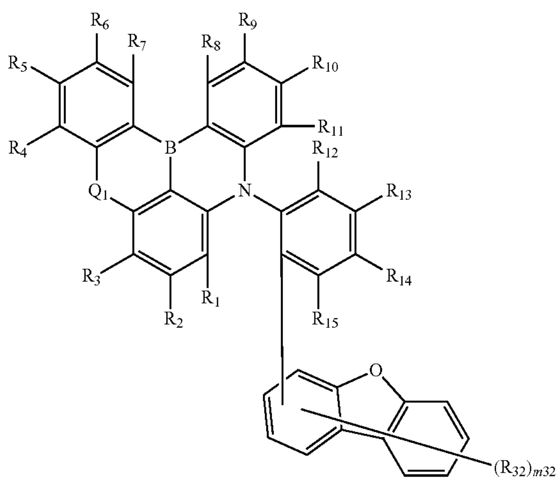

[Formula 1-A4]

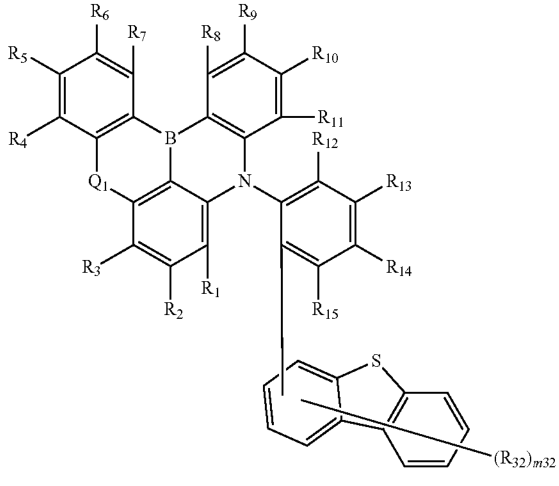

Formula 1-A1 represents a case where the carbon atom of a phenyl group including $R_{12}$ to $R_{15}$ and the nitrogen atom of a carbazole group are connected. Formula 1-A2 represents a case where the carbon atom of a phenyl group including $R_{12}$ to $R_{15}$ and the carbon atom of a carbazole group are connected.

In Formula 1-A1, m31 may be an integer from 1 to 8. If m31 is an integer of 2 or more, multiple $R_{31}$ groups may be the same or different.

In Formula 1-A2 to Formula 1-A4, m32 may be an integer from 1 to 7. If m32 is an integer of 2 or more, multiple $R_{32}$ groups may be the same or different.

In Formula 1-A1 to Formula 1-A4, $R_{31}$ to $R_{33}$ may each independently be a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, or a substituted or unsubstituted aryl group of 6 to 20 ring-forming carbon atoms. The substituted or unsubstituted alkyl group of 1 to 20 carbon atoms may be a linear chain or a branched chain. In Formula 1-A1 to Formula 1-A4, the same definition for $Q_1$ and $R_1$ to $R_{15}$ in reference to Formula 1 may be applied.

In an embodiment, $R_{32}$ may be a hydrogen atom, a deuterium atom, a substituted or unsubstituted alkyl group of 1 to 10 carbon atoms, a substituted or unsubstituted phenyl group, an unsubstituted naphthyl group, an unsubstituted phenanthryl group, or an unsubstituted anthracenyl group. $R_{32}$ may be a methyl group, a t-butyl group, or a substituted phenyl group. However, these are only illustrations, and an embodiment is not limited thereto.

According to an embodiment, Formula 1 may be represented by Formula 1-B1 or Formula 1-B2 below. Formula 1-B1 and Formula 1-B2 each represent a case where Formula 2 is combined with adjacent groups to each other among $R_1$ to $R_{16}$ of Formula 1. Formula 1-B1 represents a case where the boron atom and $Q_2$ of Formula 2 are respectively bonded to $R_9$ and $R_{10}$. Formula 1-B2 represents a case where the boron atom and $Q_2$ of Formula 2 are respectively bonded to $R_6$ and $R_5$.

[Formula 1-B1]

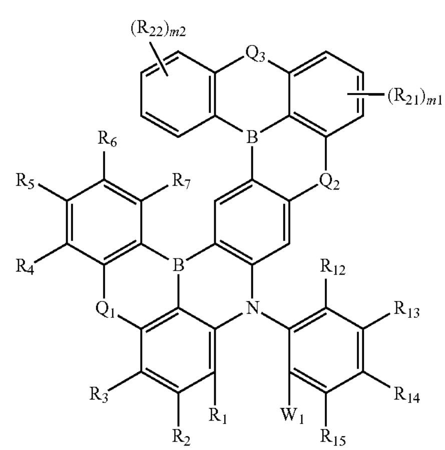

-continued

[Formula 1-B2]

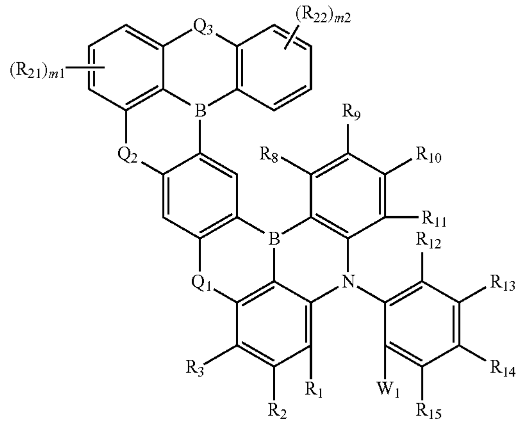

In Formula 1-B1 and Formula 1-B2, the same definition for $Q_1$, $R_1$ to $R_{15}$, and $W_1$ in reference to Formula 1 may be applied, and the same definition for $Q_2$, $Q_3$, m1, m2, $R_{21}$, and $R_{22}$ in reference to Formula 2 may be applied. In Formula 1-B1 and Formula 1-B2, at least one of $Q_1$ to $Q_3$ may be O or S. For example, any one of $Q_1$ to $Q_3$ may be an oxygen atom. For another example, any one of $Q_1$ to $Q_3$ may be a sulfur atom. In Formula 1-B1 and Formula 1-B2, $R_{21}$ and $R_2$ may be the same. For example, $R_{21}$ and $R_2$ may each be diphenylamine groups, and each of two phenyl groups may be substituted or unsubstituted. However, these are only illustrations, and an embodiment is not limited thereto.

Formula 1-B1 may be represented by any one of Formula 1-B1-1 to Formula 1-B1-4 below. Formula 1-B1-1 and Formula 1-B1-2 each represent a case where $W_1$ in Formula 1-B1 is a substituted or unsubstituted carbazole group. Formula 1-B1-3 represents a case where $W_1$ in Formula 1-B1 is a substituted or unsubstituted dibenzofuran group. Formula 1-B1-4 represents a case where $W_1$ in Formula 1-B1 is a substituted or unsubstituted dibenzothiophene group.

[Formula 1-B1-1]

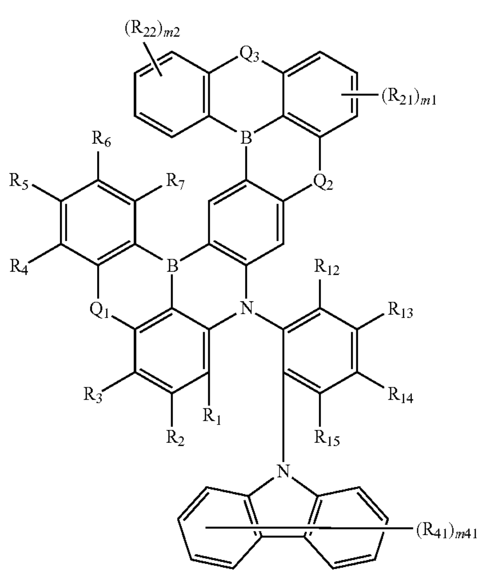

-continued

[Formula 1-B1-2]

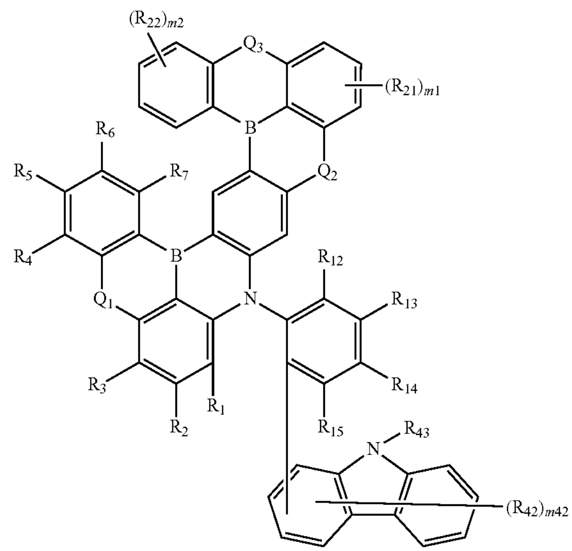

[Formula 1-B1-3]

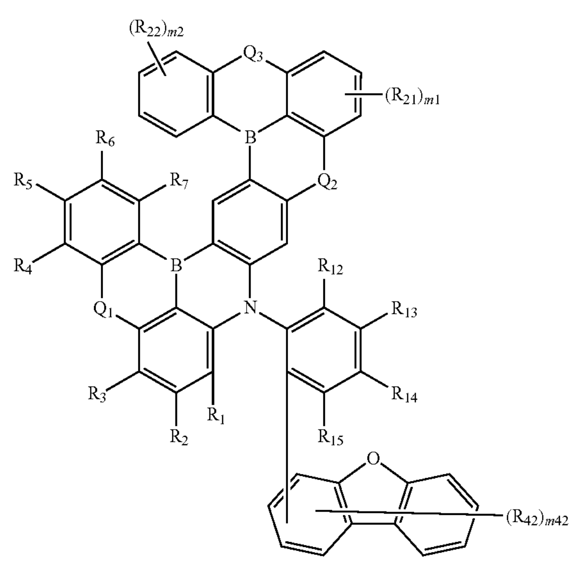

-continued

[Formula 1-B1-4]

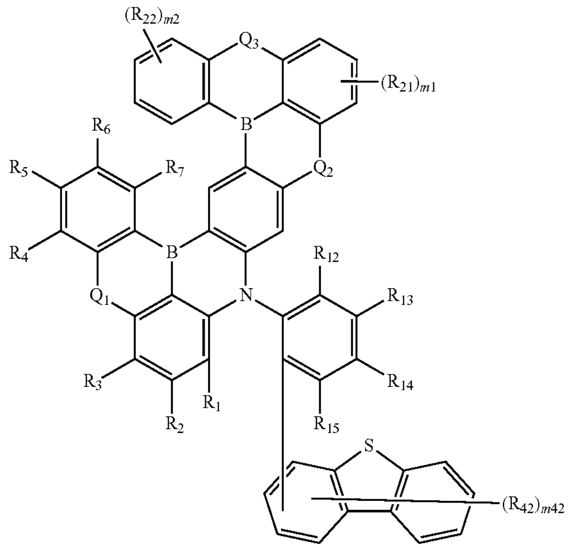

In Formula 1-B1-1, m41 may be an integer from 1 to 8. If m41 is an integer of 2 or more, multiple Rai groups may be the same or different. In Formula 1-B1-2 to Formula 1-B1-4, m42 may be an integer from 1 to 7. If m42 is an integer of 2 or more, multiple $R_{42}$ groups may be the same or different. In Formula 1-B1-2, $W_1$ may be represented by any one of $W_{1-21}$ to $W_{1-24}$ below. In Formula 1-B1-3, $W_1$ may be represented by any one of $W_{1-31}$ to $W_{1-34}$ below. In Formula 1-B1-4, $W_1$ may be represented by any one of $W_{1-41}$ to $W_{1-44}$ below.

$W_{1-21}$

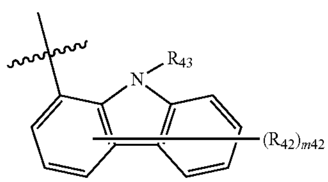

$W_{1-22}$

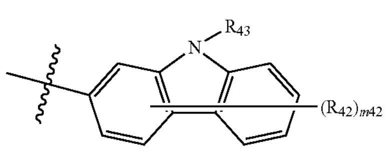

$W_{1-23}$

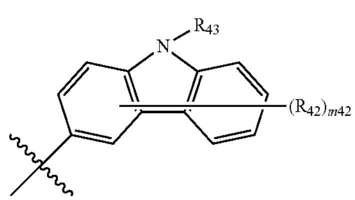

-continued $W_{1-24}$

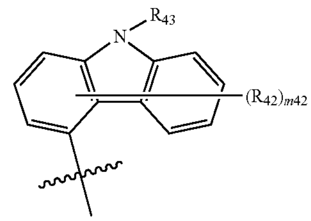

$W_{1-31}$

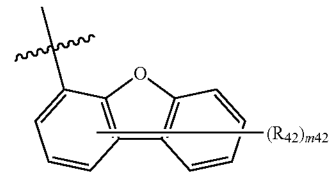

$W_{1-32}$

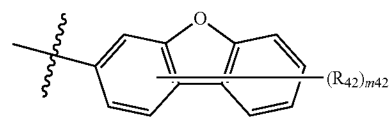

$W_{1-33}$

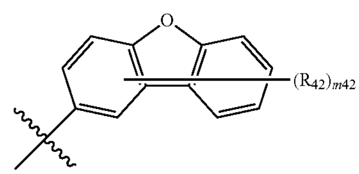

$W_{1-34}$

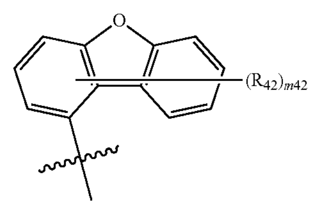

$W_{1-41}$

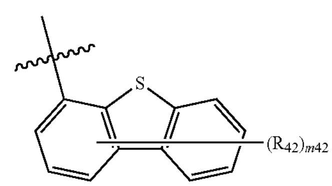

$W_{1-42}$

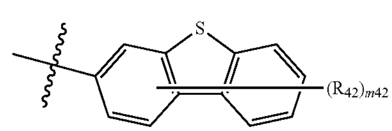

$W_{1-43}$

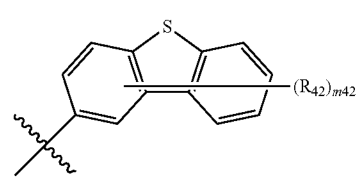

-continued $W_{1-44}$

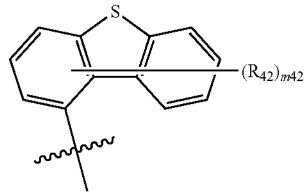

In Formula 1-B1-1 to Formula 1-B1-4, the same definition for $Q_1$, $R_1$ to $R_7$, and $R_{12}$ to $R_{15}$, in reference to Formula 1 may be applied, and the same definition for $Q_2$, $Q_3$, m1, m2, $R_{21}$, and $R_{22}$ in reference to Formula 2 may be applied. In Formula 1-B1-1 to Formula 1-B1-4, $R_{41}$ to $R_{43}$ may each independently be a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, or a substituted or unsubstituted aryl group of 6 to 20 ring-forming carbon atoms. For example, $R_{43}$ may be an unsubstituted phenyl group, or a phenyl group substituted with a deuterium atom.

According to an embodiment, Formula 1-B2 may be represented by any one of Formula 1-B2-1 to Formula 1-B2-4 below. Formula 1-B2-1 and Formula 1-B2-2 each represent a case where $W_1$ in Formula 1-B2 is a substituted or unsubstituted carbazole group. Formula 1-B2-3 represents a case where $W_1$ in Formula 1-B2 is a substituted or unsubstituted dibenzofuran group. Formula 1-B2-4 represents a case where $W_1$ in Formula 1-B2 is a substituted or unsubstituted dibenzothiophene group.

[Formula 1-B2-1]

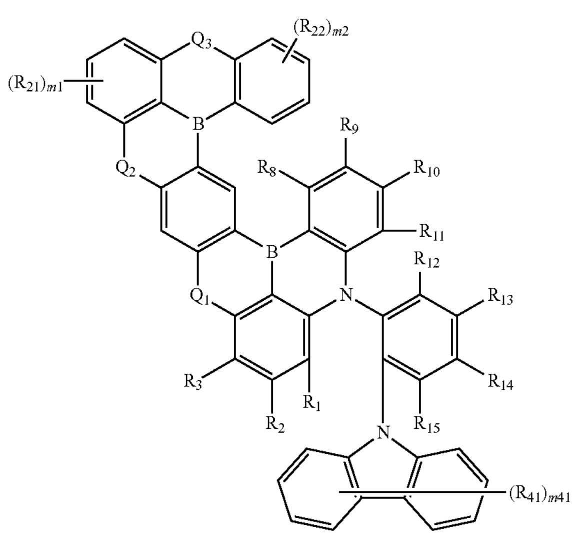

-continued

[Formula 1-B2-2]

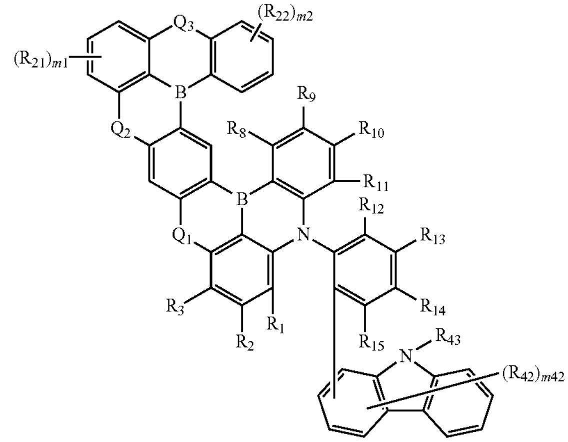

[Formula 1-B2-3]

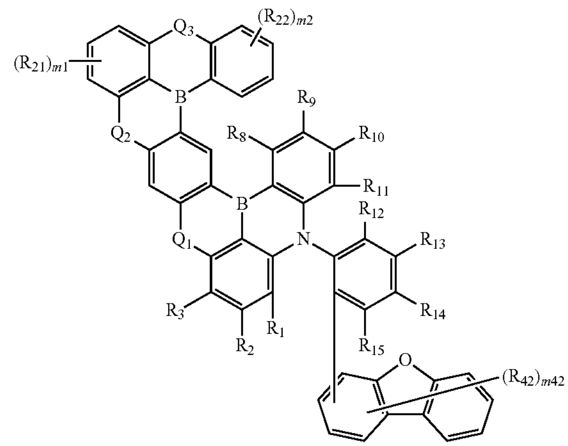

[Formula 1-B2-4]

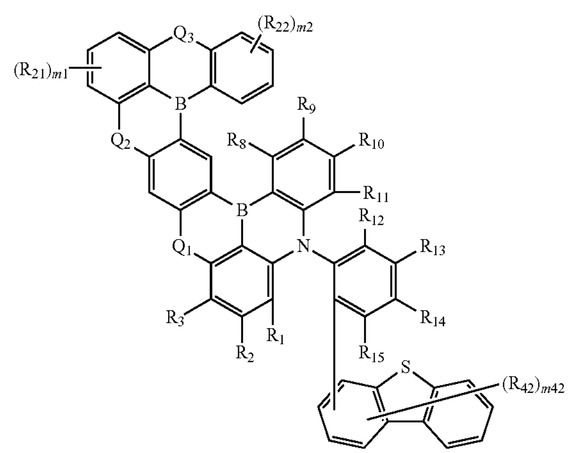

In Formula 1-B2-1, m41 may be an integer from 1 to 8. If m41 is an integer of 2 or more, multiple $R_{41}$ groups may be the same or different. In Formula 1-B2-2 to Formula 1-B2-4, m42 may be an integer from 1 to 7. If m42 is an integer of 2 or more, multiple $R_{42}$ groups may be the same or different.

In Formula 1-B2-1 to Formula 1-B2-4, the same definition for $Q_1$, $R_1$ to $R_3$, and $R_8$ to $R_{15}$ in reference to Formula 1 may be applied, and the same definition for $Q_2$, $Q_3$, m1, m2, $R_{21}$, and Rn in reference to Formula 2 may be applied.

In Formula 1-B2-1 to Formula 1-B2-4, $R_{41}$ to $R_{43}$ may each independently be a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, a substituted or unsubstituted aryl group of 6 to 20 ring-forming carbon atoms.

In an embodiment, Formula 1 may be represented by any one of Formula 1-C1 to Formula 1-C3 below. Formula 1-C1 represents a case where $Q_1$ is $NR_{16}$. Formula 1-C2 represents a case where $Q_1$ is O. Formula 1-C3 represents a case where $Q_1$ is S.

[Formula 1-C1]

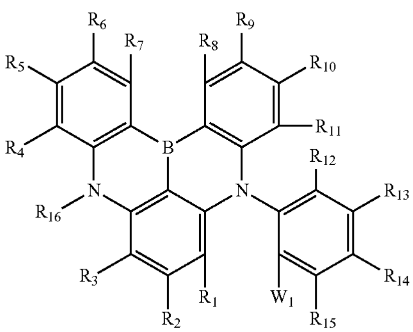

[Formula 1-C2]

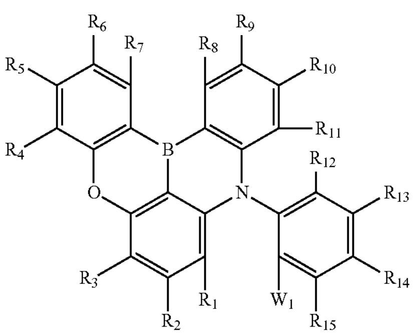

-continued

[Formula 1-C3]

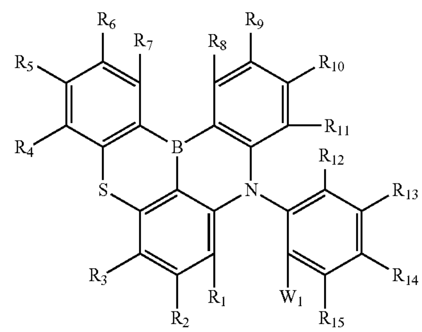

In Formula 1-C1 to Formula 1-C3, the same definition for $W_1$ and $R_1$ to $R_{16}$ in reference to Formula 1 may be applied. In Formula 1-C1, $R_{16}$ may be a substituted or unsubstituted phenyl group. The substituted phenyl group may be substituted with a fluorine atom, a t-butyl group, a phenyl group, a carbazole group or a dibenzofuran group.

The polycyclic compound of an embodiment may include a fused ring structure of five or nine rings including at least one nitrogen atom and at least one boron atom. To the at least one nitrogen atom, a phenyl group substituted with a heteroaryl group of three rings may be combined. The heteroaryl group of three rings may be positioned at an ortho position with respect to the nitrogen atom. The heteroaryl group of three rings may include a nitrogen atom, an oxygen atom, or a sulfur atom. The heteroaryl group of three rings may be a substituted or unsubstituted carbazole group, a substituted or unsubstituted dibenzofuran group, or a substituted or unsubstituted dibenzothiophene group. The heteroaryl group of three rings may sterically protect the fused ring structure of five or nine rings. Accordingly, a light emitting device including the polycyclic compound of an embodiment may show improved device life and excellent emission efficiency.

The polycyclic compound of an embodiment may be any compound represented in Compound Group 1 below. The light emitting device ED of an embodiment may include at least one polycyclic compound among the polycyclic compounds represented in Compound Group 1 in an emission layer EML.

[Compound Group 1]

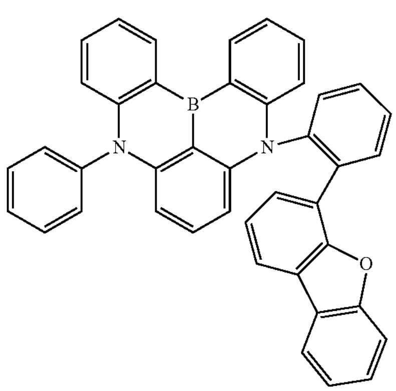

1

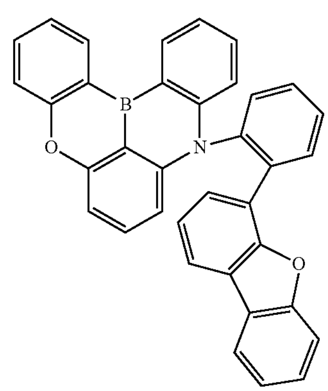

2

-continued
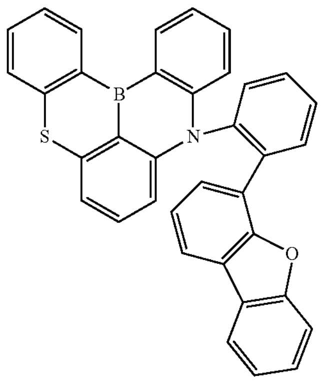
3
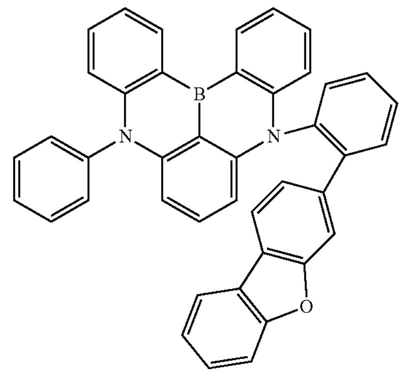
4
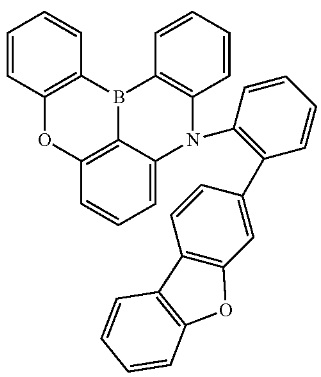
5
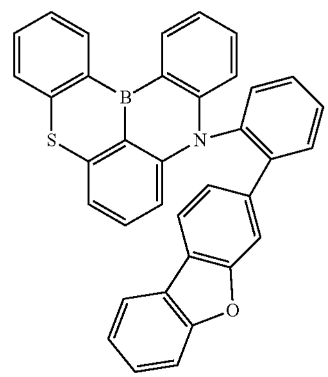
6
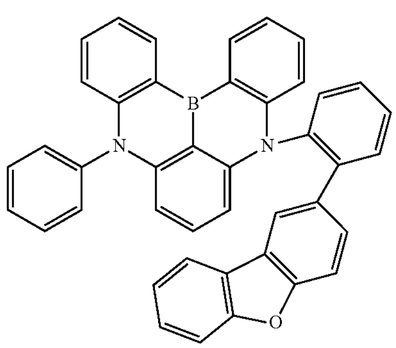
7
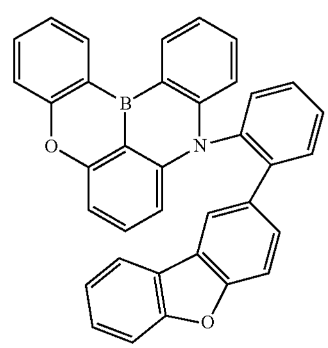
8
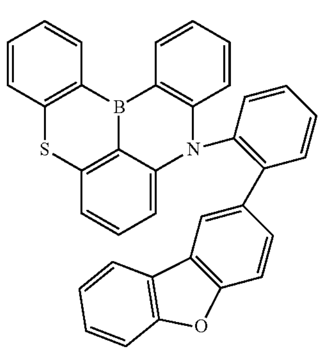
9
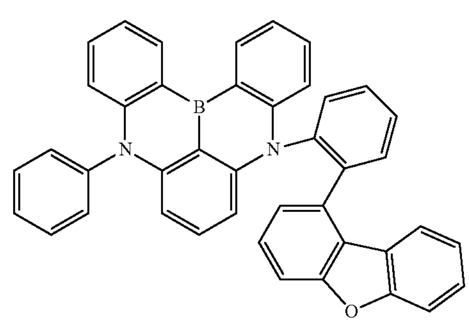
10

-continued
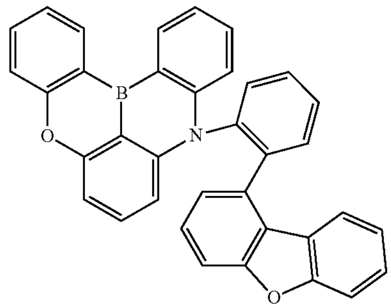
11
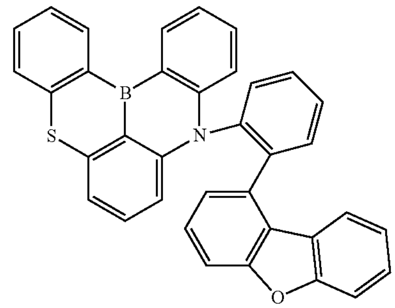
12
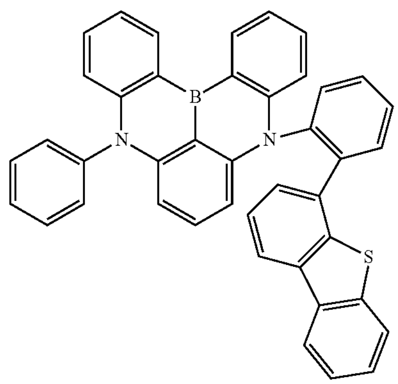
13
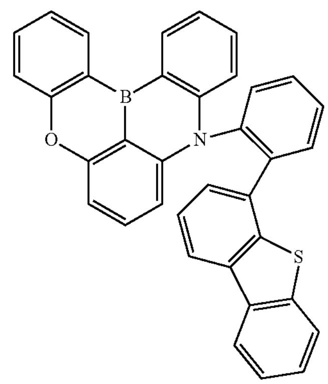
14
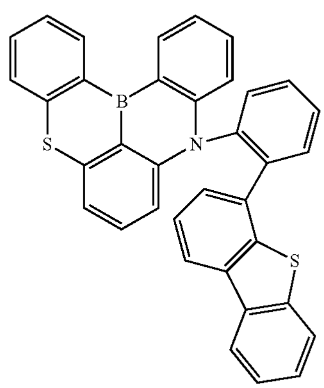
15
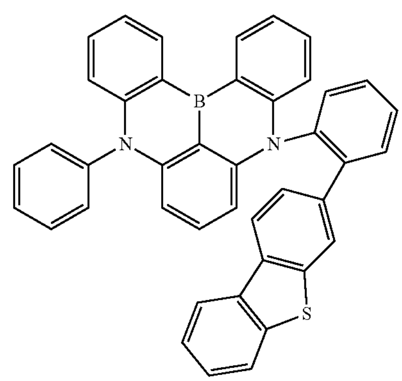
16
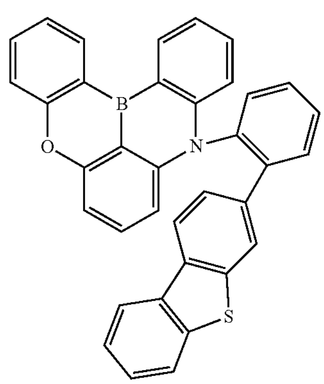
17
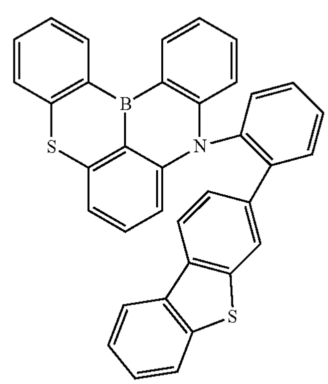
18

-continued
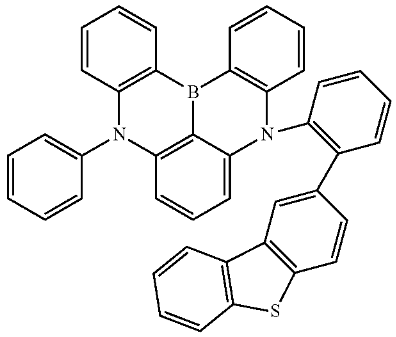
19
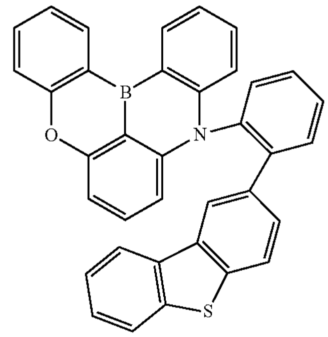
20
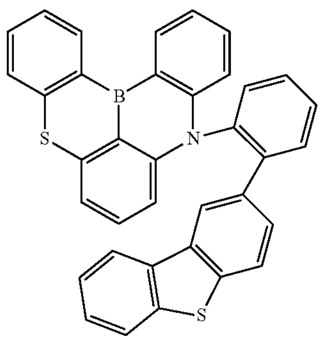
21
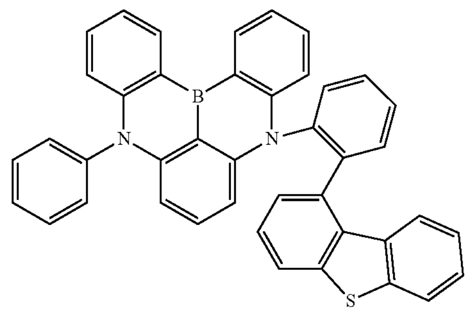
22
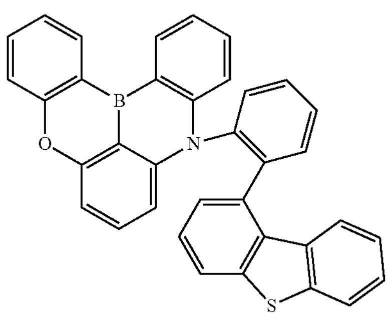
23
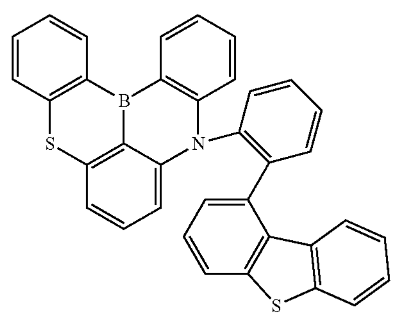
24
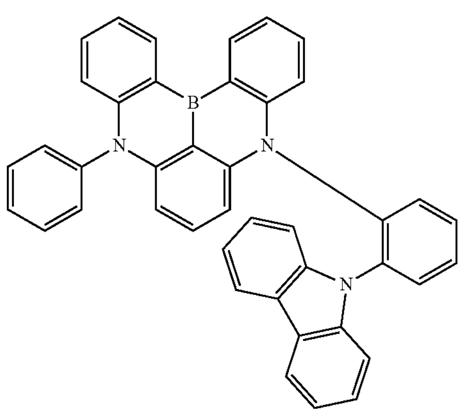
25
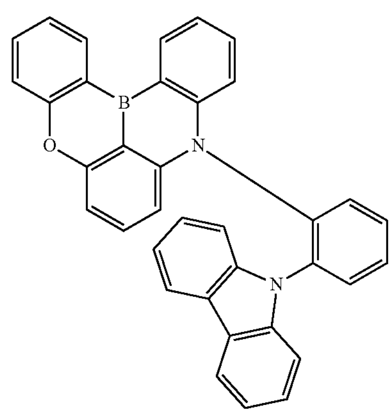
26

-continued
27
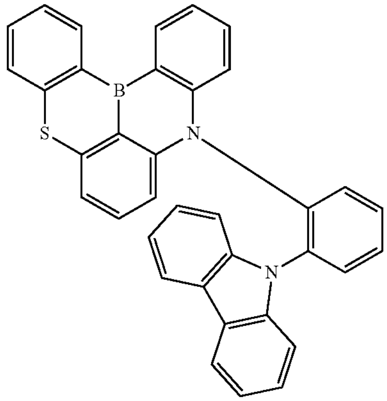
28
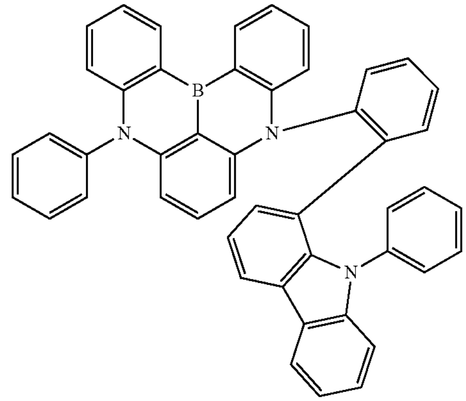
29
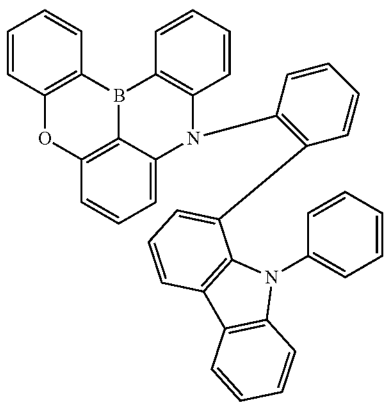
30
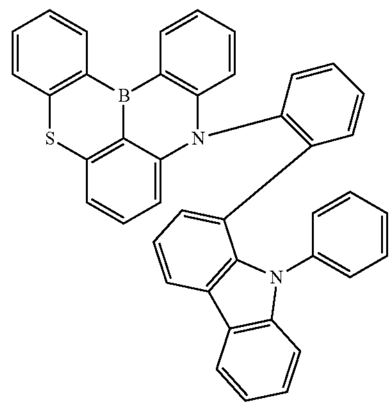
31
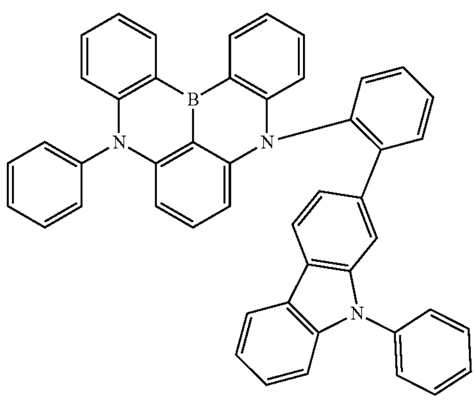
32
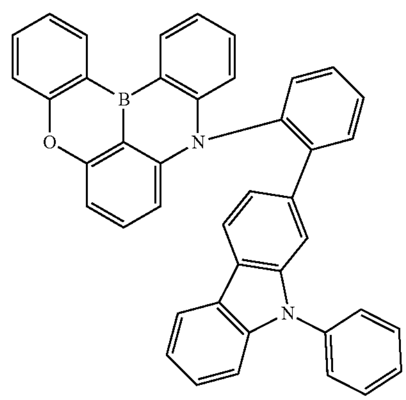
33
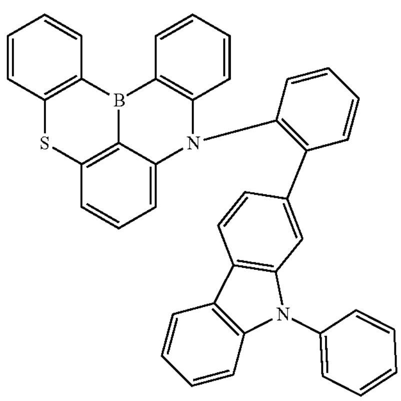
34
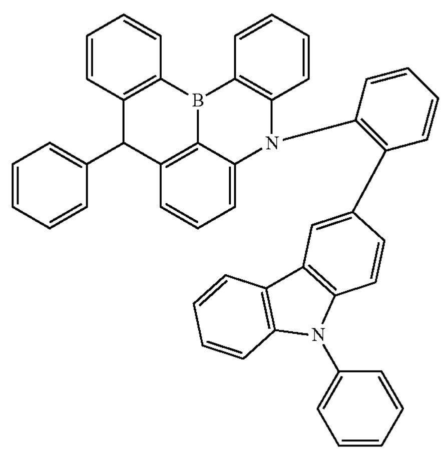

-continued
35
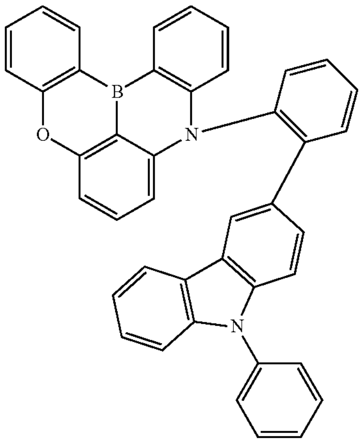
36
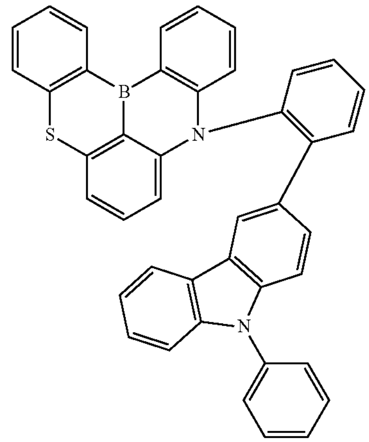
37
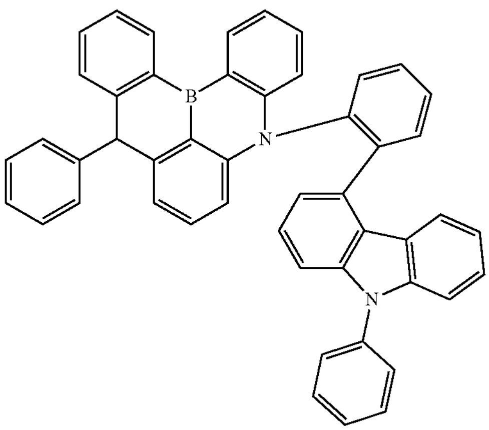
38
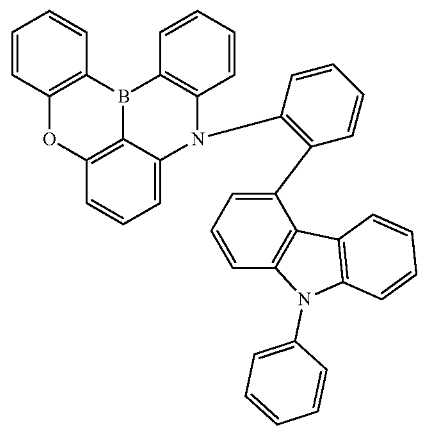
39
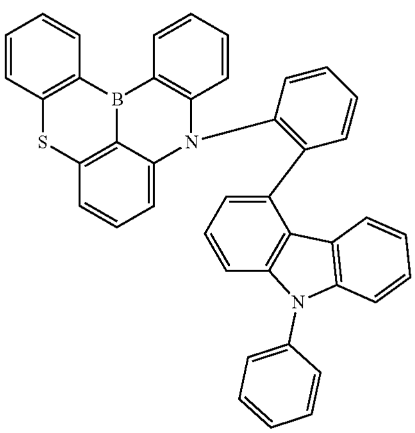
40
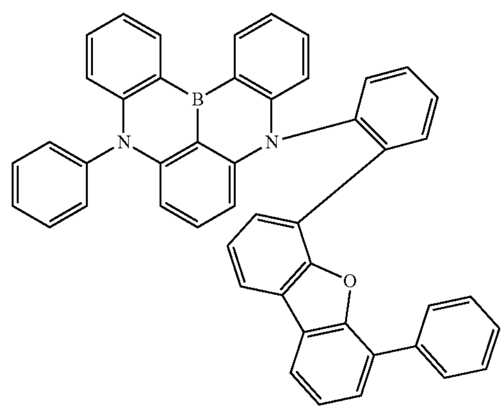

-continued
41
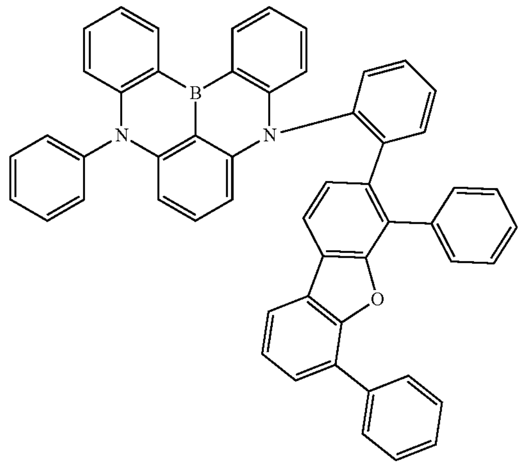
42
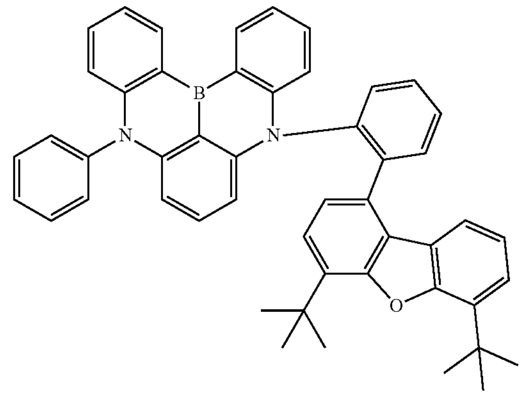
43
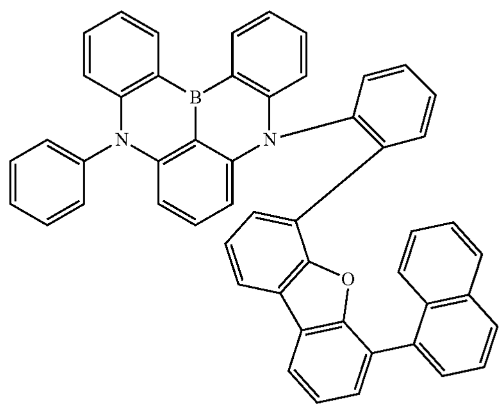
44
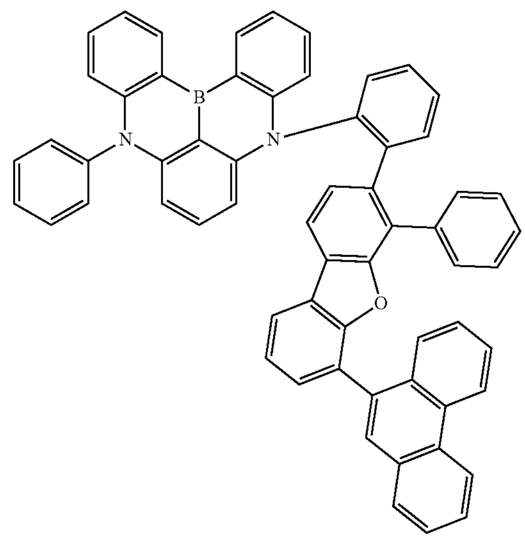
45
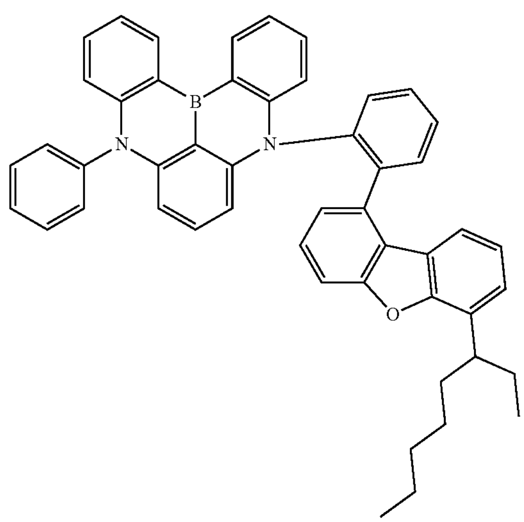
46
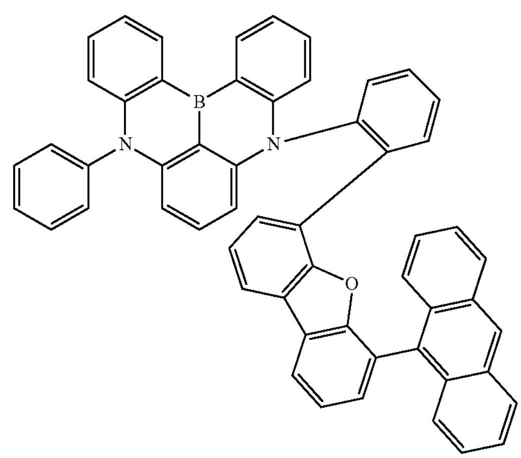

-continued
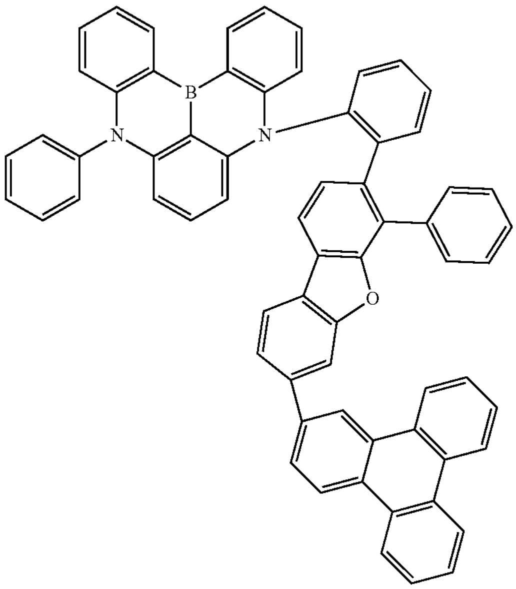
47
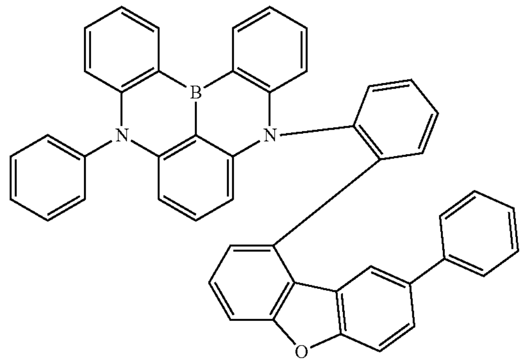
48
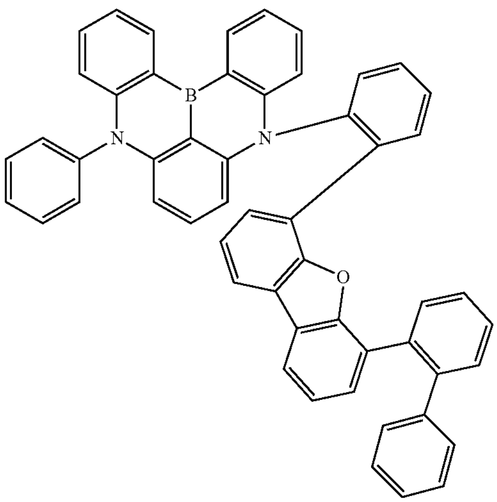
49
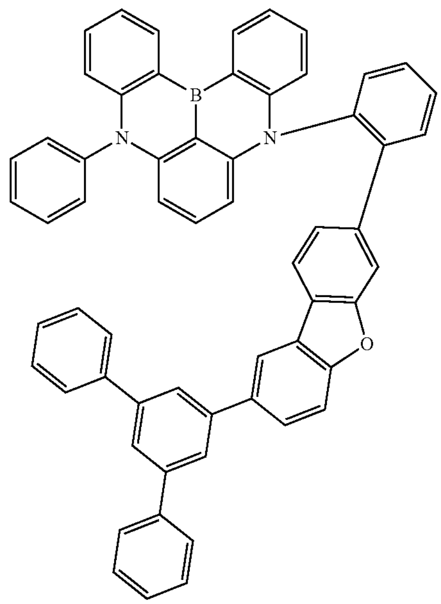
50
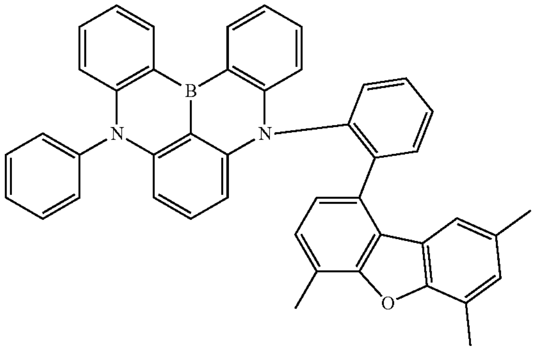
51
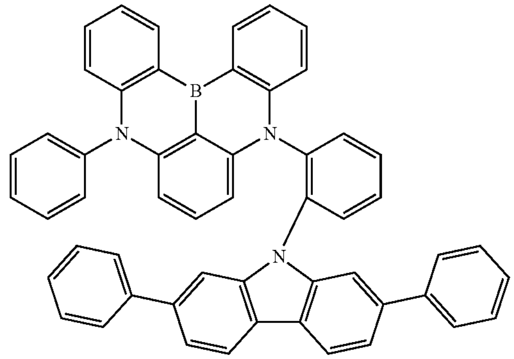
52

-continued
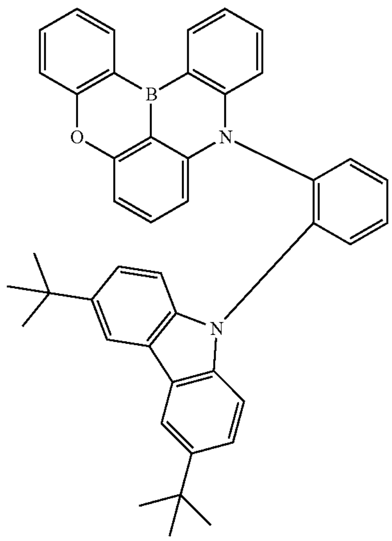
53
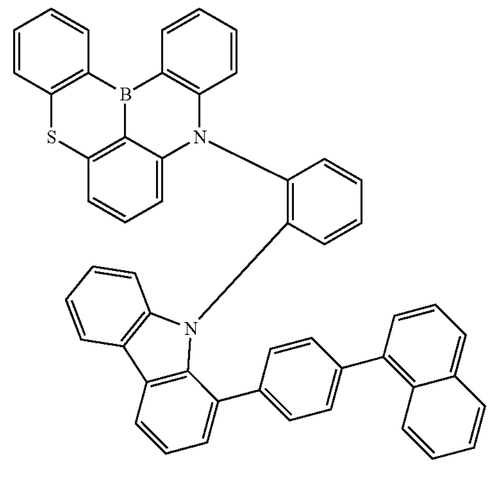
54
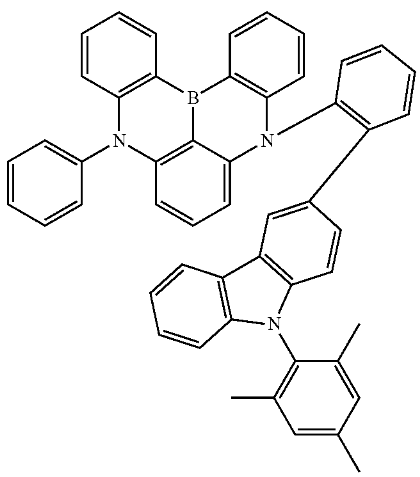
55
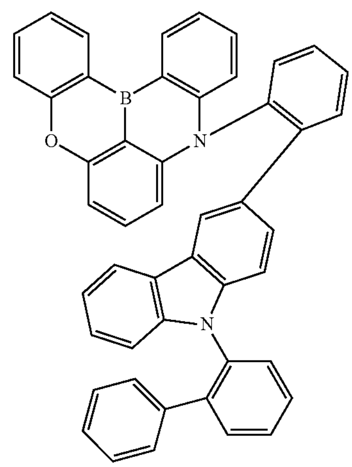
56
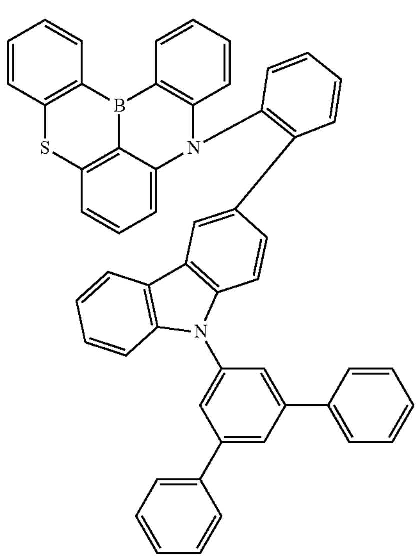
57
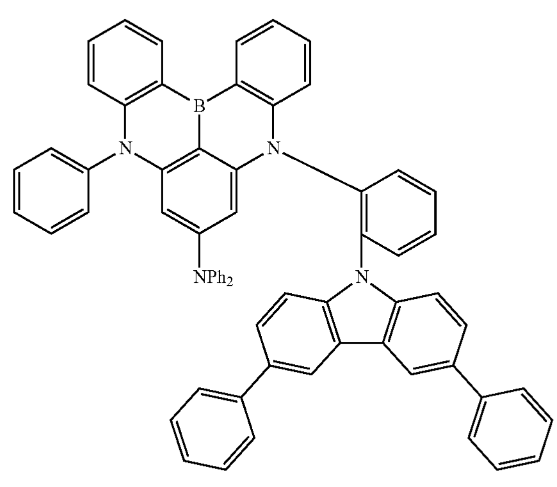
58

-continued
59
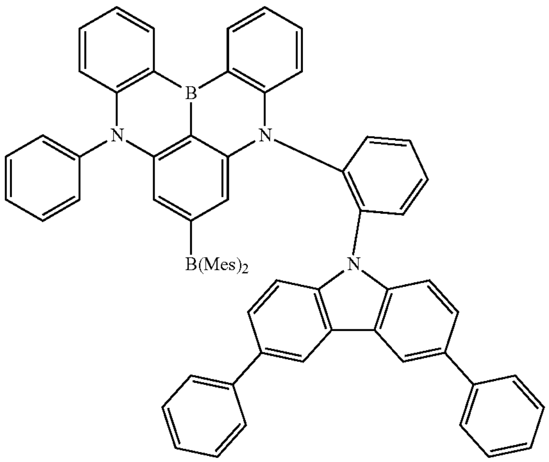
60
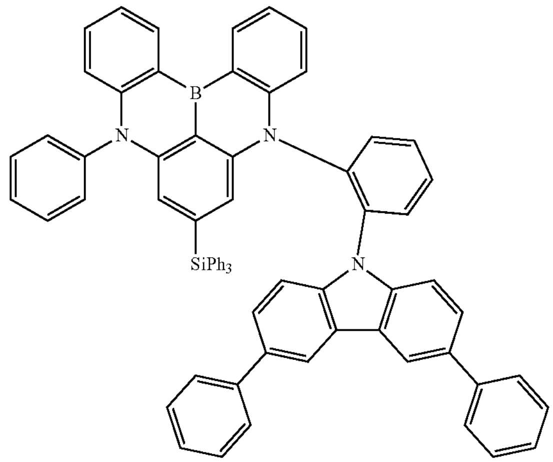
61
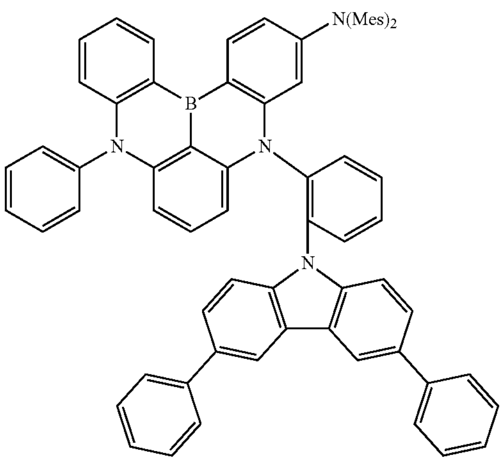
62
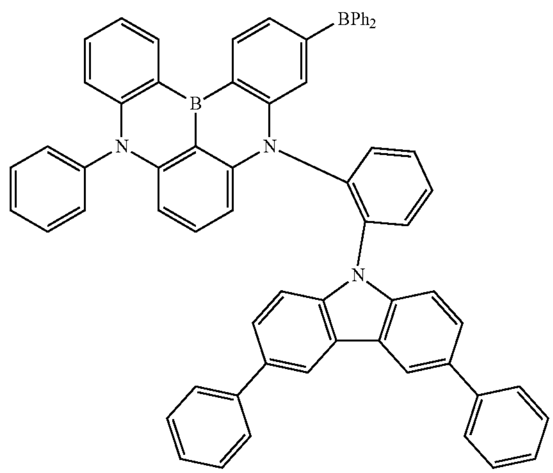
63
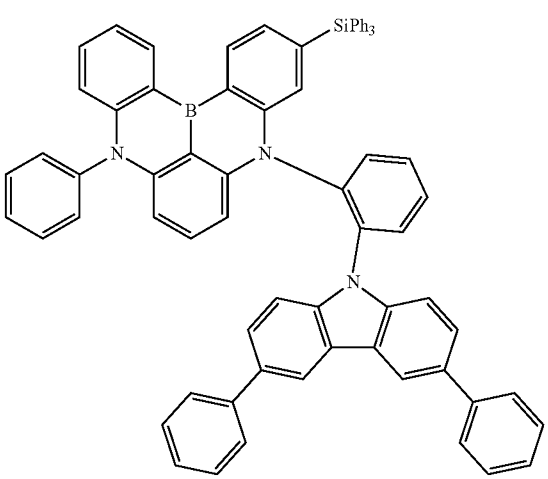
64
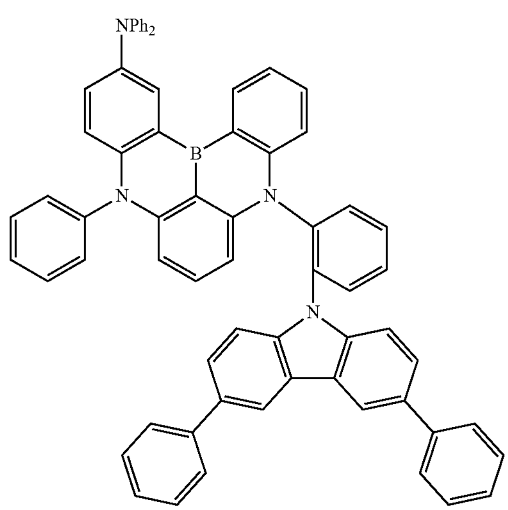

-continued
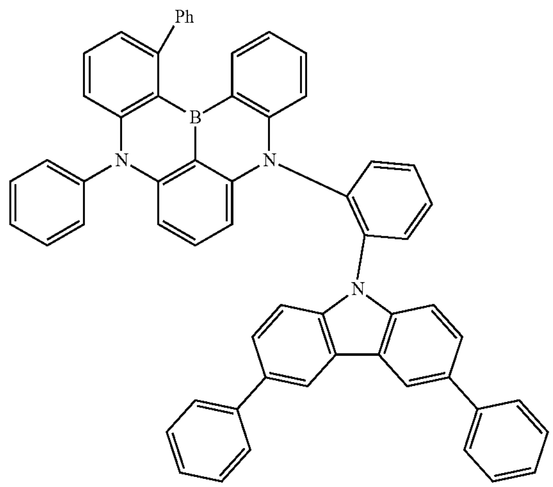
65
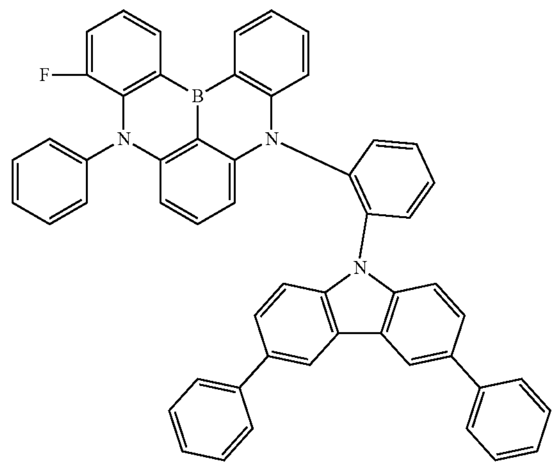
66
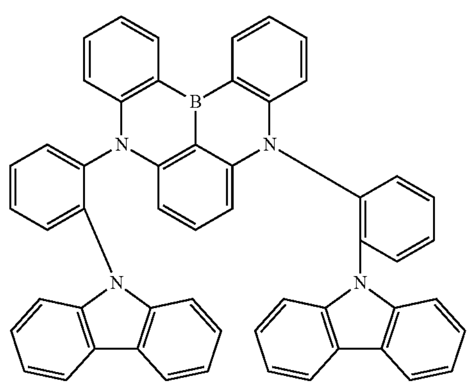
67
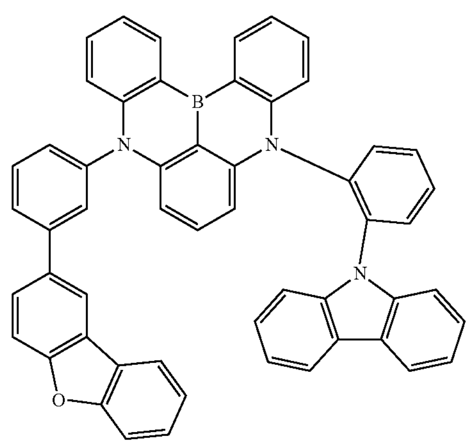
68
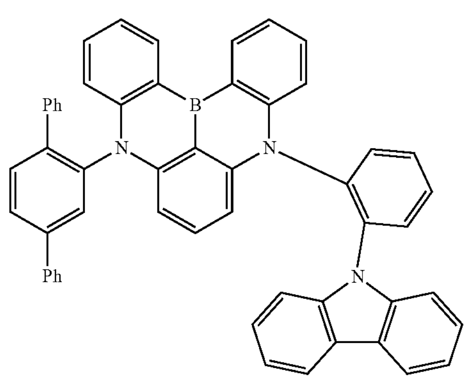
69
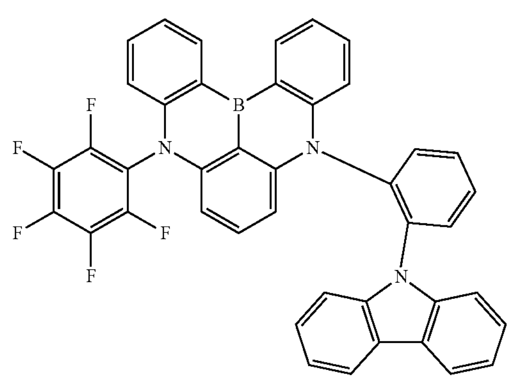
70

-continued
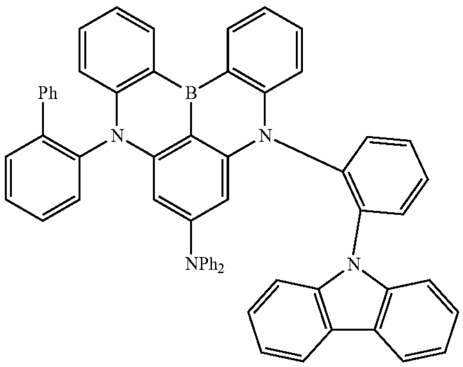
71
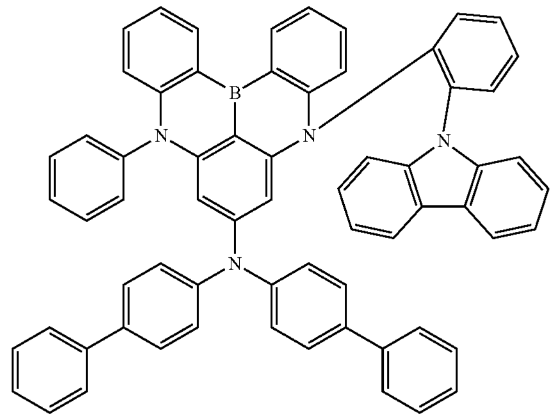
72
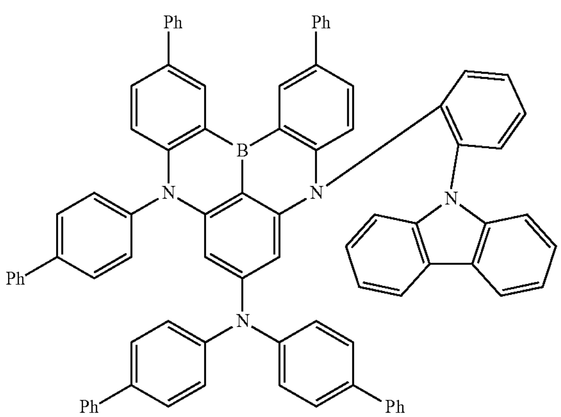
73
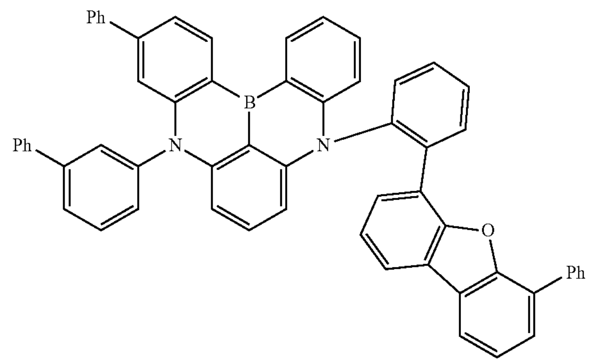
74
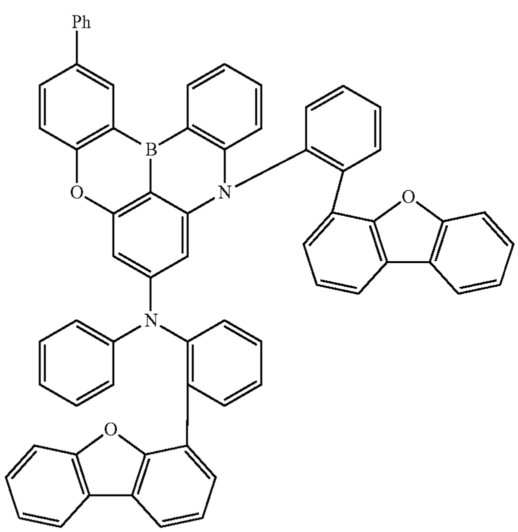
75
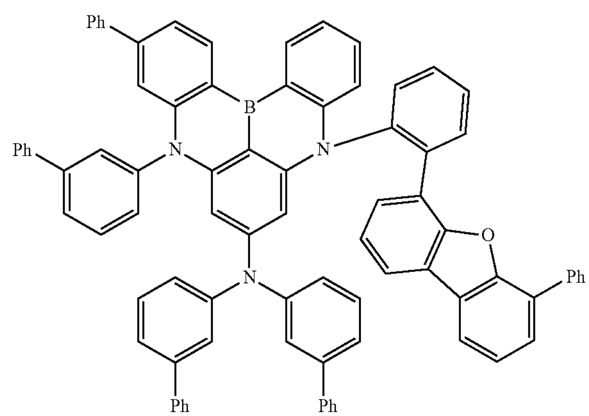
76

-continued
77
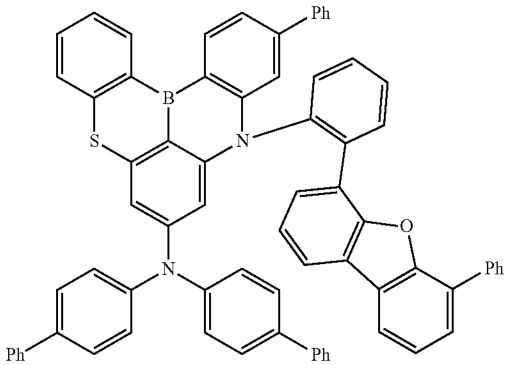
78
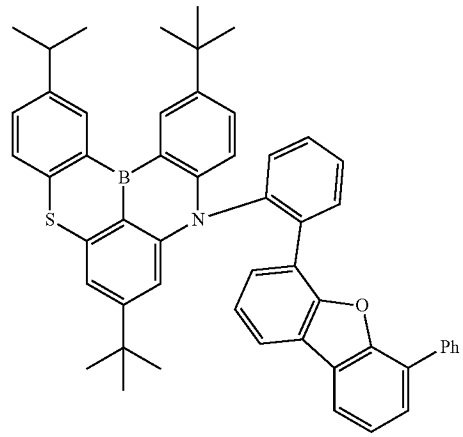
79
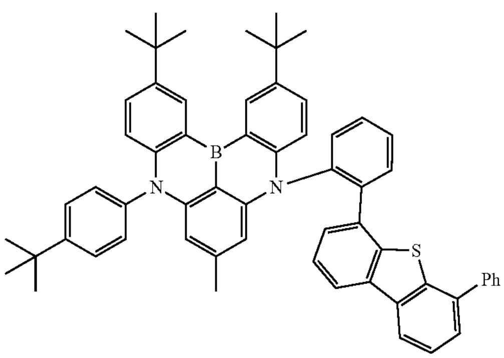
80
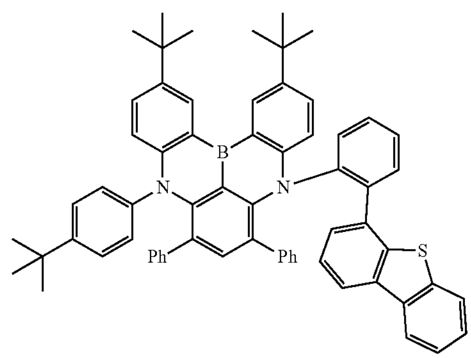
81
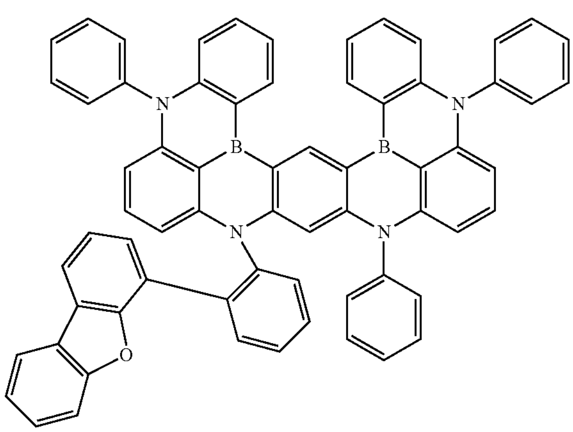
82
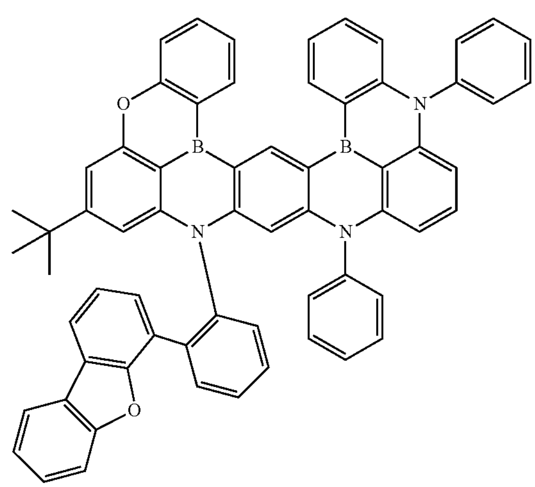

-continued
83
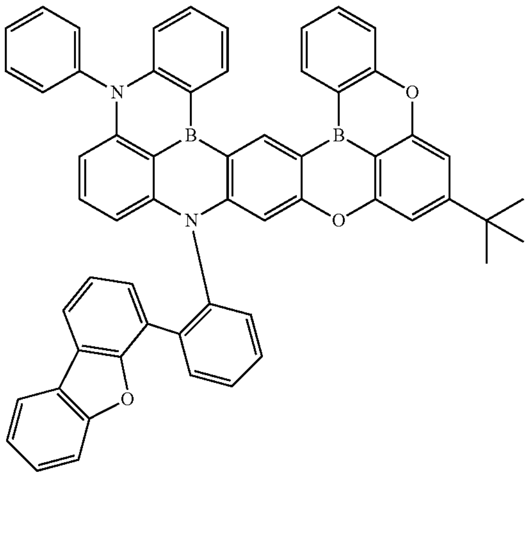
84
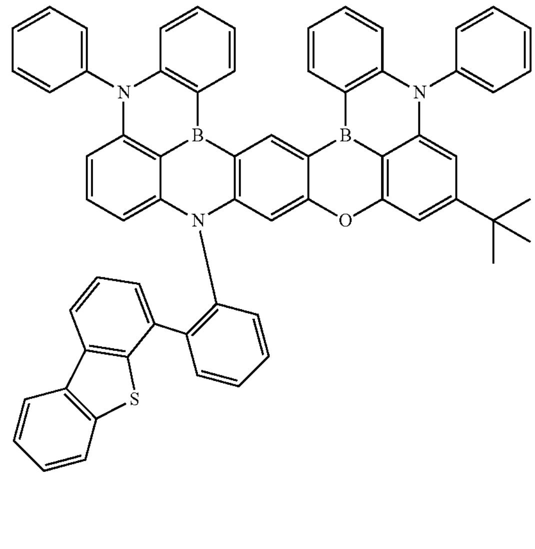
85
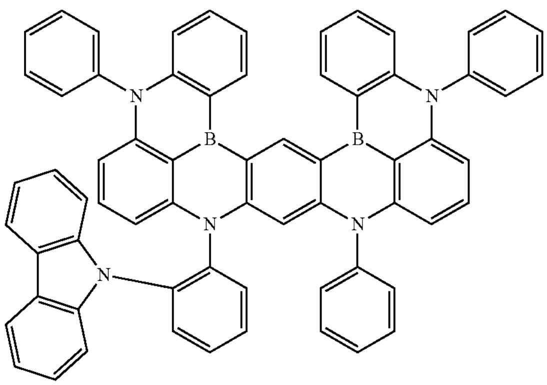
86
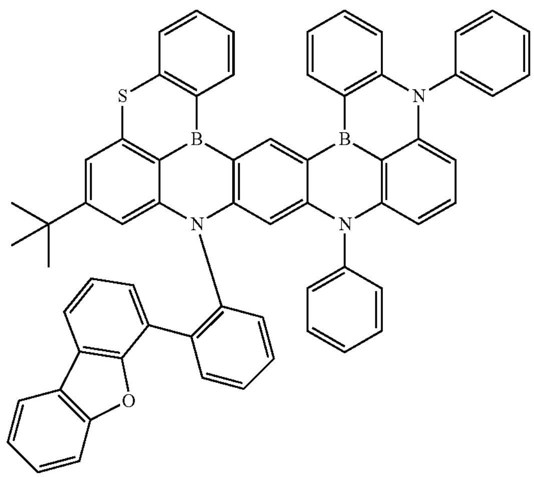
87
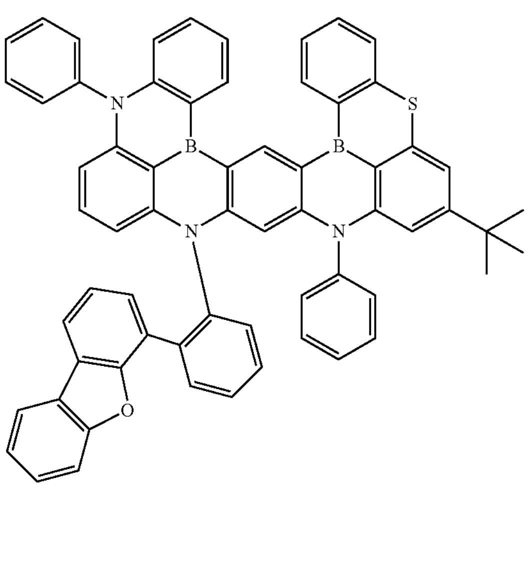
88
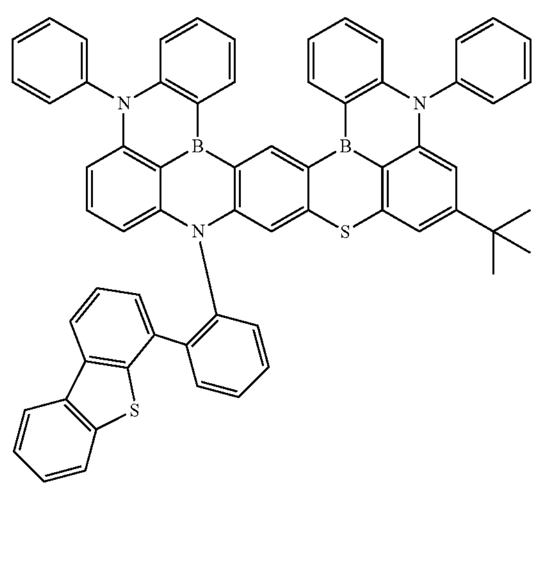

-continued
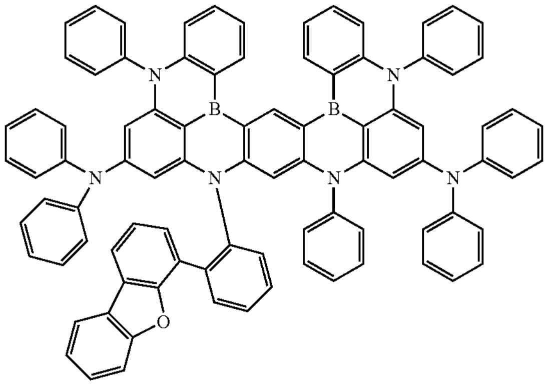
89
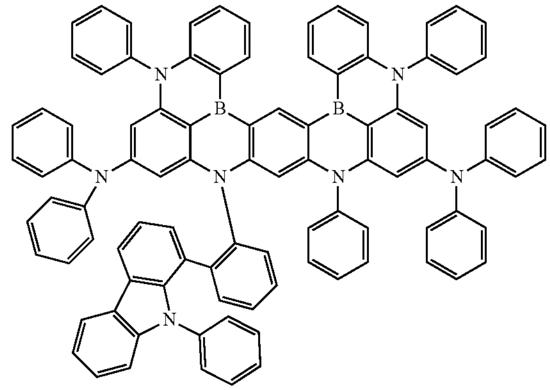
90
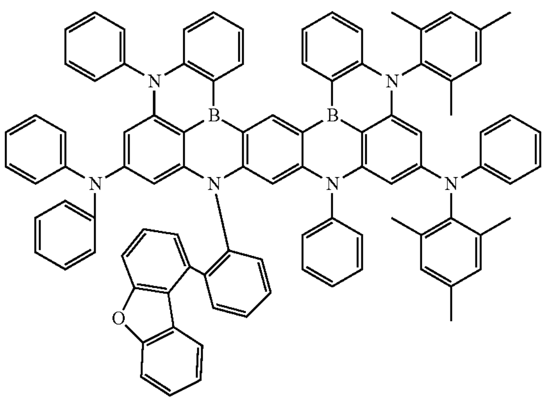
91
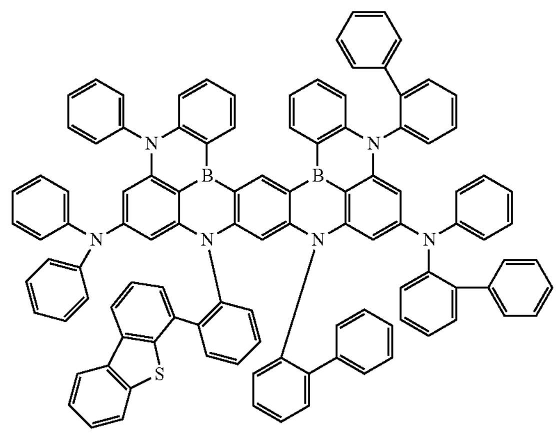
92
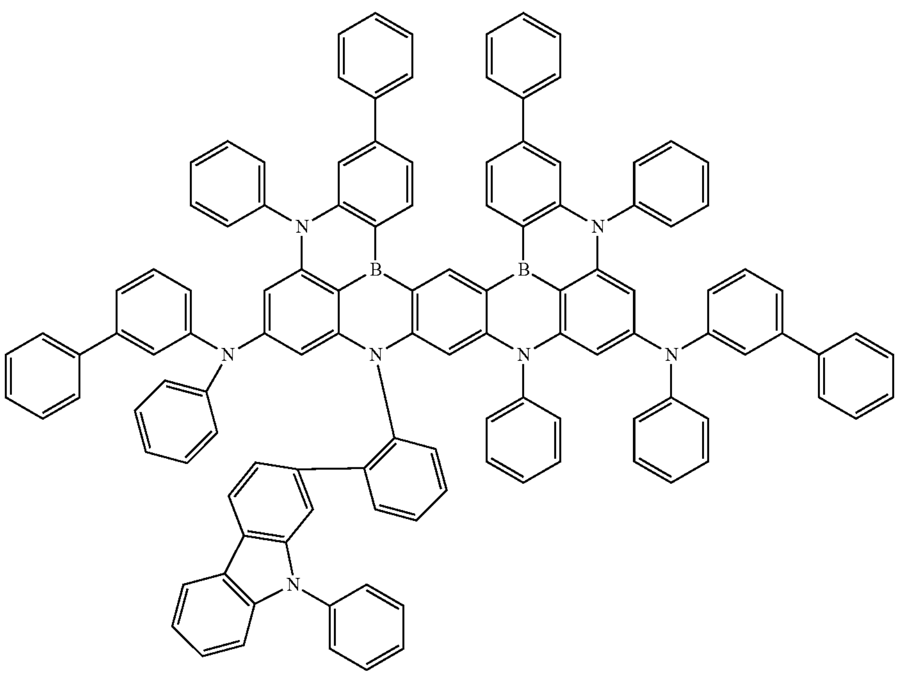
93

-continued
94
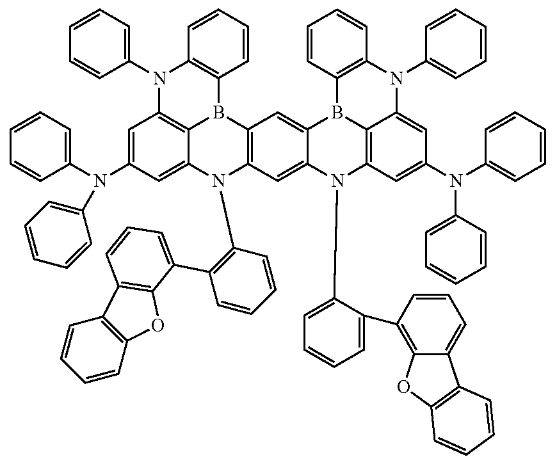
95
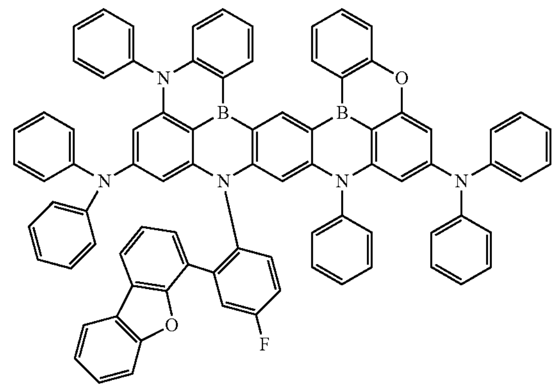
96
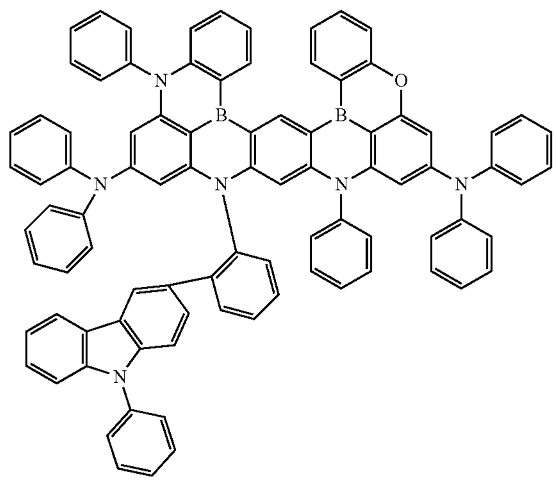
97
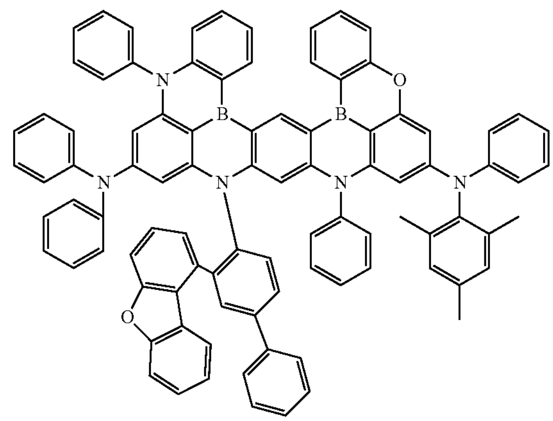
98
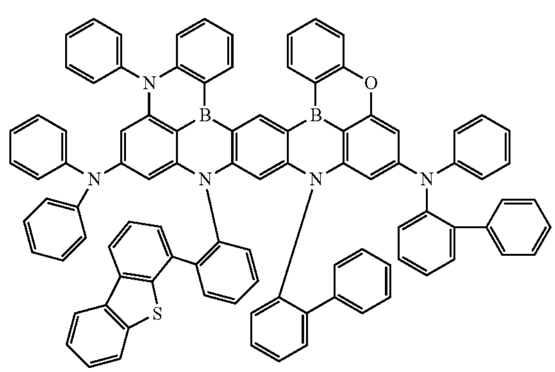
99
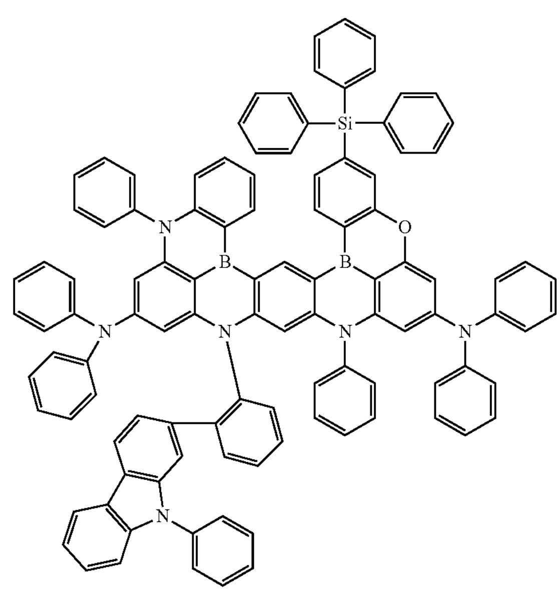

-continued
100
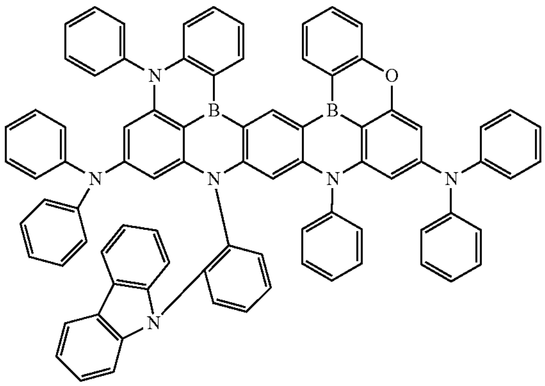
101
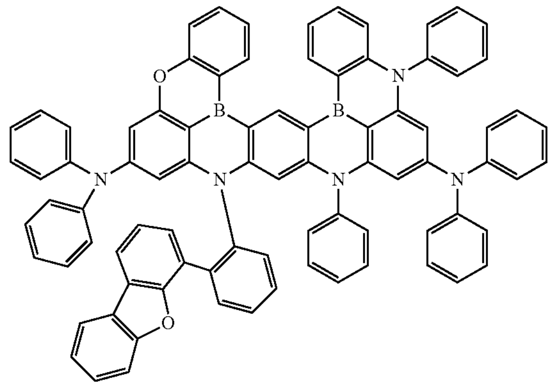
102
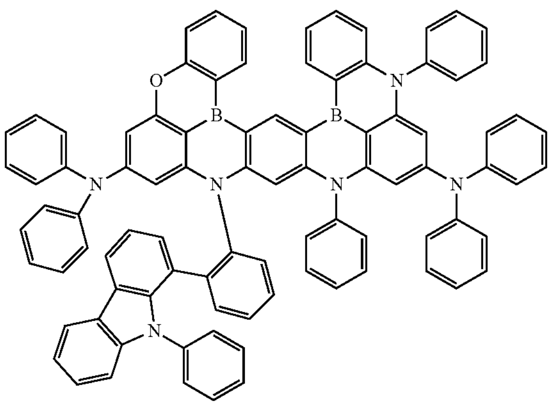
103
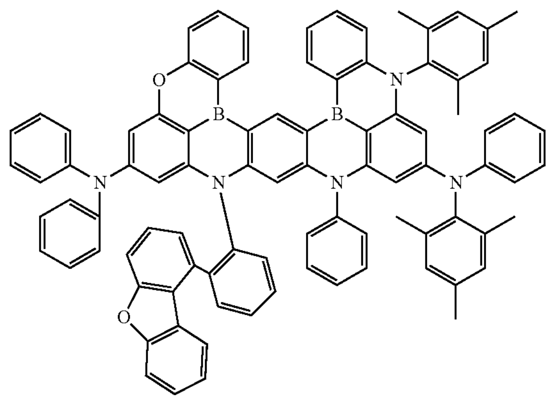
104
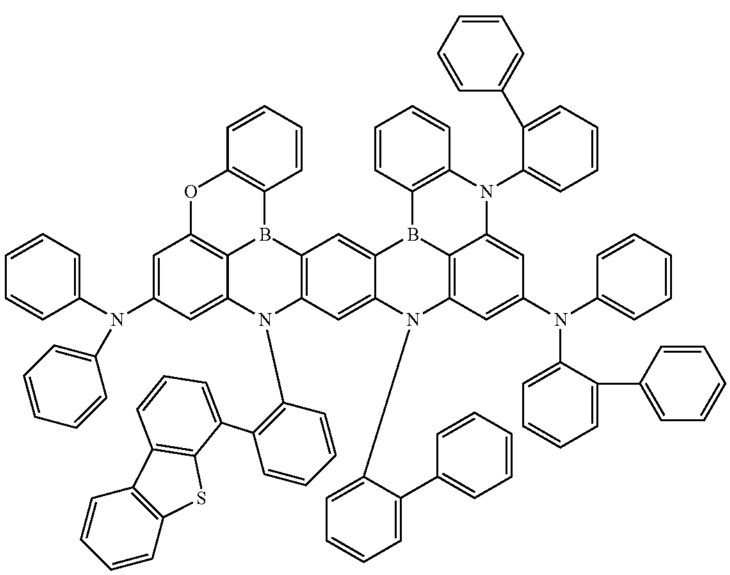

-continued
105
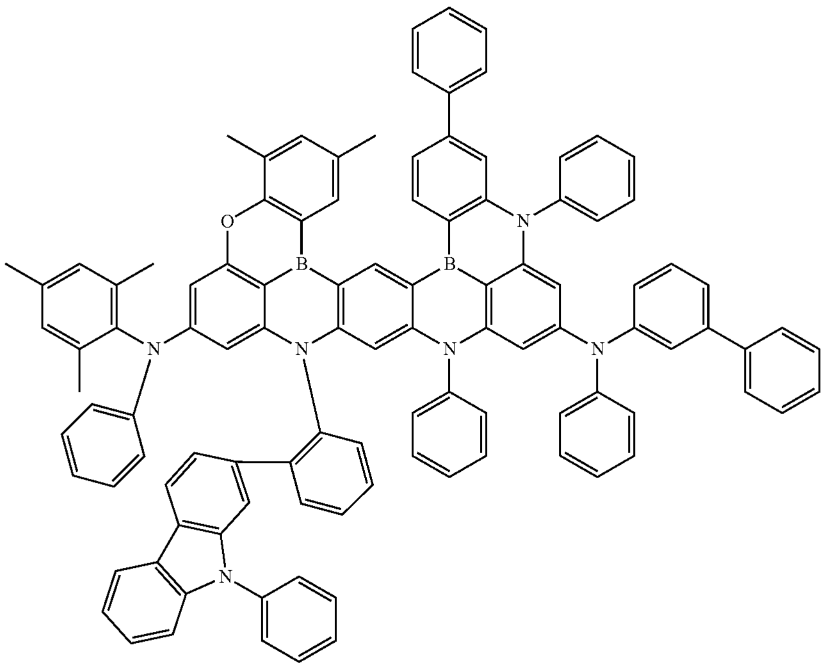
106
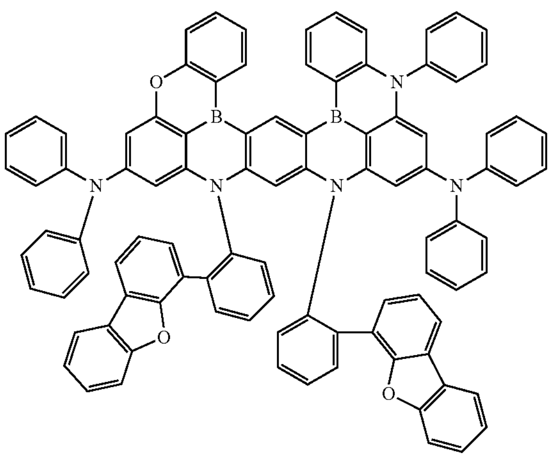
107
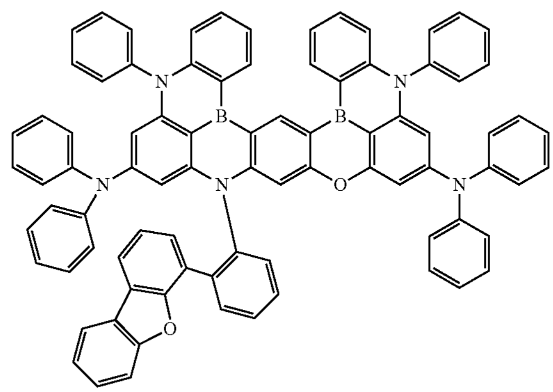
108
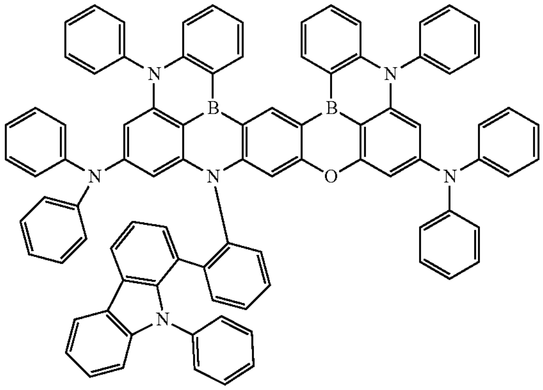
109
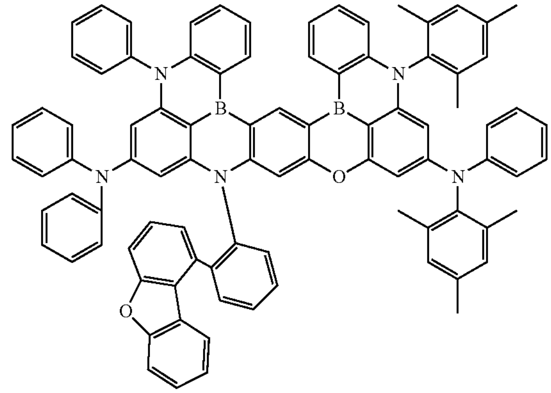

-continued
110
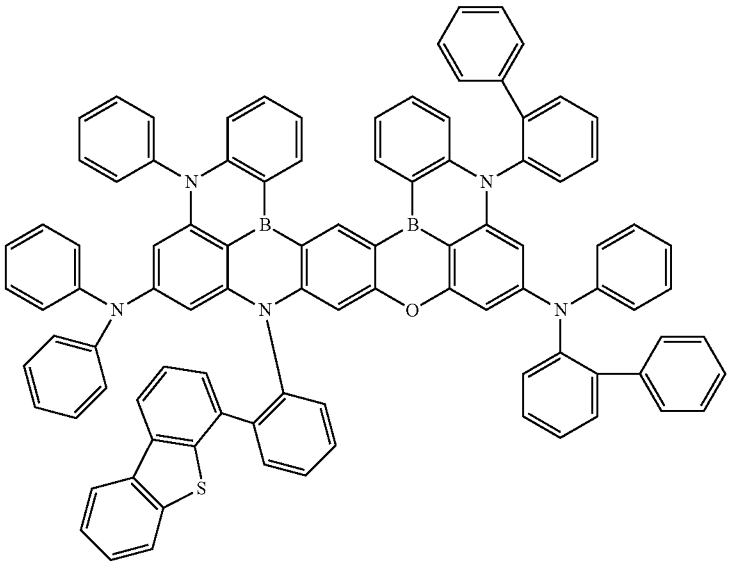
111
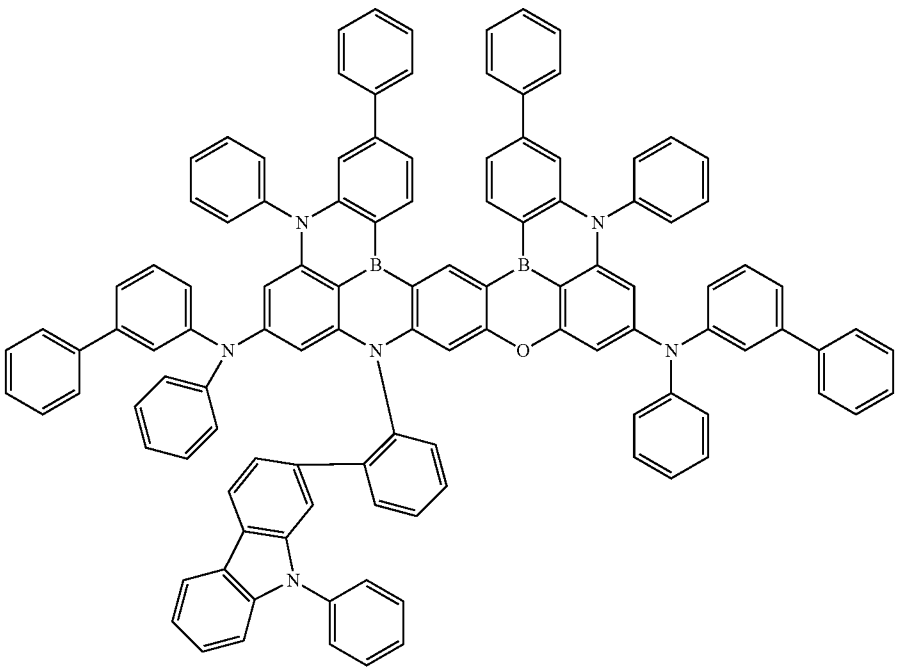
112
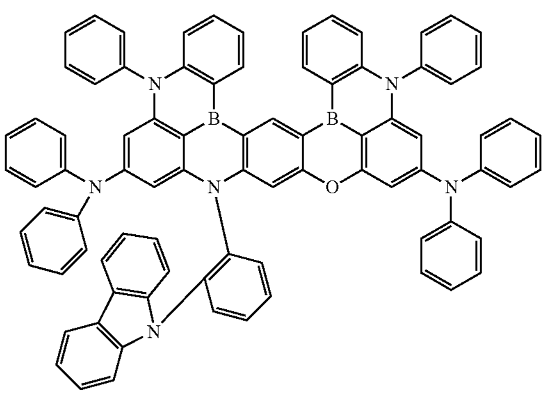
113
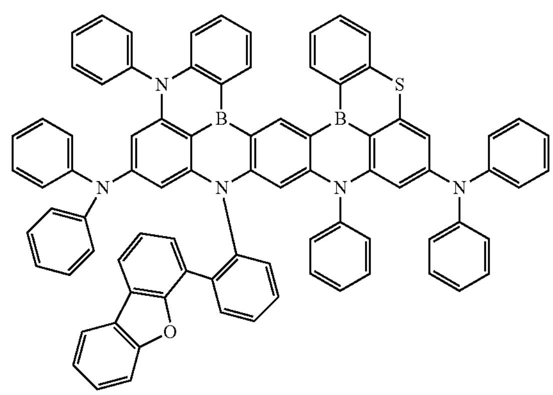

-continued
114
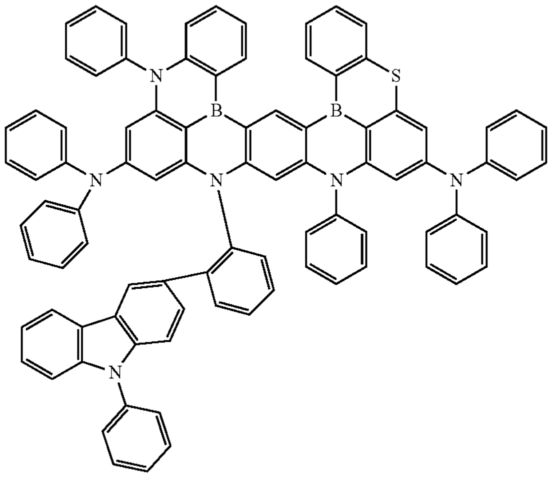
115
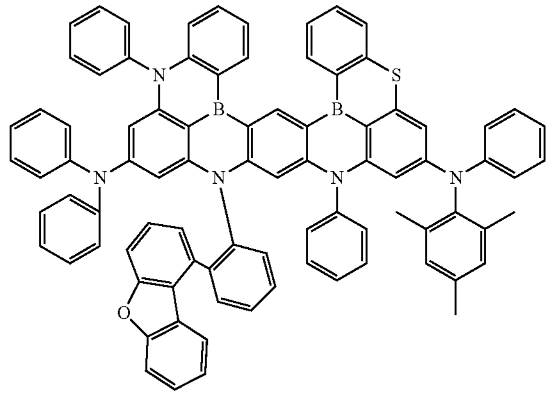
116
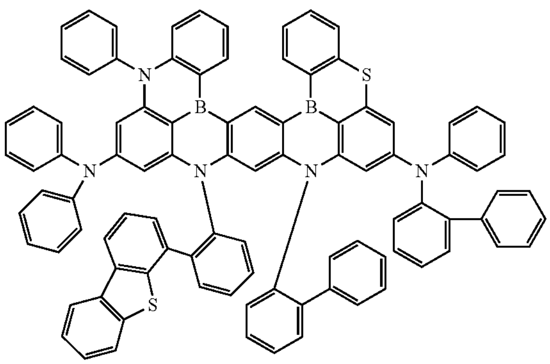
117
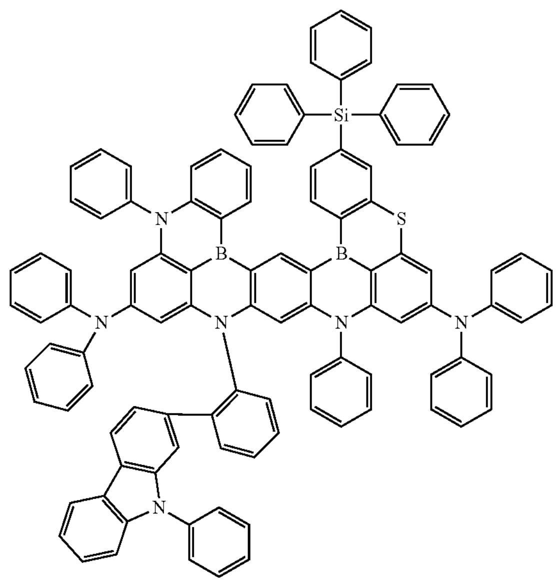
118
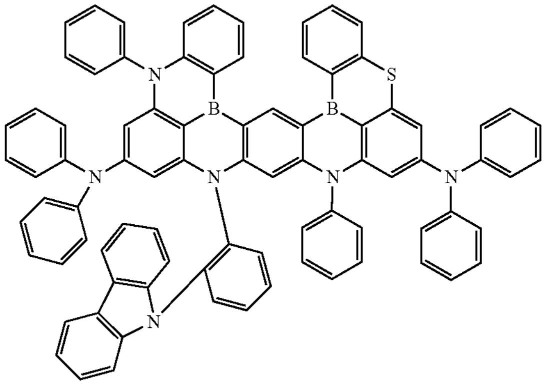
119
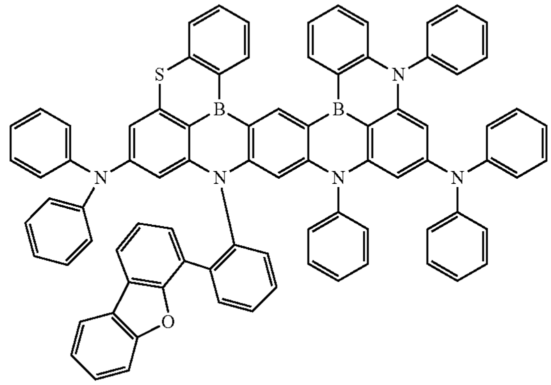

-continued
120
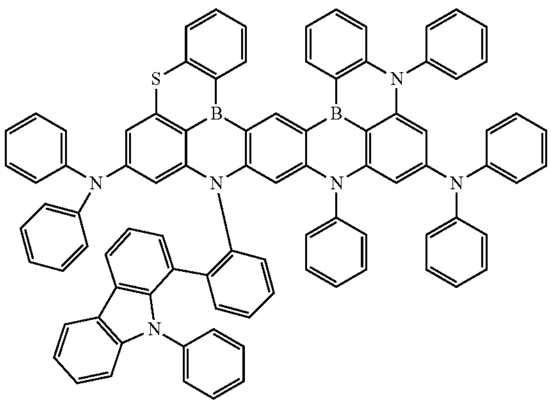
121
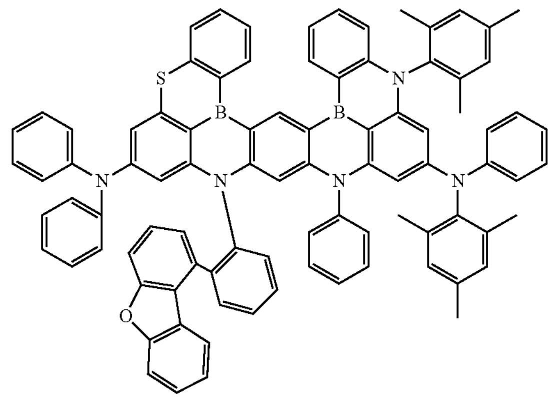
122
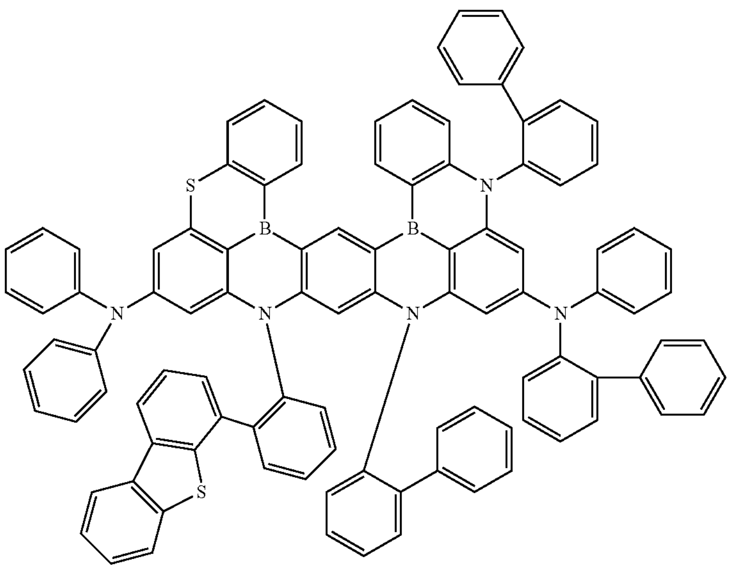
123
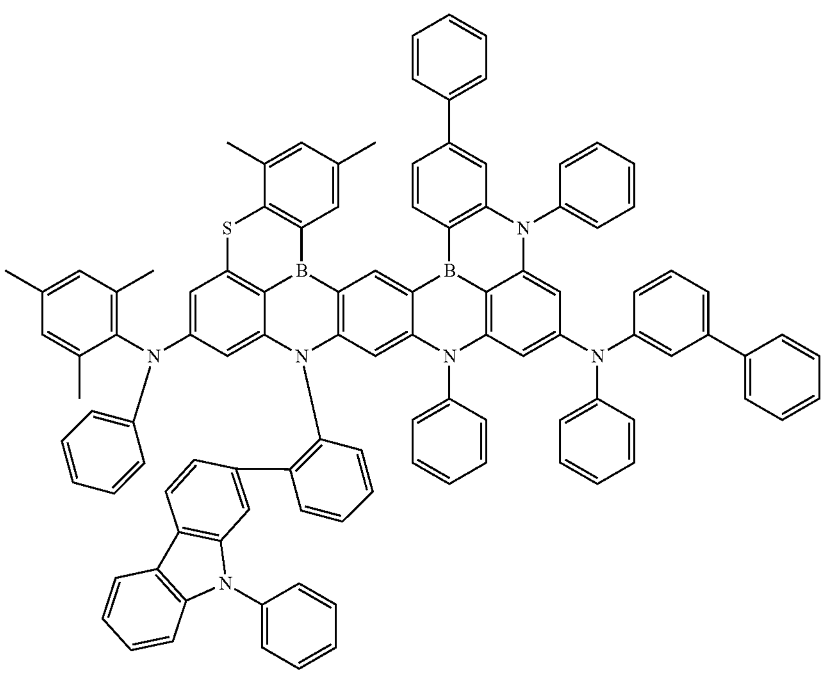

-continued
124
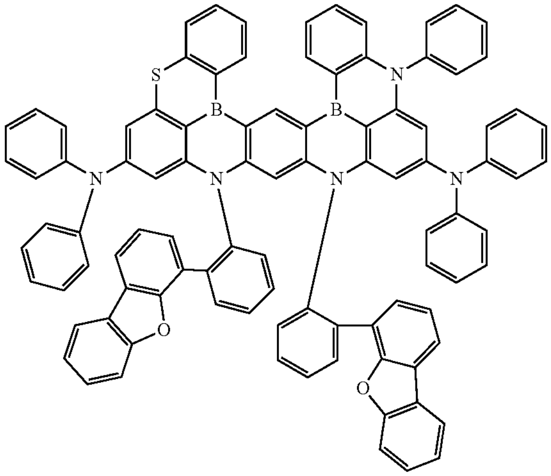
125
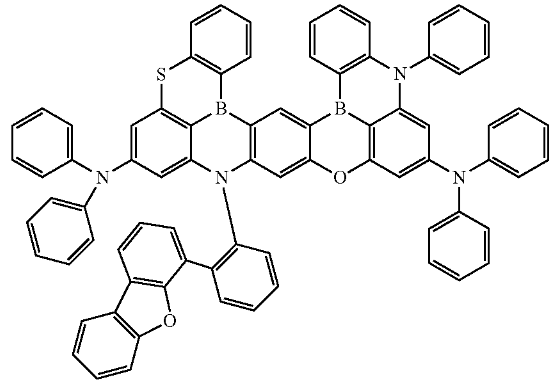
126
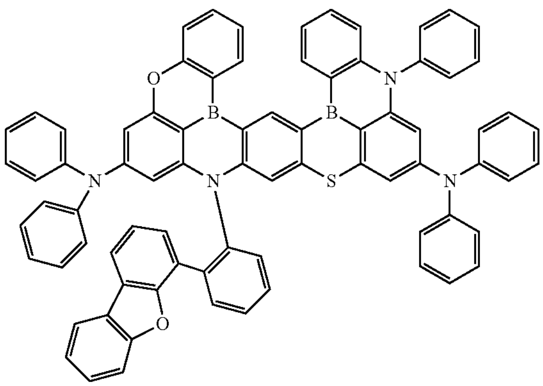
127
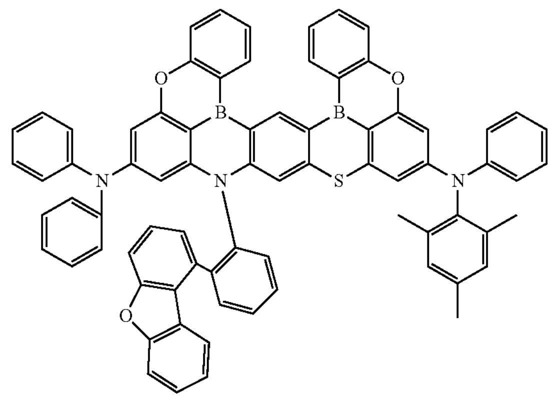
128
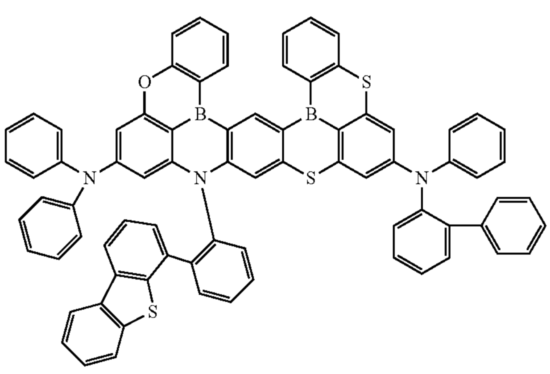
129
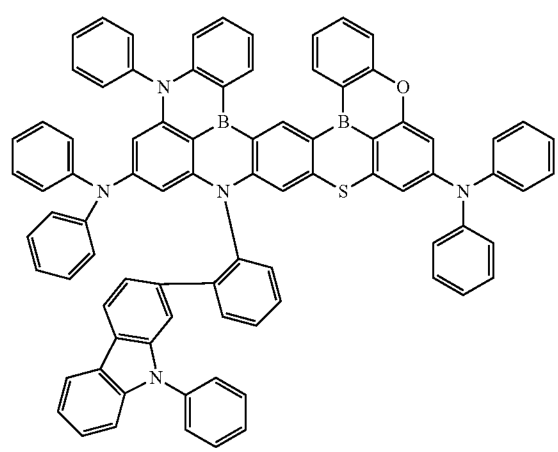

-continued
130
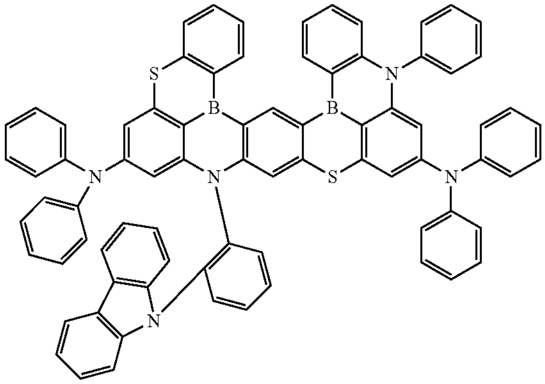
131
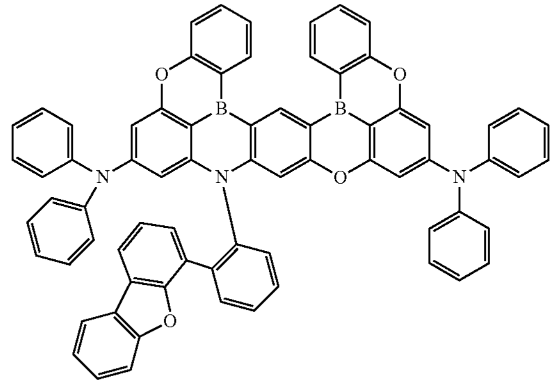
132
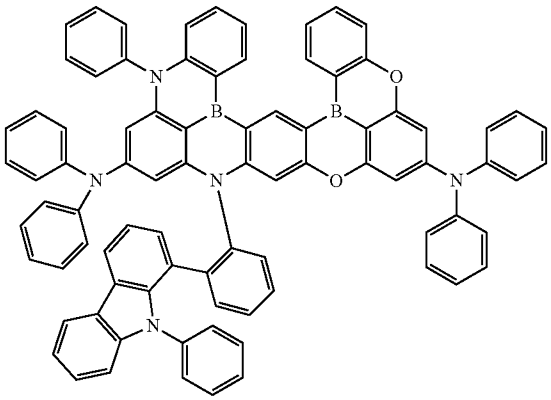
133
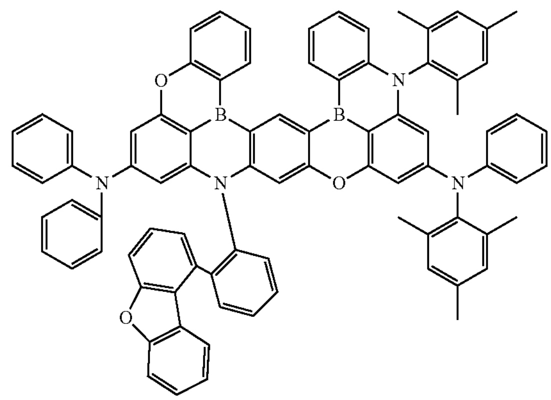
134
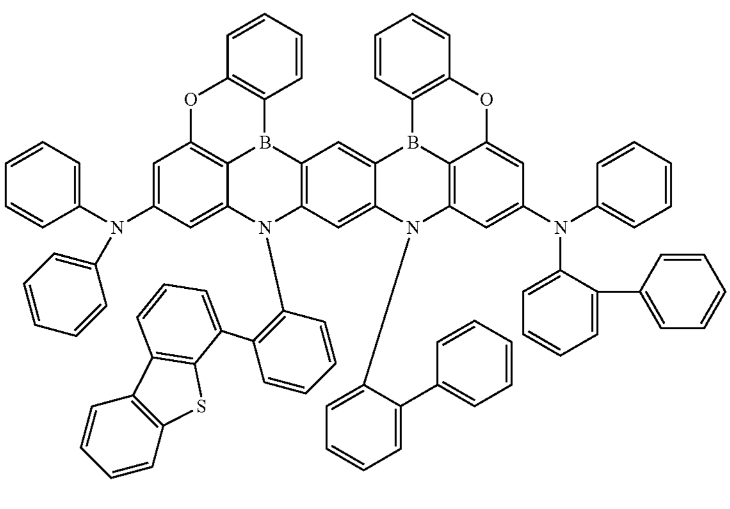

-continued
135
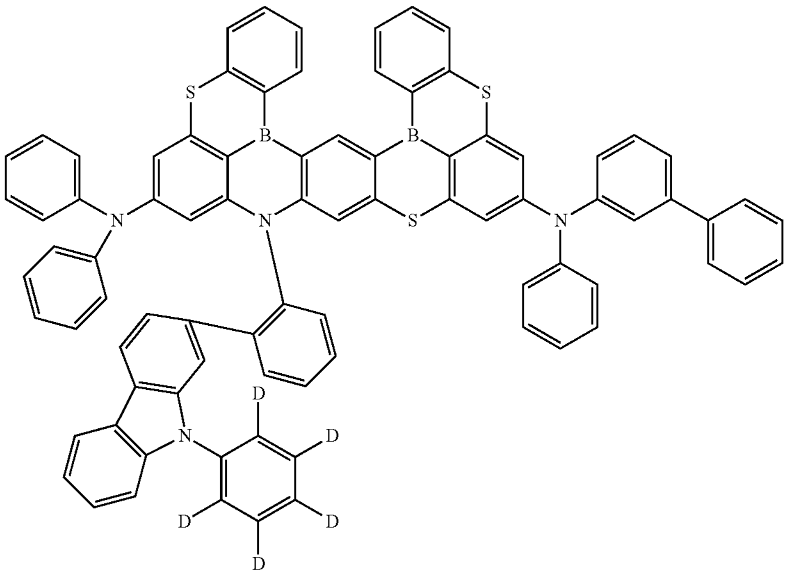
136
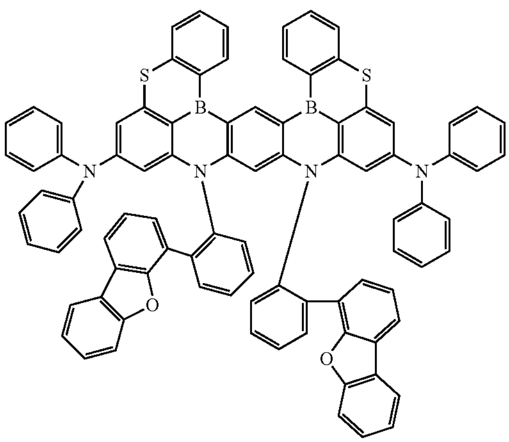
137
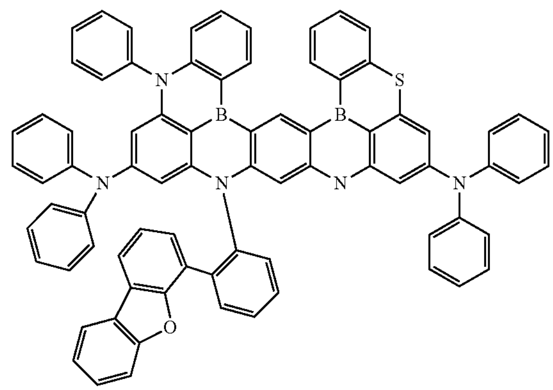
138
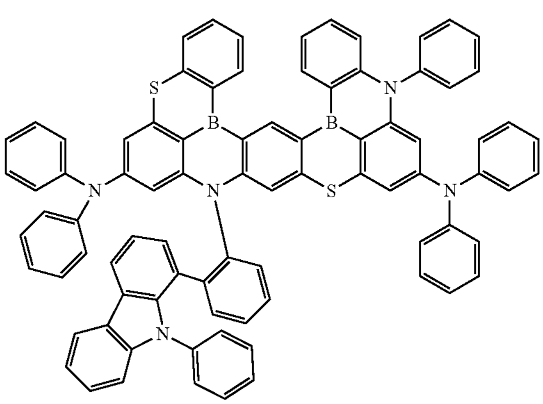
139
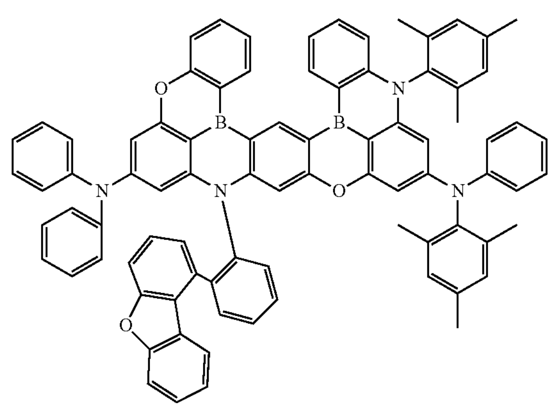

-continued
140
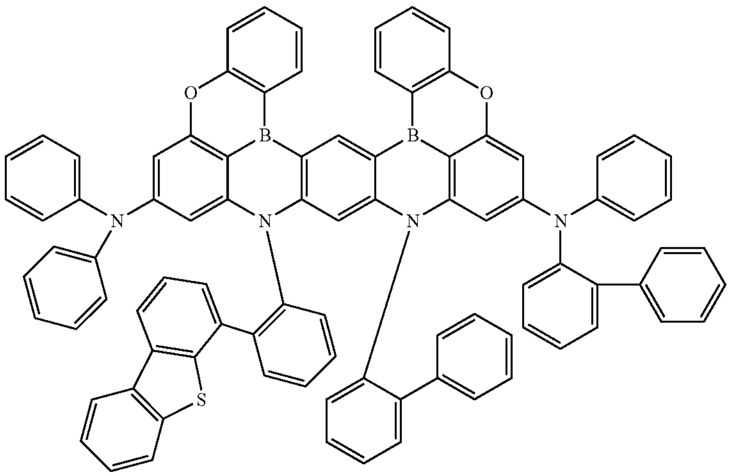
141
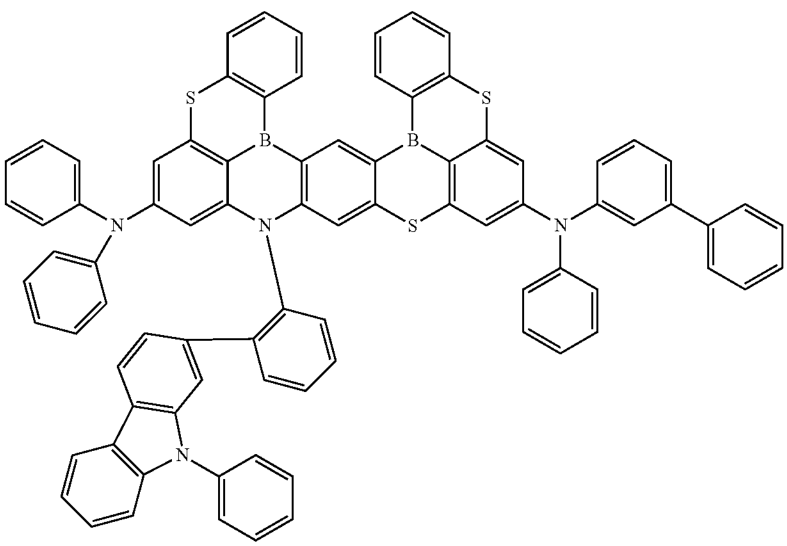
142
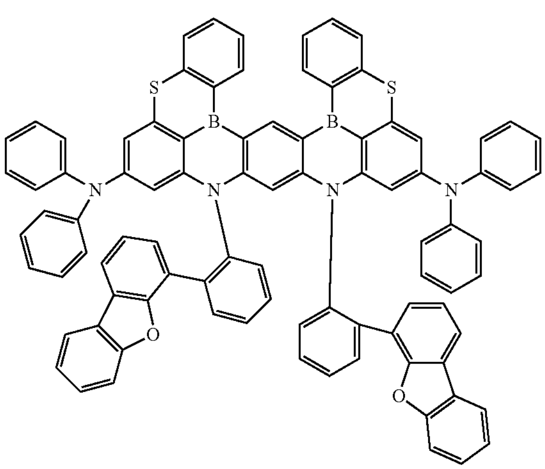
143
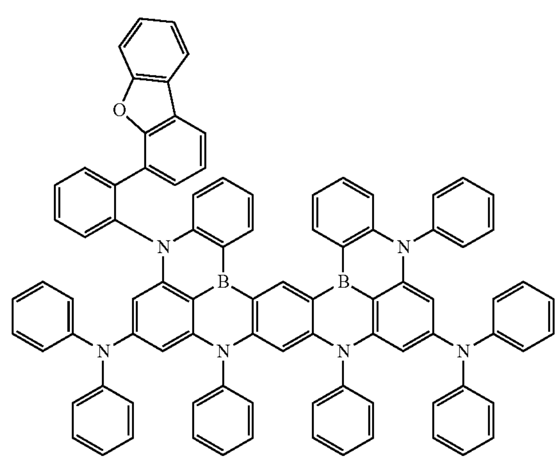

-continued
144
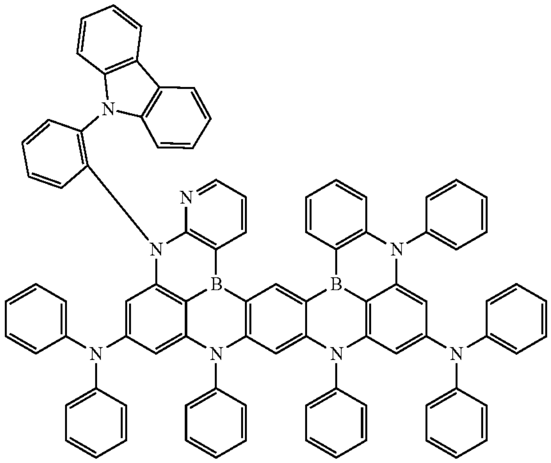
145
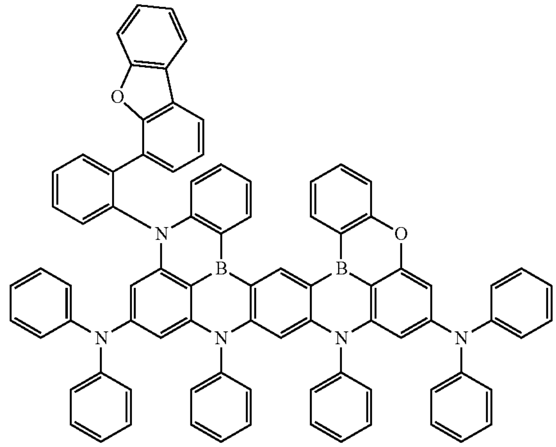
146
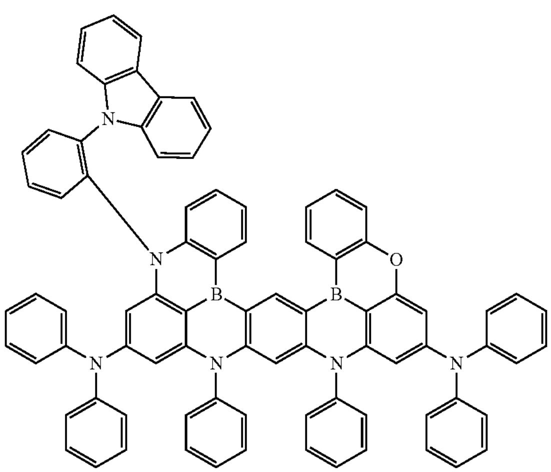
147
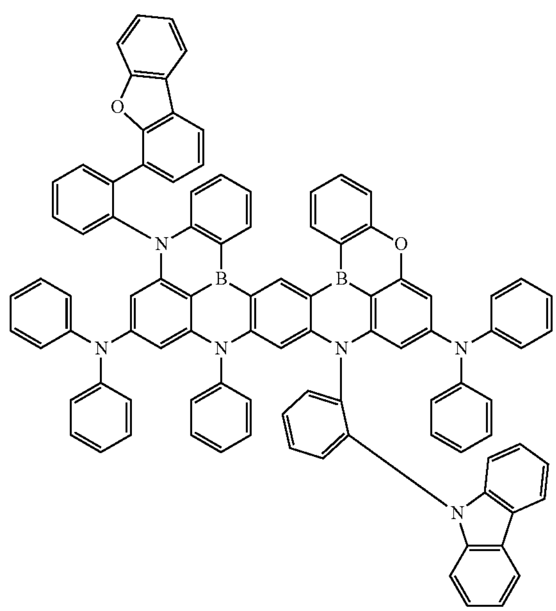

-continued
148
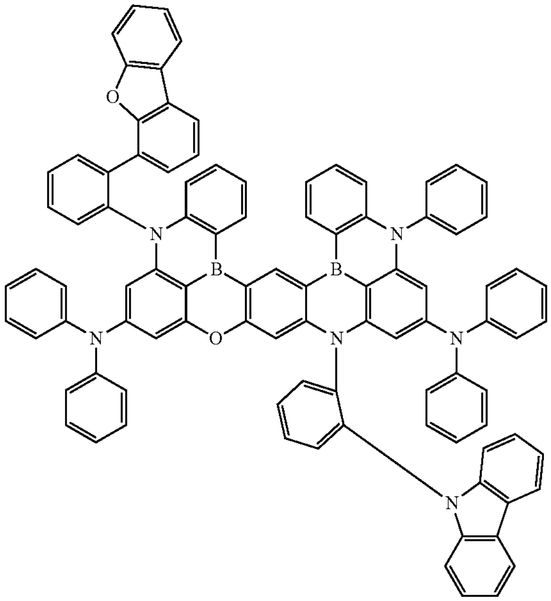
149
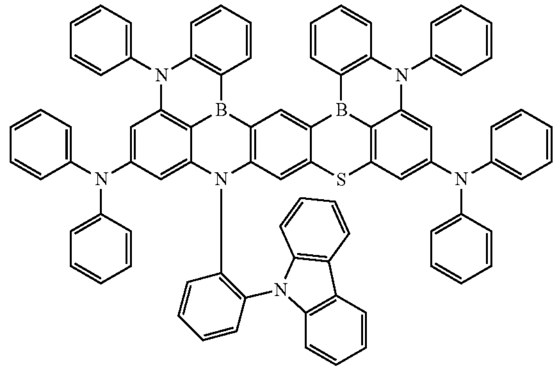
150
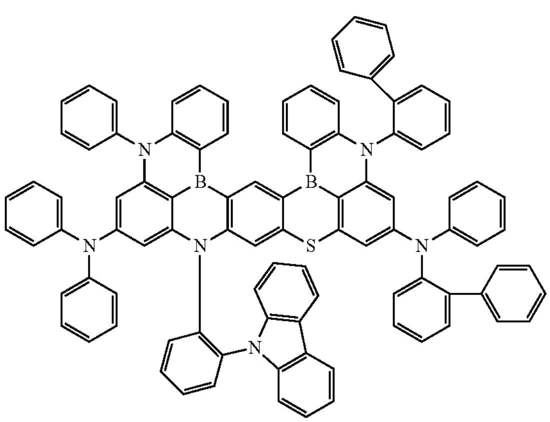
151
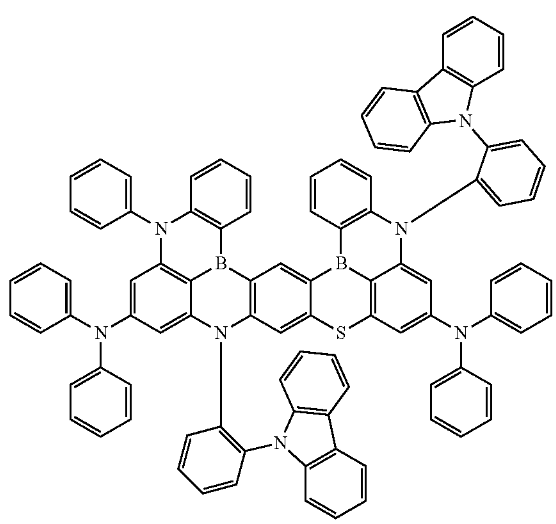

-continued
152
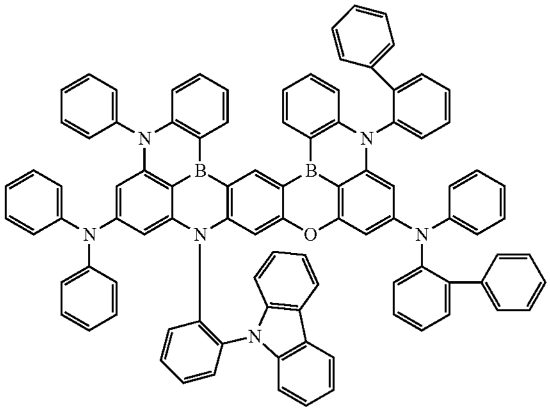
153
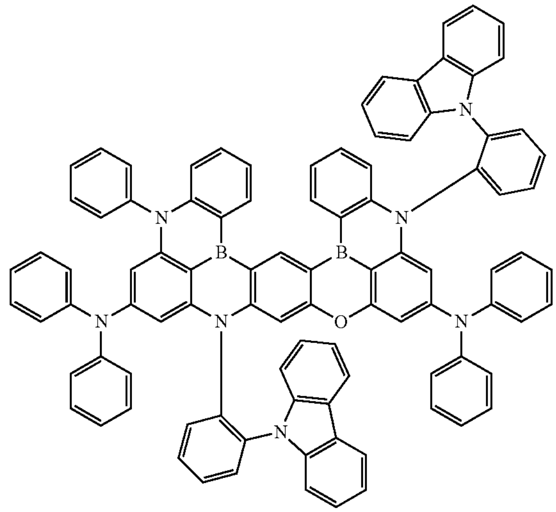
154
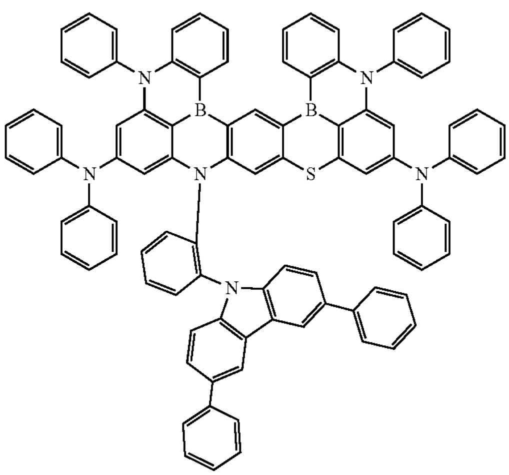
155
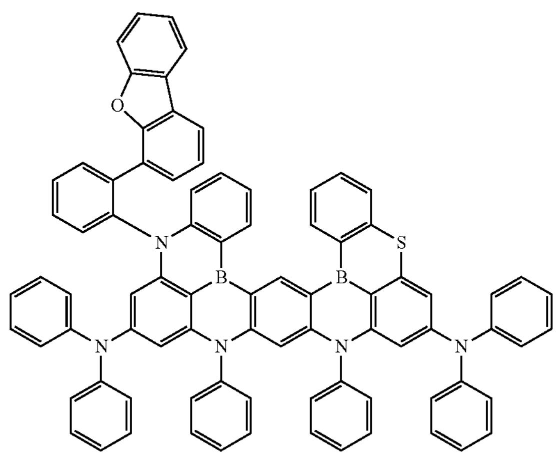
156
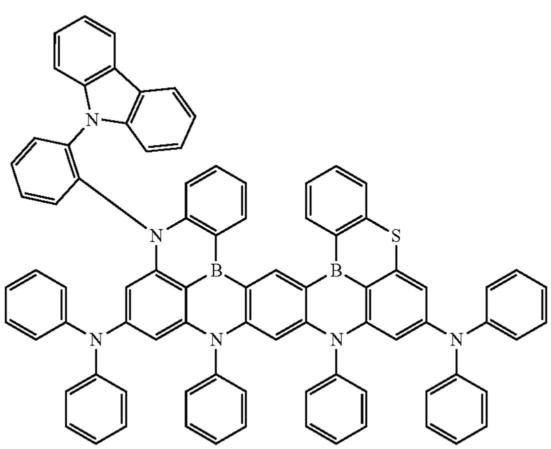
157
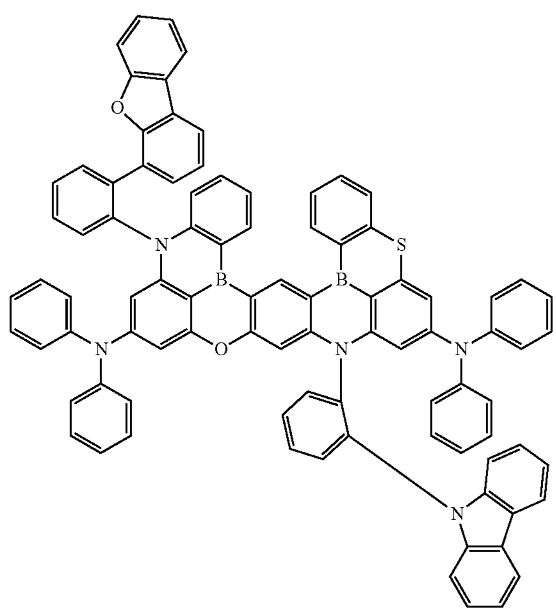

-continued
158
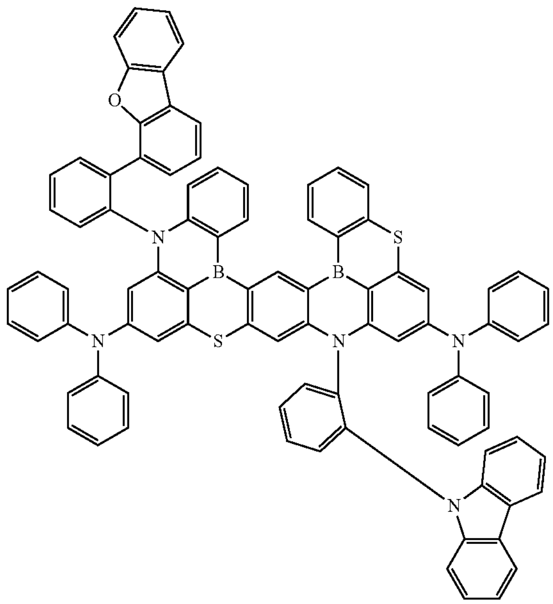
159
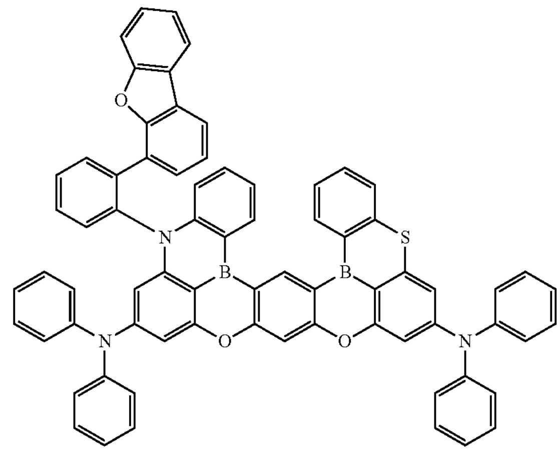
160
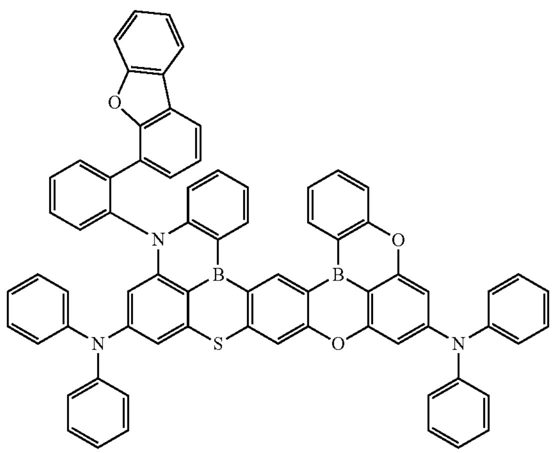
161
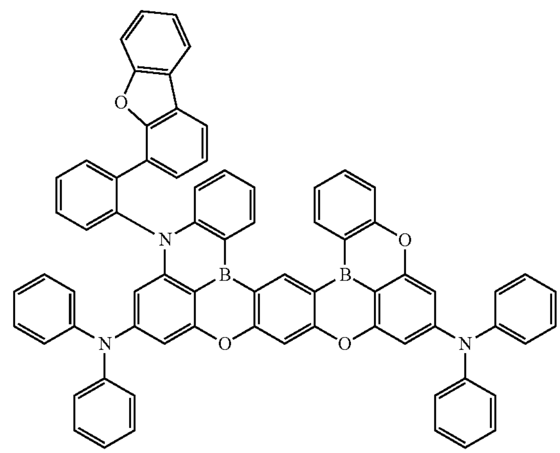
162
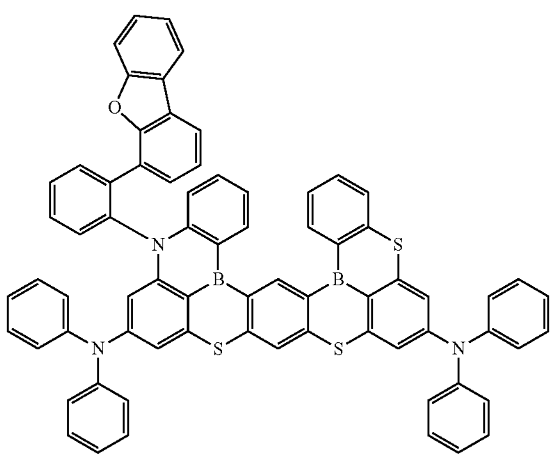
163
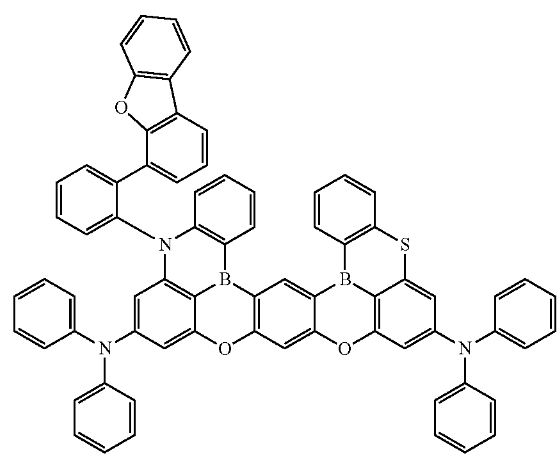

-continued
164
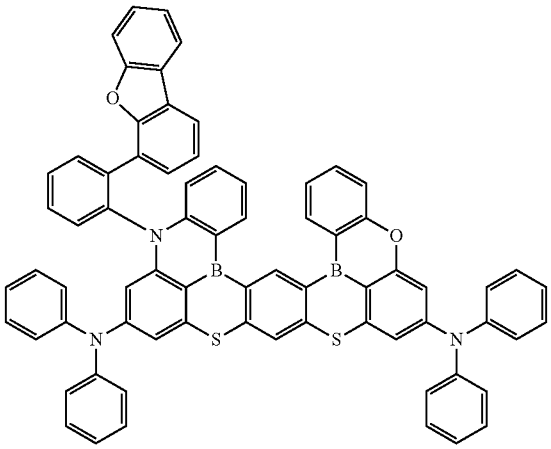
165
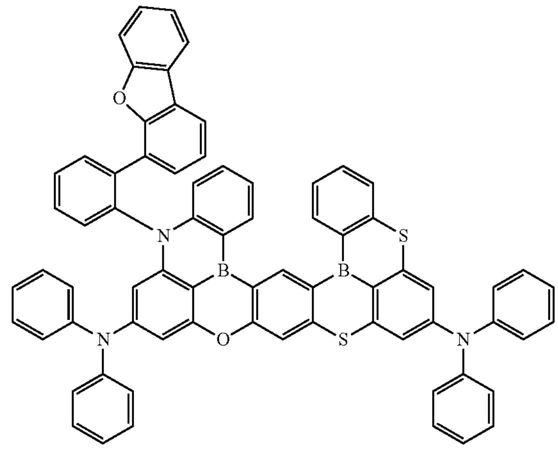
166
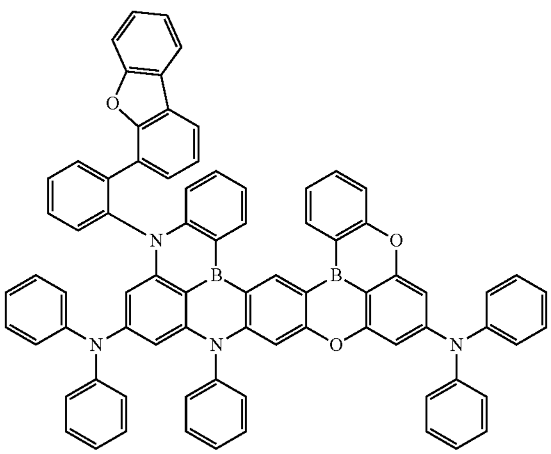
167
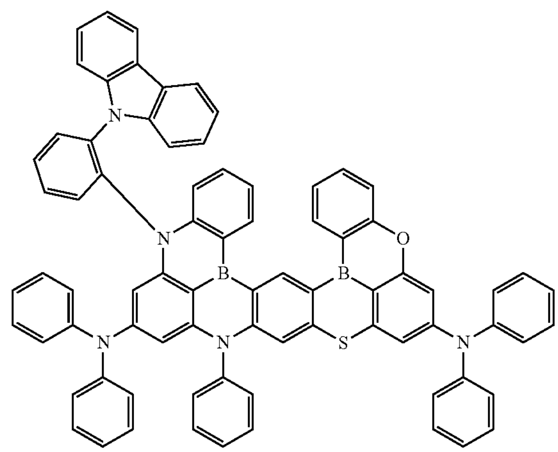
168
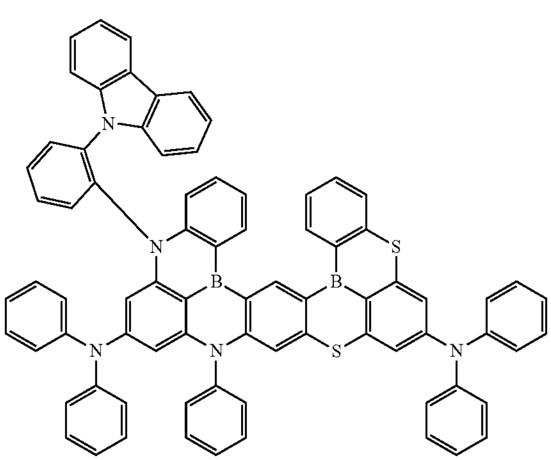
169
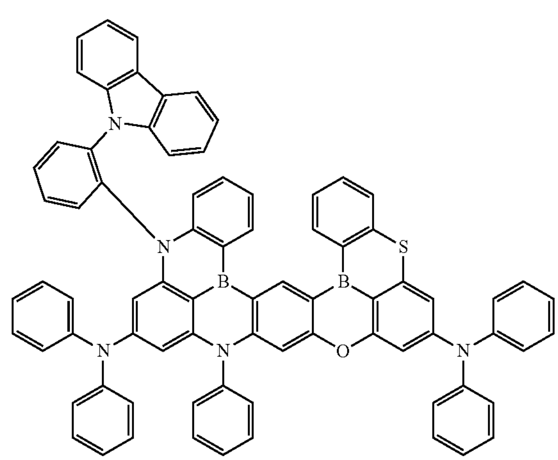

-continued
170
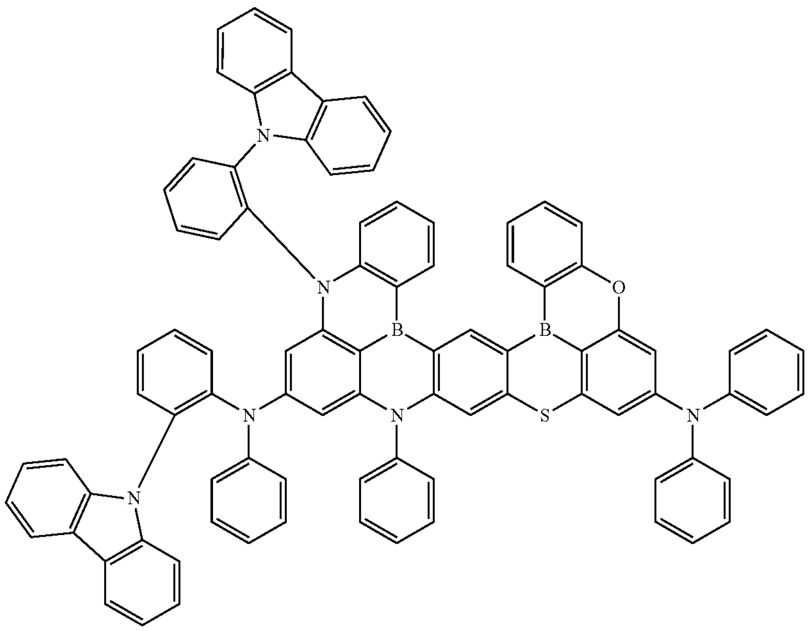
171
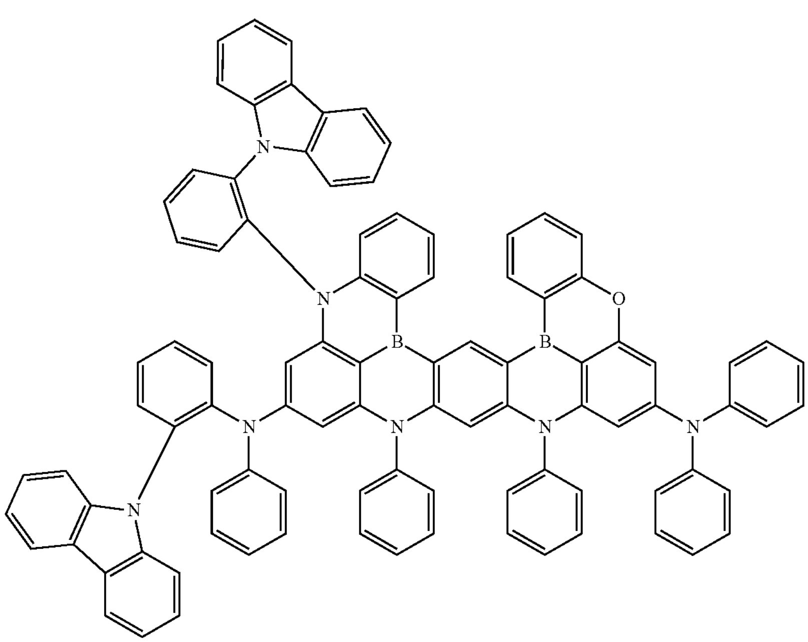

-continued
172
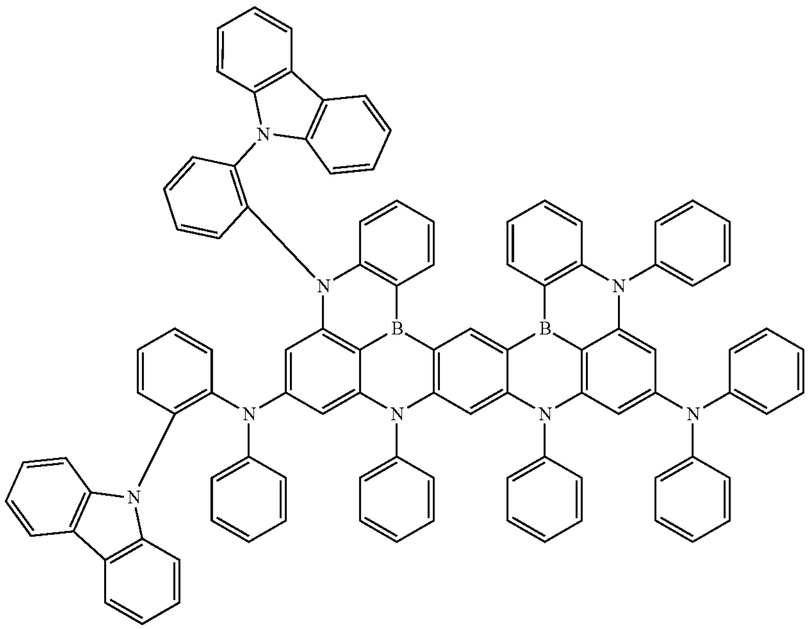
173
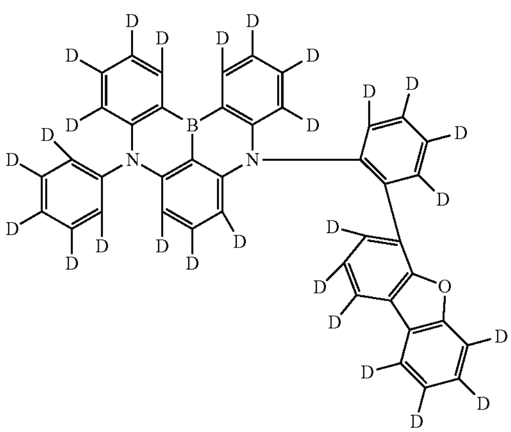
174
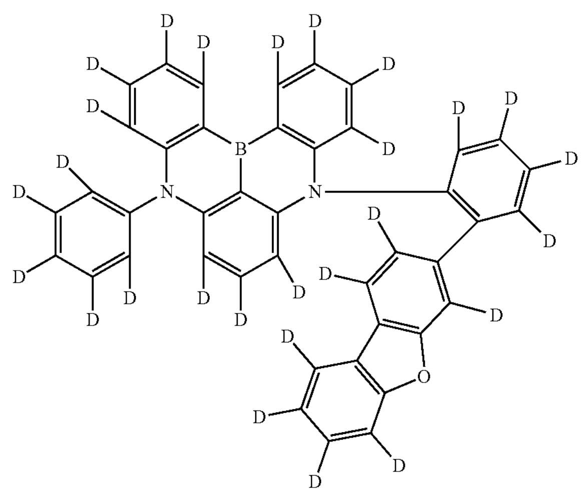
175
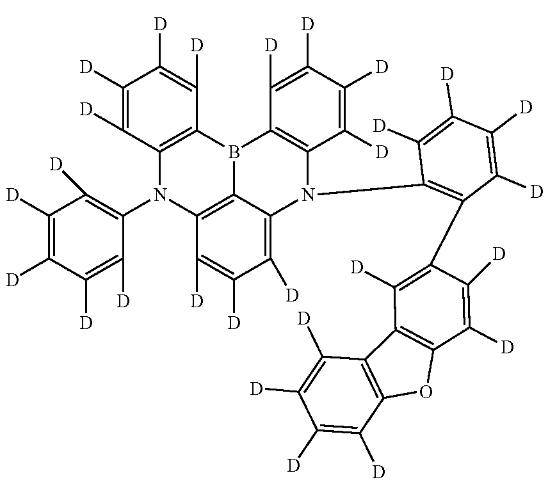
176
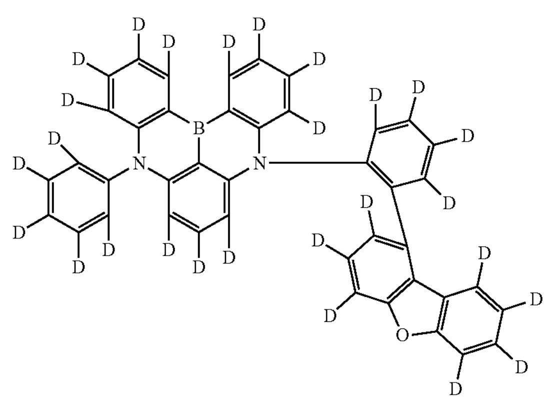

In the compounds of Compound Group 1, Ph is a phenyl group, Mes is a mesityl group, and D is a deuterium atom.

The emission layer EML may, for example, have a thickness in a range of about 100 Å to about 1,000 Å. For example, the thickness of the emission layer EML may be in a range of about 100 Å to about 300 Å. The emission layer EML may be a single layer formed using a single material, a single layer formed using different materials, or a multi-layer structure having multiple layers formed using different materials.

The polycyclic compound of an embodiment may emit blue light. The polycyclic compound of an embodiment may be included in the above-described third light emitting device ED-3 (FIG. 2). In another embodiment, the polycyclic compound of an embodiment may be included in all of the first to third light emitting devices ED-1, ED-2, and ED-3 (FIG. 2).

The polycyclic compound of an embodiment may be a material that emits thermally activated delayed fluorescence. The polycyclic compound of an embodiment represented by Formula 1 may be a thermally activated delayed fluorescence dopant that emits blue light. In the light emitting device ED of an embodiment, the emission layer EML may emit delayed fluorescence. For example, the emission layer EML may emit thermally activated delayed fluorescence (TADF).

In an embodiment, the emission layer EML includes a host and a dopant and may include the polycyclic compound of an embodiment as the dopant. For example, in the light emitting device ED of an embodiment, the emission layer EML may include a host for emitting delayed fluorescence and a dopant for emitting delayed fluorescence and may include the polycyclic compound of an embodiment as the dopant for emitting delayed fluorescence. The emission layer EML may include at least one of the polycyclic compounds represented in Compound Group 1 as a thermally activated delayed fluorescence dopant.

In an embodiment, the emission layer EML may be a delayed fluorescence emission layer, and the emission layer EML may include a host material and the above-described polycyclic compound of an embodiment. For example, in an embodiment, the polycyclic compound may be used as a TADF dopant.

The emission layer EML may further include anthracene derivatives, pyrene derivatives, fluoranthene derivatives, chrysene derivatives, dihydrobenzanthracene derivatives, or triphenylene derivatives. For example, the emission layer EML may further include anthracene derivatives or pyrene derivatives.

In the light emitting devices ED of embodiments, shown in FIG. 3 to FIG. 6, the emission layer EML may include a host and a dopant, and the emission layer EML may further include a compound represented by Formula E-1 below. The compound represented by Formula E-1 below may be used as a fluorescence host material.

[Formula E-1]

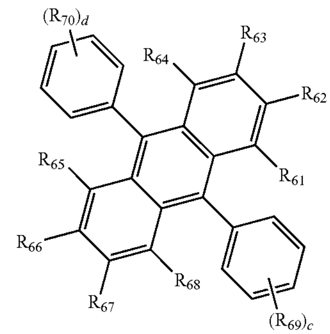

In Formula E-1, $R_{61}$ to $R_{70}$ may each independently be a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring. In an embodiment, in Formula E-1, $R_{61}$ to $R_{70}$ may be combined with an adjacent group to form a saturated hydrocarbon ring or an unsaturated hydrocarbon ring. In Formula E-1, c and d may each independently be an integer from 0 to 5.

Formula E-1 may be represented by any one of Formula E1 to Formula E19 below.

E1

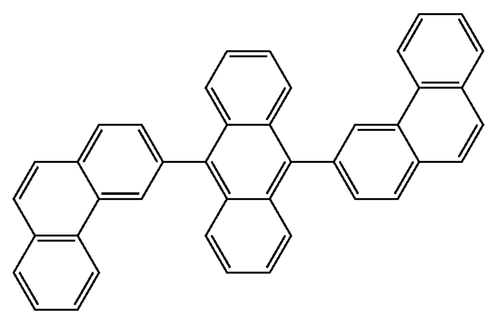

E2

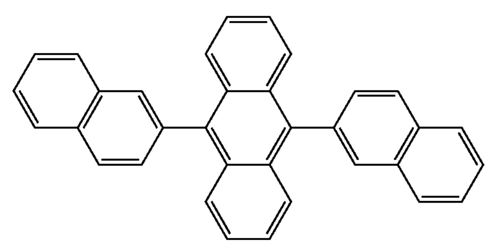

E3

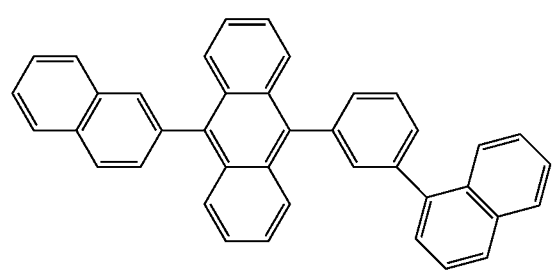

-continued
E4
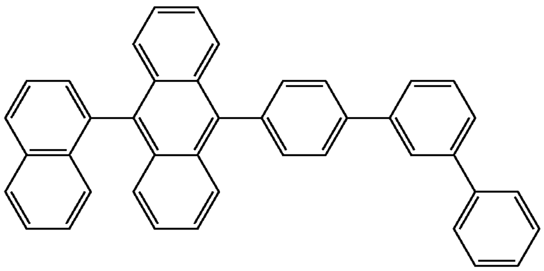
E5
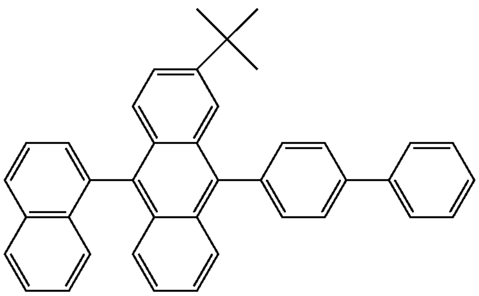
E6
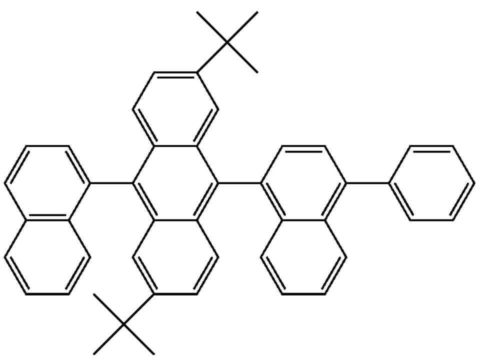
E7
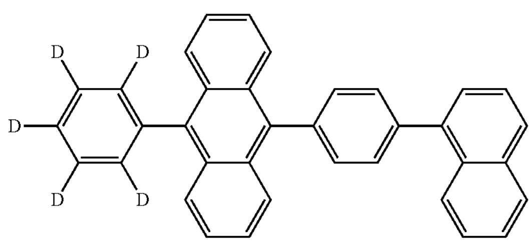
E8
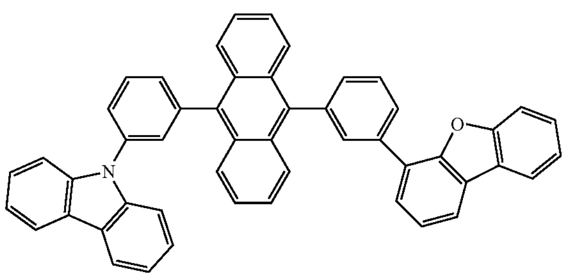
-continued
E9
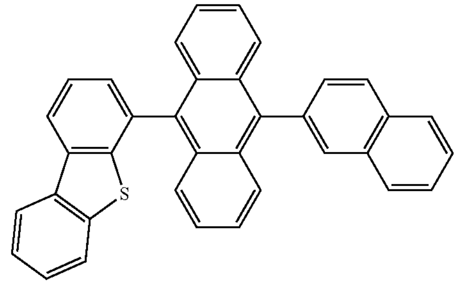
E10
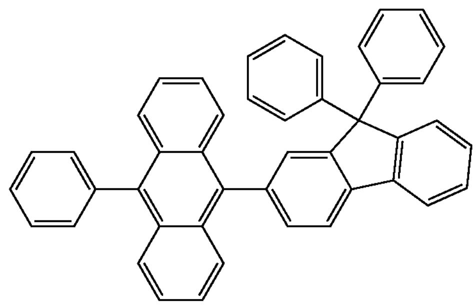
E11
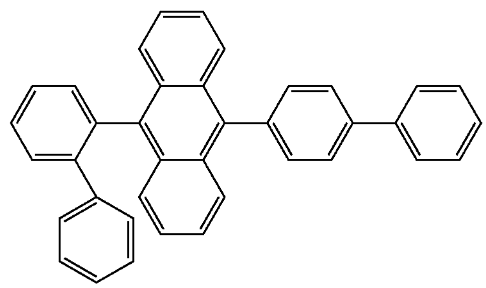
E12
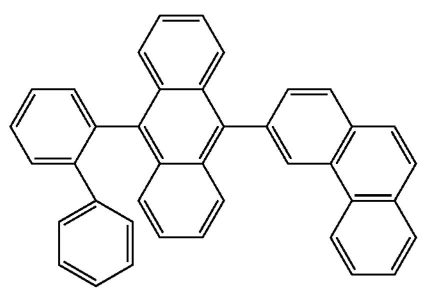
E13
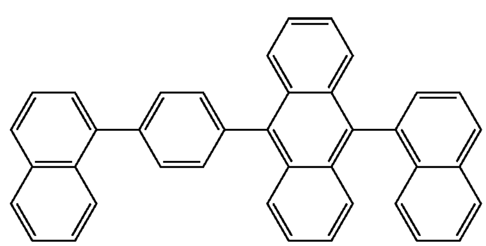

E14

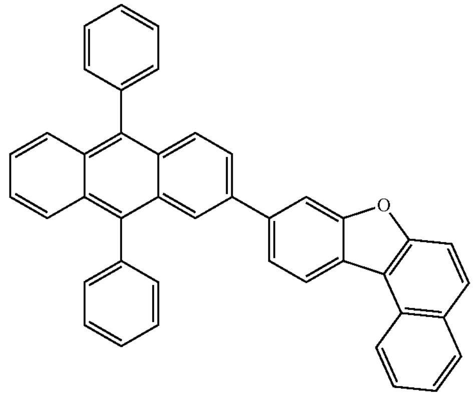

E15

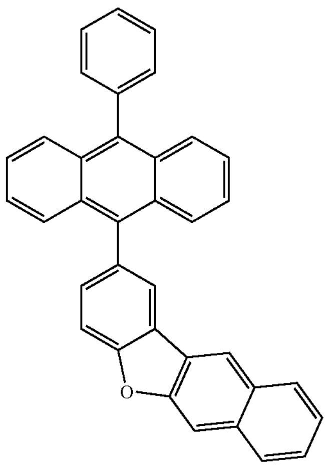

E16

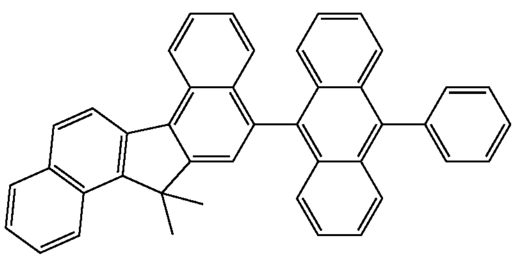

E17

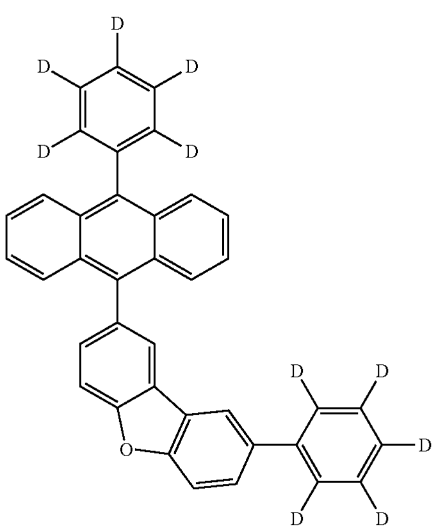

E18

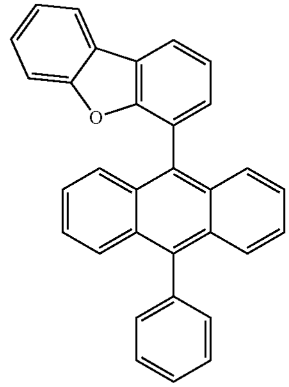

E19

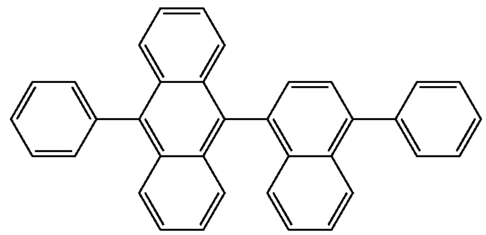

The emission layer EML may further include a material common in the art as a host material. For example, the emission layer EML may include as a host material, at least one of bis[2-(diphenylphosphino)phenyl]ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b, d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, an embodiment is not limited thereto. For example, tris(8-hydroxyquinolino)aluminum ($Alq_3$), poly(N-vinylcarbazole) (PVK), 9,10-di(naphthalene-2-yl)anthracene (ADN), 4,4',4"-tris(carbazol-9-yl)-triphenylamine (TCTA), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as the host material.

The emission layer EML may include a compound represented by Formula E-2a or Formula E-2b below. The compound represented by Formula E-2a or Formula E-2b may be used as a phosphorescence host material.

[Formula E-2a]

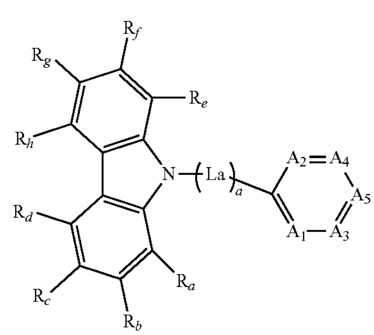

In Formula E-2a, a may be an integer from 0 to 10, $L_a$ may be a direct linkage, a substituted or unsubstituted arylene group of 6 to 30 ring-forming carbon atoms, or a substituted or unsubstituted heteroarylene group of 2 to 30 ring-forming carbon atoms. If a is an integer of 2 or more, multiple $L_a$ may each independently be a substituted or unsubstituted arylene group of 6 to 30 ring-forming carbon atoms, or a substituted or unsubstituted heteroarylene group of 2 to 30 ring-forming carbon atoms.

In Formula E-2a, $A_1$ to $A_5$ may each independently be N or CRi. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to each other to form a ring. For example, $R_a$ to $R_i$ may be combined with an adjacent group to form a hydrocarbon ring or a heterocycle including N, O, S, etc. as a ring-forming atom.

In Formula E-2a, two or three selected from $A_1$ to $A_5$ may be N, and the remainder may be $CR_i$.

[Formula E-2b]

$$(\mathrm{Cbz1}) \!-\!\!\left(L_b\right)_b\!\!-\! (\mathrm{Cbz2})$$

In Formula E-2b, Cbz1 and Cbz2 may each independently be an unsubstituted carbazole group, or a carbazole group substituted with an aryl group of 6 to 30 ring-forming carbon atoms. In Formula E-2b, $L_b$ may be a direct linkage, a substituted or unsubstituted arylene group of 6 to 30 ring-forming carbon atoms, or a substituted or unsubstituted heteroarylene group of 2 to 30 ring-forming carbon atoms. In Formula E-2b, b may be an integer from 0 to 10, and if b is an integer of 2 or more, multiple $L_b$ may each independently be a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be represented by any one of the compounds in Compound Group E-2 below. However, the compounds shown in Compound Group E-2 below are only illustrations, and the compound represented by Formula E-2a or Formula E-2b is not limited to the compounds represented in Compound Group E-2 below.

[Compound Group E-2]

E-2-1

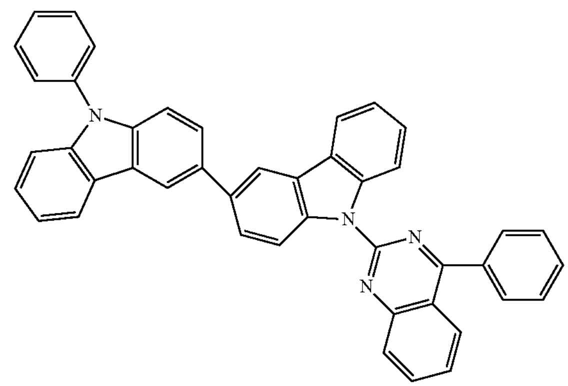

E-2-2

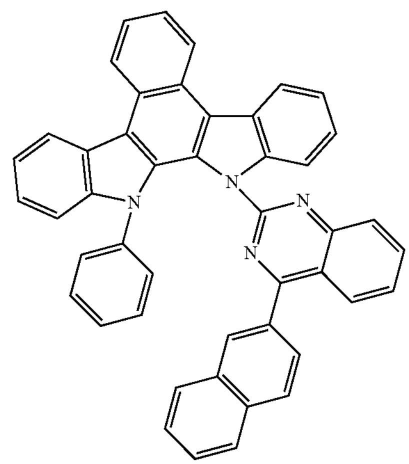

E-2-3

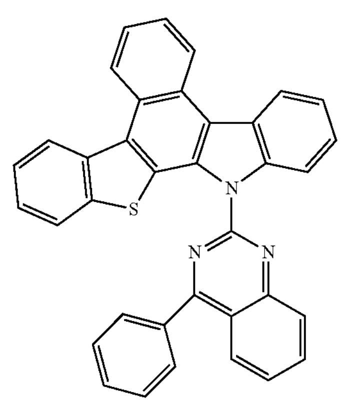

-continued
E-2-4
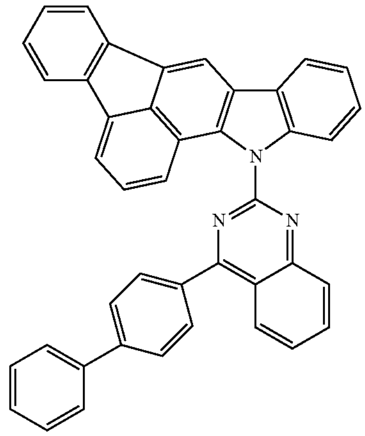
E-2-5
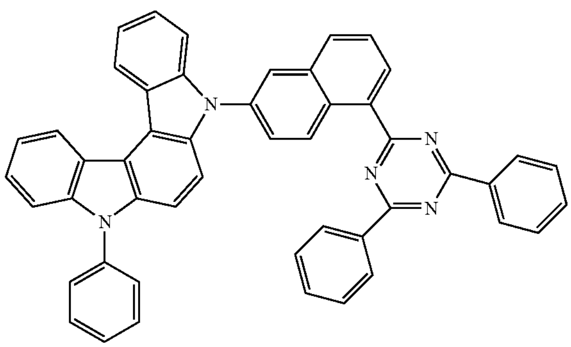
E-2-6
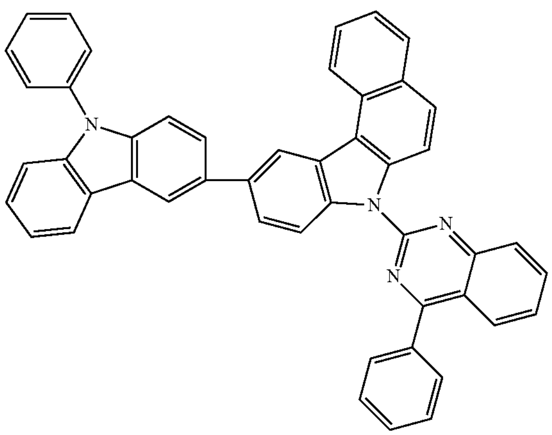
-continued
E-2-7
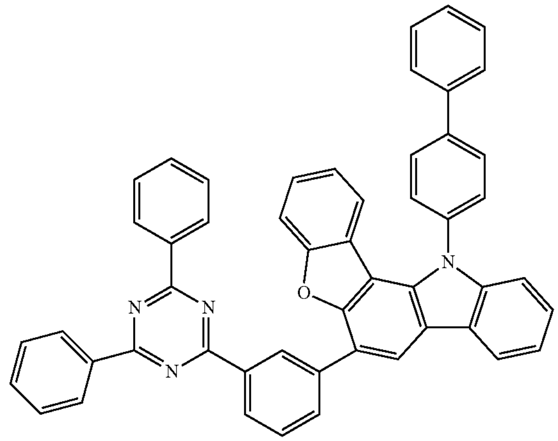
E-2-8
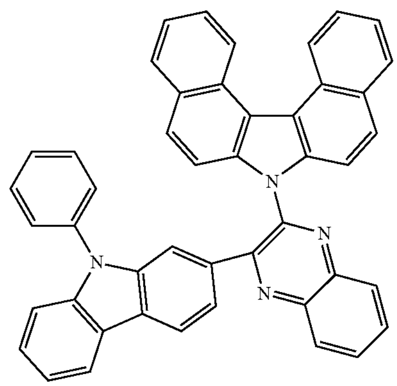
E-2-9
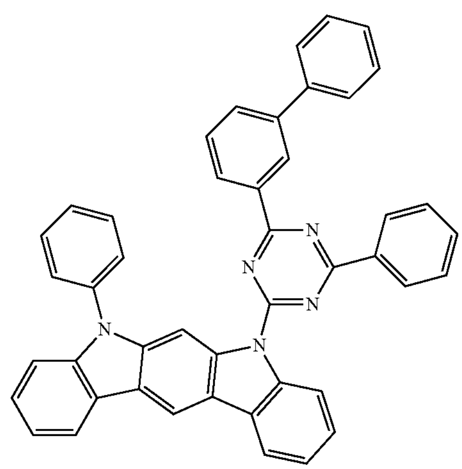

-continued
E-2-10
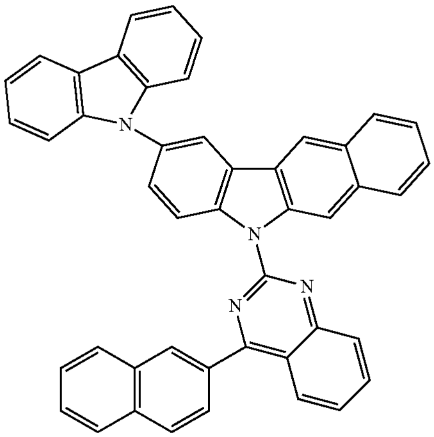
E-2-11
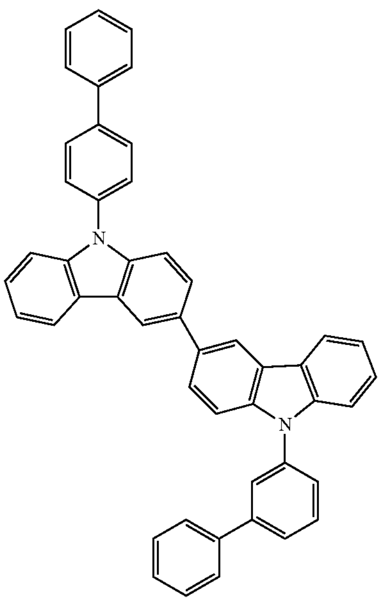
E-2-12
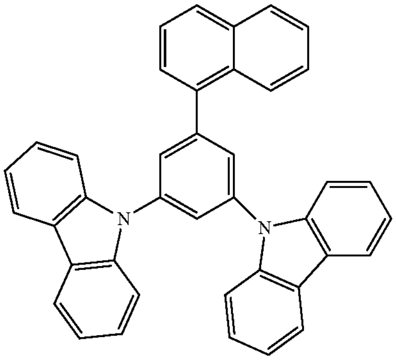
-continued
E-2-13
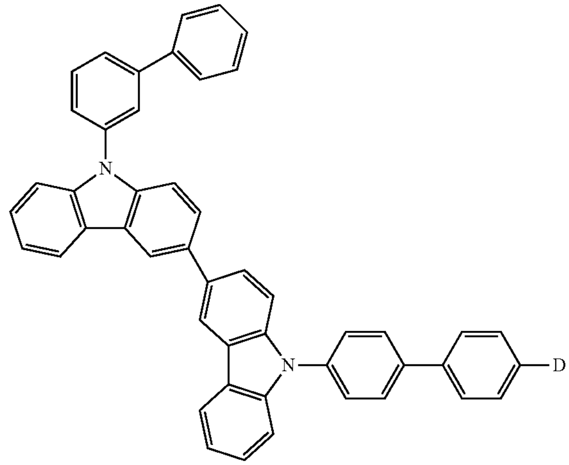
E-2-14
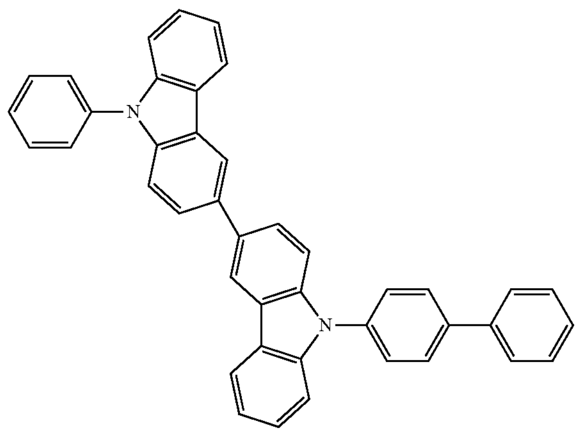
E-2-15
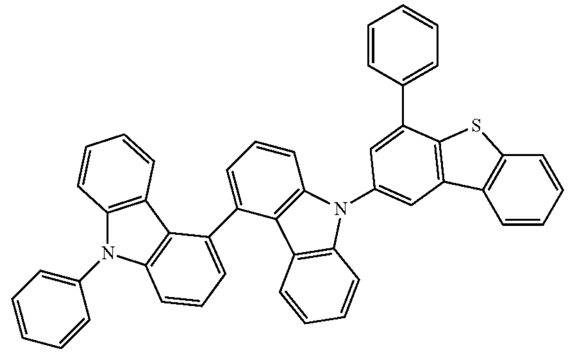

-continued
E-2-16
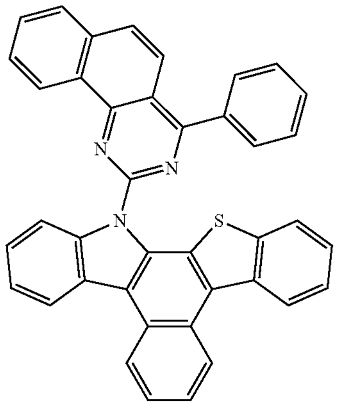
E-2-17
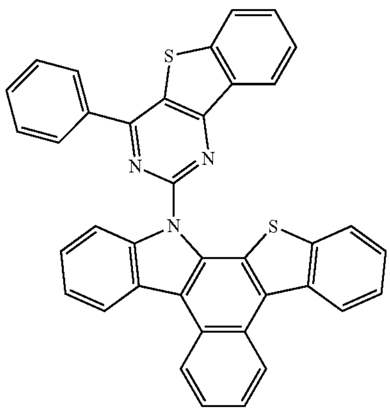
E-2-18
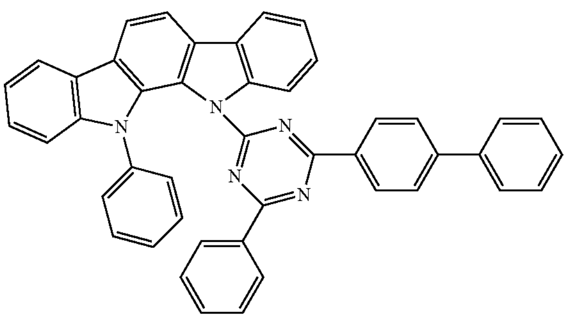
E-2-19
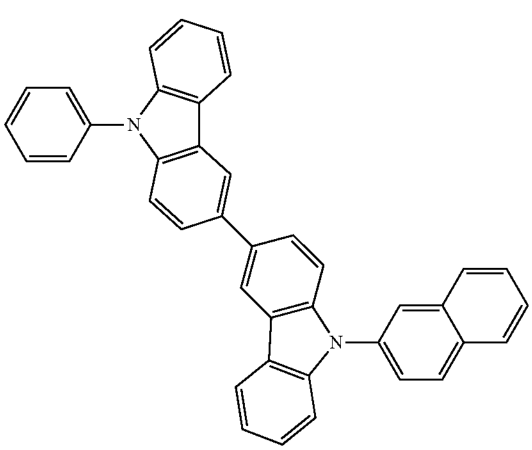
-continued
E-2-20
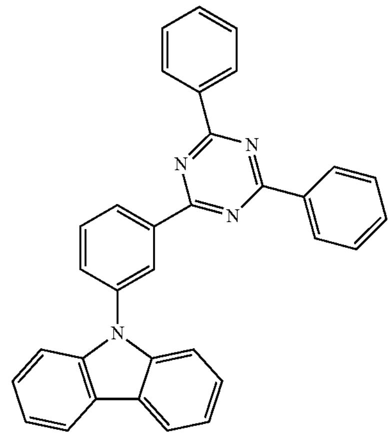
E-2-21
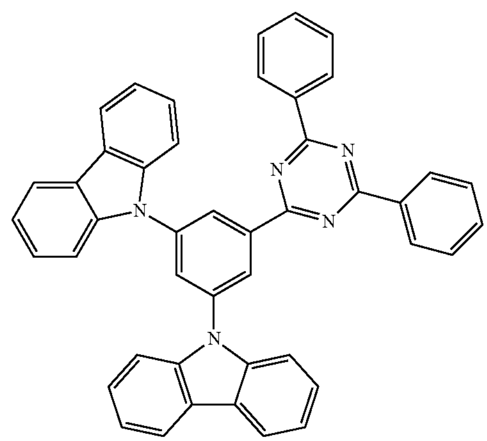
E-2-22
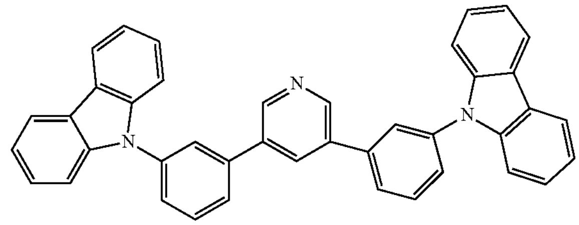

-continued

E-2-23

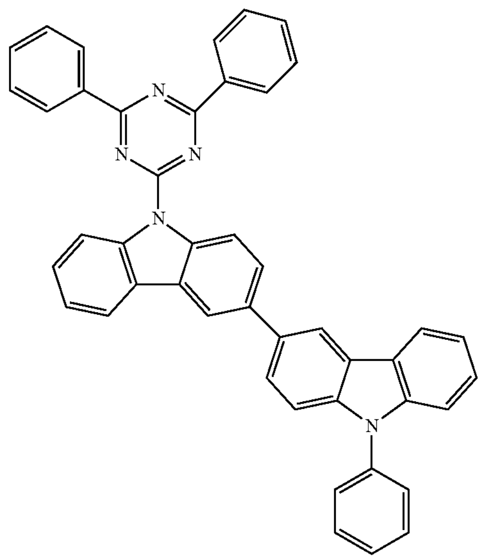

The emission layer EML may include a compound represented by Formula M-a or Formula M-b below. The compound represented by Formula M-a or Formula M-b may be used as a phosphorescence dopant material.

[Formula M-a]

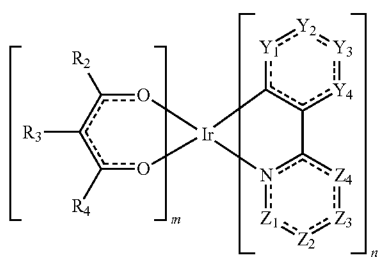

In Formula M-a, $Y_1$ to $Y_4$, and $Z_1$ to $Z_4$ may each independently be $CR_1$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula M-a, m may be 0 or 1, and n may be 2 or 3. In Formula M-a, if m is 0, n may be 3, and if m is 1, n may be 2.

The compound represented by Formula M-a may be used as a red phosphorescence dopant or a green phosphorescence dopant. The compound represented by Formula M-a may be represented by any one of Compounds M-a1 to M-a19 below. However, Compounds M-a1 to M-a19 below are illustrations, and the compound represented by Formula M-a is not limited to the compounds represented by Compounds M-a1 to M-a19 below.

M-a1

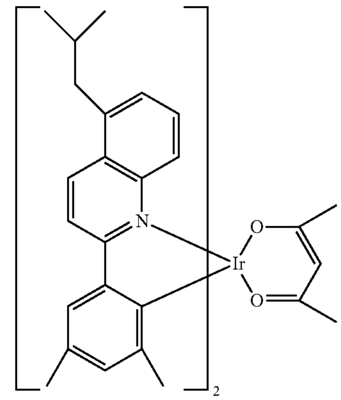

M-a2

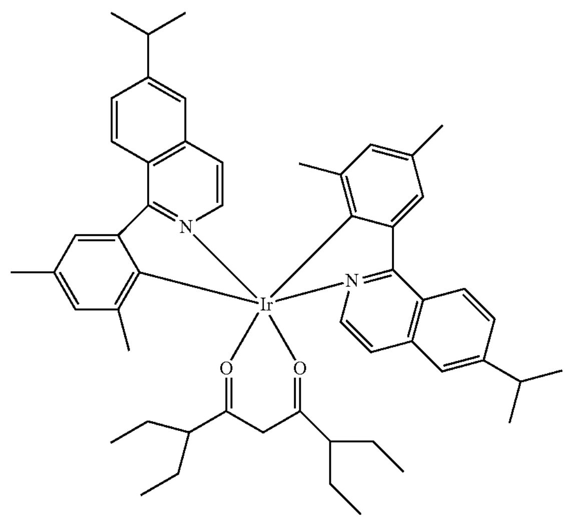

M-a3

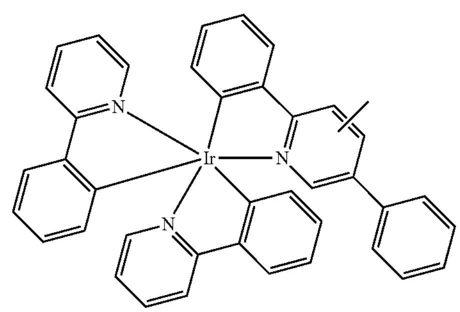

M-a4

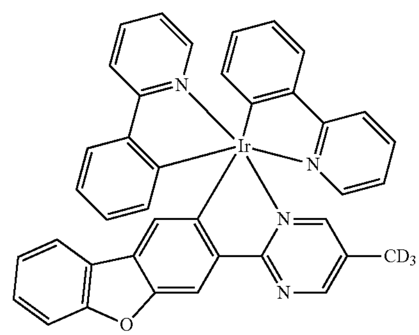

-continued
M-a5
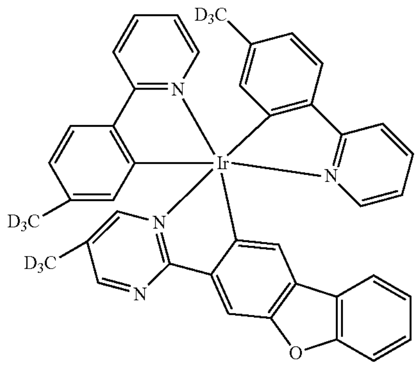
M-a6
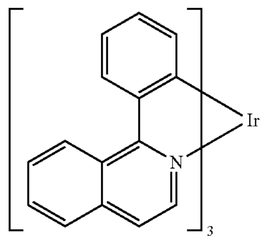
M-a7
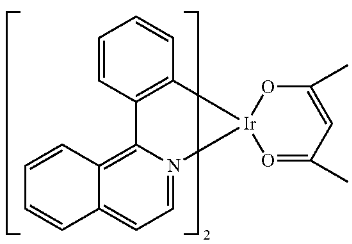
M-a8
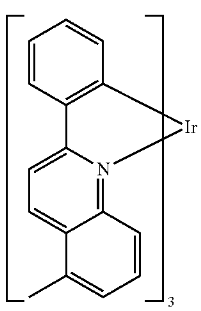
M-a9
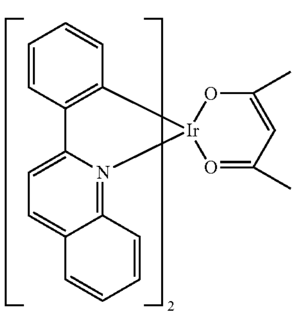
-continued
M-a10
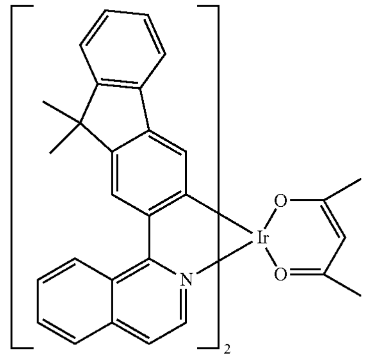
M-a11
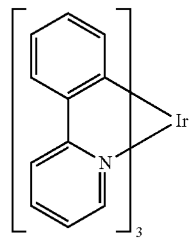
M-a12
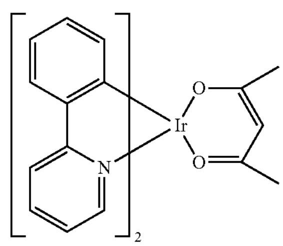
M-a13
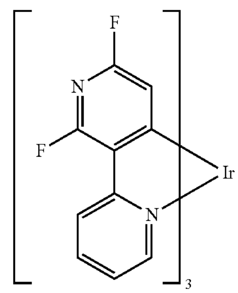
M-a14
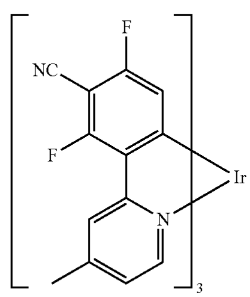

M-a15

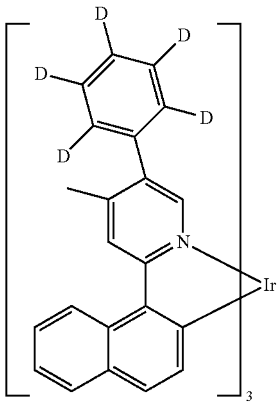

M-a16

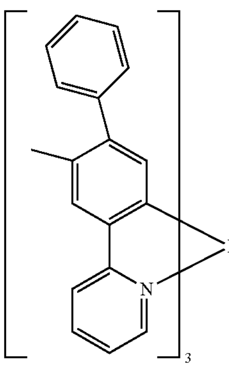

M-a17

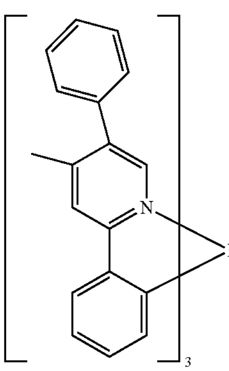

M-a18

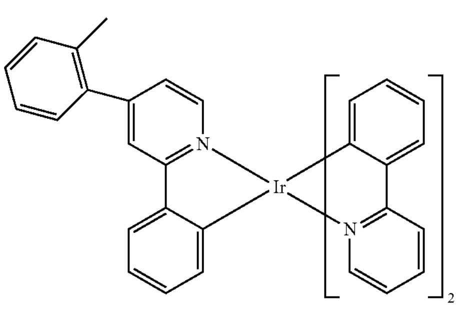

M-a19

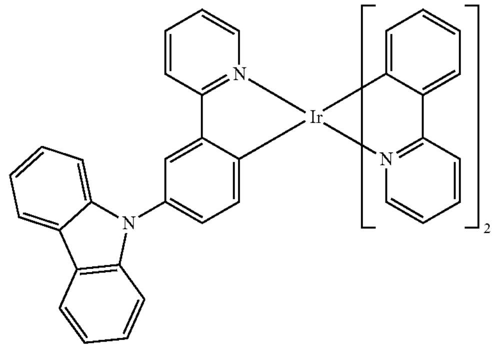

Compound M-a1 and Compound M-a2 may be used as red dopant materials, and Compound M-a3 to Compound M-a5 may be used as green dopant materials.

[Formula M-b]

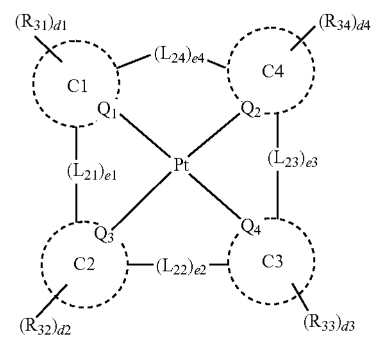

In Formula M-b, $Q_1$ to $Q_4$ may each independently be C or N, C1 to C4 may each independently be a substituted or unsubstituted hydrocarbon ring of 5 to 30 ring-forming carbon atoms, or a substituted or unsubstituted heterocycle of 2 to 30 ring-forming carbon atoms. $L_{21}$ to $L_{24}$ may each independently be a direct linkage,

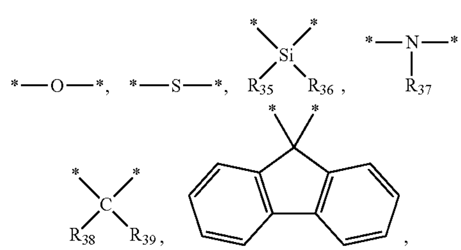

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, and e1 to e4 may each independently be 0 or 1. $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or combined with an adjacent group to form a ring, and d1 to d4 may each independently be an integer from 0 to 4.

The compound represented by Formula M-b may be used as a blue phosphorescence dopant or a green phosphorescence dopant. The compound represented by Formula M-b may be represented by any one of the compounds below. However, the compounds below are illustrations, and the compound represented by Formula M-b is not limited to the compounds represented below.

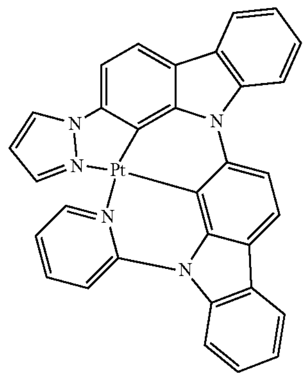

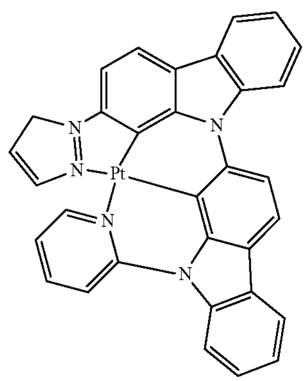

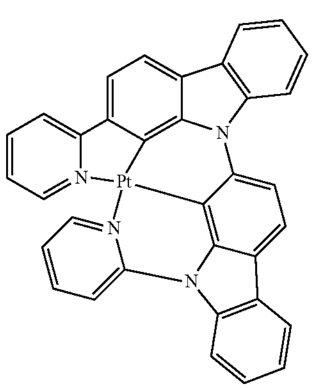

-continued

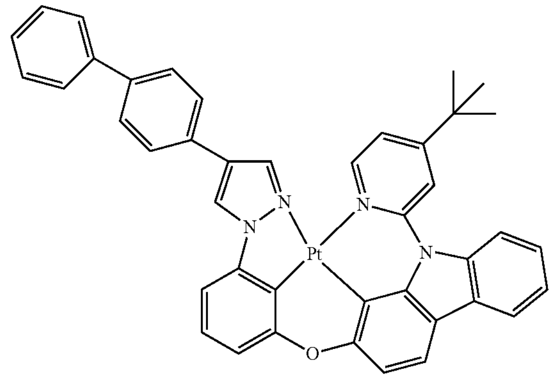

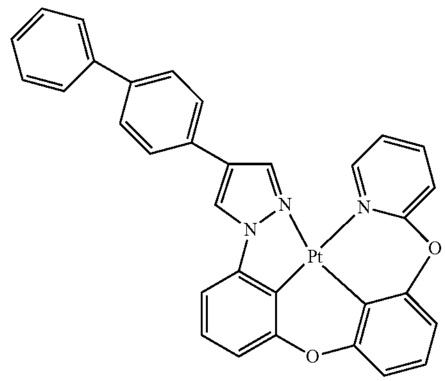

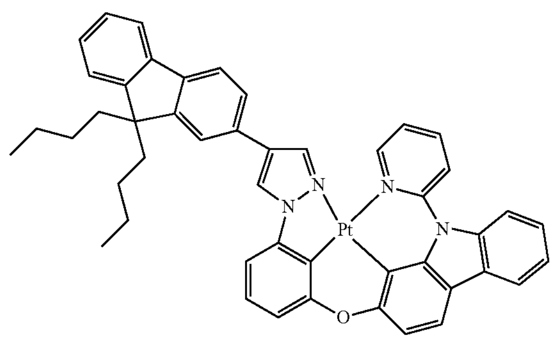

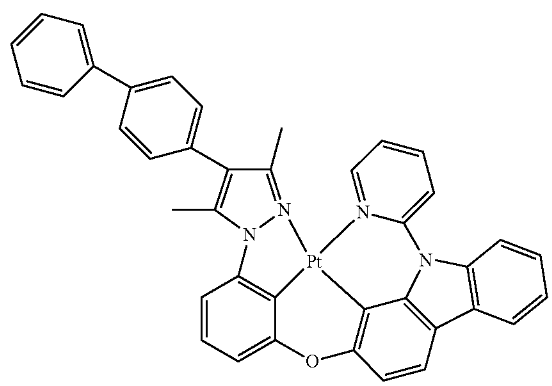

-continued

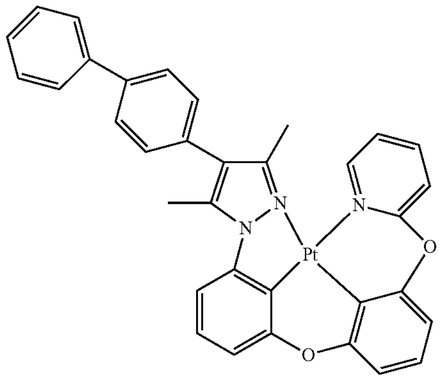

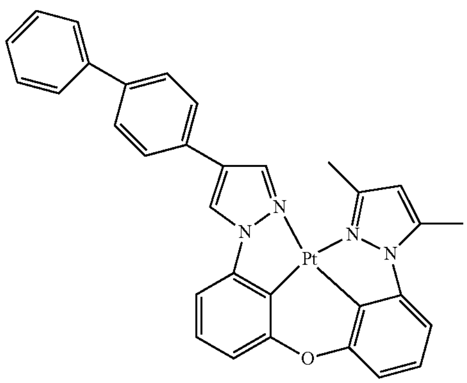

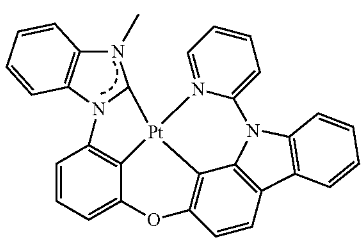

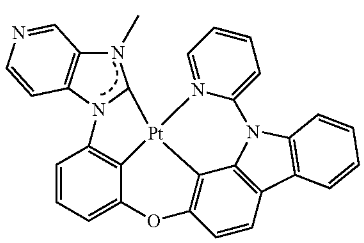

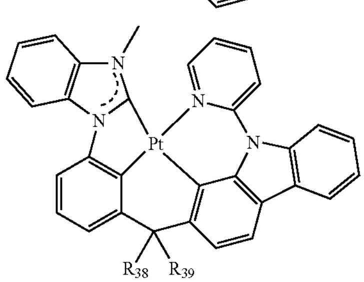

-continued

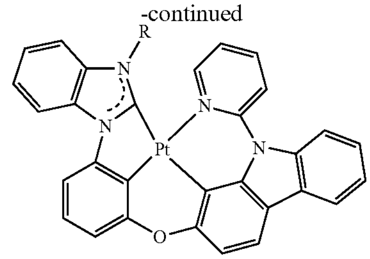

In the compounds above, R, $R_{38}$, and $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

The emission layer EML may include a compound represented by Formula F-a or Formula F-b below. The compounds represented by Formula F-a and Formula F-b below may be used as fluorescence dopant materials.

[Formula F-a]

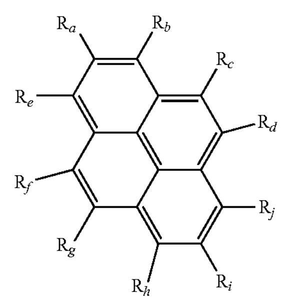

In Formula F-a, two selected from $R_a$ to $R_R$ may each independently be substituted with $$*\text{—}NAr_1Ar_2.$$

The remainder not substituted with $$*\text{—}NAr_1Ar_2$$

among $R_a$ to $R_j$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In $$*\text{—}NAr_1Ar_2,$$

$Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. For example, at least one among $Ar_1$ and $Ar_2$ may be a heteroaryl group including O or S as a ring-forming atom.

[Formula F-b]

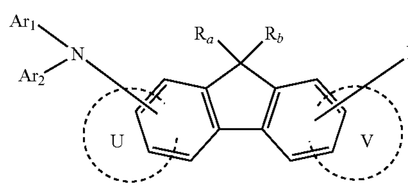

In Formula F-b, $R_a$ and $R_b$ may each independently be a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula F-b, U and V may each independently be a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may each independently be 0 or 1. For example, in Formula F-b, if the number of U or V is 1, one ring forms a fused ring at the designated part by U or V, and if the number of U or V is 0, a ring is not present at the designated part by U or V. For example, if the number of U is 0, and the number of V is 1, or if the number of U is 1, and the number of V is 0, a fused ring having the fluorene core of Formula F-b may be a ring compound with four rings. If the number of both U and V is 0, the fused ring of Formula F-b may be a ring compound with three rings. If the number of both U and V is 1, a fused ring having the fluorene core of Formula F-b may be a ring compound with five rings.

In an embodiment, the emission layer EML may include as a dopant material, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), and 4,4'-bis[2-(4-(N,N-diphenylamino)phenyl)vinyl]biphenyl(DPAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-diphenylamino)pyrene), etc.

The emission layer EML may include a phosphorescence dopant material. For example, the phosphorescence dopant may use a metal complex including iridium (Ir), platinum (Pt), osmium (Os), gold (Au), titanium (Ti), zirconium (Zr), hafnium (Hf), europium (Eu), terbium (Tb) or thulium (Tm). For example, iridium (III) bis(4,6-difluorophenylpyridinato-N,C2')picolinate (FIrpic), bis(2,4-difluorophenylpyridinato)-tetrakis(1-pyrazolyl)borate iridium (III) (Fir6), or platinum octaethyl porphyrin (PtOEP) may be used as the phosphorescence dopant. However, an embodiment is not limited thereto.

In the light emitting devices ED of embodiments, as shown in FIG. 3 to FIG. 6, the electron transport region ETR is provided on the emission layer EML. The electron transport region ETR may include at least one of an electron blocking layer HBL, an electron transport layer ETL or an electron injection layer EIL. However, an embodiment is not limited thereto.

The electron transport region ETR may have a single layer formed using a single material, a single layer formed using different materials, or a multilayer structure having multiple layers formed using different materials.

For example, the electron transport region ETR may have a single layer structure of an electron injection layer EIL or an electron transport layer ETL, or a single layer structure formed using an electron injection material and an electron transport material. For example, the electron transport region ETR may have a single layer structure having multiple different materials, or a structure stacked from the emission layer EML of electron transport layer ETL/electron injection layer EIL, or hole blocking layer HBL/electron transport layer ETL/electron injection layer EIL, without limitation. A thickness of the electron transport region ETR may be, for example, in a range of about 100 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

The electron transport region ETR may include a compound represented by Formula ET-1 below.

[Formula ET-1]

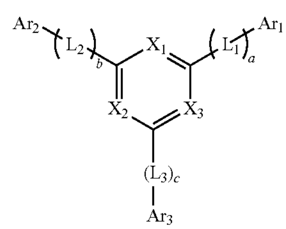

In Formula ET-1, at least one of $X_1$ to $X_3$ may be N, and the remainder may be $CR_{81}$. $R_{81}$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $Ar_1$ to $Ar_3$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms. In case where a to c are integers of 2 or more, $L_1$ to $L_3$ may each independently be a substituted or unsubstituted arylene group of 6 to 30 ring-forming carbon atoms, or a substituted or unsubstituted heteroarylene group of 2 to 30 ring-forming carbon atoms.

The electron transport region ETR may include an anthracene-based compound. However, an embodiment is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris (3'-(pyridin-3-yl)biphenyl-3-yl)-1,3,5-triazine, 2-(4-(N-phenylbenzimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl) anthracene (ADN), 1,3-bis[3,5-di(pyridin-3-yl)phenyl] benzene (BmPyPhB), and mixtures thereof, without limitation.

The electron transport region ETR may include a metal halide such as LiF, NaCl, CsF, RbCl, RbI, CuI and KI, a lanthanide metal such as Yb, or a co-depositing material of the metal halide and the lanthanide metal. For example, the electron transport region ETR may include KI:Yb, RbI:Yb, etc., as the co-depositing material. The electron transport region ETR may use a metal oxide such as $Li_2O$ and BaO, or 8-hydroxy-lithium quinolate (Liq). However, an embodiment is not limited thereto. The electron transport region ETR may also be formed using a mixture material of an electron transport material and an insulating organo metal salt. The organo metal salt may be a material having an energy band gap of equal to or greater than about 4 eV. The organo metal salt may include, for example, metal acetates, metal benzoates, metal acetoacetates, metal acetylacetonates, or metal stearates.

The electron transport region ETR may include at least one of 2,9-dimethyl-4,7-diphenyl-1,10-phenanthroline (BCP), or 4,7-diphenyl-1,10-phenanthroline (Bphen) in addition to the aforementioned materials. However, an embodiment is not limited thereto.

The electron transport region ETR may include the above-described compounds of the electron transport region in at least one of an electron injection layer EIL, an electron transport layer ETL, or a hole blocking layer HBL.

If the electron transport region ETR includes an electron transport layer ETL, a thickness of the electron transport layer ETL may be in a range of about 100 Å to about 1,000 Å. For example, the thickness of the electron transport layer ETL may be in a range of about 150 Å to about 500 Å. If the thickness of the electron transport layer ETL satisfies the above described range, satisfactory electron transport properties may be obtained without inducing substantial increase of a driving voltage. If the electron transport region ETR includes an electron injection layer EIL, a thickness of the electron injection layer EIL may be in a range of about 1 Å to about 100 Å. For example, the thickness of the electron injection layer EIL may be in a range of about 3 Å to about 90 Å. If the thickness of the electron injection layer EIL satisfies the above-described range, satisfactory electron injection properties may be obtained without substantial increase of a driving voltage.

The second electrode EL2 is provided on the electron transport region ETR. The second electrode EL2 may be a common electrode. The second electrode EL2 may be a cathode or an anode, but an embodiment is not limited thereto. For example, if the first electrode EL1 is an anode, the second cathode EL2 may be a cathode, and if the first electrode EL1 is a cathode, the second electrode EL2 may be an anode.

If the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, compounds thereof, or mixtures thereof (for example, AgMg, AgYb, or MgAg). The second electrode EL2 may have a multilayered structure including a reflective layer or a transflective layer formed using the above-described materials and a transparent conductive layer formed using ITO, IZO, ZnO, ITZO, etc. For example, the second electrode EL2 may include the aforementioned metal materials, combinations of two or more metal materials selected from the aforementioned metal materials, or oxides of the aforementioned metal materials.

Though not shown, the second electrode EL2 may be connected with an auxiliary electrode. If the second electrode EL2 is connected with the auxiliary electrode, the resistance of the second electrode EL2 may decrease.

According to an embodiment, on the second electrode EL2 in the light emitting device 10, a capping layer CPL may be further disposed. The capping layer CPL may include a multilayer or a single layer. The refractive index of the capping layer CPL may be equal to or greater than about 1.6. For example, the refractive index of the capping layer CPL with respect to light in a wavelength range of about 550 nm to about 660 nm may be equal to or greater than about 1.6.

In an embodiment, the capping layer CPL may be an organic layer or an inorganic layer. For example, if the capping layer CPL includes an inorganic material, the inorganic material may include an alkali metal compound such as LiF, an alkaline earth metal compound such as $MgF_2$, SiON, SiNx, SiOy, etc.

For example, if the capping layer CPL includes an organic material, the organic material may include α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol sol-9-yl)triphenylamine (TCTA), etc., or includes an epoxy resin, or acrylate such as methacrylate. The capping layer CPL may include at least one of Compounds P1 to P5 below, but an embodiment is not limited thereto.

P1

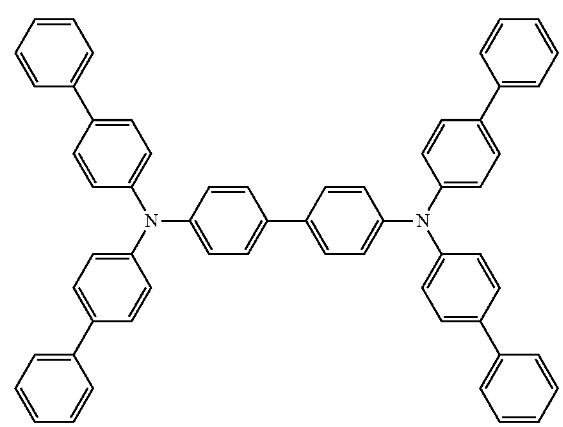

P2

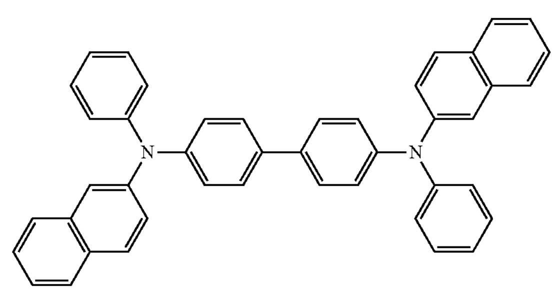

-continued

P3

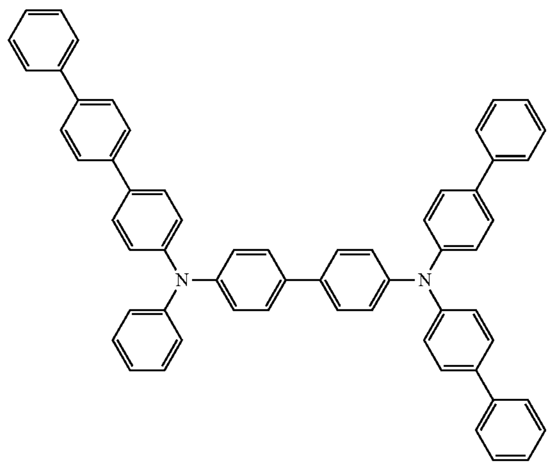

P4

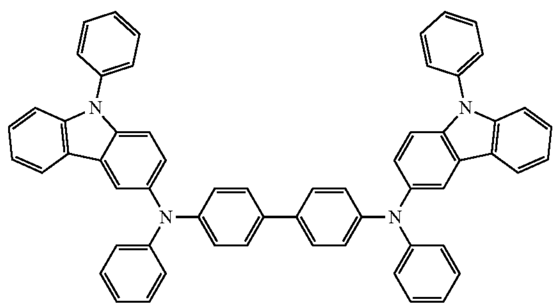

P5

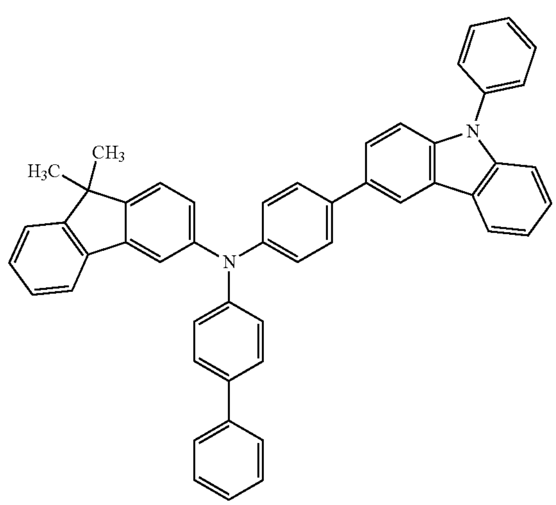

Figure 7:
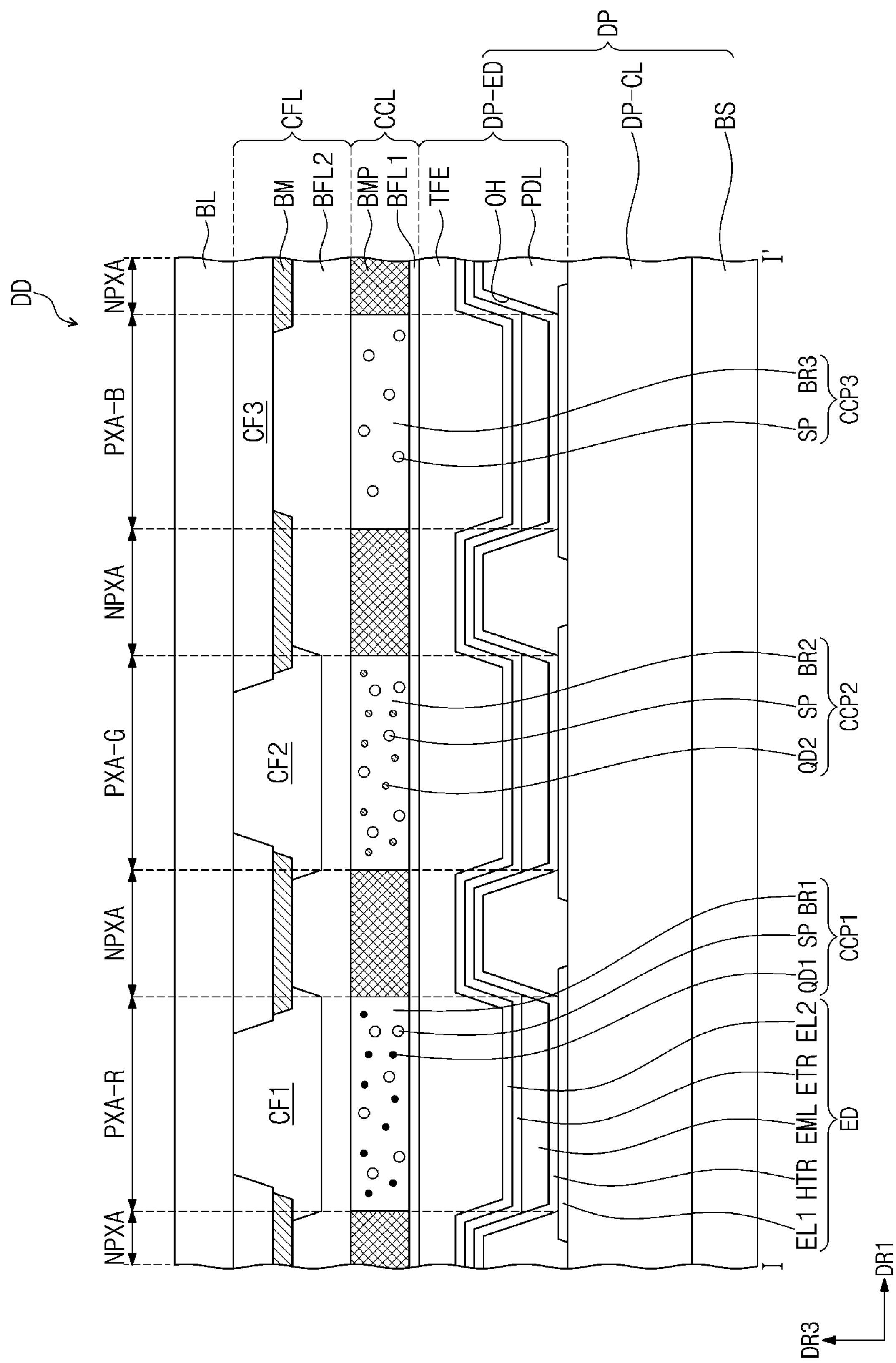
FIG. 7 is a schematic cross-sectional view showing a display apparatus according to an embodiment.
Figure 8:
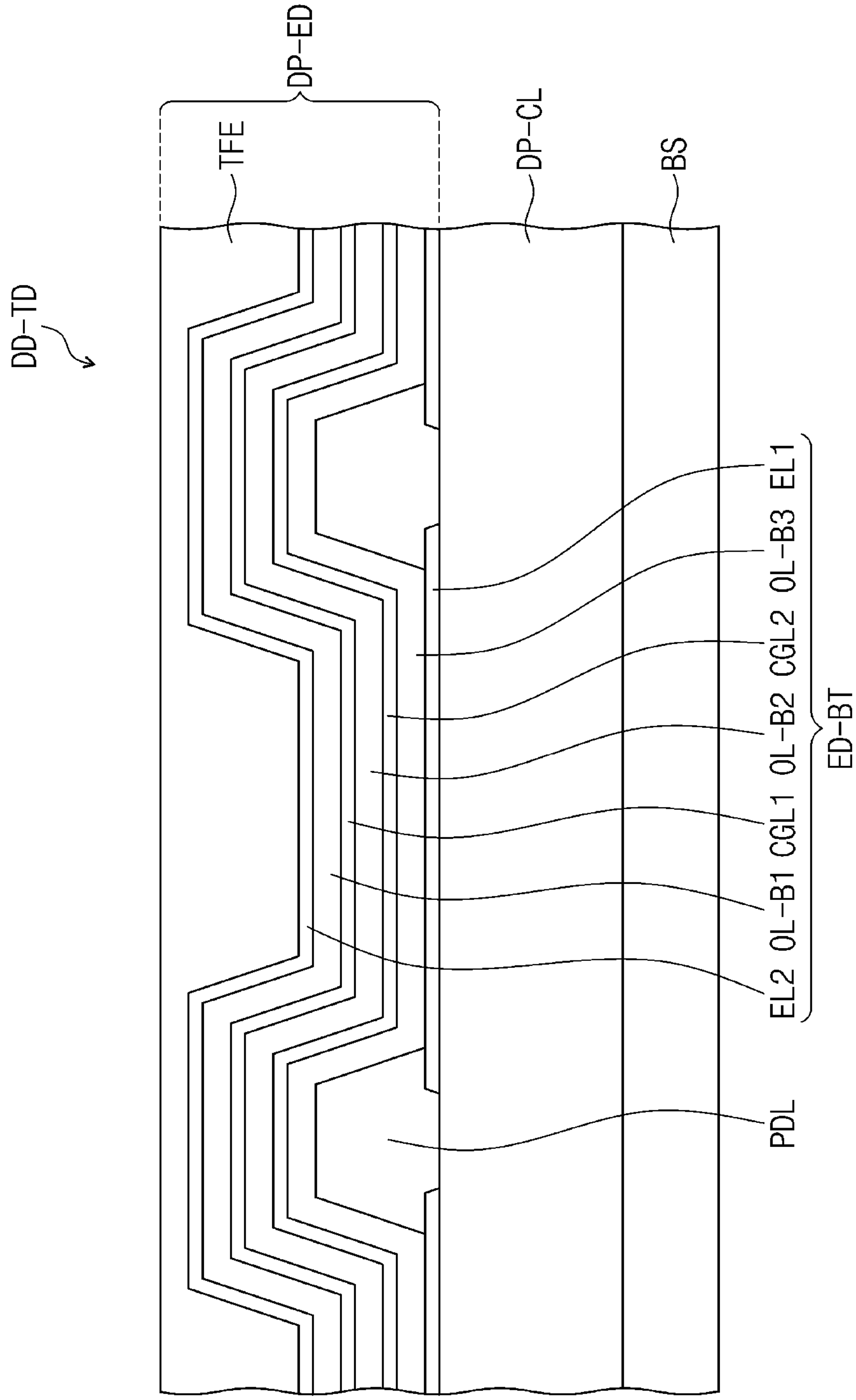
FIG. 8 is a schematic cross-sectional view showing a display apparatus according to an embodiment.

FIG. 7 and FIG. 8 are schematic cross-sectional views of display apparatuses according to embodiments. In the explanation on the display apparatuses of embodiments, referring to FIG. 7 and FIG. 8, the overlapping parts with the explanation on FIG. 1 to FIG. 6 will not be explained again, and the different features will be explained chiefly.

Referring to FIG. 7, the display apparatus DD according to an embodiment may include a display panel DP including a display device layer DP-ED, a light controlling layer CCL disposed on the display panel DP, and a color filter layer CFL.

In an embodiment shown in FIG. 7, the display panel DP includes a base layer BS, a circuit layer DP-CL provided on the base layer BS, and a display device layer DP-ED, and the display device layer DP-ED may include a light emitting device ED.

The light emitting device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. The same structures of the light emitting devices of FIG. 4 to FIG. 6 may be applied to the structure of the light emitting device ED shown in FIG. 7.

Referring to FIG. 7, the emission layer EML may be disposed in an opening part OH defined in a pixel definition layer PDL. For example, the emission layer EML divided by the pixel definition layer PDL and correspondingly provided to each of luminous areas PXA-R, PXA-G, and PXA-B may emit light in a same wavelength region. In the display apparatus DD of an embodiment, the emission layer EML may emit blue light. Different from the drawings, in another embodiment, the emission layer EML may be provided as a common layer for all luminous areas PXA-R, PXA-G, and PXA-B.

The light controlling layer CCL may be disposed on the display panel DP. The light controlling layer CCL may include a light converter. The light converter may be a quantum dot or a phosphor. The light converter may transform a wavelength of light provided and then emit converted light. For example, the light controlling layer CCL may be a layer including a quantum dot or a layer including a phosphor.

The light controlling layer CCL may include multiple light controlling parts CCP1, CCP2, and CCP3. The light controlling parts CCP1, CCP2, and CCP3 may be separated from one another.

Referring to FIG. 7, partition pattern BMP may be disposed between the separated light controlling parts CCP1, CCP2, and CCP3, but an embodiment is not limited thereto. In FIG. 7, the partition pattern BMP is shown not to be overlapped with the light controlling parts CCP1, CCP2, and CCP3, but at least a portion of the edge of the light controlling parts CCP1, CCP2, and CCP3 may be overlapped with the partition pattern BMP.

The light controlling layer CCL may include a first light controlling part CCP1 including a first quantum dot QD1 converting first color light provided from the light emitting device ED into second color light, a second light controlling part CCP2 including a second quantum dot QD2 converting first color light into third color light, and a third light controlling part CCP3 transmitting first color light.

In an embodiment, the first light controlling part CCP1 provides red light which is the second color light, and the second light controlling part CCP2 may provide green light which is the third color light. The third color controlling part CCP3 may transmit and provide blue light which is the first color light provided from the light emitting device ED. For example, the first quantum dot QD1 may be a red quantum dot, and the second quantum dot QD2 may be a green quantum dot.

The quantum dots QD1 and QD2 are materials having a crystal structure with a few nanometer size, are composed of about hundreds to thousands of atoms, and may show quantum confinement effects increasing an energy band gap due to a small size. If light having a wavelength with higher energy than the band gap is incident to the quantum dots QD1 and QD2, the quantum dots QD1 and QD2 absorb light to be in an excited state and then fall to a ground state while emitting light of a specific wavelength. The light of an emitted wavelength has a value corresponding to the band gap. If the size and composition of the quantum dots QD1 and QD2 are controlled, light-emitting properties by the quantum confinement effects may be controlled. The quantum dots QD1 and QD2 may be selected from II-VI group compounds, III-V group compounds, IV-VI group compounds, IV group elements, IV group compounds, I-III-VI group compounds, and combinations thereof. If the quantum dots QD1 and QD2 are binary compounds, ternary compounds, or quaternary compounds, each may be present in uniform concentration in a particle, or in a state with partially different concentration distribution in the same particle. The quantum dots QD1 and QD2 may have a core/shell structure in which one quantum dot surrounds the other quantum dot. The interface of a core and a shell may have concentration gradient with the decreasing concentration of an element present in the shell toward the center.

The light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but include the scatterer SP.

The scatterer SP may be an inorganic particle. For example, the scatterer SP may include at least one of $TiO_2$, ZnO, $Al_2O_3$, $SiO_2$, and hollow silica. The scatterer SP may include at least one of $TiO_2$, ZnO, $Al_2O_3$, $SiO_2$, and hollow silica, or may be a mixture of two or more materials selected among $TiO_2$, ZnO, $Al_2O_3$, $SiO_2$, and hollow silica.

Each of the first light controlling part CCP1, the second light controlling part CCP2, and the third light controlling part CCP3 may include base resins BR1, BR2, and BR3 dispersing the quantum dots QD1 and QD2 and the scatterer SP. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatter SP dispersed in the third base resin BR3. The base resins BR1, BR2, and BR3 are mediums in which the quantum dots QD1 and QD2 and the scatterer SP are dispersed, and may be composed of various resin compositions which may be generally referred to as a binder. For example, the base resins BR1, BR2, and BR3 may be acrylic resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 may be the same or different from each other.

The light controlling layer CCL may include a barrier layer BFL1. The barrier layer BFL1 may play the role of blocking the penetration of moisture and/or oxygen (hereinafter, will be referred to as "humidity/oxygen"). The barrier layer BFL1 may be disposed on the light controlling parts CCP1, CCP2, and CCP3 to block the exposure of the light controlling parts CCP1, CCP2, and CCP3 to humidity/oxygen. The barrier layer BFL1 may cover the light controlling parts CCP1, CCP2, and CCP3. A barrier layer BFL2 may be provided between the light controlling parts CCP1, CCP2, and CCP3 and a color filter layer CFL.

Barrier layers BFL1 and BFL2 may include at least one inorganic layer. For example, the barrier layers BFL1 and BFL2 may be formed by including an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide and silicon oxynitride, or a metal thin film securing light transmittance. The barrier layers BFL1 and BFL2 may further include an organic layer. The barrier layers BFL1 and BFL2 may be composed of a single layer or of multiple layers.

In the display apparatus DD of an embodiment, the color filter layer CFL may be disposed on the light controlling layer CCL. For example, the color filter layer CFL may be disposed directly on the light controlling layer CCL, and the barrier layer BFL2 may be omitted.

The color filter layer CFL may include a light blocking part BM and filters CF-B, CF-G, and CF-R. The color filter layer CFL may include a first filter CF1 transmitting second color light, a second filter CF2 transmitting third color light, and a third filter CF3 transmitting first color light. For example, the first filter CF1 may be a red filter, the second filter CF2 may be a green filter, and the third filter CF3 may be a blue filter. Each of the filters CF1, CF2, and CF3 may include a polymer photosensitive resin and a pigment or dye. The first filter CF1 may include a red pigment or dye, the second filter CF2 may include a green pigment or dye, and the third filter CF3 may include a blue pigment or dye. However, an embodiment is not limited thereto, and the third filter CF3 may not include a pigment or dye. The third filter CF3 may include a polymer photosensitive resin and not include a pigment or dye. The third filter CF3 may be transparent. The third filter CF3 may be formed using a transparent photosensitive resin.

In an embodiment, the first filter CF1 and the second filter CF2 may be yellow filters. The first filter CF1 and the second filter CF2 may be provided in one body without distinction.

The light blocking part BM may be a black matrix. The light blocking part BM may be formed by including an organic light blocking material or an inorganic light blocking material including a black pigment or black dye. The light blocking part BM may prevent light leakage phenomenon and divide the boundaries among adjacent filters CF1, CF2, and CF3. In an embodiment, the light blocking part BM may be formed as a blue filter.

Each of the first to third filters CF1, CF2, and CF3 may be disposed corresponding to each of a red luminous area PXA-R, green luminous area PXA-G, and blue luminous area PXA-B.

On the color filter layer CFL, a base substrate BL may be disposed. The base substrate BL may be a member providing a base surface on which the color filter layer CFL, the light controlling layer CCL, etc. are disposed. The base substrate BL may be a glass substrate, a metal substrate, a plastic substrate, etc. However, an embodiment is not limited thereto, and the base substrate BL may be an inorganic layer, an organic layer, or a composite material layer. In contrast to the drawing, the base substrate BL may be omitted in an embodiment.

FIG. 8 is a schematic cross-sectional view showing a portion of the display apparatus according to an embodiment. In FIG. 8, the schematic cross-sectional view of a portion corresponding to the display panel DP in FIG. 7 is shown. In a display apparatus DD-TD of an embodiment, the light emitting device ED-BT may include multiple light emitting structures OL-B1, OL-B2, and OL-B3. The light emitting device ED-BT may include oppositely disposed first electrode EL1 and second electrode EL2, and the multiple light emitting structures OL-B1, OL-B2, and OL-B3 stacked in order in a thickness direction and provided between the first electrode EL1 and the second electrode EL2. Each of the light emitting structures OL-B1, OL-B2, and OL-B3 may include an emission layer EML (FIG. 7), and a hole transport region HTR, and an electron transport region ETR disposed, with the emission layer EML (FIG. 7) therebetween.

For example, the light emitting device ED-BT included in the display apparatus DD-TD of an embodiment may be a light emitting device of a tandem structure including multiple emission layers. At least one emission layer among multiple emission layers may include the polycyclic compound of an embodiment.

In an embodiment shown in FIG. 8, light emitted from each of the light emitting structures OL-B1, OL-B2, and OL-B3 may be all blue light. However, an embodiment is not limited thereto, and the wavelength regions of light emitted from the light emitting structures OL-B1, OL-B2, and OL-B3 may be different from each other. For example, the light emitting device ED-BT including the multiple light emitting structures OL-B1, OL-B2, and OL-B3 emitting light in different wavelength regions may emit white light.

Between neighboring light emitting structures OL-B1, OL-B2, and OL-B3, charge generating layers CGL1 and CGL2 may be disposed. The charge generating layers CGL1 and CGL2 may include a p-type charge generating layer and/or an n-type charge generating layer.

Hereinafter, the compound according to an embodiment and the light emitting device of an embodiment will be explained referring to embodiments and comparative embodiments. The following embodiments are only illustrations to assist the understanding of the disclosure, and the embodiments are not limited thereto.

EXAMPLES

1. Synthesis of Polycyclic Compound of an Embodiment

A synthesis method of the polycyclic compound according to an embodiment will be explained in particular illustrating the synthesis methods of Compounds 74, 76, 82, 89, 91, 94, 96, 146 and 149. The synthesis methods of the polycyclic compounds explained hereinafter are embodiments, and a synthesis method of a compound according to an embodiment is not limited to the following embodiments.

(1) Synthesis of Compound 74

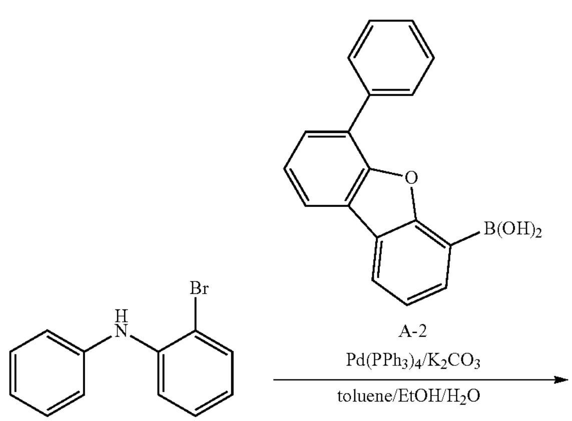

A-1 A-2

-continued

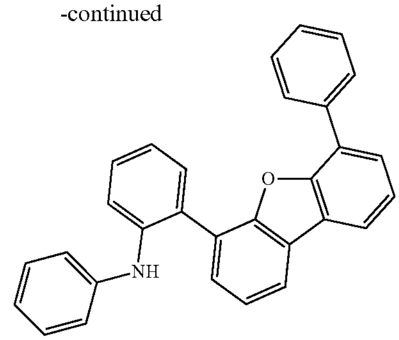

A-3

Synthesis of Intermediate A-3

A-1 (10 g, 40 mmol), A-2 (12 g, 40 mmol), $Pd(PPh_3)_4$ (2.3 g, 2 mmol), and $K_2CO_3$ (5.8 g, 42 mmol) were added to a 500 ml, three-neck flask, and under an argon atmosphere, 200 ml of toluene, 17 ml of ethanol and 34 ml of water were added thereto, followed by reacting with heating and stirring at about 80° C. for about 6 hours. To the reaction solution thus obtained, a saline solution was added, an aqueous layer was removed, and an organic layer was extracted. The organic layer was dried with magnesium sulfate ($MgSO_4$), a solid was filtered, and a filtrate was concentrated using a rotary evaporator and separated by column chromatography (eluent:toluene/hexane=1/2). By FAB-MS, a molecular weight was secured. The white solid thus obtained was 10 g (yield 63%), m/z=412 was obtained from the FAB-MS measurement, and the preparation of the target material A-3 was confirmed.

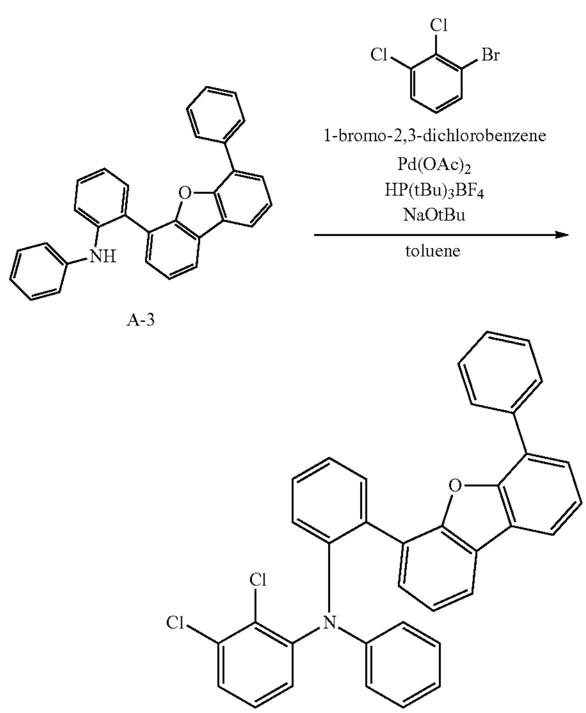

A-4

Synthesis of Intermediate A-4

A-3 (10 g, 24 mmol), 1-bromo-2,3-dichlorobenzene (5.5 g, 24 mmol), $Pd(OAc)_2$ (0.1 g, 0.5 mmol), $HP(tBu)_3BF_4$ (0.3 g, 1.0 mmol), and NaOtBu (2.5 g, 26 mmol) were added to a 200 ml, three-neck flask, and under an argon atmosphere, 120 ml of toluene was added, followed by reacting with heating and stirring at about 80° C. for about 6 hours. The reaction solution thus obtained was separated into a solid and a liquid using Florisil, and the liquid was concentrated using a rotary evaporator. The crude product thus obtained was separated by column chromatography (eluent:toluene/hexane=1/2) and a molecular weight was secured by FAB-MS. The white solid thus obtained was 11 g (yield 82%), m/z=556 was obtained from the FAB-MS measurement, and the preparation of the target material A-4 was confirmed.

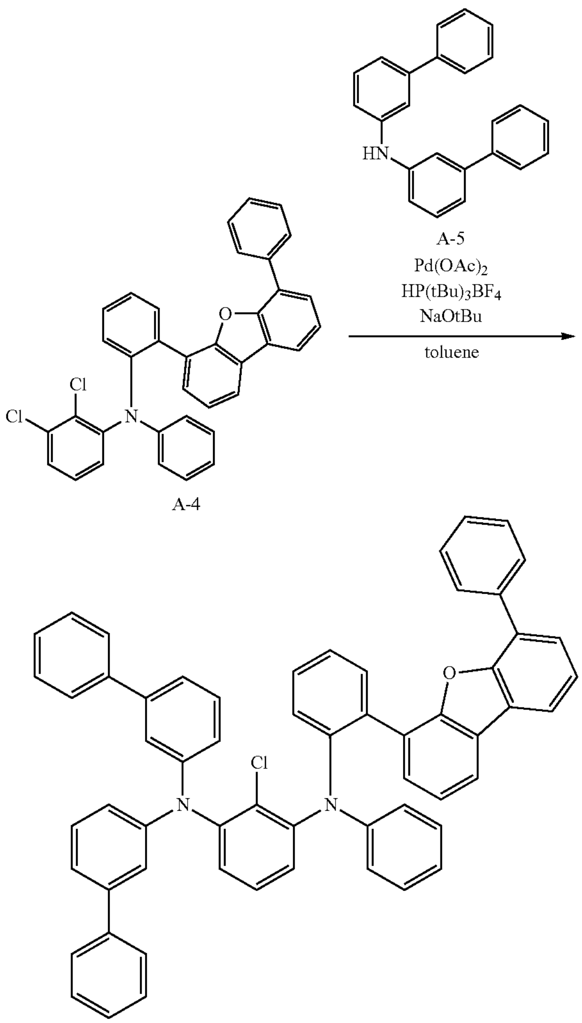

Synthesis of Intermediate A-6

A-4 (11 g, 20 mmol), A-5 (6.3 g, 20 mmol), $Pd(OAc)_2$ (0.1 g, 0.5 mmol), $HP(tBu)_3BF_4$ (0.3 g, 1.0 mmol), and NaOtBu (2.0 g, 21 mmol) were added to a 200 ml, three-neck flask, and under an argon atmosphere, 100 ml of toluene was added, followed by reacting with heating and stirring for about 6 hours. The reaction solution thus obtained was separated into a solid and a liquid using Florisil, and the liquid was concentrated using a rotary evaporator. The crude product thus obtained was separated by column chromatography (eluent:toluene/hexane=1/1) and a molecular weight was secured by FAB-MS. The white solid thus obtained was 13 g (yield 80%), m/z=841 was obtained from the FAB-MS measurement, and the preparation of the target material A-6 was confirmed.

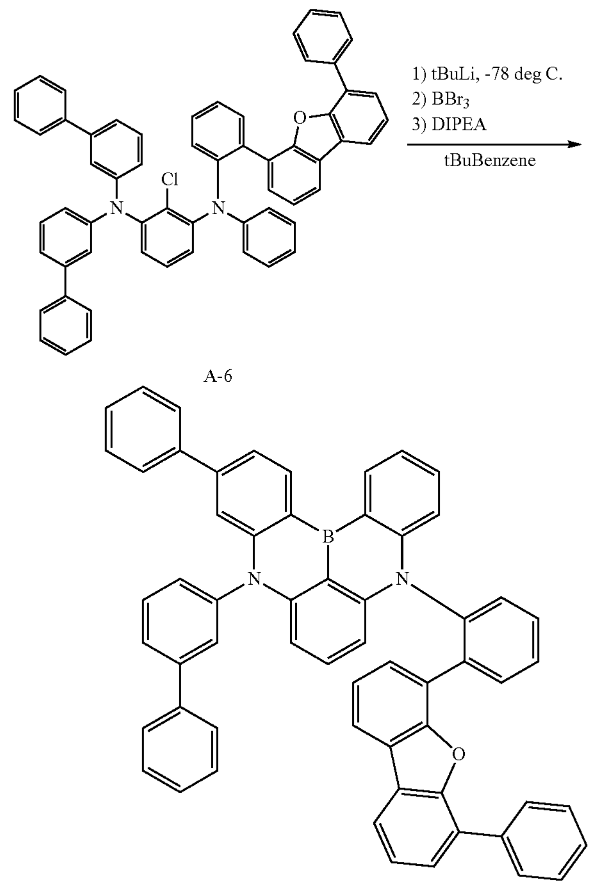

Compound 74

Synthesis of Compound 74

To a 200 ml, three-neck flask, A-6 (11 g, 13 mmol) was added and dried, and under an argon atmosphere, 77 ml of t-butylbenzene was added thereto. After cooling to about −78° C., a tBuLi solution (1.60 M in pentane, 16 ml, 26 mmol) was slowly added, and heating and stirring was performed at about 60° C. for about 3 hours. After that, the temperature was reduced to about −78° C., and $BBr_3$ (2.5 ml, 26 mmol) was added and stirred at room temperature for about 30 minutes. To the reaction product thus obtained in an ice bath, N,N-diisopropylethylamine (DIPEA, 5 ml, 26 mmol) was added, followed by heating and stirring at about 120° C. for about 3 hours. The reaction product was cooled in room temperature, and methanol (MetOH) was added to precipitate a solid. Through ultrasonic cleaning, the precipitate was recovered. The crude product thus precipitated was separated by column chromatography (eluent:toluene/hexane=1/1), and its molecular weight was secured by FAB-MS. The yellow solid thus obtained was 1.0 g (yield 10%), m/z=814 was obtained from the FAB-MS measurement, and the preparation of Compound 74 was confirmed. The Compound 74 thus obtained was further separated by sublimation purification and was used for the manufacture of a device.

(2) Synthesis of Compound 76

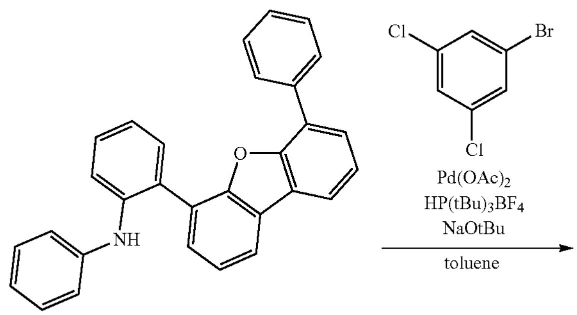

A-3

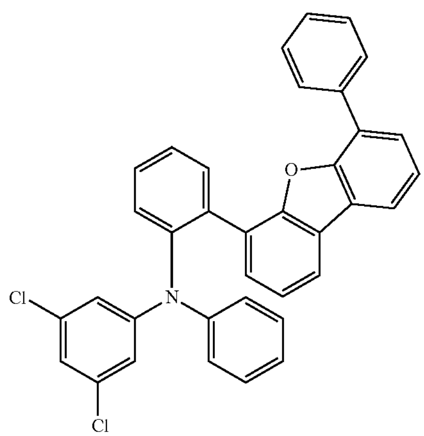

B-1

Synthesis of Intermediate B-1

The same method for preparing A-4 was performed except for using 1-bromo-3,5-dichlorobenzene (5.5 g, 24 mmol) instead of 1-bromo-2,3-dichlorobenzene. The crude product thus obtained was separated by column chromatography (eluent:toluene/hexane=1/2), and its molecular weight was secured by FAB-MS. The white solid thus obtained was 12 g (yield 85%), m/z=556 was obtained from the FAB-MS measurement, and the preparation of the target material B-1 was confirmed.

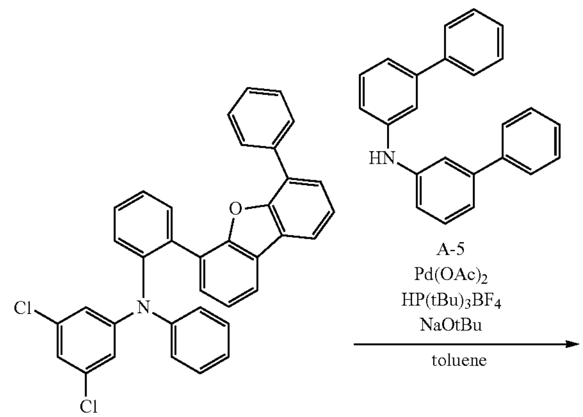

B-1

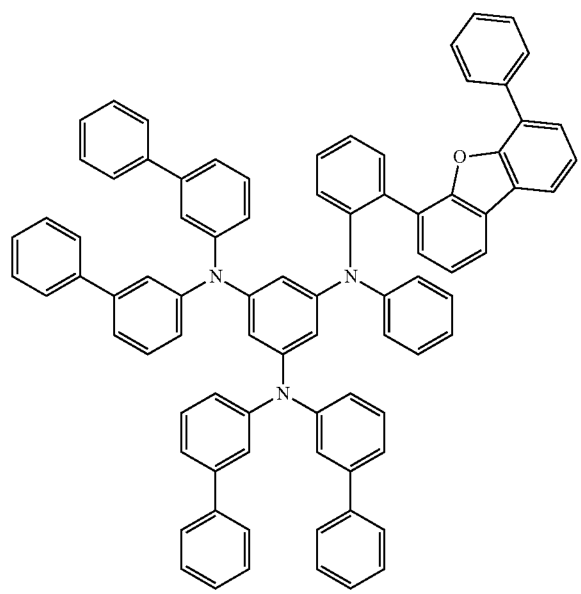

B-2

Synthesis of Intermediate B-2

The same method for preparing A-6 was performed using B-1 (11 g, 20 mmol) and A-5 (12.7 g, 40 mmol). The crude product thus obtained was separated by column chromatography (eluent:toluene/hexane=1/1), and its molecular weight was secured by FAB-MS. The white solid thus obtained was 19 g (yield 84%), m/z=1126 was obtained from the FAB-MS measurement, and the preparation of the target material B-2 was confirmed

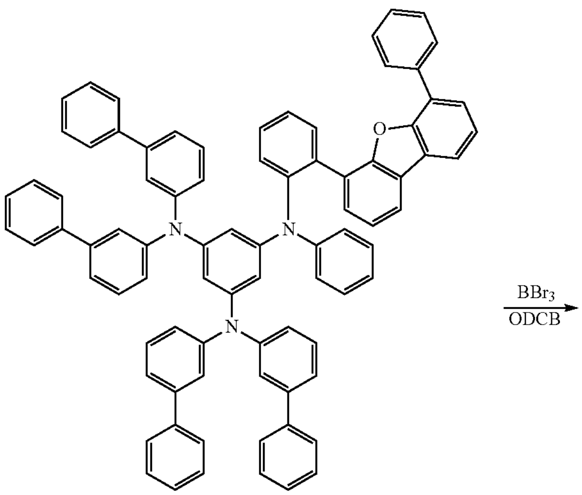

B-2

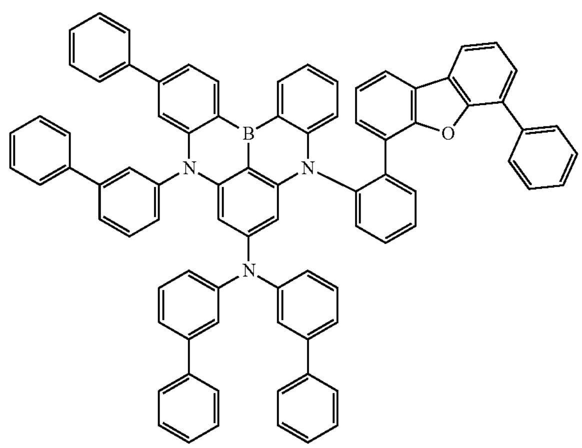

Compound 76

Synthesis of Compound 76

To a 200 ml, three-neck flask, B-2 (18 g, 16 mmol) was added and dried, and under an Ar atmosphere, 80 ml of o-dichlorobenzene (ODCB) was added thereto, and $BBr_3$ (3.0 ml, 32 mmol) was added and stirred at about 180° C. for about 8 hours. To the reaction product thus obtained in an ice bath, N,N-diisopropylethylamine (17 ml, 96 mmol) was added, followed by stirring at room temperature. To the reaction product, methanol was added to precipitate a solid. Through ultrasonic cleaning, the precipitate was recovered. The crude product thus precipitated was separated by column chromatography (eluent:toluene/hexane=1/1), and its molecular weight was secured by FAB-MS. The yellow solid thus obtained was 5.8 g (yield 32%), m/z=1134 was obtained from the FAB-MS measurement, and the preparation of Compound 76 was confirmed. The Compound 76 thus obtained was further separated by sublimation purification and was used for the manufacture of a device.

(3) Synthesis of Compound 82

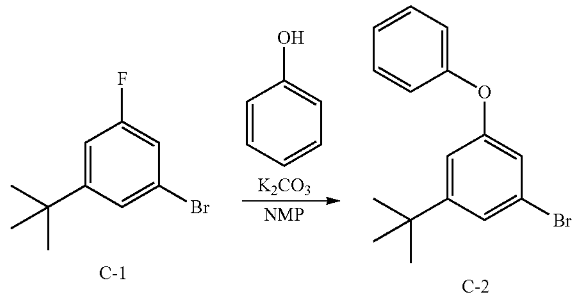

C-1 C-2

Synthesis of Intermediate C-2

C-1 (10 g, 43 mmol), phenol (7.3 g, 87 mmol), and $K_2CO_3$ (6.3 g, 45 mmol) were added to a 200 ml, three-neck flask, and under an argon atmosphere, 87 ml of N-methylpyrrolidone was added thereto, followed by reacting with heating and stirring at about 180° C. for about 6 hours. To the reaction solution thus obtained, a saline solution and toluene were added, an aqueous layer was removed, and an organic layer was extracted. The organic layer was dried with magnesium sulfate, a solid was filtered, and a filtrate was concentrated using a rotary evaporator and separated by column chromatography (eluent:hexane). By FAB-MS, a molecular weight was secured. The white solid thus obtained was 12 g (yield 73%), m/z=412 was obtained from the FAB-MS measurement, and the preparation of the target material C-2 was confirmed.

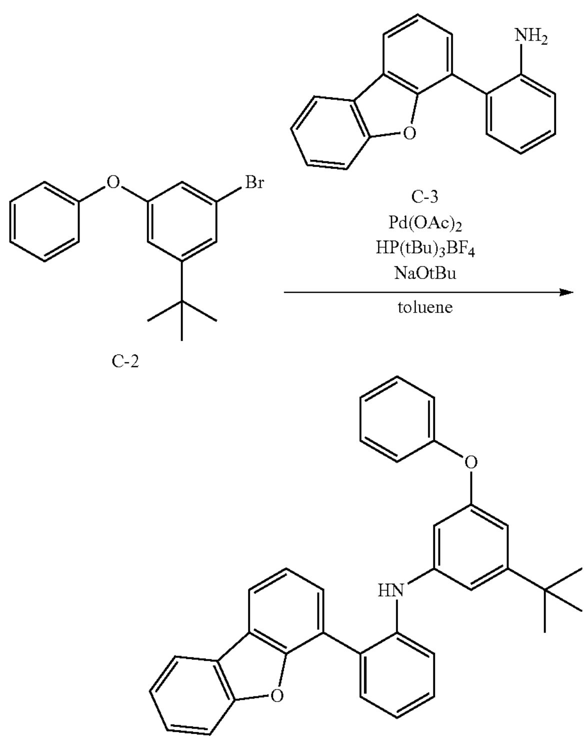

C-4

Synthesis of Intermediate C-4

C-2 (13 g, 43 mmol), C-3 (11 g, 42 mmol), $Pd(OAc)_2$ (0.2 g, 0.9 mmol), $HP(tBu)_3BF_4$ (0.50 g, 1.7 mmol), and NaOtBu (4.3 g, 45 mmol) were added to a 500 ml, three-neck flask, and under an argon atmosphere, 210 ml of toluene was added, followed by reacting with heating and stirring at about 80° C. for about 6 hours. The reaction solution thus obtained was separated into a solid and a liquid using Florisil, and the liquid was concentrated using a rotary evaporator. The crude product thus obtained was separated by column chromatography (eluent:toluene/hexane=1/2) and a molecular weight was secured by FAB-MS. The white solid thus obtained was 16 g (yield 78%), m/z=484 was obtained from the FAB-MS measurement, and the preparation of the target material C-4 was confirmed.

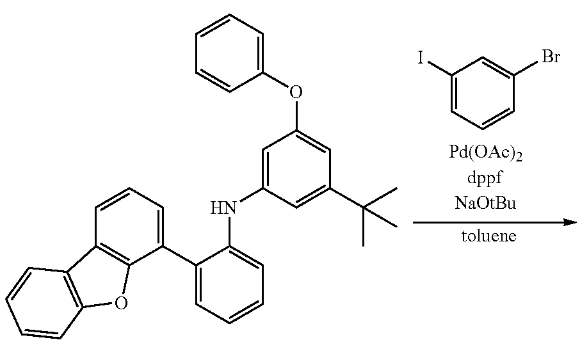

C-4

-continued

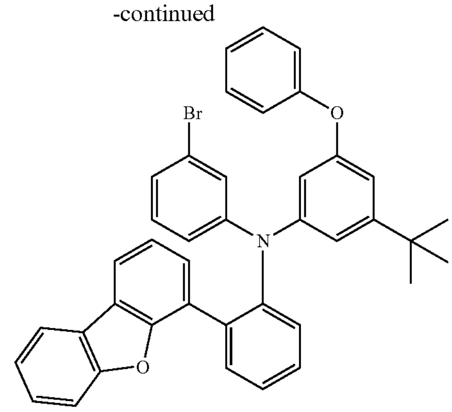

C-5

Synthesis of Intermediate C-5

C-4 (16 g, 33 mmol), 1-bromo-3-iodobenzene (9.4 g, 33 mmol), $Pd(OAc)_2$ (0.15 g, 0.7 mmol), diphenylphosphinoferrocene (dppf, 0.73 g, 1.3 mmol), and NaOtBu (3.3 g, 35 mmol) were added to a 500 ml, three-neck flask, and under an argon atmosphere, 160 ml of toluene was added, followed by reacting with heating and stirring at about 80° C. for about 6 hours. The reaction solution thus obtained was separated into a solid and a liquid using Florisil, and the liquid was concentrated using a rotary evaporator. The crude product thus obtained was separated by column chromatography (eluent:toluene/hexane=1/2) and a molecular weight was secured by FAB-MS. The white solid thus obtained was 19 g (yield 88%), m/z=638 was obtained from the FAB-MS measurement, and the preparation of the target material C-5 was confirmed.

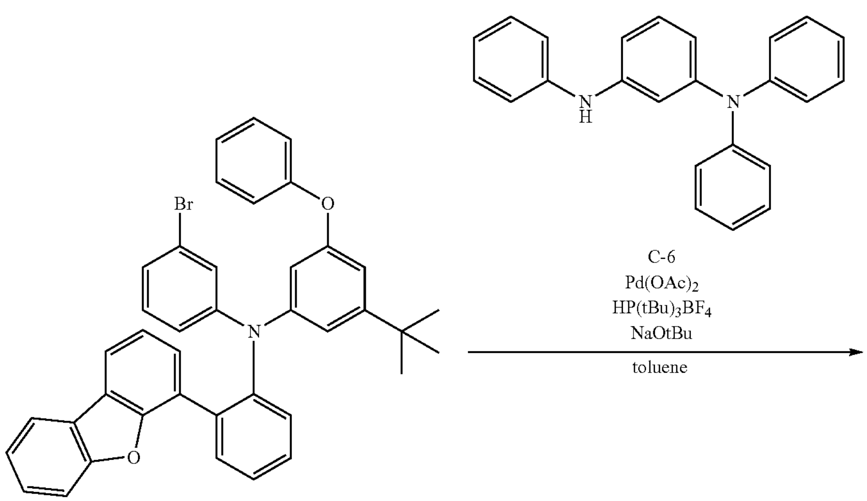

C-5

-continued

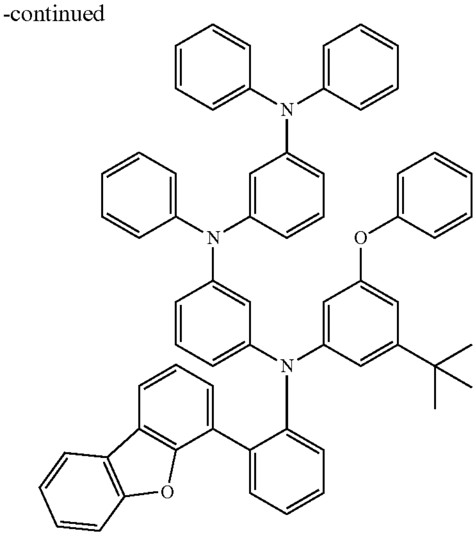

C-7

Synthesis of Intermediate C-7

C-5 (16 g, 25 mmol), C-6 (8.4 g, 42 mmol), $Pd(OAc)_2$ (0.1 g, 0.5 mmol), $HP(tBu)_3BF_4$ (0.29 g, 1.0 mmol), and NaOtBu (2.5 g, 26 mmol) were added to a 200 ml, three-neck flask, and under an argon atmosphere, 130 ml of toluene was added, followed by reacting with heating and stirring at about 80° C. for about 6 hours. The reaction solution thus obtained was separated into a solid and a liquid using Florisil, and the liquid was concentrated using a rotary evaporator. The crude product thus obtained was separated by column chromatography (eluent:toluene/hexane=1/2) and a molecular weight was secured by FAB-MS. The white solid thus obtained was 18 g (yield 80%), m/z=894 was obtained from the FAB-MS measurement, and the preparation of the target material C-7 was confirmed.

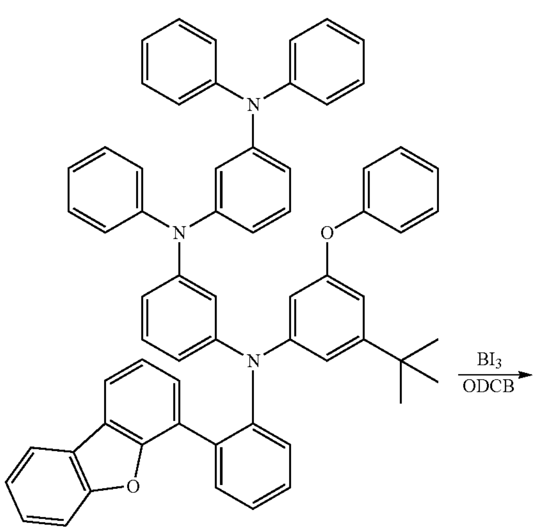

C-7

-continued

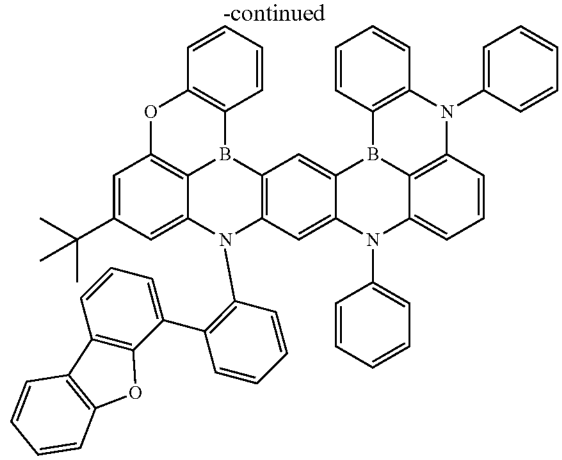

Compound 82

Synthesis of Compound 82

To a 200 ml, three-neck flask, C-7 (18 g, 20 mmol) was added and dried, and under an argon atmosphere, $BI_3$ (47 g, 121 mmol) and 100 ml of o-dichlorobenzene were added thereto and stirred at about 180° C. for about 8 hours. To the reaction product thus obtained in an ice bath, N,N-diisopropylethylamine (63 ml, 362 mmol) was added, followed by stirring at room temperature. To the reaction product, methanol was added to precipitate a solid. Through ultrasonic cleaning, the precipitate was recovered. The crude product thus precipitated was separated by column chromatography (eluent:toluene/hexane=1/1), and its molecular weight was secured by FAB-MS. The yellow solid thus obtained was 2.7 g (yield 15%), m/z=909 was obtained from the FAB-MS measurement, and the preparation of Compound 82 was confirmed. The Compound 82 thus obtained was further separated by sublimation purification and was used for the manufacture of a device.

(4) Synthesis of Compound 89

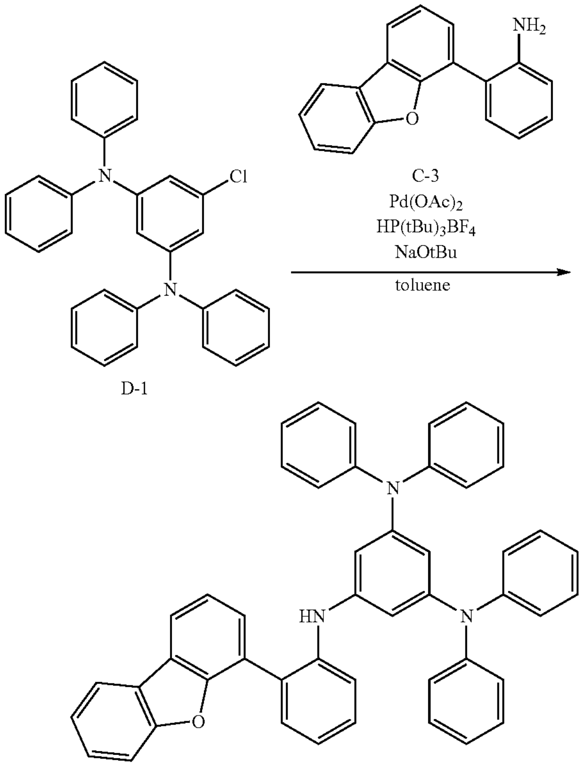

D-2

Synthesis of Intermediate D-2

The same method for preparing C-4 was performed using D-1 (15 g, 34 mmol) and C-3 (8.7 g, 34 mmol). The crude product thus obtained was separated by column chromatography (eluent:dichloromethane/hexane=1/3), and its molecular weight was secured by FAB-MS. The white solid thus obtained was 18 g (yield 80%), m/z=670 was obtained from the FAB-MS measurement, and the preparation of the target material D-2 was confirmed.

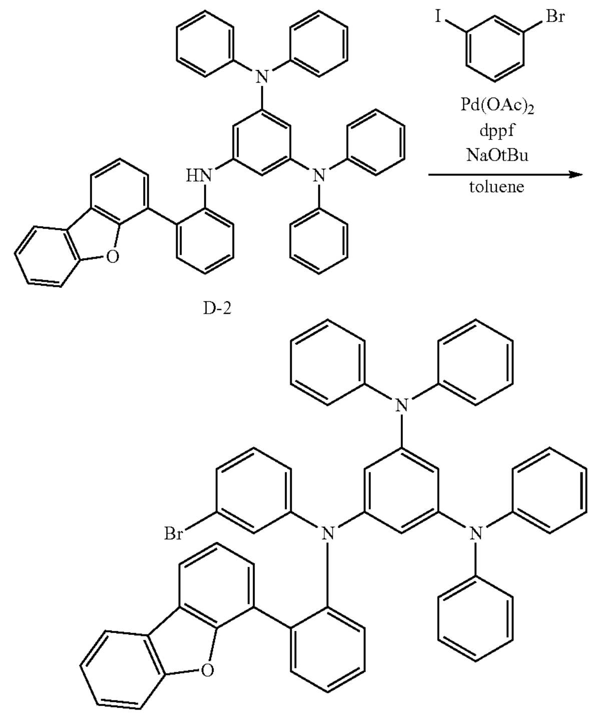

D-3

Synthesis of Intermediate D-3

The same method for preparing C-5 was performed using D-2 (18 g, 27 mmol) and 1-bromo-3-iodobenzene (7.6 g, 27 mmol). The crude product was separated by column chromatography (eluent:dichloromethane/hexane=1/3), and its molecular weight was secured by FAB-MS. The white solid thus obtained was 19 g (yield 88%), m/z=824 was obtained from the FAB-MS measurement, and the preparation of the target material D-3 was confirmed.

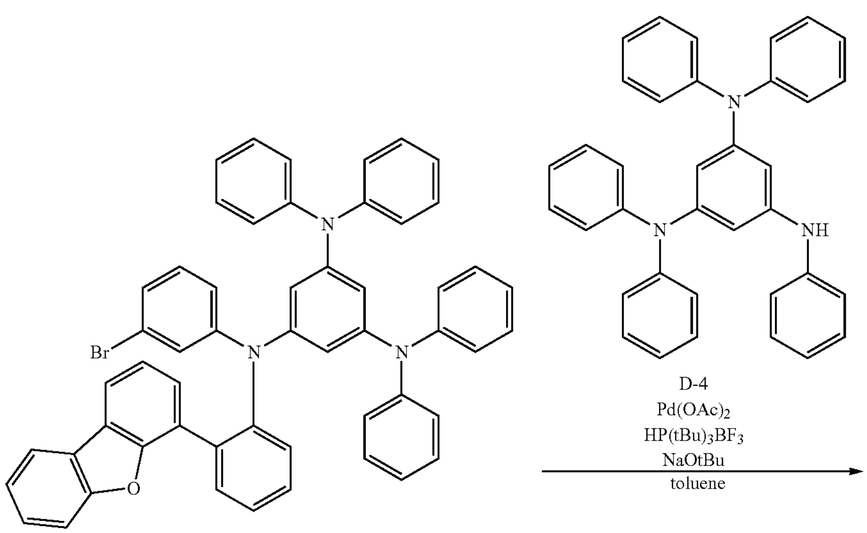

D-3

-continued

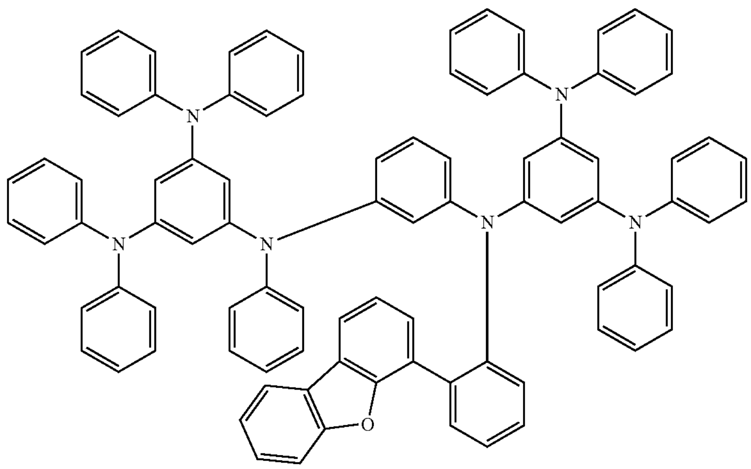

D-5

Synthesis of Intermediate D-5

The same method for preparing C-7 was performed using D-3 (19 g, 23 mmol) and D-4 (12 g, 23 mmol). The crude product thus obtained was separated by column chromatography (eluent:dichloromethane/hexane=1/2), and its molecular weight was secured by FAB-MS. The white solid thus obtained was 22 g (yield 78%), m/z=1247 was obtained from the FAB-MS measurement, and the preparation of the target material D-5 was confirmed.

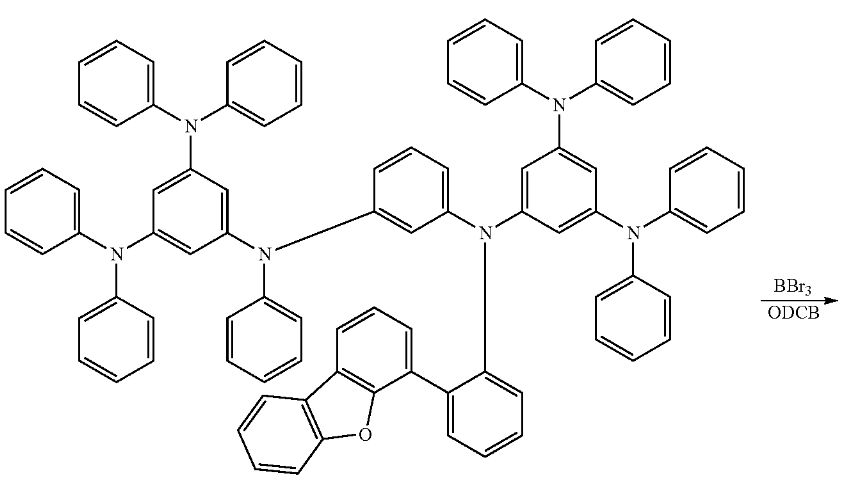

D-5

-continued

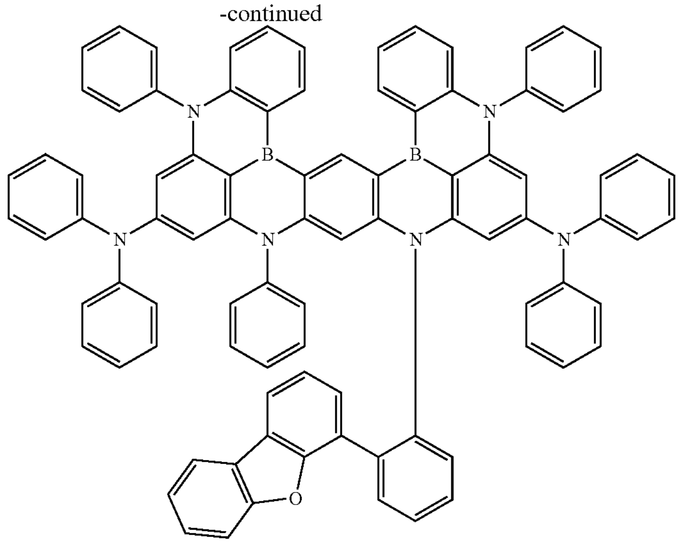

Compound 89

Synthesis of Compound 89

The same method for preparing Compound 76 was performed using D-5 (22 g, 18 mmol), $BBr_3$ (6.7 ml, 71 mmol) and N,N-diisopropylethylamine (37 ml, 212 mmol). The crude product thus obtained was separated by column chromatography (eluent:dichloromethane/hexane=1/2), and its molecular weight was secured by FAB-MS. The yellow solid thus obtained was 4.5 g (yield 20%), m/z=1263 was obtained from the FAB-MS measurement, and the preparation of Compound 89 was confirmed. The Compound 89 thus obtained was further separated by sublimation purification and was used for the manufacture of a device.

(5) Synthesis of Compound 91

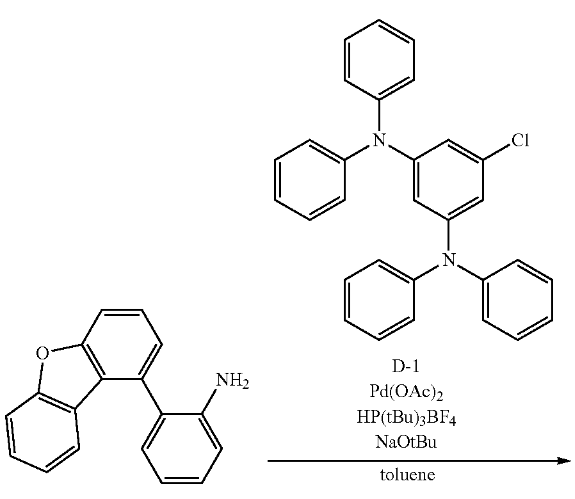

E-1

-continued

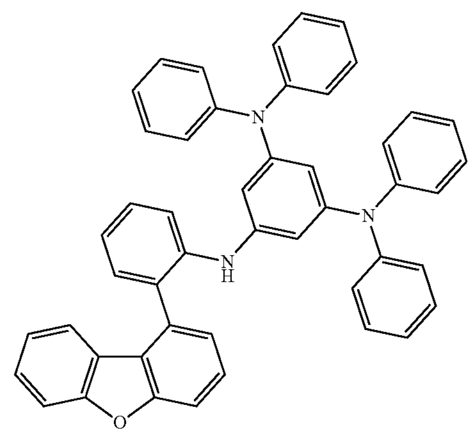

E-2

Synthesis of Intermediate E-2

The same method for preparing C-4 was performed using D-1 (15 g, 34 mmol) and E-1 (8.7 g, 34 mmol). The crude product thus obtained was separated by column chromatography (eluent:dichloromethane/hexane=1/3), and its molecular weight was secured by FAB-MS. The white solid thus obtained was 19 g (yield 83%), m/z=670 was obtained from the FAB-MS measurement, and the preparation of the target material E-2 was confirmed.

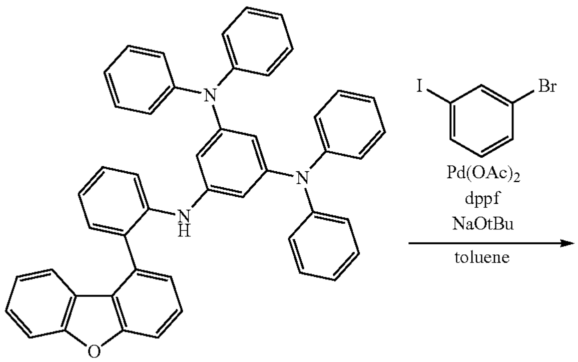

E-2

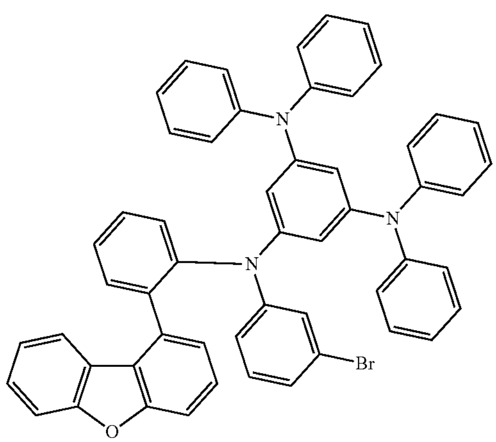

E-3

Synthesis of Intermediate E-3

The same method for preparing C-5 was performed using E-2 (19 g, 28 mmol) and 1-bromo-3-iodobenzene (8.0 g, 28 mmol). The crude product thus obtained was separated by column chromatography (eluent:dichloromethane/hexane=1/3), and its molecular weight was secured by FAB-MS. The white solid thus obtained was 19 g (yield 85%), m/z=824 was obtained from the FAB-MS measurement, and the preparation of the target material E-3 was confirmed.

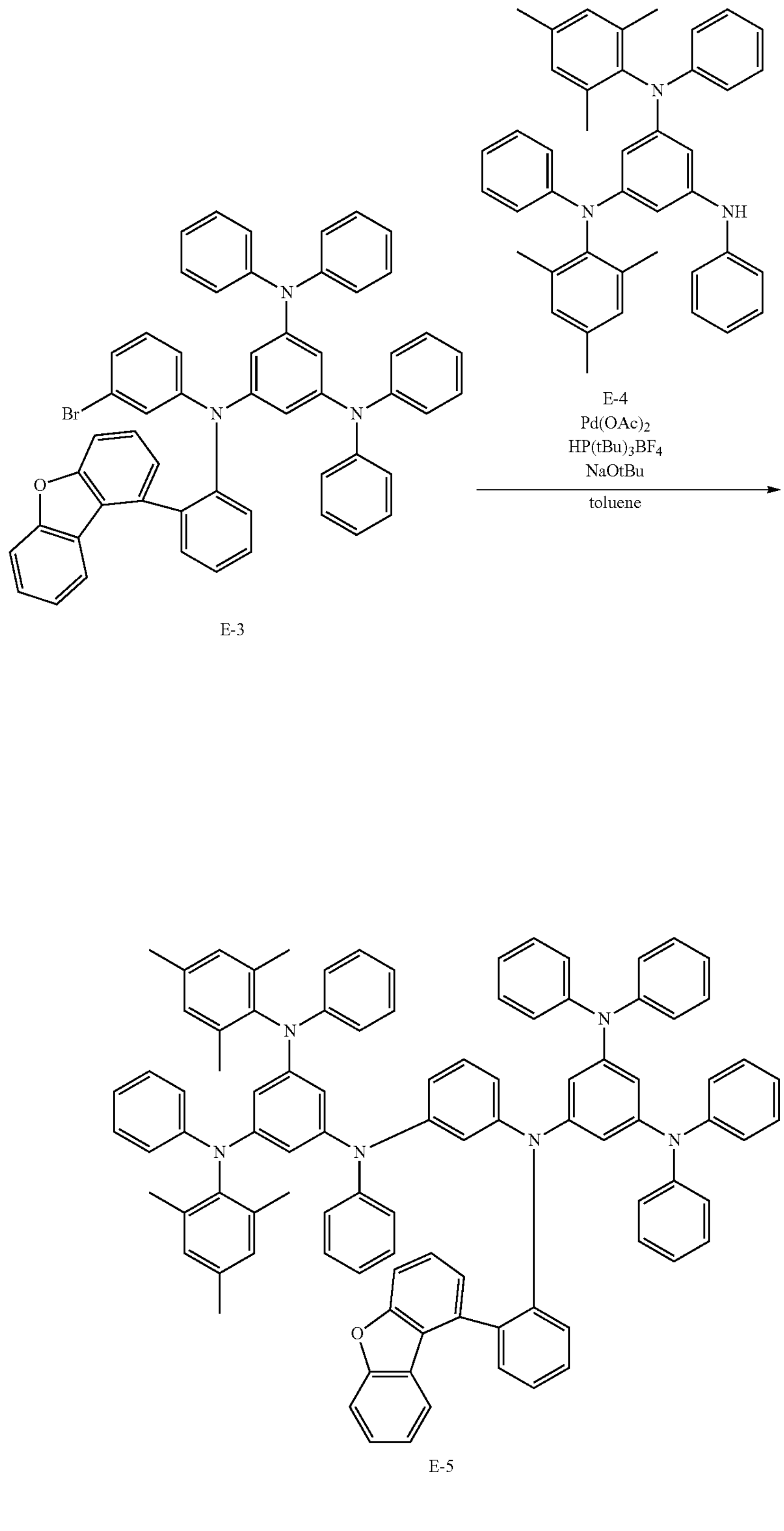

Synthesis of Intermediate E-5

The same method for preparing C-7 was performed using E-3 (19 g, 23 mmol) and E-4 (14 g, 23 mmol). The crude product thus obtained was separated by column chromatography (eluent:dichloromethane/hexane=1/2), and its molecular weight was secured by FAB-MS. The white solid thus obtained was 24 g (yield 79%), m/z=1332 was obtained from the FAB-MS measurement, and the preparation of the target material E-5 was confirmed.

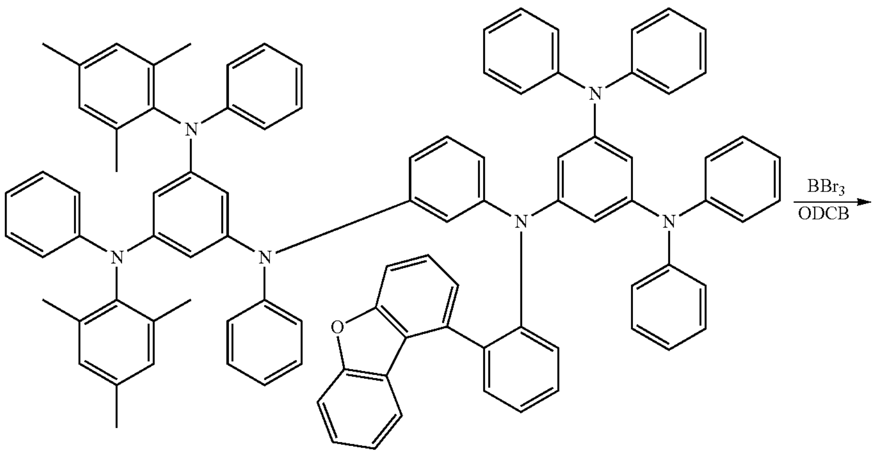

E-5

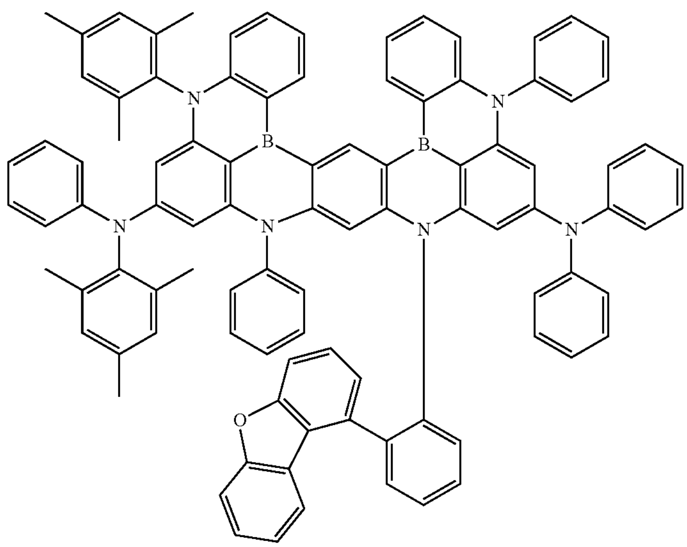

Compound 91

Synthesis of Compound 91

The same method for preparing Compound 76 was performed using E-5 (24 g, 18 mmol), $BBr_3$ (6.8 ml, 72 mmol) and N,N-diisopropylethylamine (38 ml, 216 mmol). The crude product thus obtained was separated by column chromatography (eluent:dichloromethane/hexane=1/2), and its molecular weight was secured by FAB-MS. The yellow solid thus obtained was 8.0 g (yield 33%), m/z=1347 was obtained from the FAB-MS measurement, and the preparation of Compound 91 was confirmed. The Compound 91 thus obtained was further separated by sublimation purification and was used for the manufacture of a device.

(6) Synthesis of Compound 94

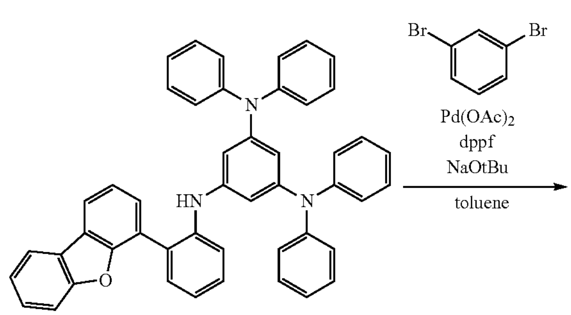

E-2

-continued

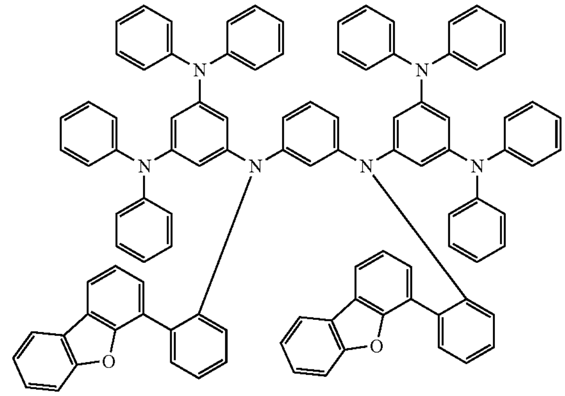

F-1

Synthesis of Intermediate F-1

The same method for preparing C-5 was performed using E-2 (19 g, 28 mmol) and 1,3-dibromobenzene (4.0 g, 14 mmol). The crude product thus obtained was separated by column chromatography (eluent:dichloromethane/hexane=1/2), and its molecular weight was secured by FAB-MS. The white solid thus obtained was 36 g (yield 90%), m/z=1413 was obtained from the FAB-MS measurement, and the preparation of the target material F-1 was confirmed.

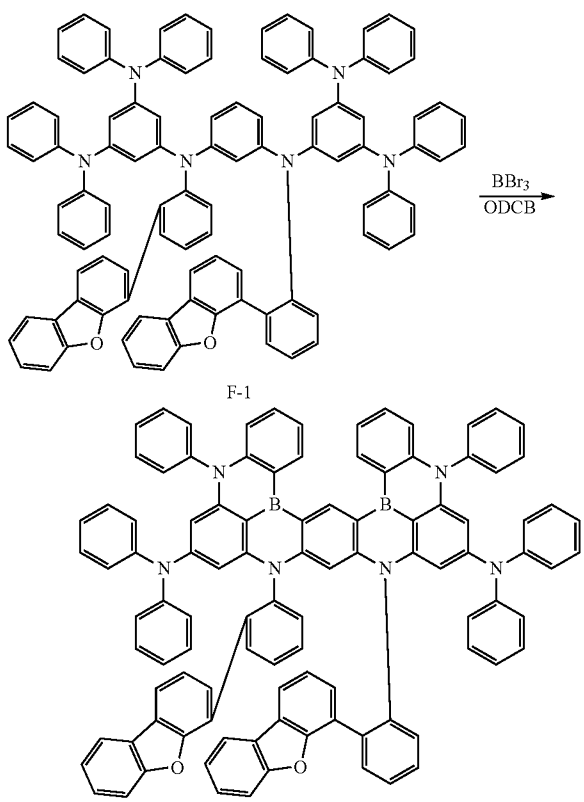

F-1

Compound 94

Synthesis of Compound 94

The same method for preparing Compound 76 was performed using F-1 (36 g, 25 mmol), $BBr_3$ (9.7 ml, 102 mmol) and N,N-diisopropylethylamine (53 ml, 306 mmol). The crude product thus obtained was separated by column chromatography (eluent:dichloromethane/hexane=1/2), and its molecular weight was secured by FAB-MS. The yellow solid thus obtained was 5.5 g (yield 15%), m/z=1429 was obtained from the FAB-MS measurement, and the preparation of Compound 94 was confirmed. The Compound 94 thus obtained was further separated by sublimation purification and was used for the manufacture of a device.

(7) Synthesis of Compound 96

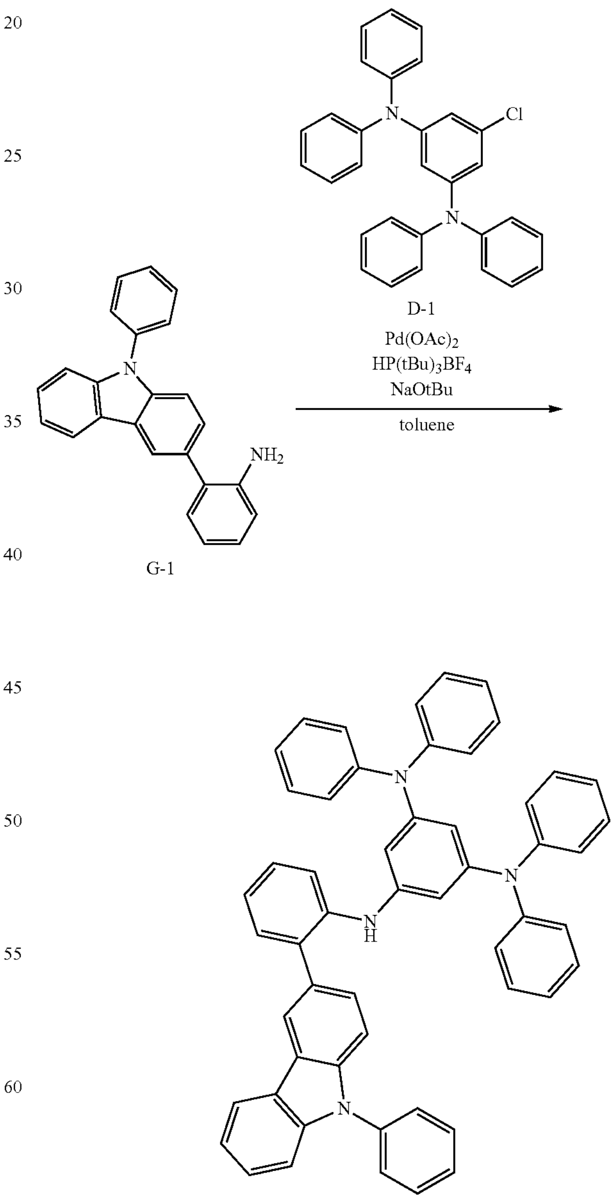

G-1

G-2

Synthesis of Intermediate G-2

The same method for preparing C-4 was performed using D-1 (15 g, 34 mmol) and G-1 (11 g, 34 mmol). The crude product thus obtained was separated by column chromatography (eluent:dichloromethane/hexane=1/3), and its molecular weight was secured by FAB-MS. The white solid thus obtained was 21 g (yield 85%), m/z=745 was obtained from the FAB-MS measurement, and the preparation of the target material G-2 was confirmed.

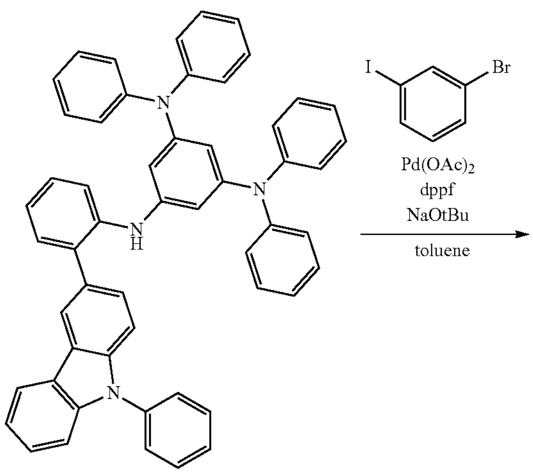

G-2

-continued

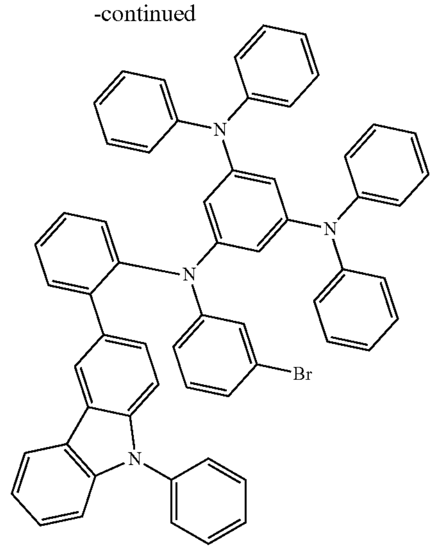

G-3

Synthesis of Intermediate G-3

The same method for preparing C-5 was performed using G-2 (21 g, 28 mmol) and 1-bromo-3-iodobenzene (8.0 g, 28 mmol). The crude product thus obtained was separated by column chromatography (eluent:dichloromethane/hexane=1/3), and its molecular weight was secured by FAB-MS. The white solid thus obtained was 22 g (yield 88%), m/z=900 was obtained from the FAB-MS measurement, and the preparation of the target material G-3 was confirmed.

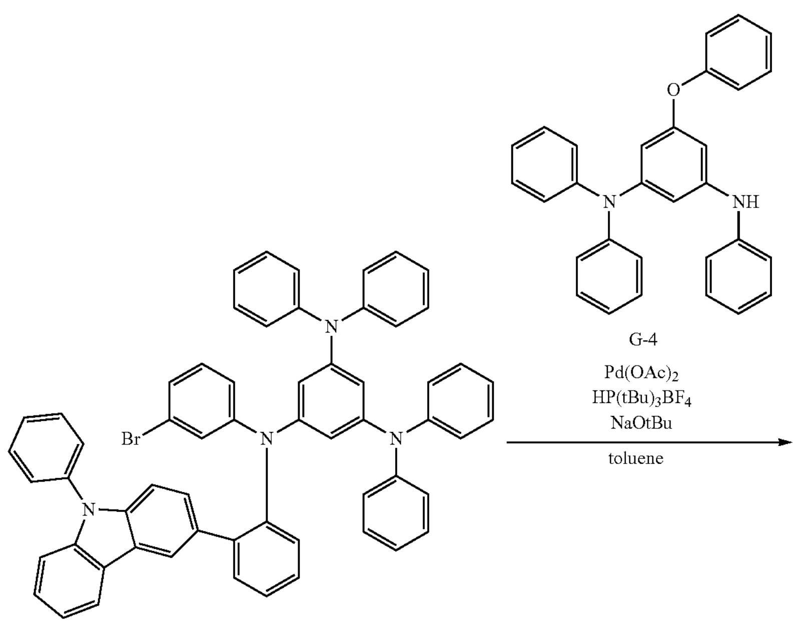

G-3

-continued

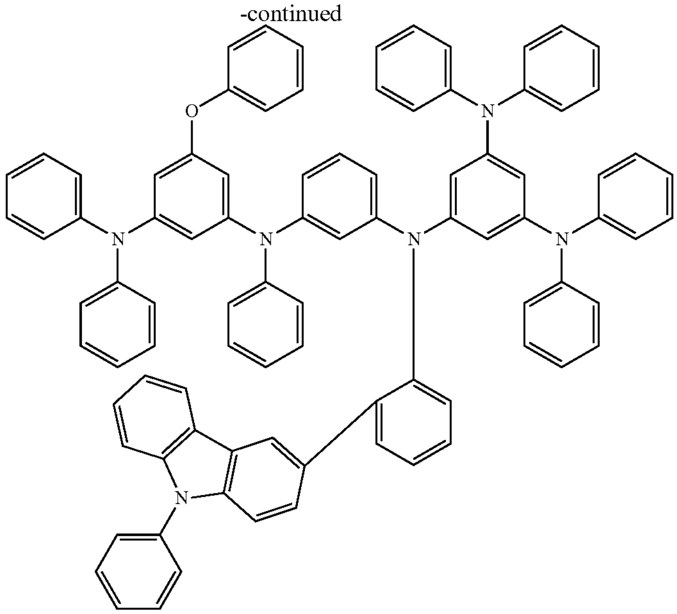

G-5

Synthesis of Intermediate G-5

The same method for preparing C-7 was performed using G-3 (22 g, 24 mmol) and G-4 (10 g, 24 mmol). The crude product thus obtained was separated by column chromatography (eluent:dichloromethane/hexane=1/2), and its molecular weight was secured by FAB-MS. The white solid thus obtained was 24 g (yield 80%), m/z=1248 was obtained from the FAB-MS measurement, and the preparation of the target material G-5 was confirmed.

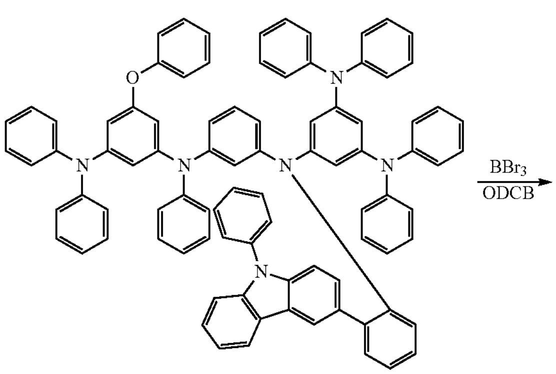

G-5

-continued

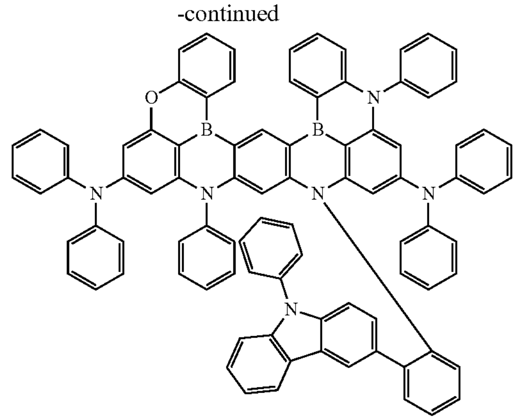

Compound 96

Synthesis of Compound 96

The same method for preparing Compound 76 was performed using G-5 (24 g, 19 mmol), $BBr_3$ (7.3 ml, 77 mmol) and N,N-diisopropylethylamine (40 ml, 231 mmol). The crude product thus obtained was separated by column chromatography (eluent:dichloromethane/hexane=1/2), and its molecular weight was secured by FAB-MS. The yellow solid thus obtained was 1.7 g (yield 7%), m/z=1263 was obtained from the FAB-MS measurement, and the preparation of Compound 96 was confirmed. The Compound 96 thus obtained was further separated by sublimation purification and was used for the manufacture of a device.

(8) Synthesis of Compound 146

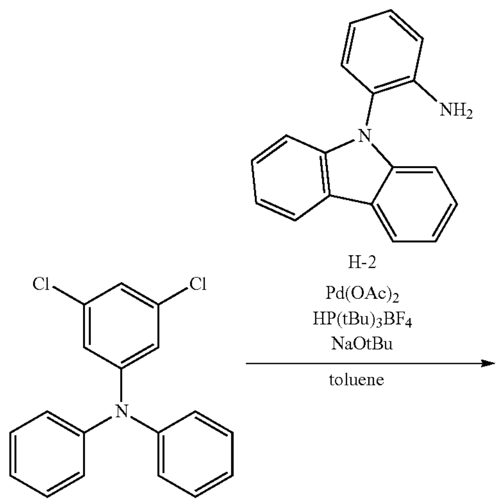

H-1

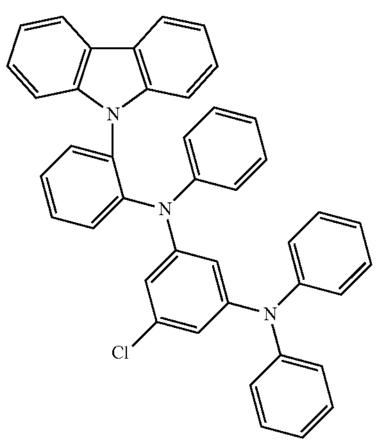

H-3

Synthesis of Intermediate H-3

The same method for preparing C-4 was performed using H-1 (30 g, 95 mmol) and H-2 (26 g, 95 mmol). The crude product thus obtained was separated by column chromatography (eluent:dichloromethane/hexane=1/3), and its molecular weight was secured by FAB-MS. The white solid thus obtained was 26 g (yield 45%), m/z=612 was obtained from the FAB-MS measurement, and the preparation of the target material H-3 was confirmed.

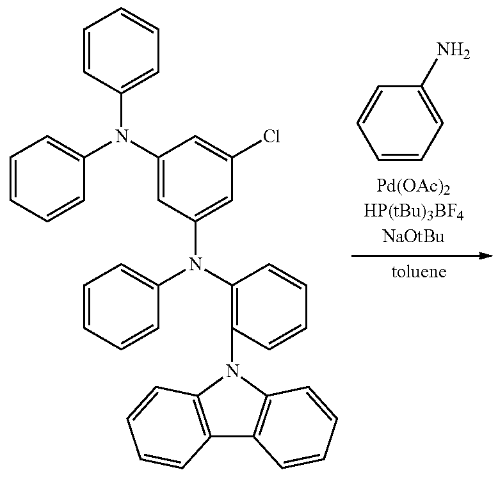

H-3

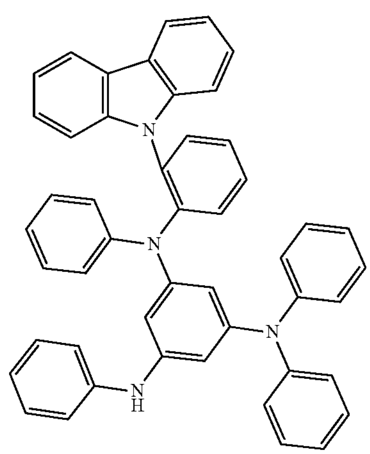

H-4

Synthesis of Intermediate H-4

The same method for preparing C-4 was performed using H-3 (30 g, 43 mmol) and aniline (4.0 g, 43 mmol). The crude product thus obtained was separated by column chromatography (eluent:dichloromethane/hexane=1/3), and its molecular weight was secured by FAB-MS. The white solid thus obtained was 22 g (yield 78%), m/z=669 was obtained from the FAB-MS measurement, and the preparation of the target material H-4 was confirmed.

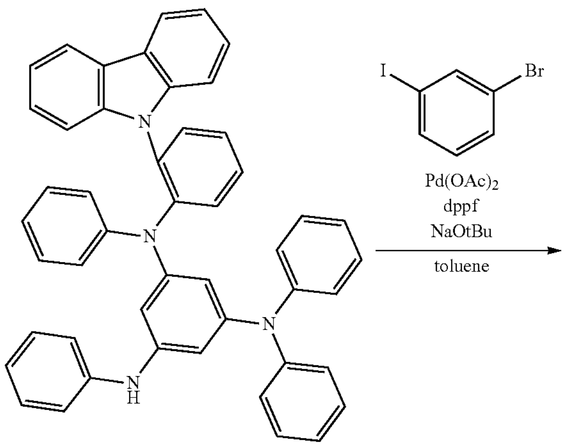

H-4

-continued

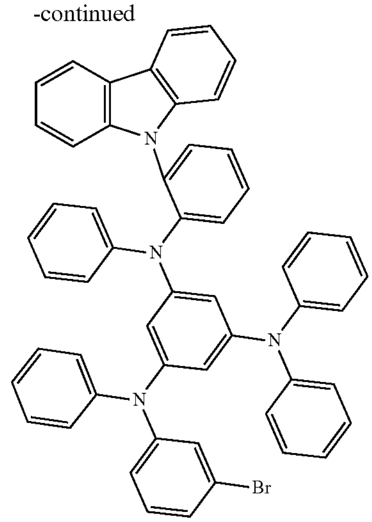

H-5

Synthesis of Intermediate H-5

The same method for preparing C-5 was performed using H-4 (22 g, 33 mmol) and 1-bromo-3-iodobenzene (9.3 g, 33 mmol). The crude product thus obtained was separated by column chromatography (eluent:dichloromethane/hexane=1/3), and its molecular weight was secured by FAB-MS. The white solid thus obtained was 25 g (yield 92%), m/z=824 was obtained from the FAB-MS measurement, and the preparation of the target material H-5 was confirmed.

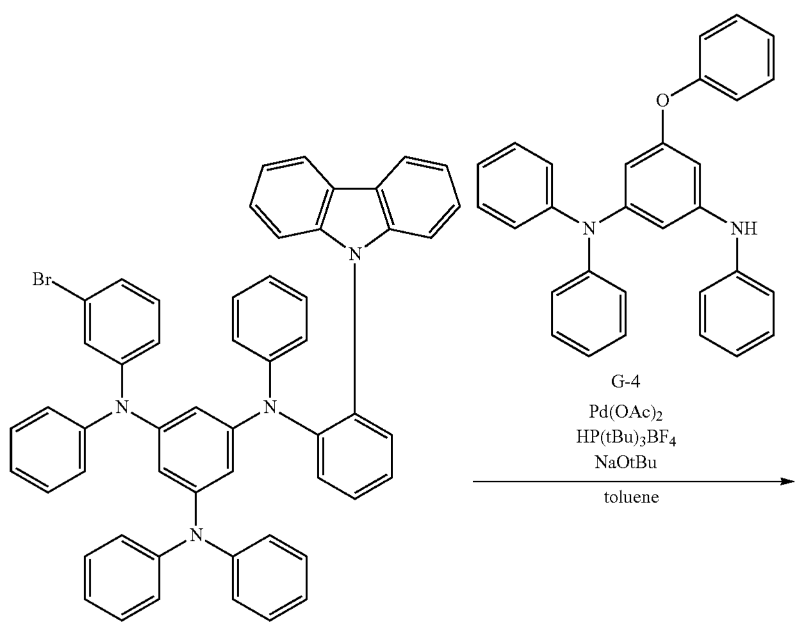

H-5

-continued

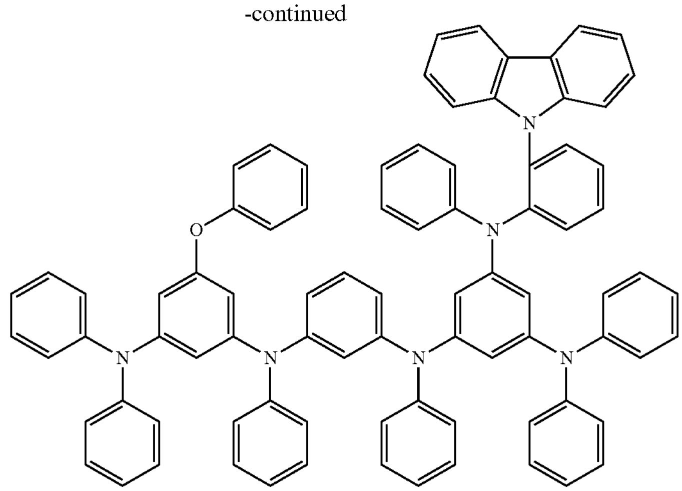

H-6

Synthesis of Intermediate H-6

The same method for preparing C-7 was performed using H-5 (25 g, 30 mmol) and G-4 (13 g, 30 mmol). The crude product thus obtained was separated by column chromatography (eluent:dichloromethane/hexane=1/2), and its molecular weight was secured by FAB-MS. The white solid thus obtained was 30 g (yield 85%), m/z=1171 was obtained from the FAB-MS measurement, and the preparation of the target material H-6 was confirmed.

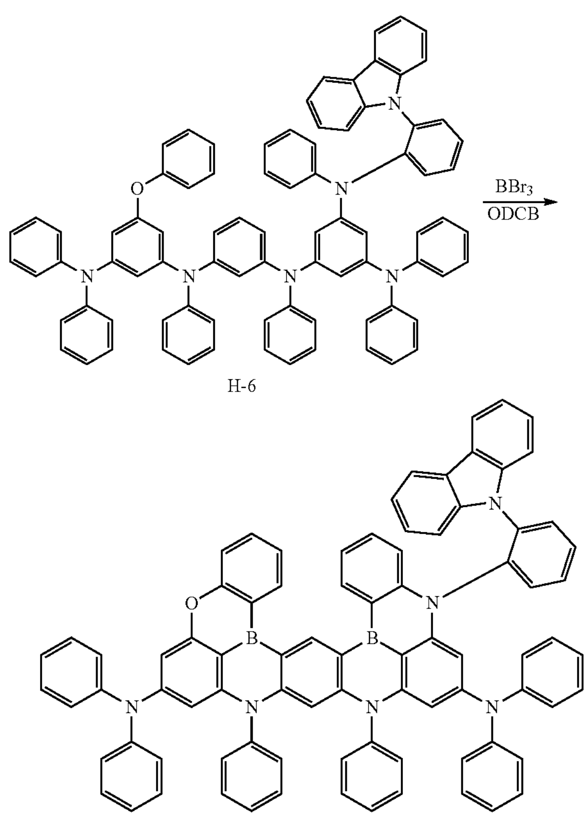

Compound 146

Synthesis of Compound 146

The same method for preparing Compound 76 was performed using H-6 (30 g, 26 mmol), $BBr_3$ (9.7 ml, 102 mmol) and N,N-diisopropylethylamine (54 ml, 307 mmol). The crude product thus obtained was separated by column chromatography (eluent:dichloromethane/hexane=1/2), and its molecular weight was secured by FAB-MS. The yellow solid thus obtained was 0.92 g (yield 3%), m/z=1187 was obtained from the FAB-MS measurement, and the preparation of Compound 146 was confirmed. The Compound 146 thus obtained was further separated by sublimation purification and was used for the manufacture of a device.

(9) Synthesis of Compound 149

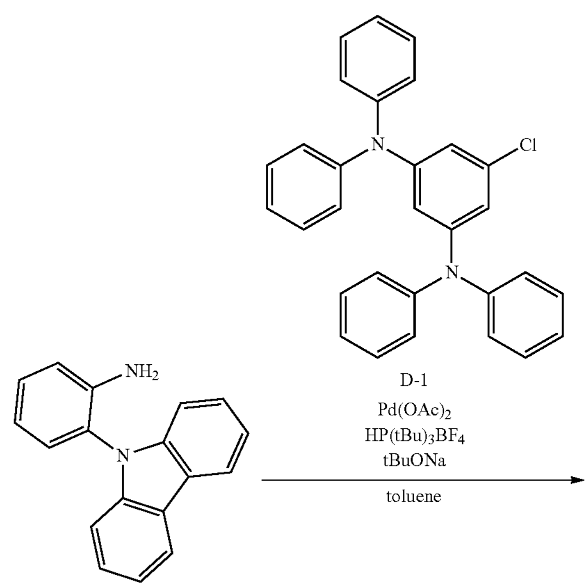

I-1

-continued

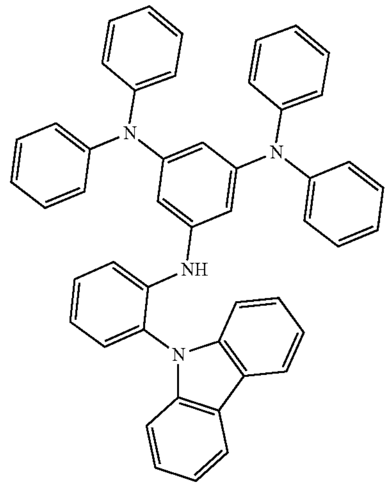

I-2

-continued

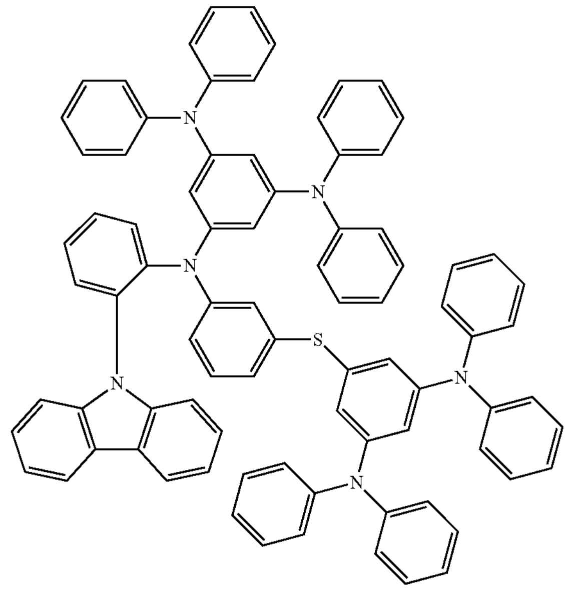

I-4

Synthesis of Intermediate I-2

The same method for preparing C-4 was performed using D-1 (53 g, 118 mmol) and I-1 (31 g, 118 mmol), changing the temperature for heating and stirring to about 120° C., and reacting. The crude product thus obtained was separated by column chromatography (eluent:dichloromethane/hexane=1/3), and its molecular weight was secured by FAB-MS. The white solid thus obtained was 62 g (yield 78%), m/z=669 was obtained from the FAB-MS measurement, and the preparation of the target material I-2 was confirmed.

Synthesis of Intermediate I-4

The same method for preparing C-4 was performed using I-2 (28 g, 42 mmol) and I-3 (23 g, 42 mmol), changing the temperature for heating and stirring to about 120° C., and reacting. The crude product thus obtained was separated by column chromatography (eluent:dichloromethane/hexane=1/2), and its molecular weight was secured by FAB-MS. The white solid thus obtained was 45 g (yield 90%), m/z=1188 was obtained from the FAB-MS measurement, and the preparation of the target material I-4 was confirmed.

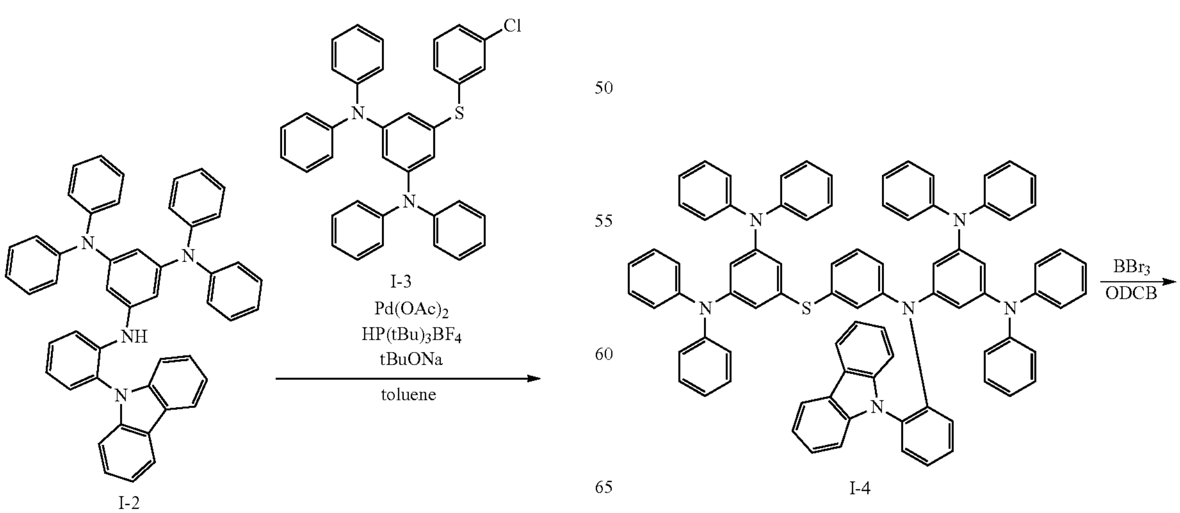

-continued

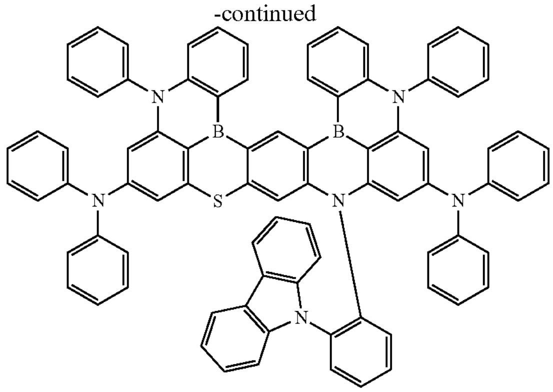

Compound 149

Synthesis of Compound 149

The same method for preparing Compound 76 was performed using 1-4 (30 g, 25 mmol), $BBr_3$ (9.6 ml, 101 mmol) and N,N-diisopropylethylamine (53 ml, 303 mmol). The crude product thus obtained was separated by column chromatography (eluent:dichloromethane/hexane=1/2), and its molecular weight was secured by FAB-MS. The yellow solid thus obtained was 0.46 g (yield 1.5%), m/z=1203 was obtained from the FAB-MS measurement, and the preparation of Compound 149 was confirmed. The Compound 149 thus obtained was further separated by sublimation purification and was used for the manufacture of a device.

2. Manufacture of Light Emitting Device

On a glass substrate, ITO with a thickness of about 1,500 Å was patterned and washed with ultra-pure water, cleaned with ultrasonic waves, exposed to UV for about 30 minutes and treated with ozone. To form a hole transport region, α-NPD was deposited to a thickness of about 600 Å, TCTA was deposited to about 200 Å, and mCP was deposited to a thickness of about 50 Å.

The polycyclic compound of an embodiment or the Comparative Compound and mCBP were co-deposited in a ratio of 1:99 to form a layer into a thickness of about 300 Å and to form an emission layer. The emission layer formed by the co-deposition was formed by mixing each of Compounds 74, 76, 82, 89, 91, 94, 96, and 146 with mCBP in Example 1 to Example 8, or each of Comparative Compounds X-1 to X-7 with mCBP in Comparative Example 1 to Comparative Example 7.

After that, on the emission layer, DPEPO was deposited to about 100 Å, a layer with a thickness of about 200 Å was formed using TPBi, and a layer with a thickness of about 5 Å was formed using LiF to form an electron transport region. A second electrode with a thickness of about 1,000 Å was formed using aluminum (A1). On the second electrode, a layer with a thickness of about 600 Å was formed using Compound P4 below to form a capping layer. In the Examples, the hole transport region, the emission layer, the electron transport region, the second electrode, and the capping layer were formed using a vacuum deposition apparatus.

P4

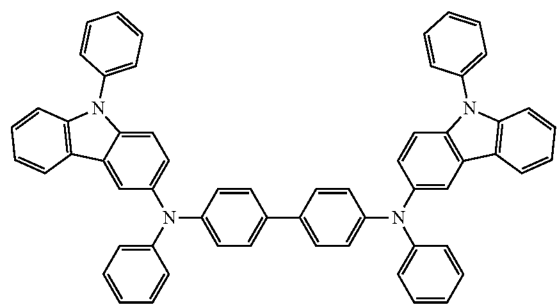

The compounds used in Examples 1 to 8, and Comparative Examples 1 to 7 are shown in Table 1.

TABLE 1

| | |
|---|---|
| Compound 74 | 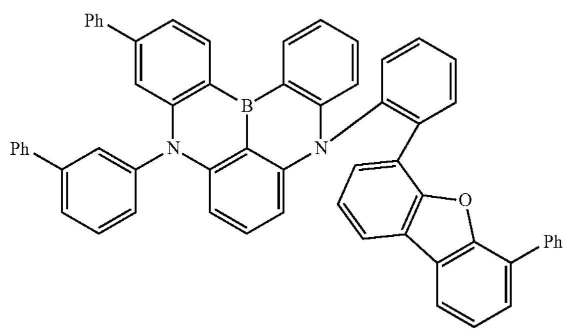 74 |

TABLE 1-continued
Compound 76
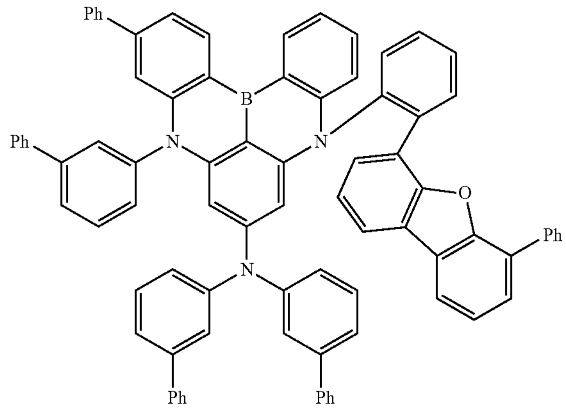
76
Compound 82
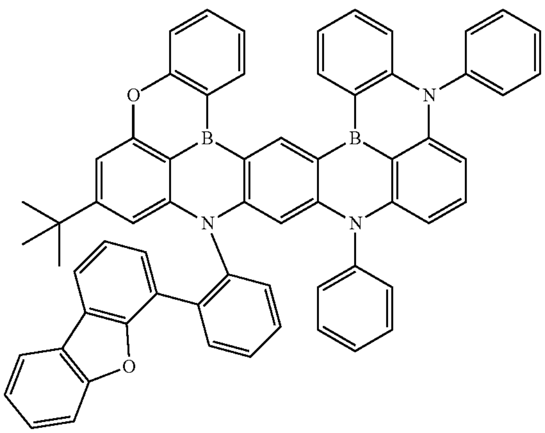
82
Compound 89
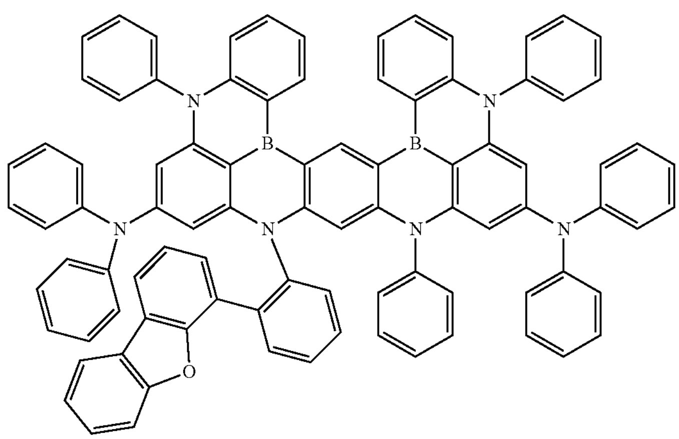
89

TABLE 1-continued
Compound 91
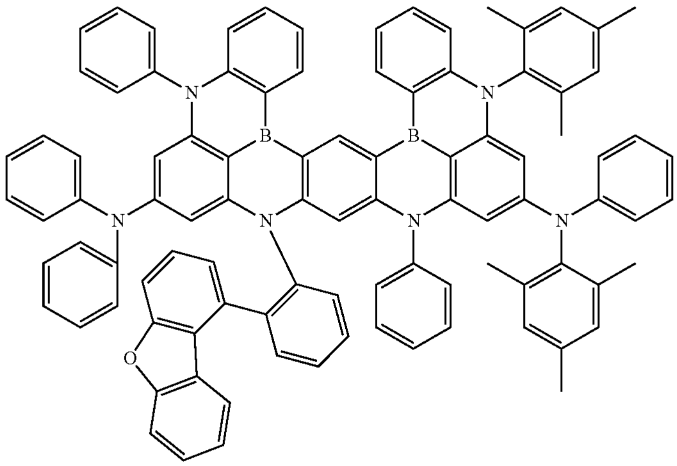
91
Compound 94
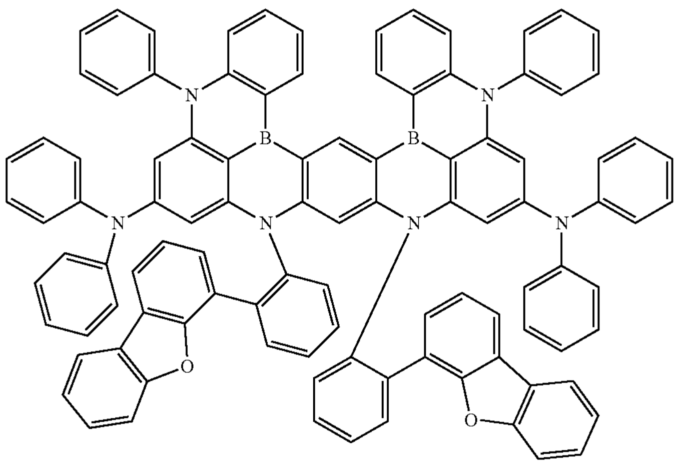
94
Compound 96
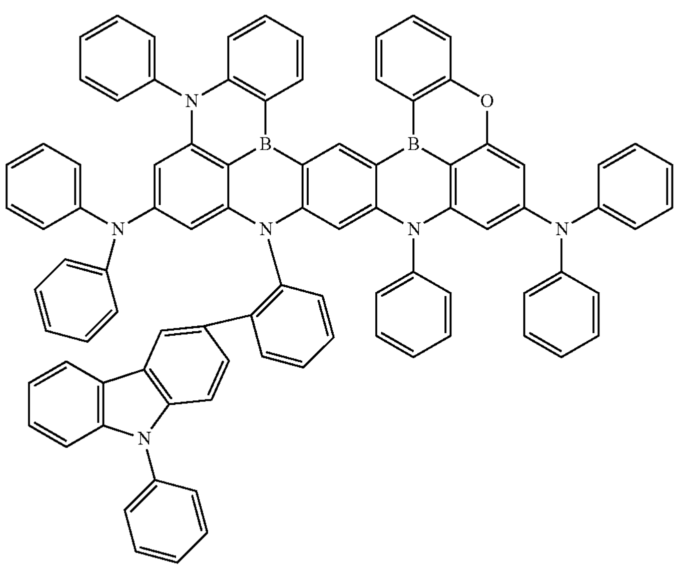
96

TABLE 1-continued
Compound 146
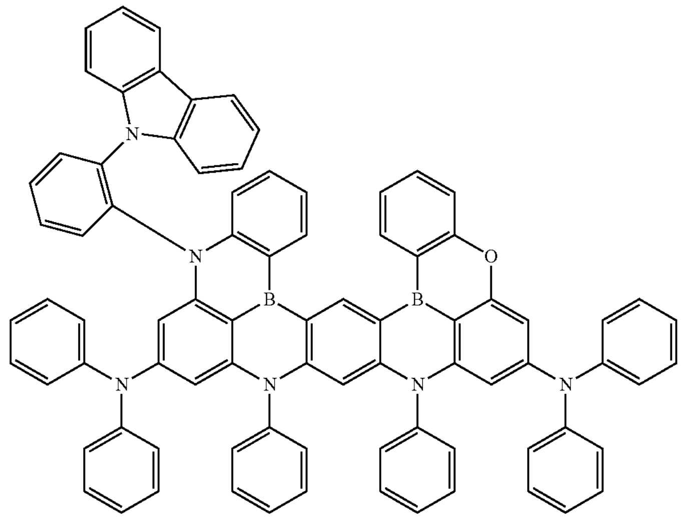
146
Comparative Compound X-1
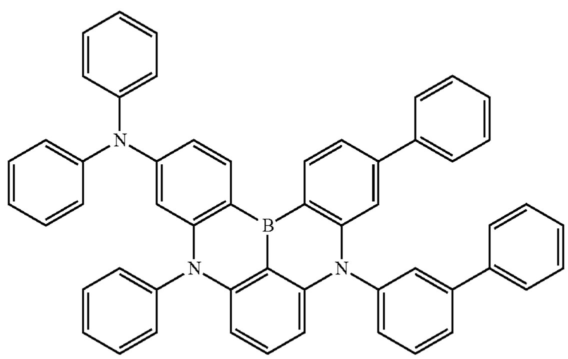 [SMILES: c1ccc(-c2cccc(N3c4cc(-c5ccccc5)ccc4B4c5ccc(N(c6ccccc6)c6ccccc6)cc5N(c5ccccc5)c5cccc3c54)c2)cc1]
Comparative Compound X-2
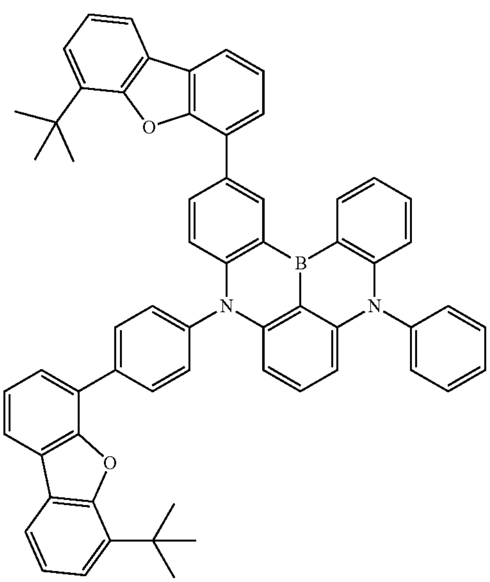 [SMILES: CC(C)(C)c1cccc2c1oc1c(-c3ccc(N4c5ccc(-c6cccc7c6oc6c(C(C)(C)C)cccc67)cc5B5c6ccccc6N(c6ccccc6)c6cccc4c65)cc3)cccc12]

TABLE 1-continued
Comparative Compound X-3
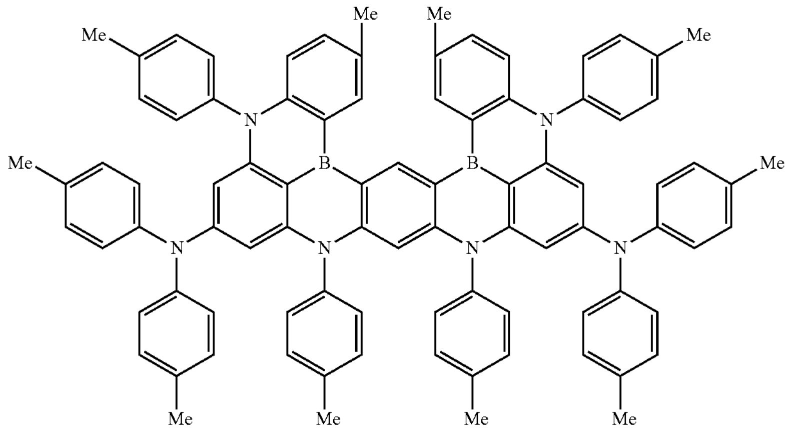 [SMILES: Cc1ccc(N(c2ccc(C)cc2)c2cc3c4c(c2)N(c2ccc(C)cc2)c2cc5c(cc2B4c2cc(C)ccc2N3c2ccc(C)cc2)B2c3cc(C)ccc3N(c3ccc(C)cc3)c3cc(N(c4ccc(C)cc4)c4ccc(C)cc4)cc(c32)N5c2ccc(C)cc2)cc1]
Comparative Compound X-4
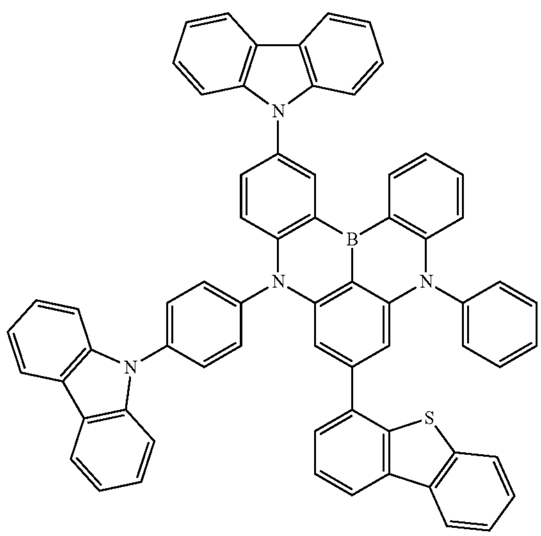 [SMILES: c1ccc(N2c3ccccc3B3c4cc(-n5c6ccccc6c6ccccc65)ccc4N(c4ccc(-n5c6ccccc6c6ccccc65)cc4)c4cc(-c5cccc6c5sc5ccccc56)cc2c43)cc1]
Comparative Compound X-5
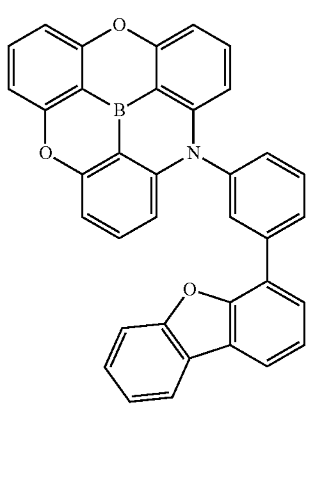 [SMILES: c1cc(-c2cccc3c2oc2ccccc23)cc(N2c3cccc4c3B3c5c(cccc5Oc5cccc2c53)O4)c1]

TABLE 1-continued

Comparative Compound X-6

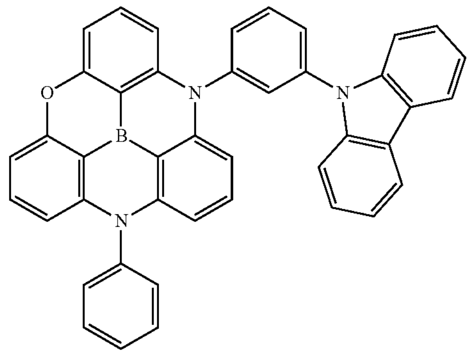 [SMILES: c1ccc(N2c3cccc4c3B3c5c(cccc5N(c5cccc(-n6c7ccccc7c7ccccc76)c5)c5cccc2c53)O4)cc1]

Comparative Compound X-7

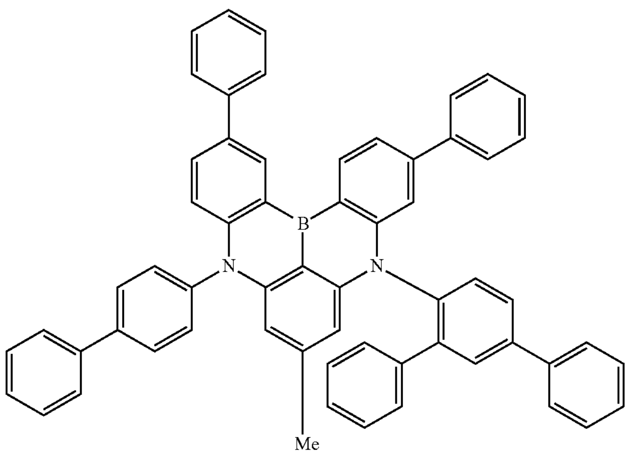 [SMILES: Cc1cc2c3c(c1)N(c1ccc(-c4ccccc4)cc1-c1ccccc1)c1cc(-c4ccccc4)ccc1B3c1cc(-c3ccccc3)ccc1N2c1ccc(-c2ccccc2)cc1]

—

3. Evaluation of Properties of Light Emitting Device

In Table 2, the evaluation results of light emitting devices of Example 1 to Example 8, and Comparative Example 1 to Comparative Example 7 are shown. In Table 2, maximum emission wavelength ($\lambda_{max}$), external quantum efficiency ($EQE_{max}$) and relative device life ratio in the light emitting devices thus manufactured are compared and shown. In the evaluation results of properties for the Examples and the Comparative Examples, shown in Table 2, the maximum emission wavelength ($\lambda_{max}$) shows a wavelength showing the maximum value in emission spectrum, and the external quantum efficiency was computed from the maximum emission wavelength, the luminance measured for the device, and a current value, and the maximum value of the external quantum efficiency is shown by $EQE_{max}$. The life is a relative value and shows relative life in the light emitting devices of the Comparative Examples and the Examples considering the life of Comparative Example 1 as 1. The life of the Comparative Examples and the Examples is for evaluating constant-luminance device life at a luminance of 1000 nit.

TABLE 2

| Division | Dopant material | $\lambda_{max}$ (nm) | $EQE_{max}$ (%) | Life |
|---|---|---|---|---|
| Example 1 | Compound 74 | 472 | 20.3 | 1.07 |
| Example 2 | Compound 76 | 478 | 22.9 | 1.10 |
| Example 3 | Compound 82 | 462 | 21.3 | 1.05 |
| Example 4 | Compound 89 | 469 | 23.4 | 1.13 |
| Example 5 | Compound 91 | 466 | 24.5 | 1.05 |
| Example 6 | Compound 94 | 468 | 23.7 | 1.12 |
| Example 7 | Compound 96 | 462 | 21.6 | 1.06 |
| Example 8 | Compound 146 | 459 | 20.7 | 1.05 |
| Comparative Example 1 | Comparative Compound X-1 | 468 | 20.2 | 1.00 |
| Comparative Example 2 | Comparative Compound X-2 | 460 | 14.5 | 1.02 |
| Comparative Example 3 | Comparative Compound X-3 | 467 | 20.6 | 0.95 |
| Comparative Example 4 | Comparative Compound X-4 | 474 | 18.3 | 1.03 |
| Comparative Example 5 | Comparative Compound X-5 | 432 | 6.3 | 0.44 |
| Comparative Example 6 | Comparative Compound X-6 | 444 | 8.2 | 0.62 |
| Comparative Example 7 | Comparative Compound X-7 | 465 | 18.6 | 1.03 |

Referring to Table 2, it could be found that the light emitting devices of Examples 1 to 8 and Comparative Examples 1 to 7 emitted blue light. The maximum values of the external quantum efficiency of the light emitting devices of Comparative Example 1, Comparative Example 3, and Examples 1 to 8 were from about 20% to about 30%. It could be found that the maximum values of the external quantum efficiency of the light emitting devices of Comparative Example 1, Comparative Example 3, and Examples 1 to 8 showed improved values when compared with the light emitting devices of Comparative Example 2, and Comparative Example 4 to Comparative Example 7. It could be found that the light emitting devices of Examples 1 to 8 showed improved device life than the light emitting devices of Comparative Examples 1 to 7.

In Comparative Compounds X-1 to X-6 included in the light emitting devices of Comparative Examples 1 to 6, an aryl group or a heteroaryl group is bonded at a metal position or para position with respect to a nitrogen atom, and are considered to show shorter device life than the light emitting devices of Examples 1 to 8. The light emitting devices of Comparative Examples 5 and 6 showed shorter wavelength when compared with the light emitting devices of Comparative Examples 1 to 4, and the light emitting devices of Examples 1 to 8, and a current amount applied to the light emitting devices may increase when compared with the light emitting devices of Comparative Examples 1 to 4, and the light emitting devices of Examples 1 to 8. Accordingly, it is considered that the light emitting devices of Comparative Examples 5 and 6 may be easily deteriorated, and the device life was relatively short.

The Example Compounds include a fused ring structure having five rings or nine rings including at least one nitrogen atom and at least one boron atom, and to the nitrogen atom, a substituted phenyl group may be bonded. The substituted phenyl group may include a substituted or unsubstituted carbazole group, a substituted or unsubstituted dibenzofuran group, or a substituted or unsubstituted dibenzothiophene group bonded at an ortho position with respect to the nitrogen atom. The fused ring structure having five rings or nine rings including the nitrogen atom and the boron atom may be sterically protected by the carbazole group, dibenzofuran group, or dibenzothiophene group. The carbazole group, dibenzofuran group, and dibenzothiophene group are substituents having high planarity, and the carbazole group, dibenzofuran group, and dibenzothiophene group may suppress exciton-exciton interaction, and exciton-polaron interaction between the fused ring structure with five or nine rings and neighboring molecules. The suppressing properties of the exciton-exciton interaction and exciton-polaron interaction may be better in case where the carbazole group, dibenzofuran group, and dibenzothiophene group included in the substituted phenyl group are bonded at an ortho position with respect to the nitrogen than a case where the carbazole group, dibenzofuran group, and dibenzothiophene group are bonded at a position other than the ortho position. By suppressing the exciton-exciton interaction and exciton-polaron interaction, the deterioration of materials included in a light emitting device may be prevented, and device life may be improved. Accordingly, it is considered that the light emitting devices of Examples 1 to 8 including the polycyclic compound of an embodiment shows better emission efficiency and improved device life when compared with those of Comparative Examples 1 to 7.

If voltages are applied to the first electrode EL1 and second electrode EL2 of the light emitting device, electrons and holes may move to produce positive polarons and negative polarons in an emission layer EML. Through the recombination of the polarons, excitons may be produced. Light may be emitted through the transition of the excitons from an excited state to a ground state.

The polycyclic compound of an embodiment has a fused ring structure with five rings or nine rings including at least one nitrogen atom and at least one boron atom as a ring-forming atom, and to the nitrogen atom, a substituted phenyl group may be bonded. The substituted phenyl group may be substituted with a substituted or unsubstituted carbazole group, a substituted or unsubstituted dibenzofuran group, or a substituted or unsubstituted dibenzothiophene group. The substituted or unsubstituted carbazole group, the substituted or unsubstituted dibenzofuran group, or the substituted or unsubstituted dibenzothiophene group may be bonded at an ortho position with respect to the nitrogen atom bonded to the phenyl group. The substituted or unsubstituted carbazole group, the substituted or unsubstituted dibenzofuran group, or the substituted or unsubstituted dibenzothiophene group may sterically protect the fused ring with five rings or nine rings including the nitrogen atom and the boron atom. Accordingly, the polycyclic compound of an embodiment may show excellent emission efficiency and contribute to the improvement of the life of a device.

The light emitting device including the polycyclic compound of an embodiment may show excellent emission efficiency and improved device life.

The light emitting device of an embodiment may show improved device properties of high efficiency in a blue wavelength region.

The polycyclic compound of an embodiment is included in the emission layer of a light emitting device and may contribute to the increase of efficiency of the light emitting device.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light emitting device, comprising:

a first electrode;

a second electrode disposed on the first electrode; and an emission layer disposed between the first electrode and the second electrode and comprising a polycyclic compound represented by Formula 1, wherein the light emitting device has an external quantum efficiency in a range of about 20% to about 30%:

[Formula 1]

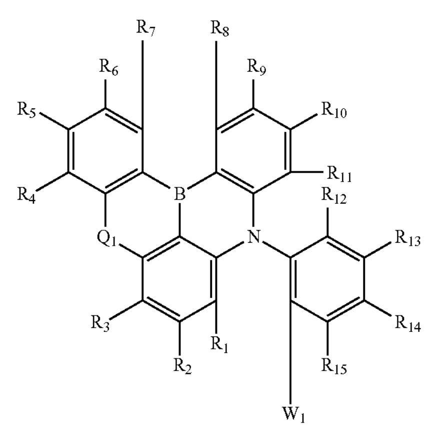

wherein in Formula 1, $W_1$ is a substituted or unsubstituted carbazole group, a substituted or unsubstituted dibenzofuran group, or a substituted or unsubstituted dibenzothiophene group, $Q_1$ is $NR_{16}$, O, or S, and $R_1$ to $R_{16}$ are each independently a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, a substituted or unsubstituted aryl group of 6 to 20 ring-forming carbon atoms, or a substituted or unsubstituted heteroaryl group of 2 to 20 ring-forming carbon atoms, or a group represented by Formula 2 is bonded to adjacent groups of $R_1$ to $R_{16}$:

[Formula 2]

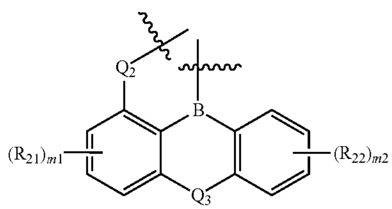

wherein in Formula 2, $Q_2$ and $Q_3$ are each independently $NR_{23}$, O, or S, m1 is an integer from 1 to 3, m2 is an integer from 1 to 4, $R_{21}$ to $R_{23}$ are each independently a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, a substituted or unsubstituted aryl group of 6 to 20 ring-forming carbon atoms, or a substituted or unsubstituted heteroaryl group of 2 to 20 ring-forming carbon atoms, and

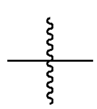

indicates a binding site to a neighboring atom.

2. A light emitting device, comprising:

a first electrode;

a hole transport region disposed on the first electrode;

an emission layer disposed on the hole transport region and comprising a polycyclic compound represented by Formula 1;

an electron transport region disposed on the emission layer; and a second electrode disposed on the electron transport region:

[Formula 1]

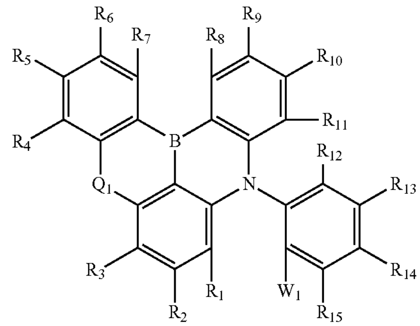

wherein in Formula 1, $W_1$ is a substituted or unsubstituted carbazole group, a substituted or unsubstituted dibenzofuran group, or a substituted or unsubstituted dibenzothiophene group, $Q_1$ is $NR_{16}$, O, or S, $R_2$ is a hydrogen atom, a deuterium atom, a substituted or unsubstituted boryl group, a substituted or unsubstituted silyl group, a substituted or unsubstituted amine group, a substituted or unsubstituted alkyl group of 1 to 20 carbon atoms, a substituted or unsubstituted aryl group of 6 to 20 ring-forming carbon atoms, or a substituted or unsubstituted heteroaryl group of 2 to 20 ring-forming carbon atoms, $R_{12}$ is a hydrogen atom, a deuterium atom, a halogen atom, a substituted or unsubstituted boryl group, a substituted or unsubstituted silyl group, a substituted or unsubstituted alkyl group of 1 to 20 carbon atoms, or a substituted or unsubstituted aryl group of 6 to 20 ring-forming carbon atoms, and $R_1$, $R_3$ to $R_{11}$, and $R_{13}$ to $R_{16}$ are each independently a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, a substituted or unsubstituted aryl group of 6 to 20 ring-forming carbon atoms, or a substituted or unsubstituted heteroaryl group of 2 to 20 ring-forming carbon atoms, or a group represented by Formula 2 is bonded to adjacent groups of $R_4$ to $R_{11}$:

[Formula 2]

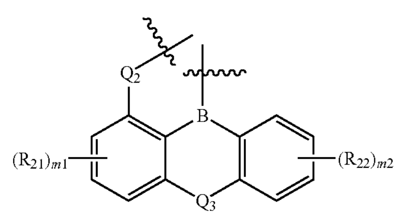

wherein in Formula 2, $Q_2$ and $Q_3$ are each independently $NR_{23}$, O, or S, m1 is an integer from 1 to 3, m2 is an integer from 1 to 4, $R_{21}$ to $R_{23}$ are each independently a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, a substituted or unsubstituted aryl group of 6 to 20 ring-forming carbon atoms, or a substituted or unsubstituted heteroaryl group of 2 to 20 ring-forming carbon atoms,

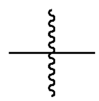

indicates a binding site to a neighboring atom, and the polycyclic compound does not include an alkyl group substituted with a deuterium atom.

3. The light emitting device of claim 2, wherein Formula 1 is represented by one of Formula 1-A1 to Formula 1-A4:

[Formula 1-A1]

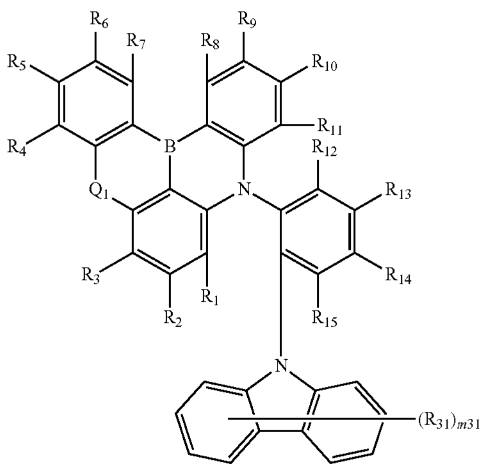

[Formula 1-A2]

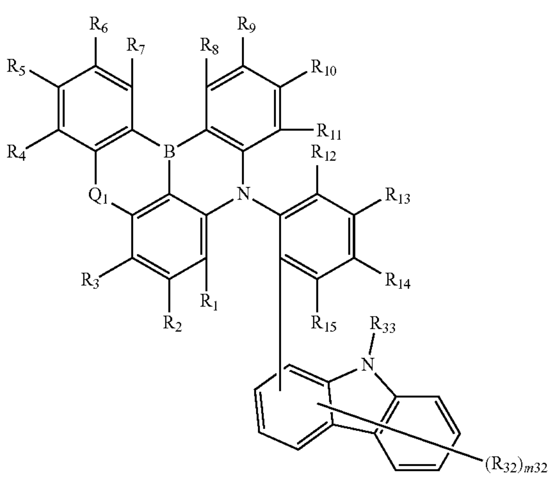

-continued

[Formula 1-A3]

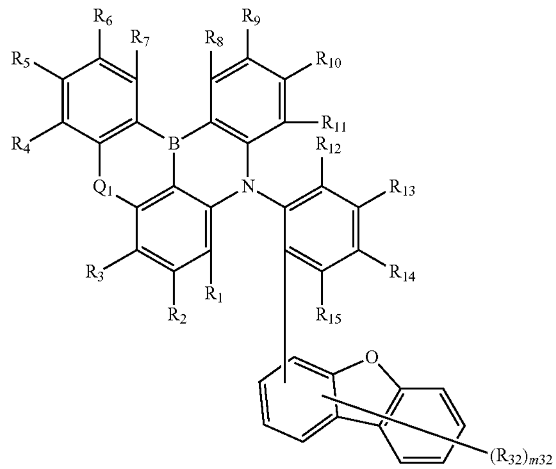

[Formula 1-A4]

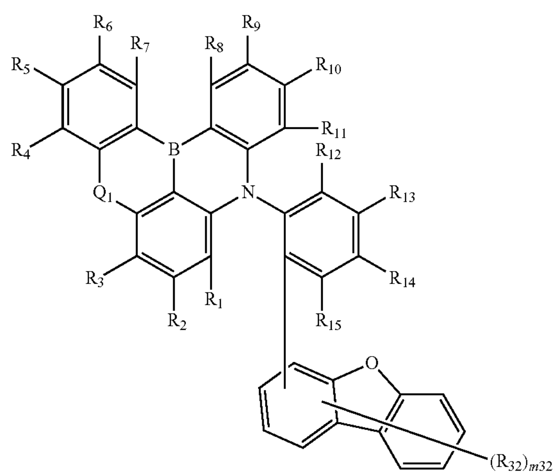

wherein in Formula 1-A1 to Formula 1-A4, m31 is an integer from 1 to 8, m32 is an integer from 1 to 7, $R_{31}$ to $R_{33}$ are each independently a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, or a substituted or unsubstituted aryl group of 6 to 20 ring-forming carbon atoms, and $Q_1$ and $R_1$ to $R_{15}$ are the same as defined in connection with Formula 1.

4. The light emitting device of claim 2, wherein Formula 1 is represented by Formula 1-B1 or Formula 1-B2:

[Formula 1-B1]
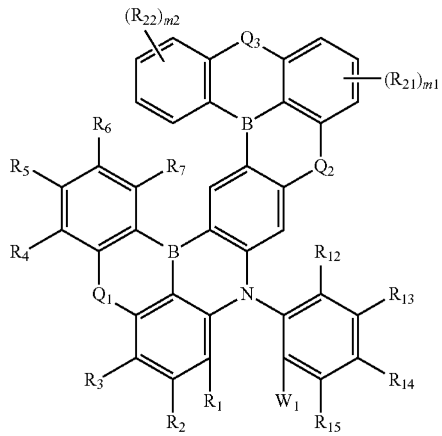
[Formula 1-B2]
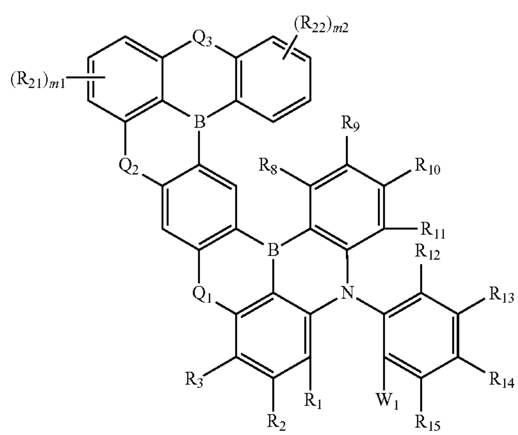
wherein in Formula 1-B1 and Formula 1-B2,
$Q_1$ to $Q_3$, $R_1$ to $R_{15}$, m1, m2, $R_{21}$, $R_{22}$, and $W_1$ are the same as defined in connection with Formula 1 and Formula 2.
5. The light emitting device of claim 4, wherein at least one of $Q_1$ to $Q_3$ is O or S.
6. The light emitting device of claim 4, wherein Formula 1-B1 is represented by one of Formula 1-B1-1 to Formula 1-B1-4:
[Formula 1-B1-1]
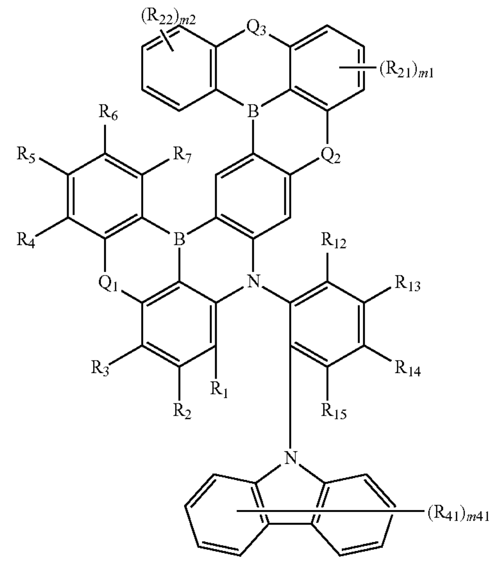
[Formula 1-B1-2]
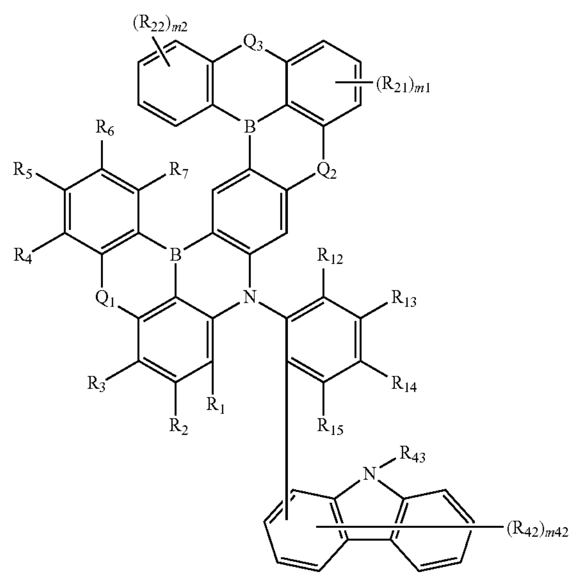

-continued

[Formula 1-B1-3]

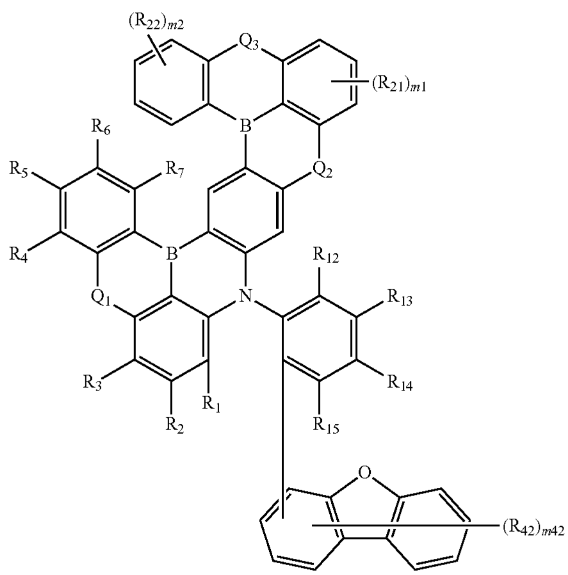

[Formula 1-B1-4]

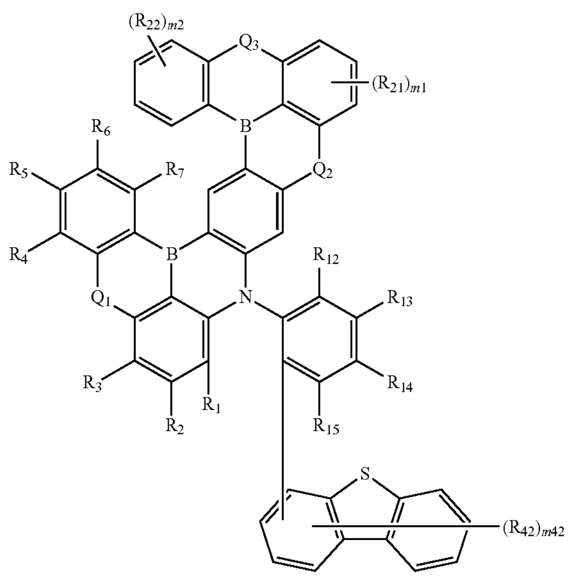

wherein in Formula 1-B1-1 to Formula 1-B1-4, m41 is an integer from 1 to 8, m42 is an integer from 1 to 7, $R_{41}$ to $R_{43}$ are each independently a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, or a substituted or unsubstituted aryl group of 6 to 20 ring-forming carbon atoms, $Q_1$ to $Q_3$, $R_1$ to $R_7$, $R_{12}$ to $R_{15}$, m1, m2, $R_{21}$ and $R_{22}$ are the same as defined in connection with Formula 1 and Formula 2.

7. The light emitting device of claim 4, wherein Formula 1-B2 is represented by one of Formula 1-B2-1 to Formula 1-B2-4:

[Formula 1-B2-1]

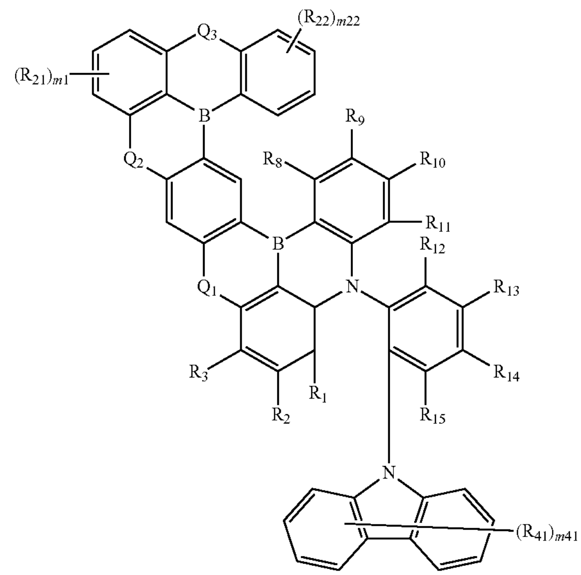

[Formula 1-B2-2]

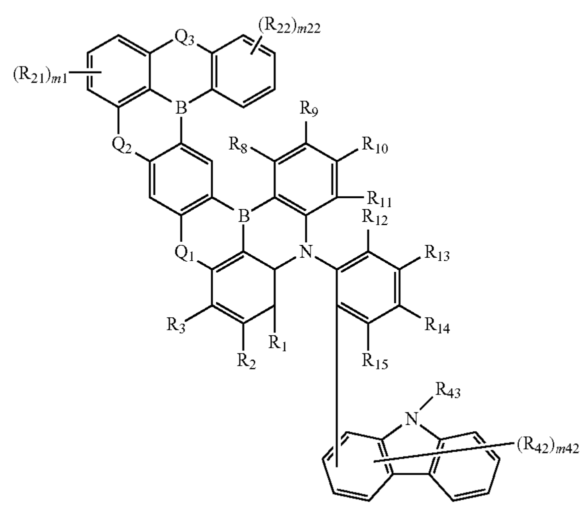

[Formula 1-B2-3]

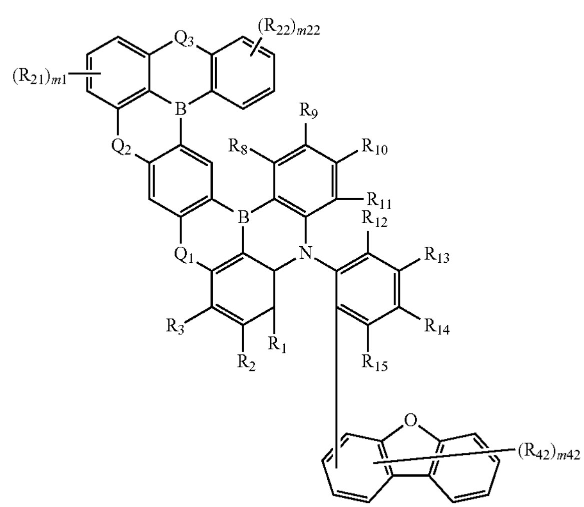

-continued

[Formula 1-B2-4]

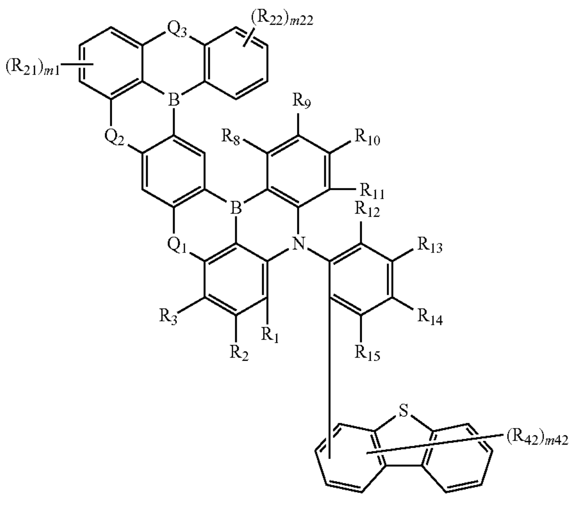

wherein in Formula 1-B2-1 to Formula 1-B2-4, m41 is an integer from 1 to 8, m42 is an integer from 1 to 7, $R_{41}$ to $R_{43}$ are each independently a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, a substituted or unsubstituted aryl group of 6 to 20 ring-forming carbon atoms, $Q_1$ to $Q_3$, $R_1$ to $R_3$, $R_8$ to $R_{15}$, m1, m2, $R_{21}$ and $R_{22}$ are the same as defined in connection with Formula 1 and Formula 2.

8. The light emitting device of claim 2, wherein Formula 1 is represented by one of Formula 1-C1 to Formula 1-C3:

[Formula 1-C1]

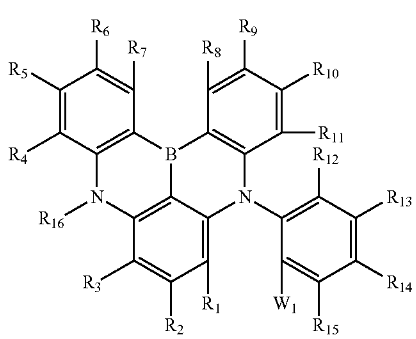

-continued

[Formula 1-C2]

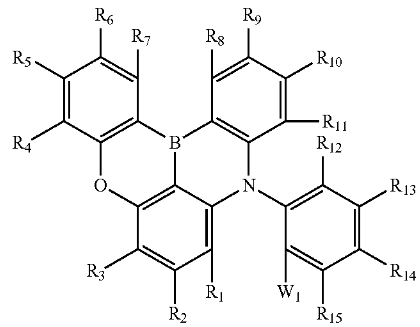

[Formula 1-C3]

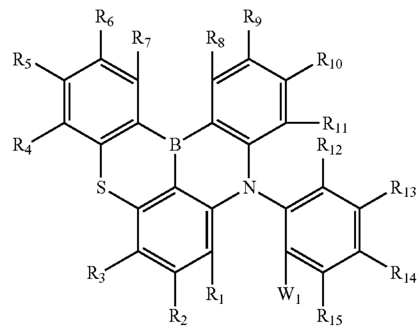

wherein in Formula 1-C1 to Formula 1-C3, $W_1$ and $R_1$ to $R_{16}$ are the same as defined in connection with Formula 1.

9. The light emitting device of claim 2, further comprising a capping layer disposed on the second electrode, wherein a refractive index of the capping layer is equal to or greater than about 1.6.

10. The light emitting device of claim 2, wherein the hole transport region comprises an amine compound represented by Formula H-1:

[Formula H-1]

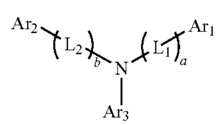

wherein in Formula H-1, a and b are each independently an integer from 0 to 10, $L_1$ and $L_2$ are each independently a direct linkage, a substituted or unsubstituted arylene group of 6 to 30 ring-forming carbon atoms, or a substituted or unsubstituted heteroarylene group of 2 to 30 ring-forming carbon atoms, $Ar_1$ and $Ar_2$ are each independently a substituted or unsubstituted aryl group of 6 to 30 ring-forming carbon atoms, or a substituted or unsubstituted heteroaryl group of 2 to 30 ring-forming carbon atoms, and $Ar_3$ is a substituted or unsubstituted aryl group of 6 to 30 ring-forming carbon atoms.

11. The light emitting device of claim 2, wherein the emission layer comprises at least one polycyclic compound selected from Compound Group 1:

[Compound Group 1]
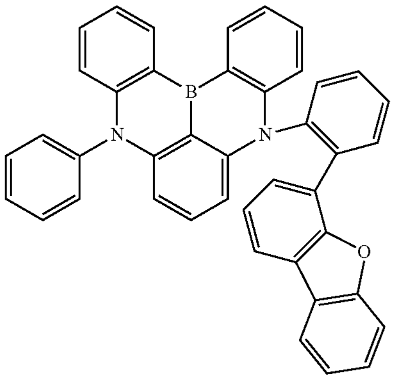
1
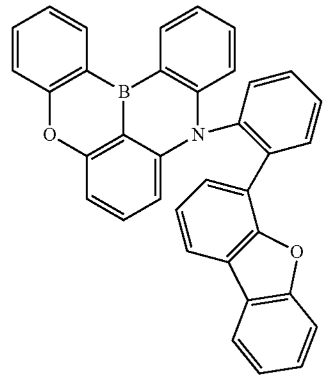
2
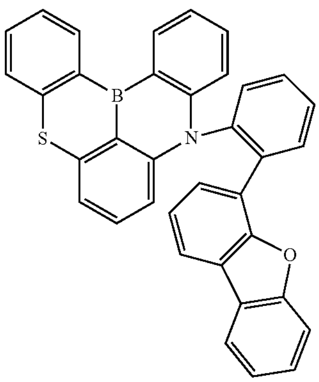
3
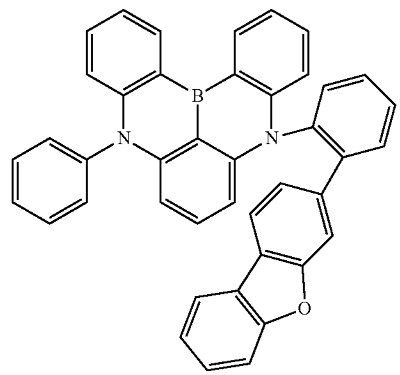
4
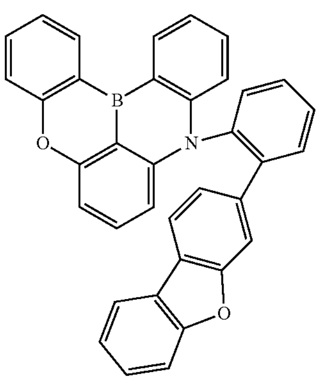
5
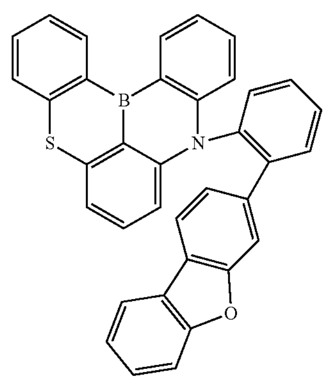
6
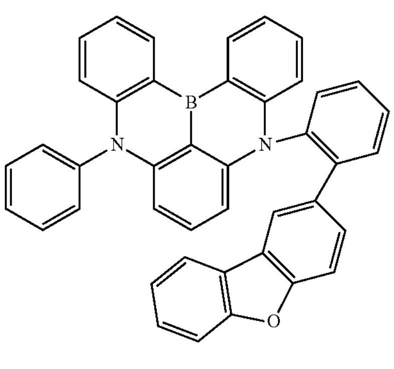
7
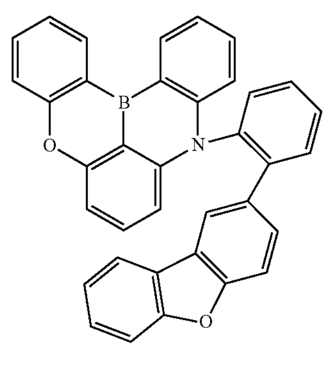
8

-continued
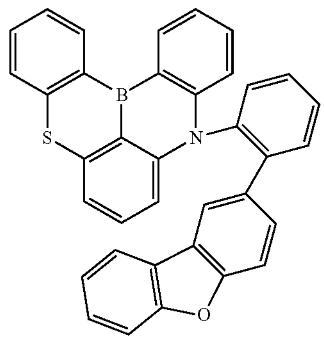
9
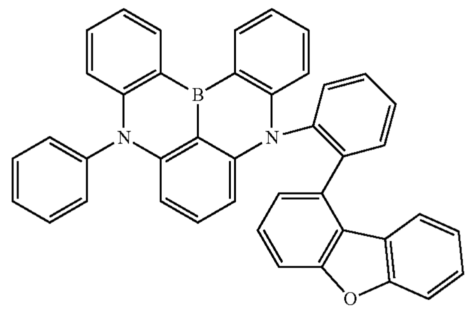
10
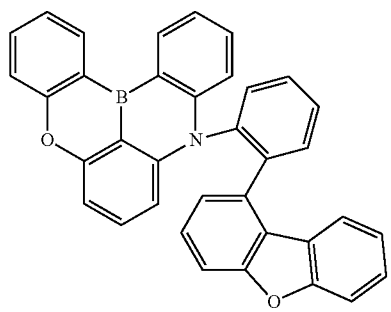
11
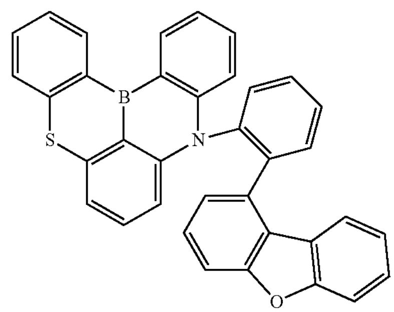
12
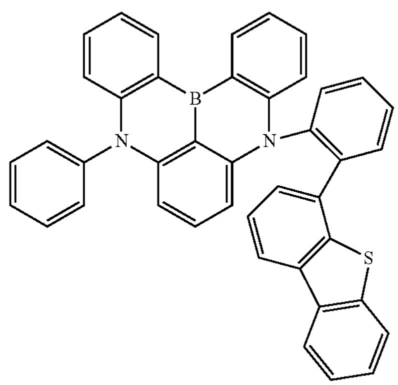
13
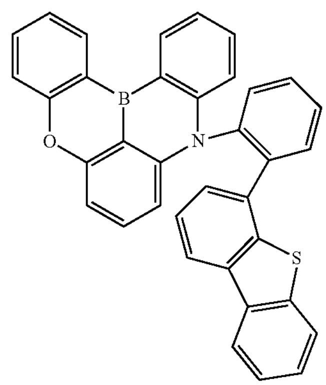
14
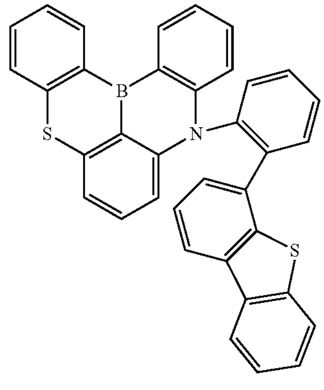
15
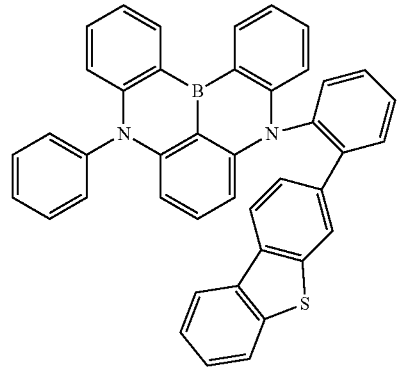
16

-continued
17
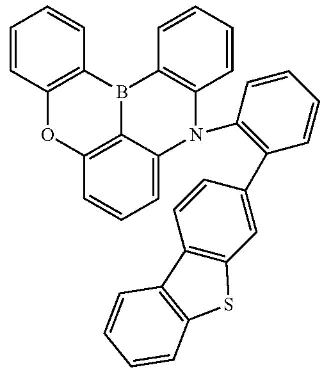
18
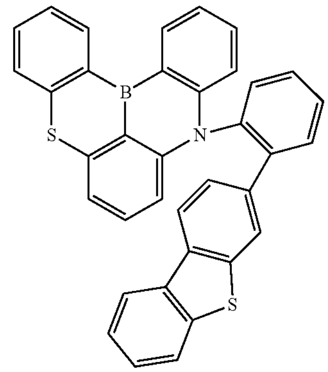
19
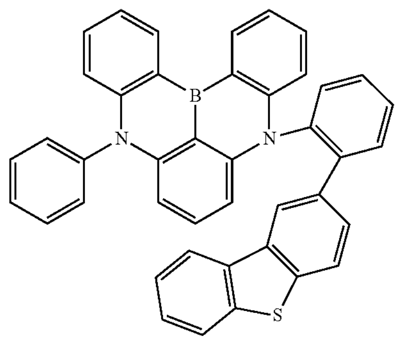
20
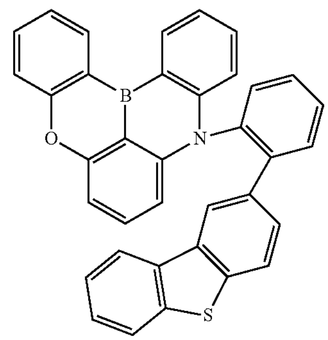
21
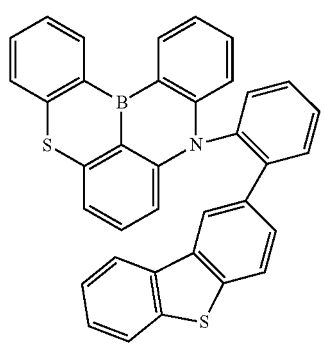
22
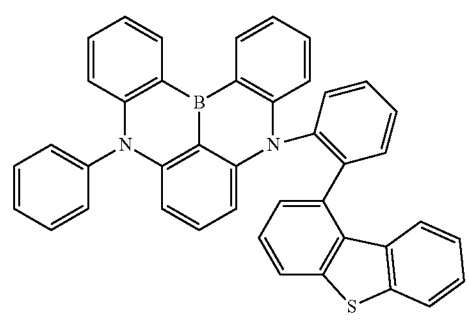
23
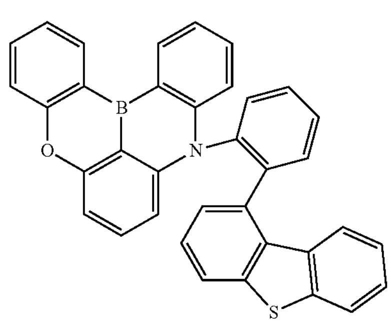
24
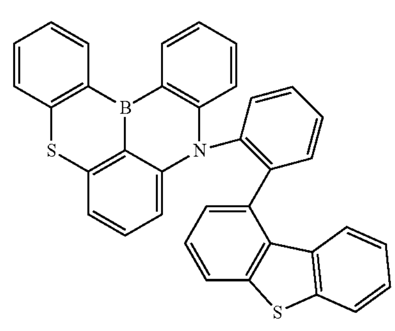

-continued
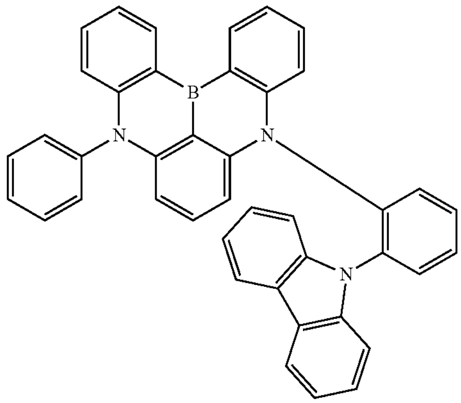
25
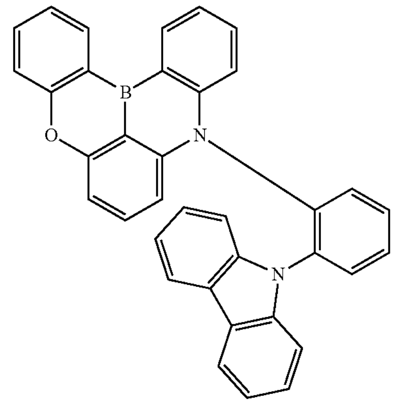
26
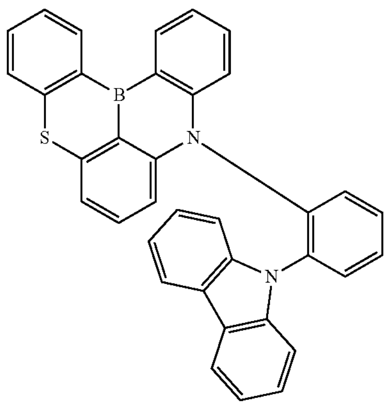
27
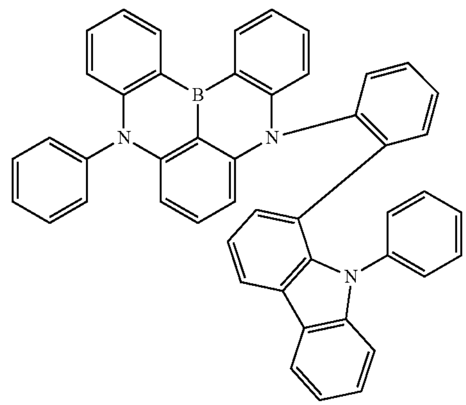
28
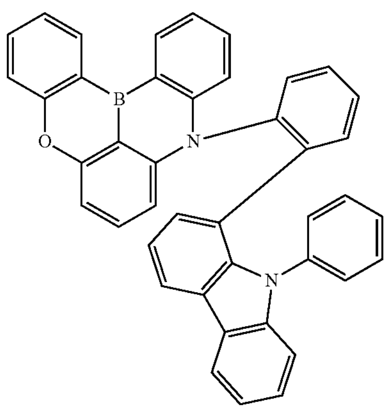
29
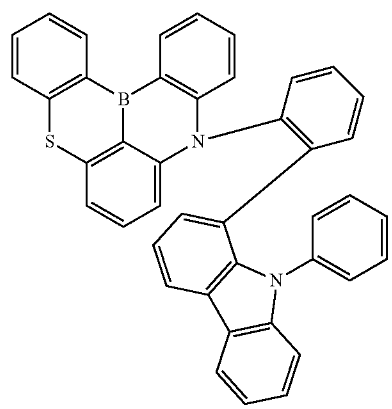
30
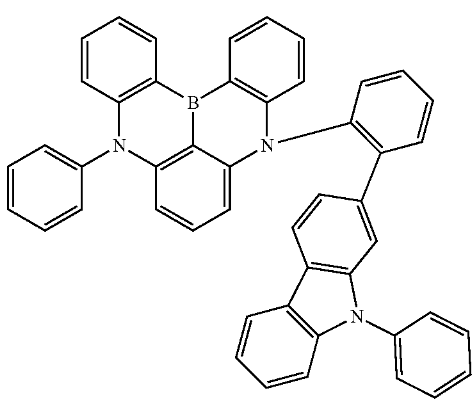
31
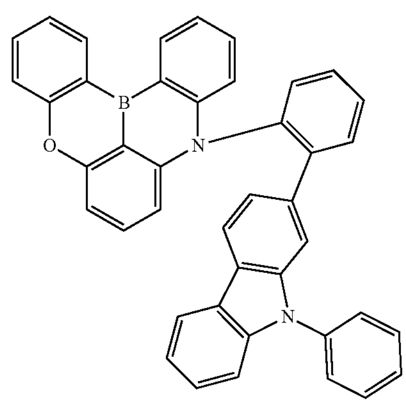
32

-continued
33
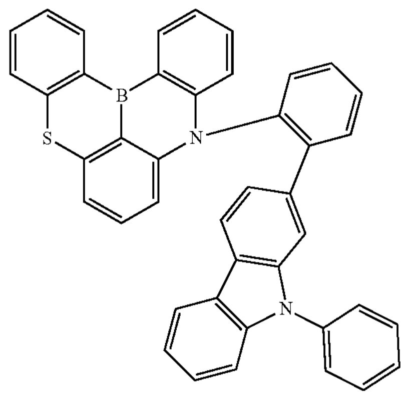
34
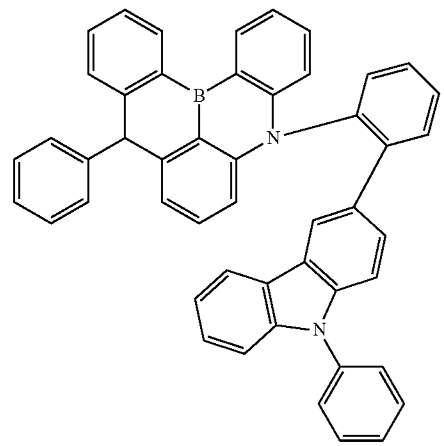
35
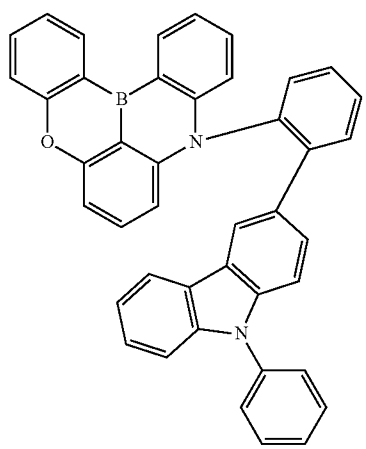
36
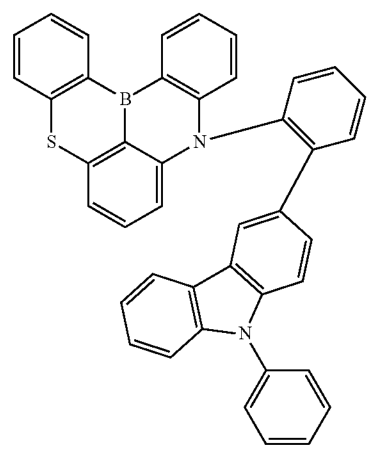
37
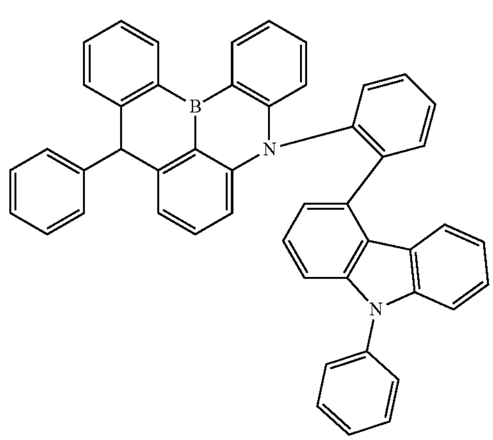
38
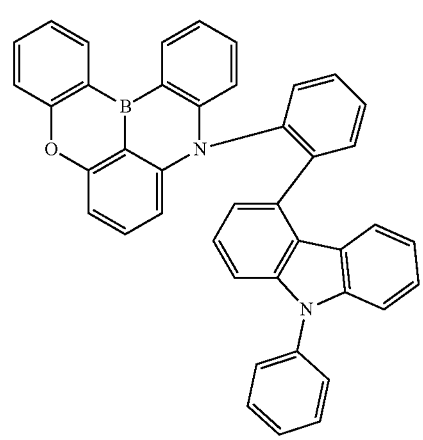

-continued
39
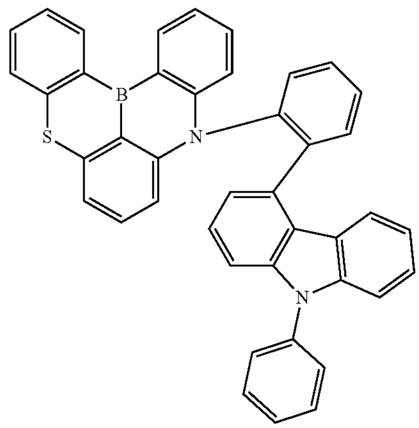
40
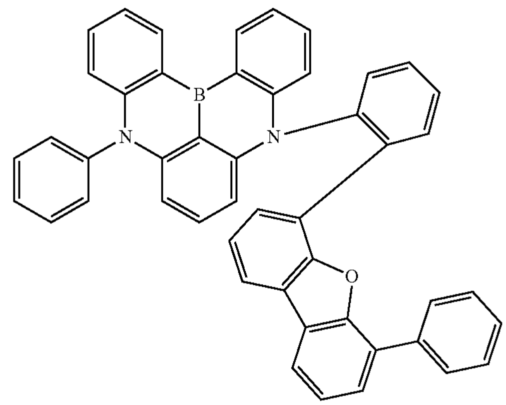
41
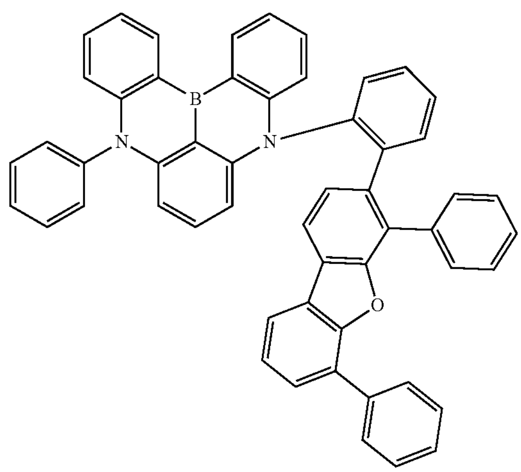
42
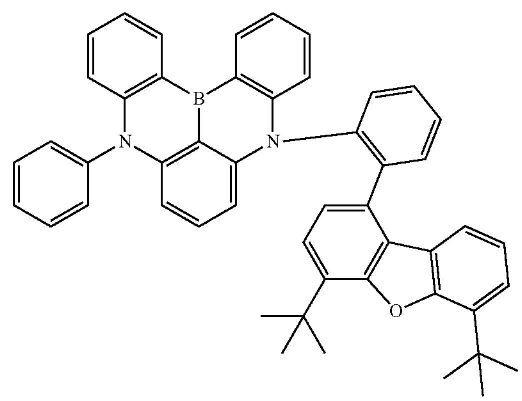
43
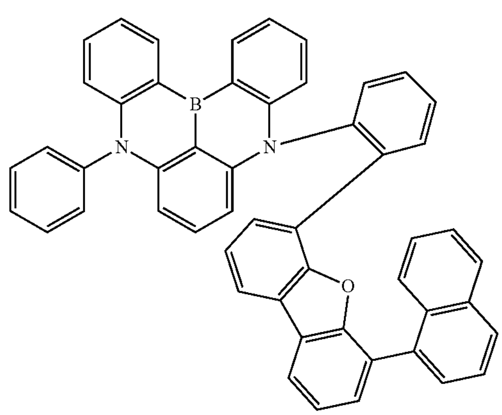
44
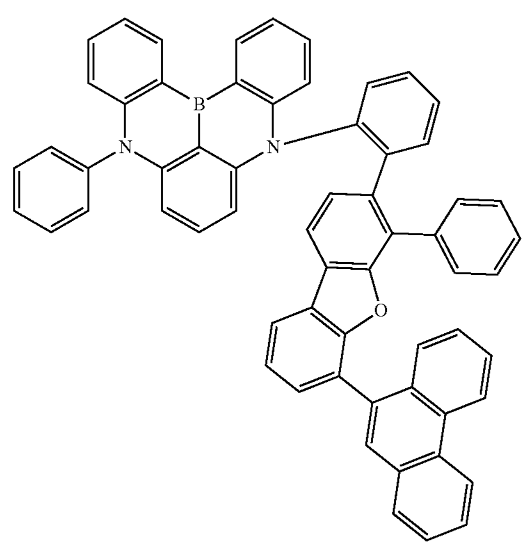

-continued
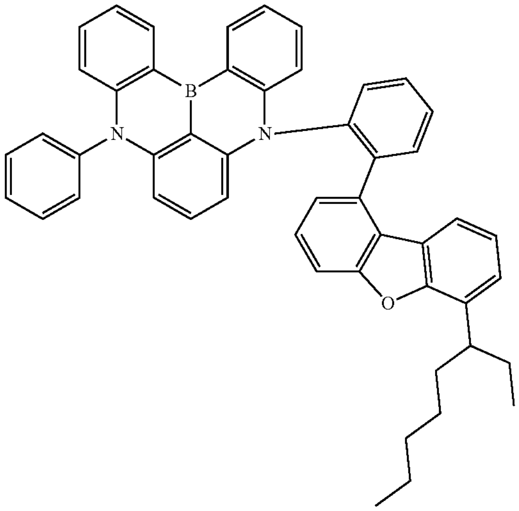
45
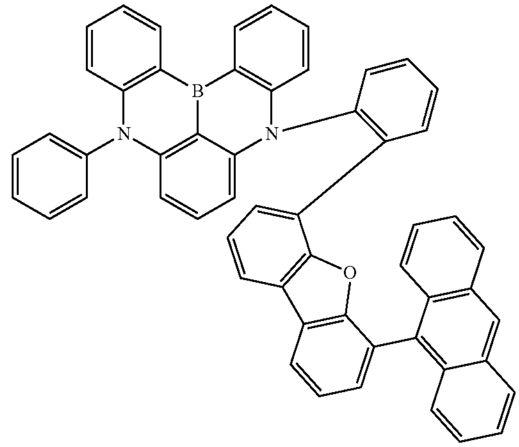
46
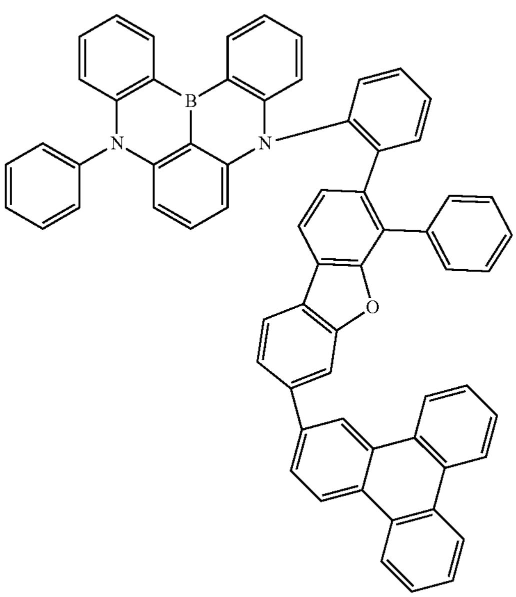
47
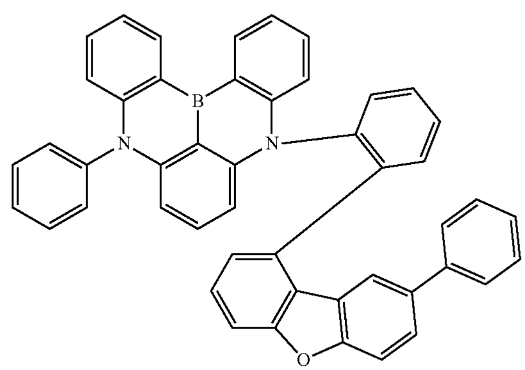
48

-continued
49
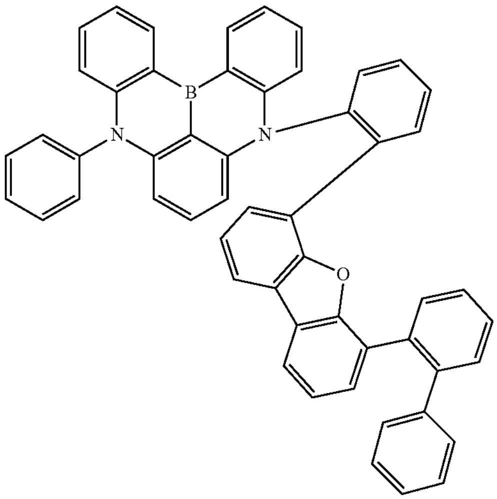
50
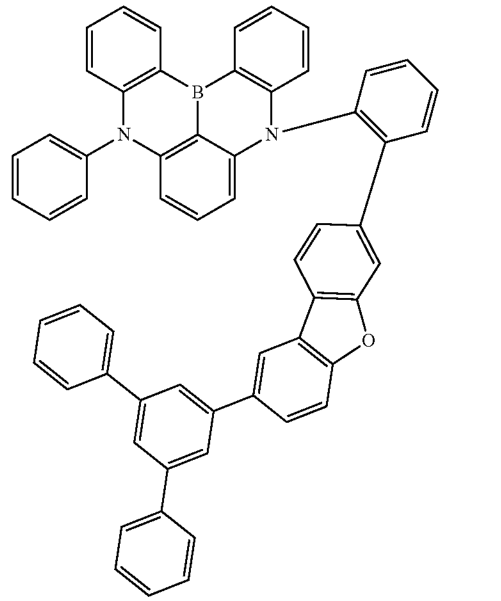
51
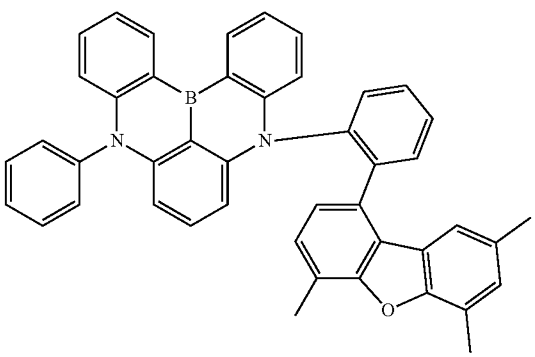
52
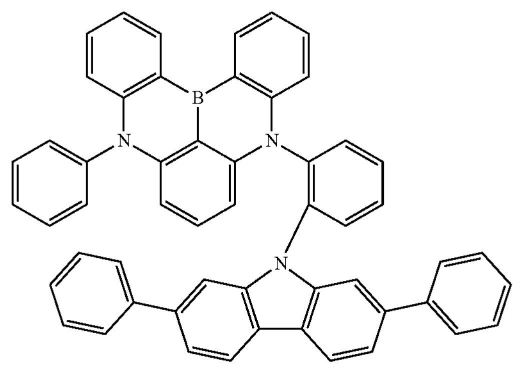
53
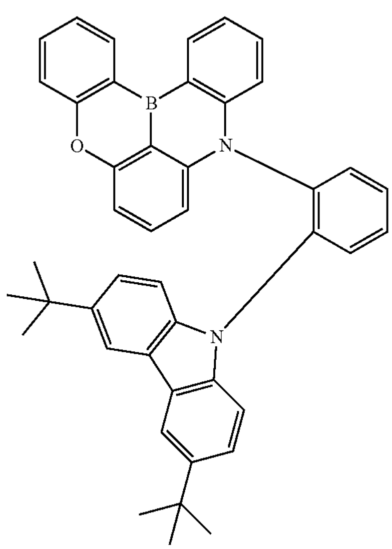
54
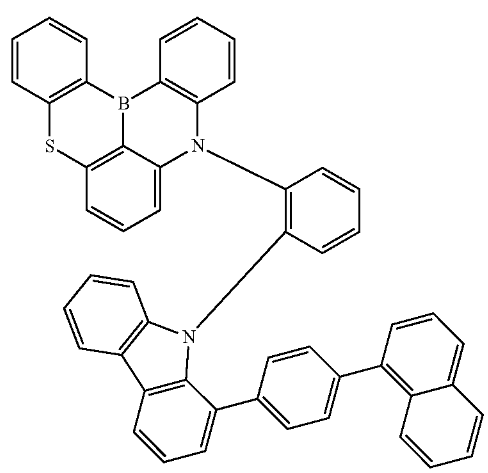

-continued
55
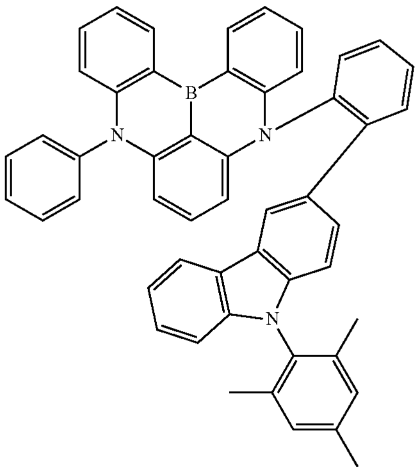
56
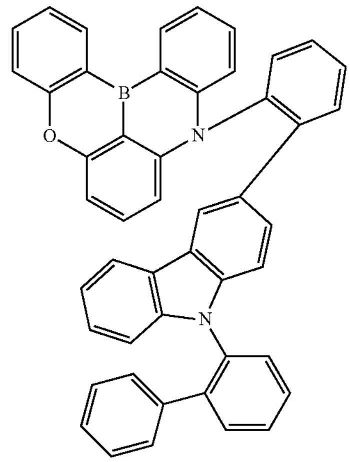
57
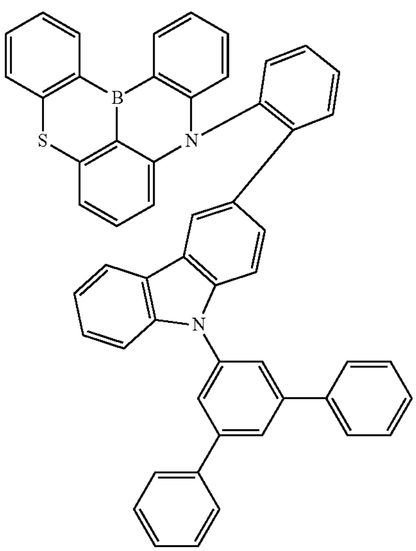
58
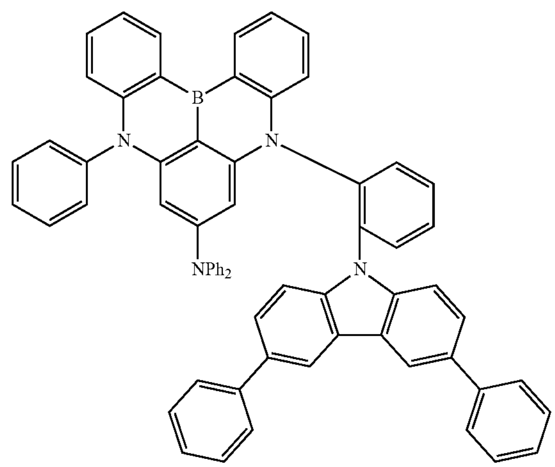
59
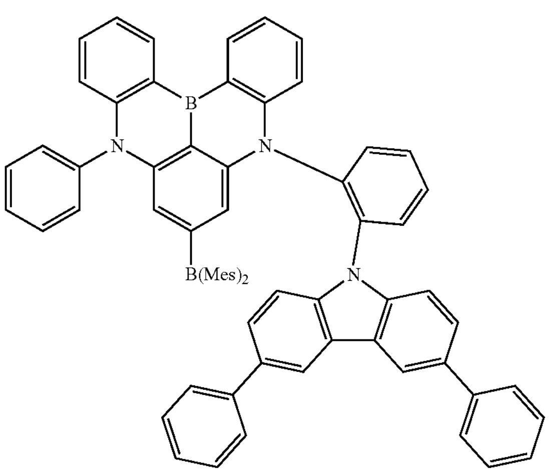
60
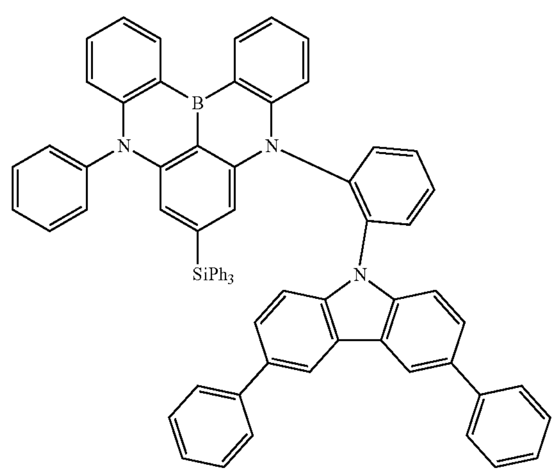

-continued
61
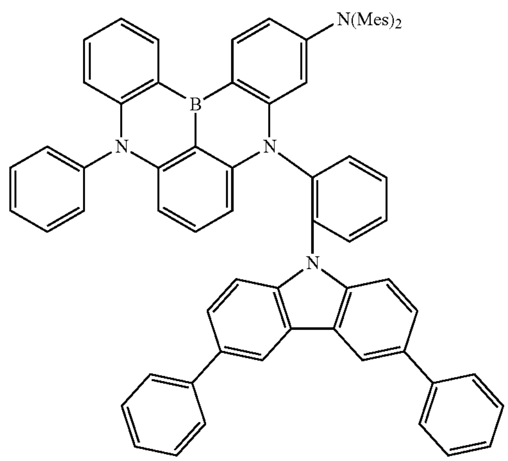
62
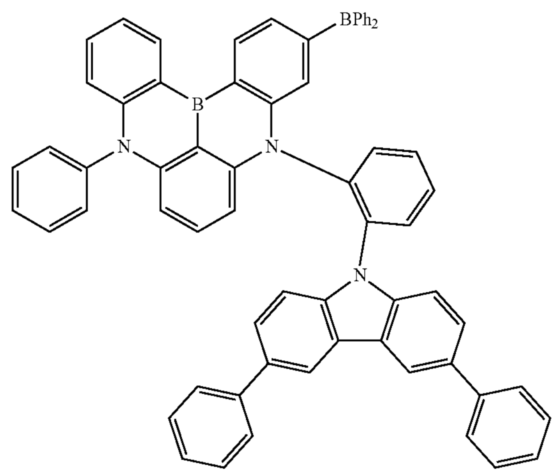
63
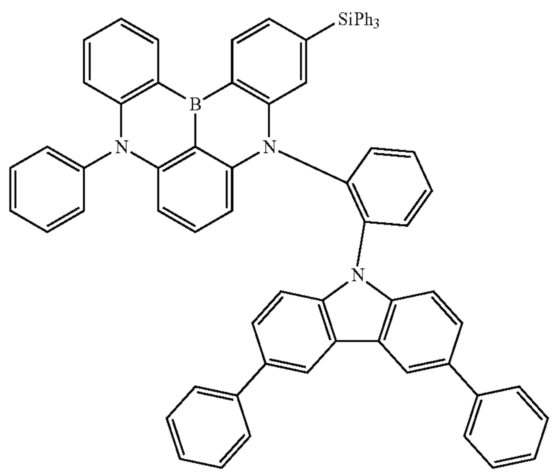
64
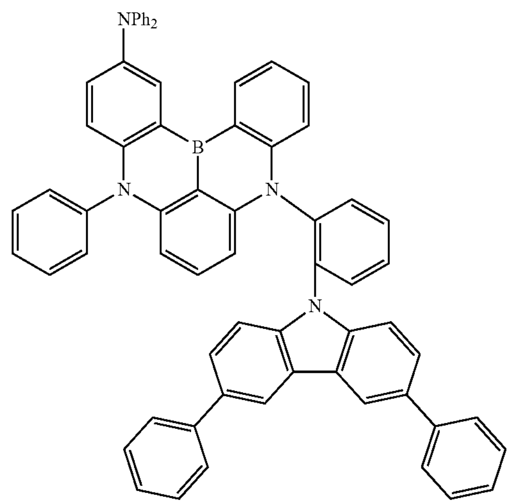
65
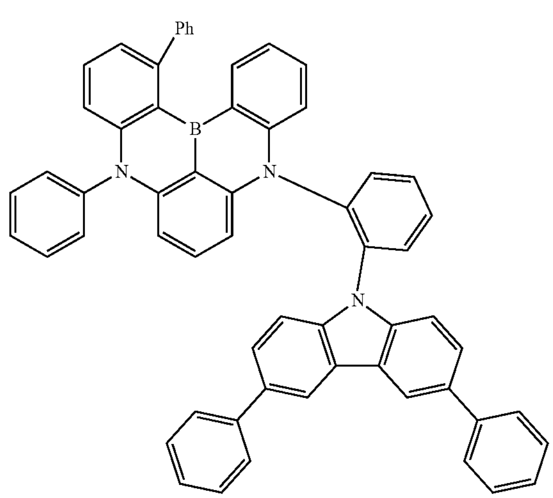
66
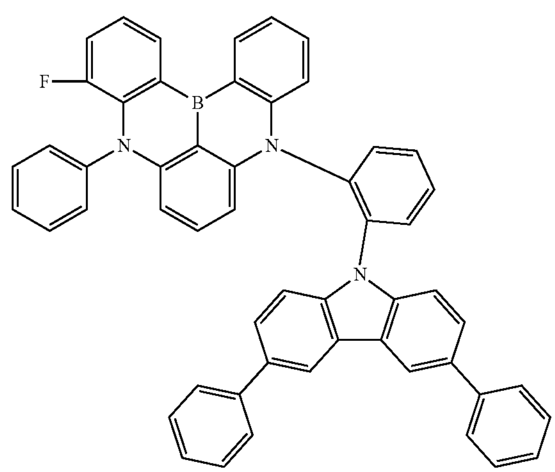

-continued
67
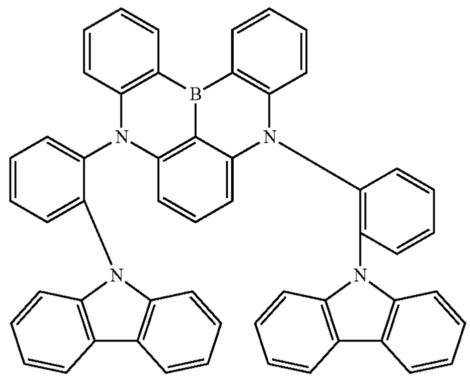
68
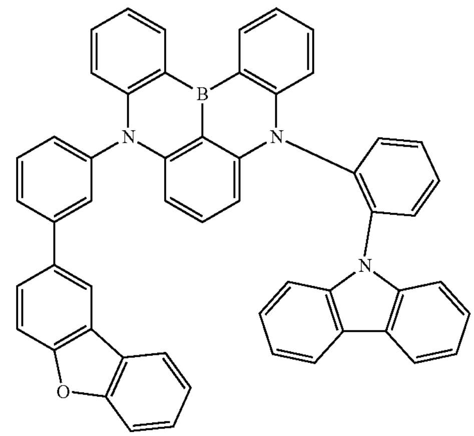
69
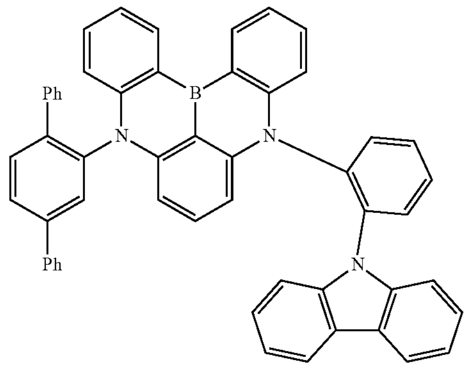
70
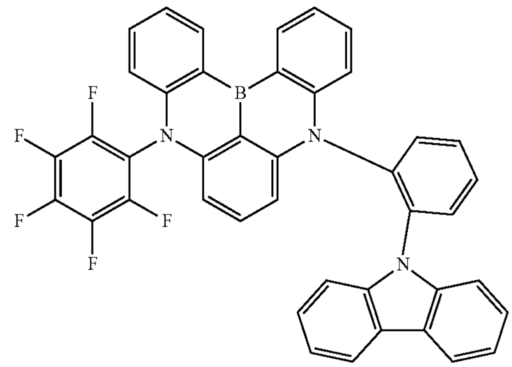
71
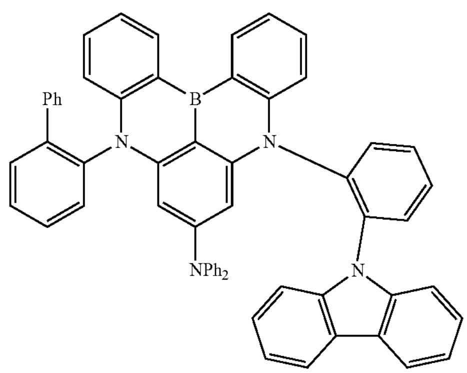
72
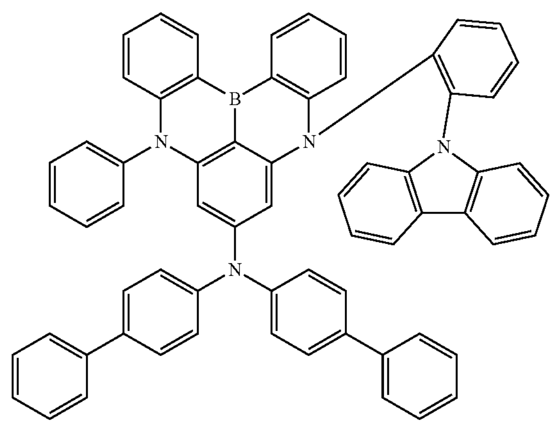
73
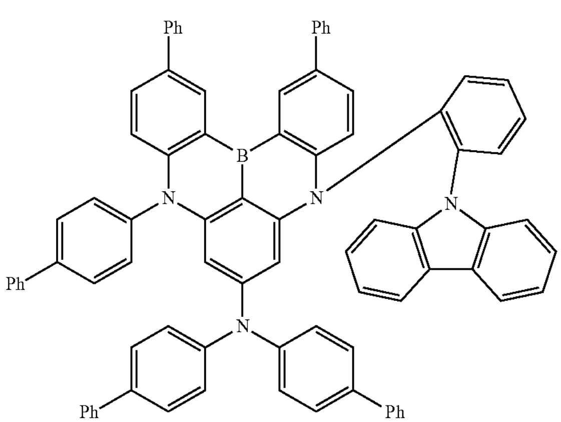
74
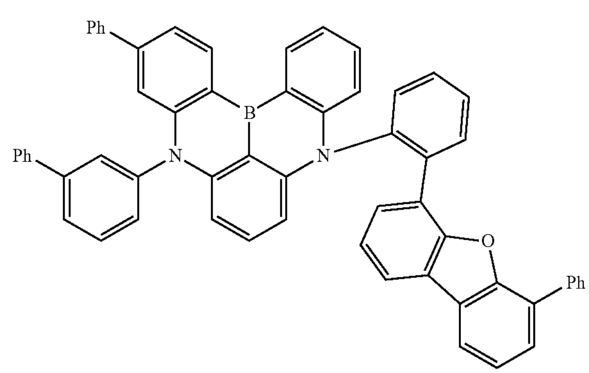

-continued
75
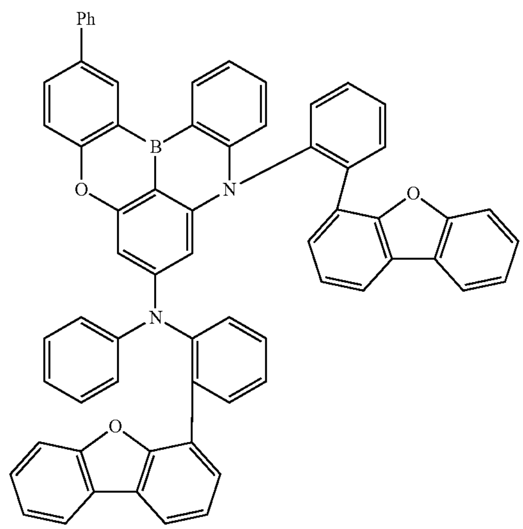
76
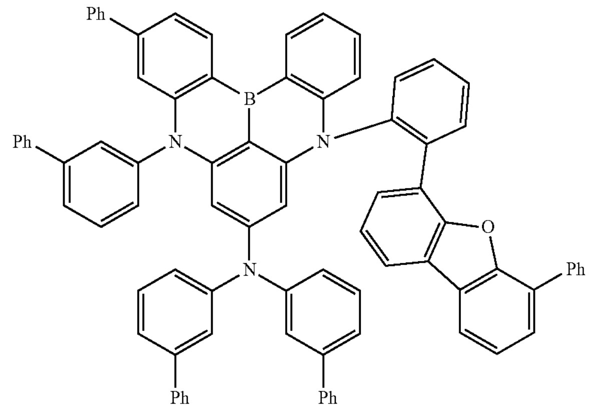
77
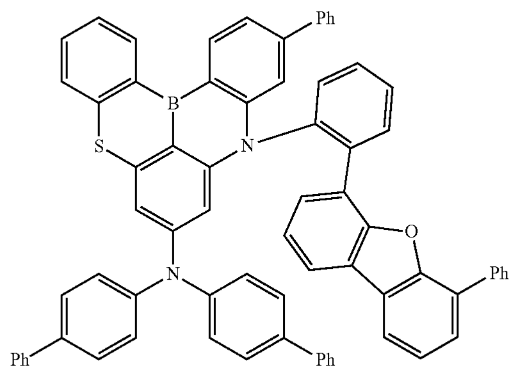
78
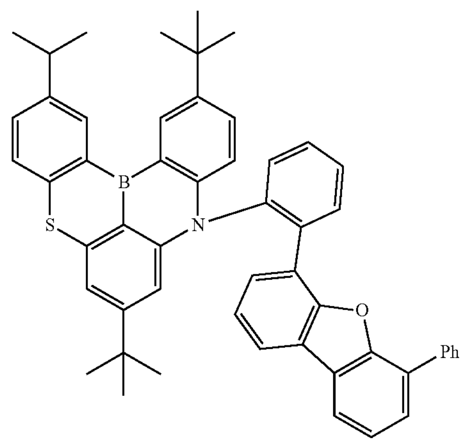
79
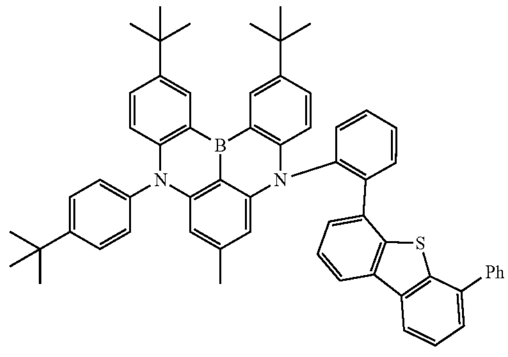
80
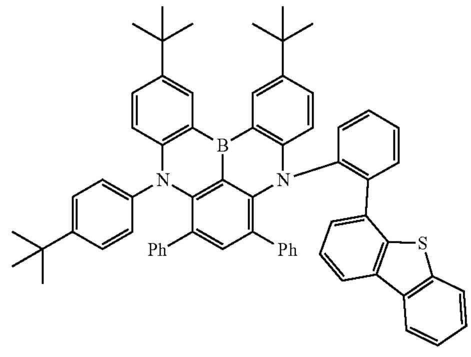

-continued
81
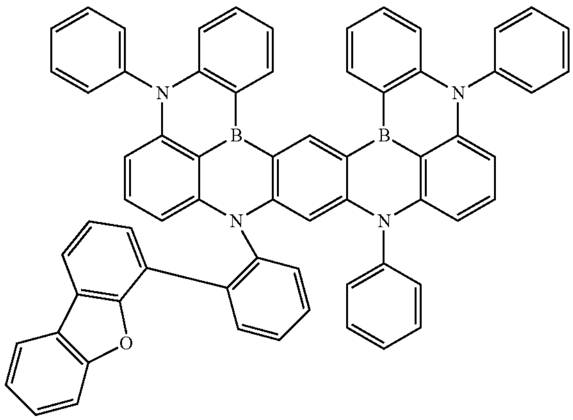
82
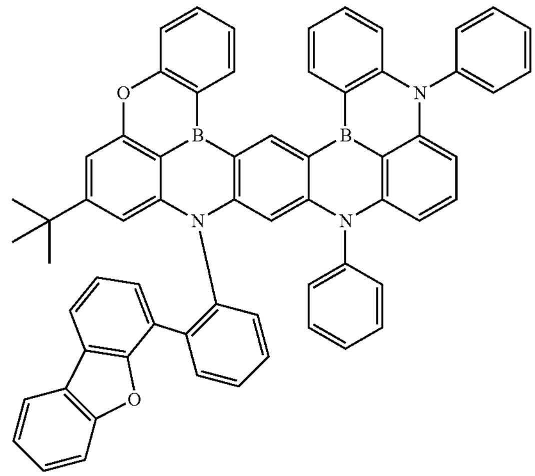
83
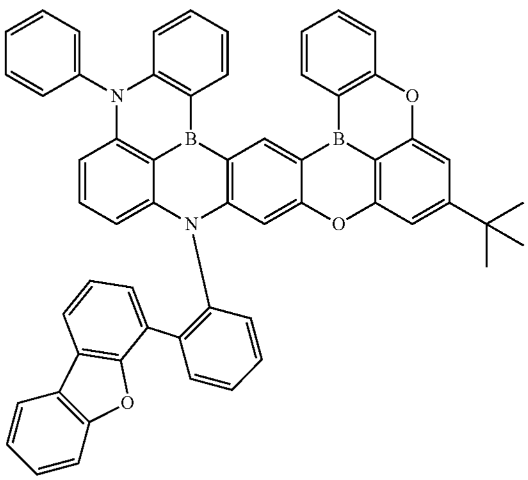
84
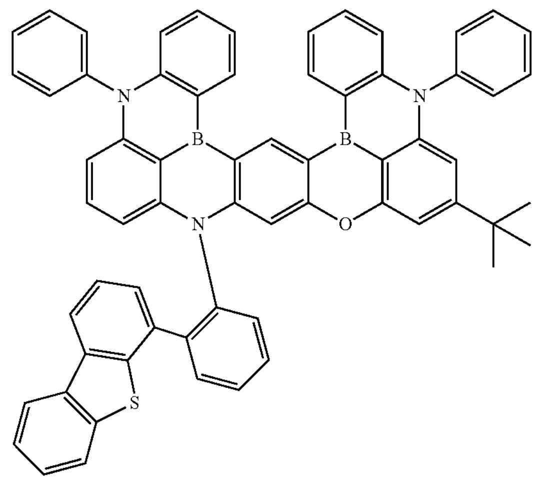
85
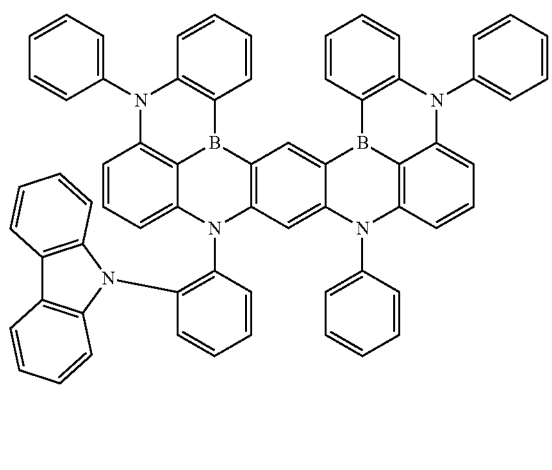
86
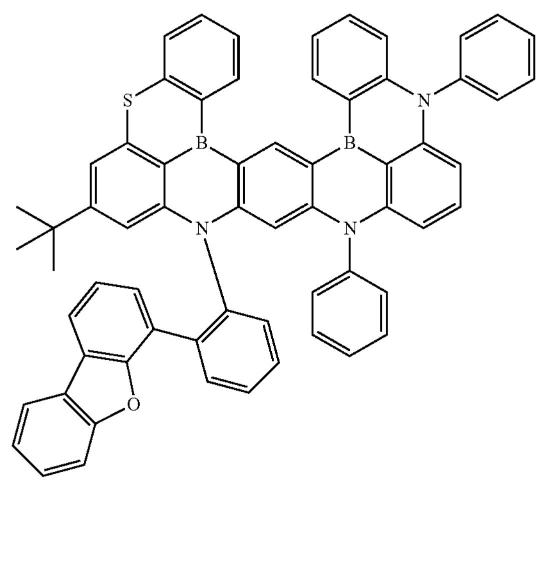

-continued
87
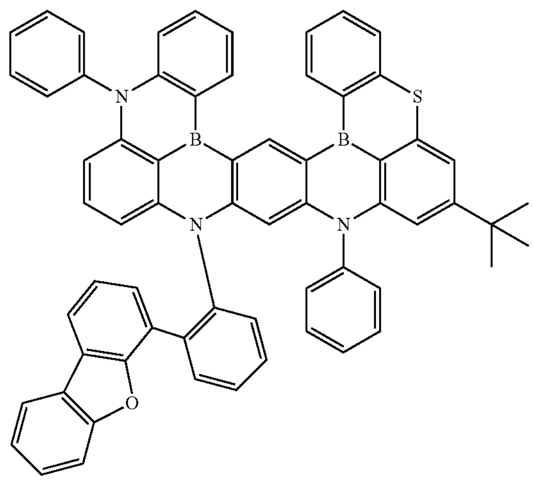
88
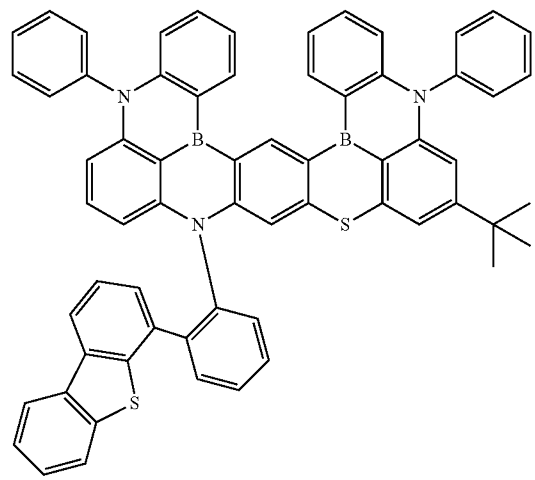
89
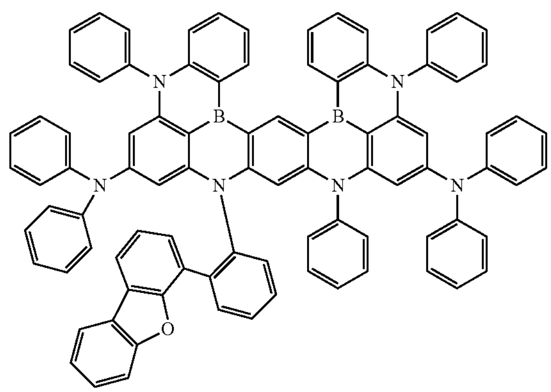
90
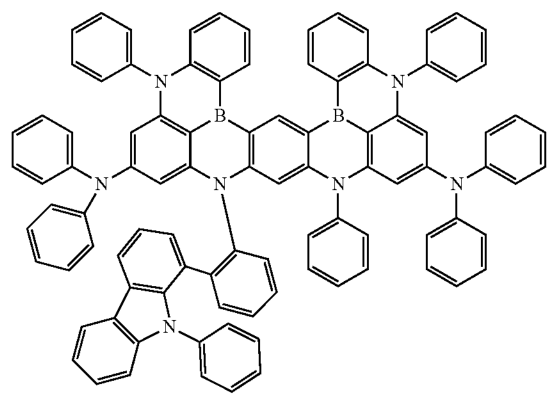
91
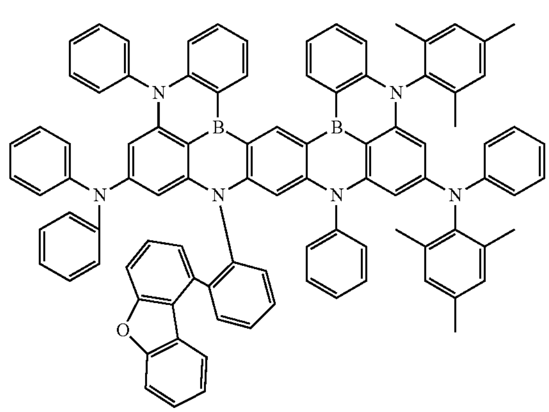
92
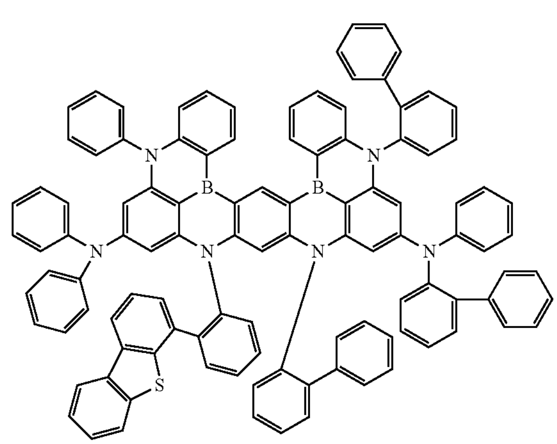

-continued
93
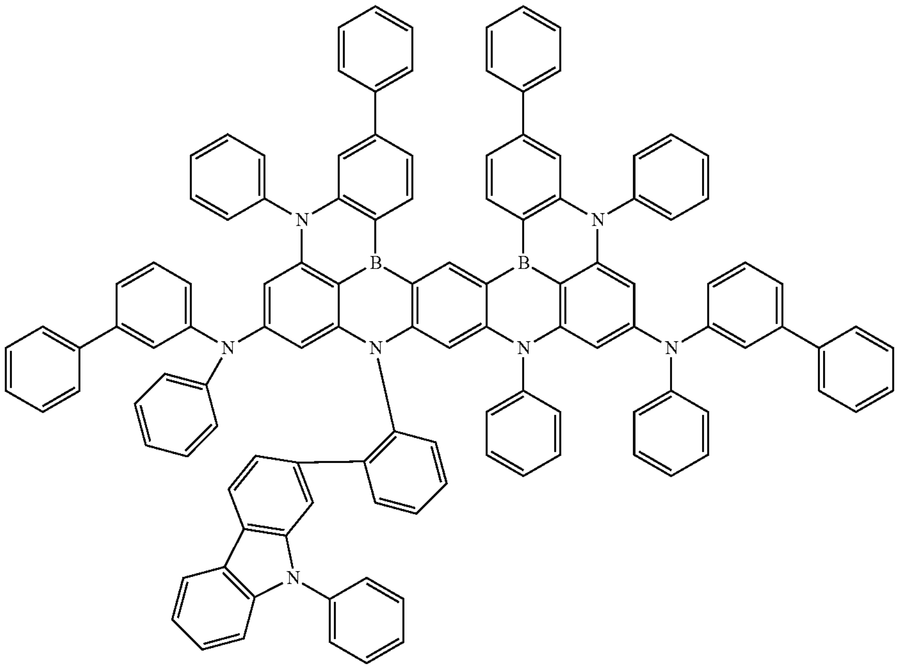
94
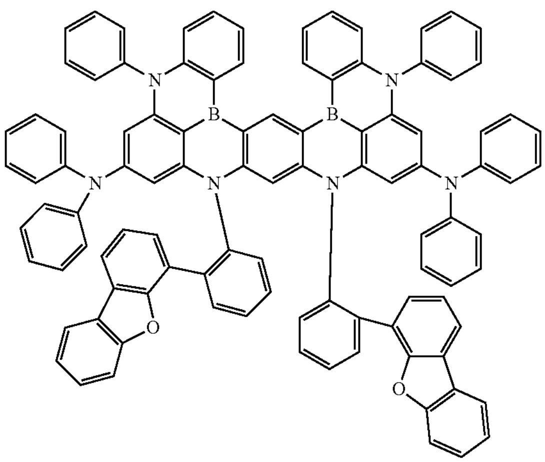
95
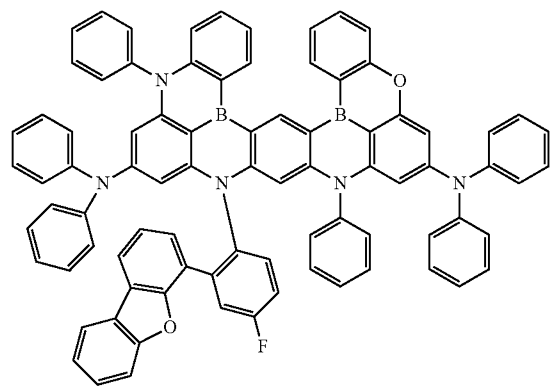
96
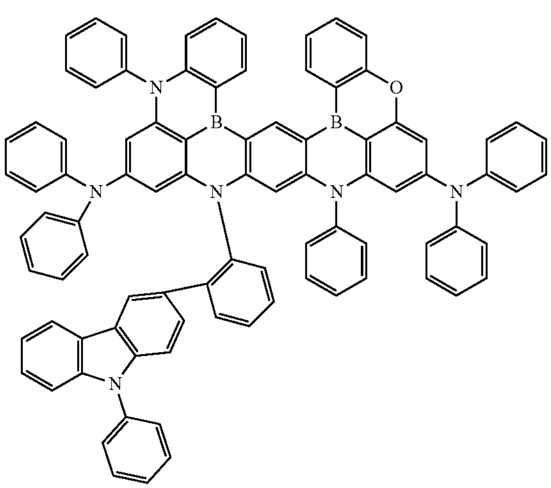
97
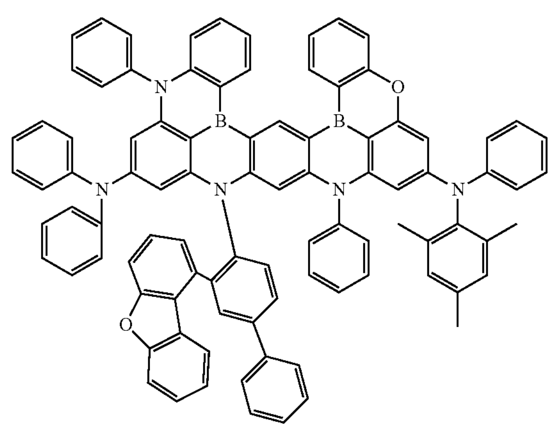

-continued
98
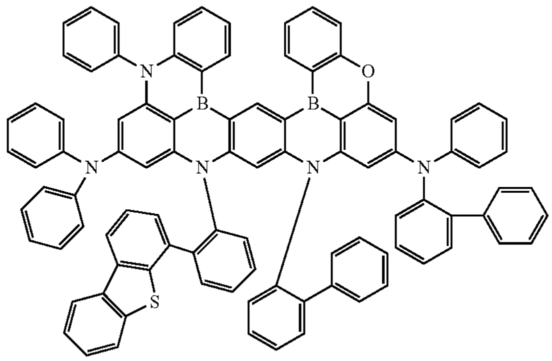
99
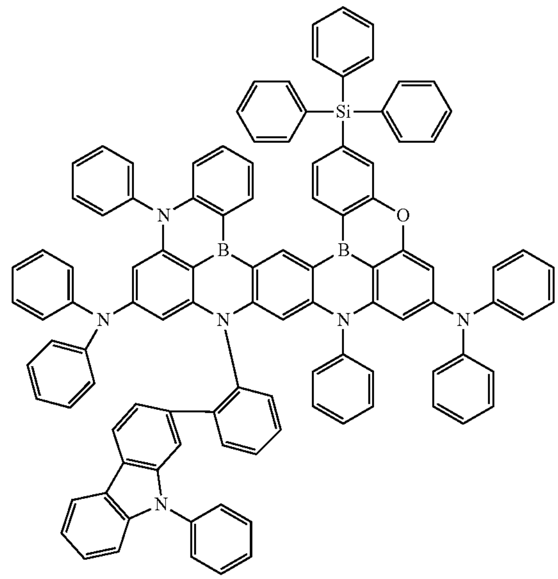
100
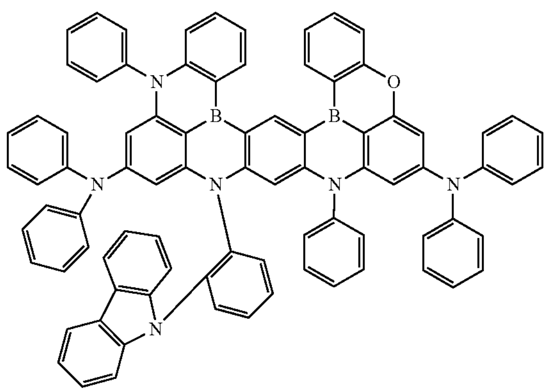
101
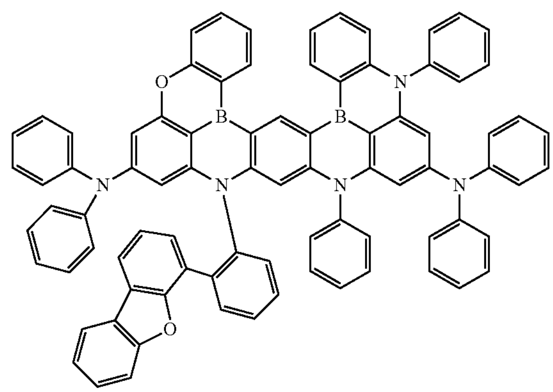
102
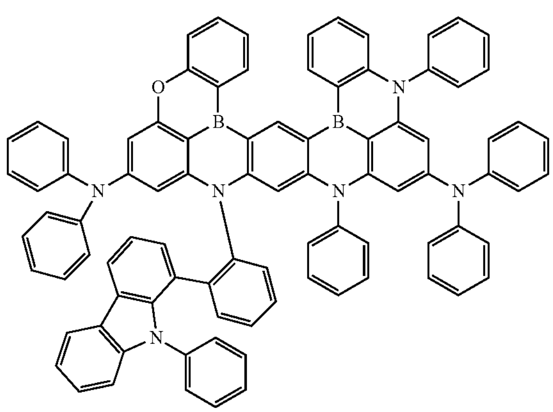
103
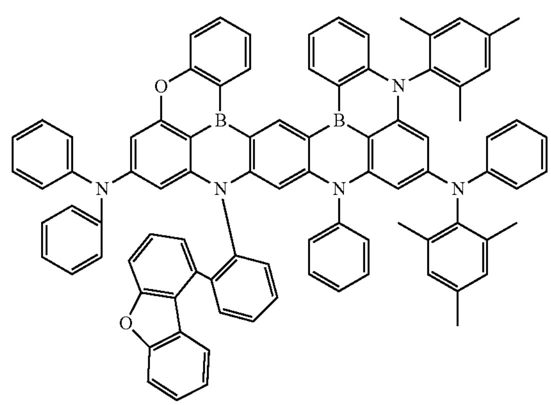

-continued
104
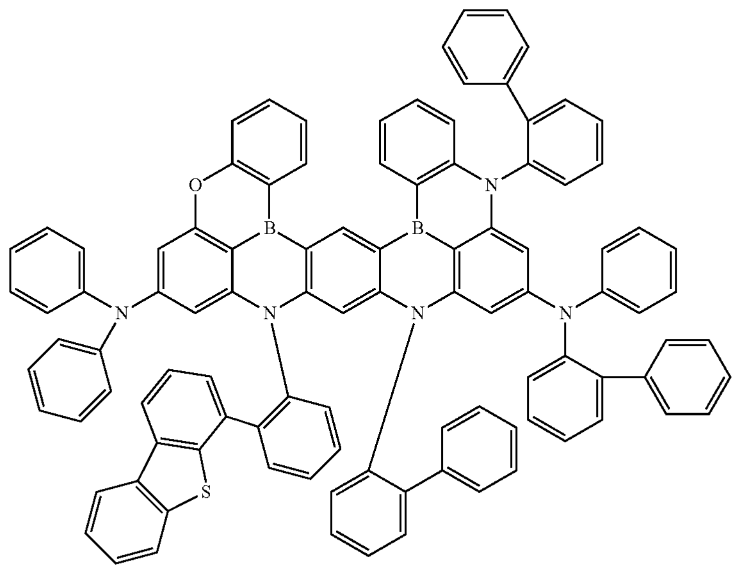
105
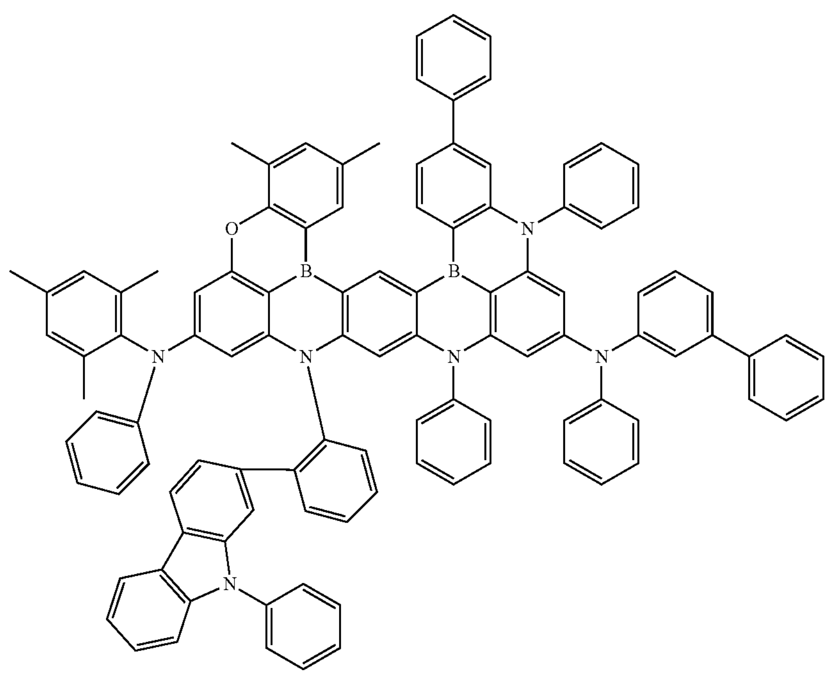

-continued
106
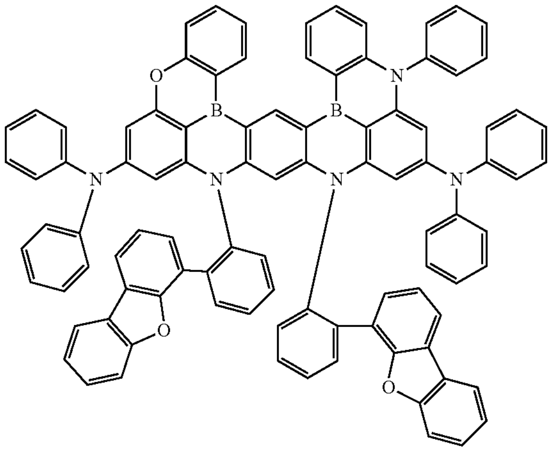
107
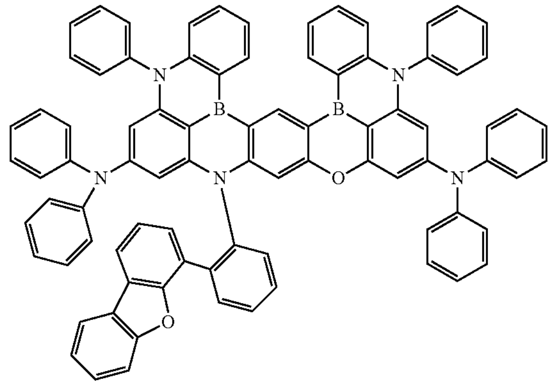
108
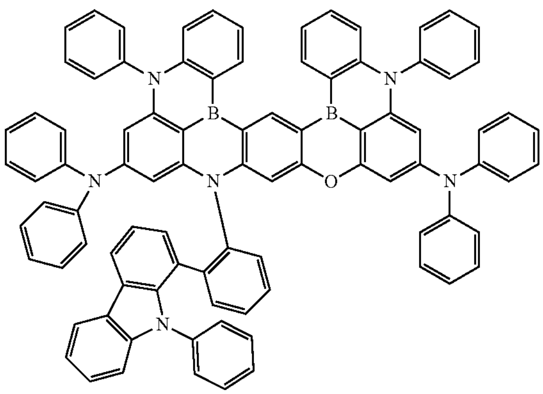
109
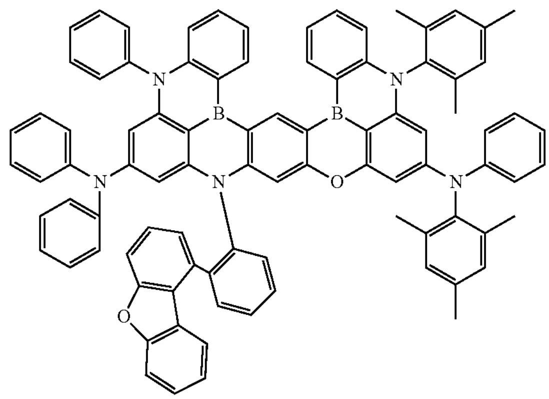
110
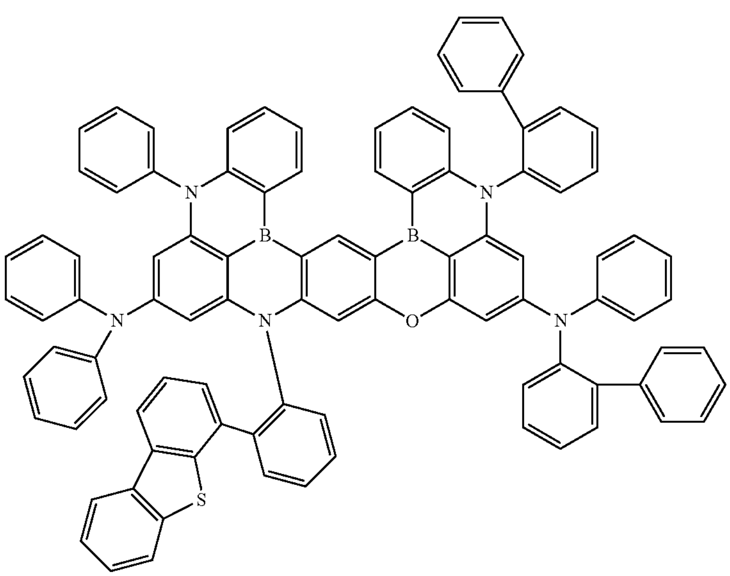

-continued
111
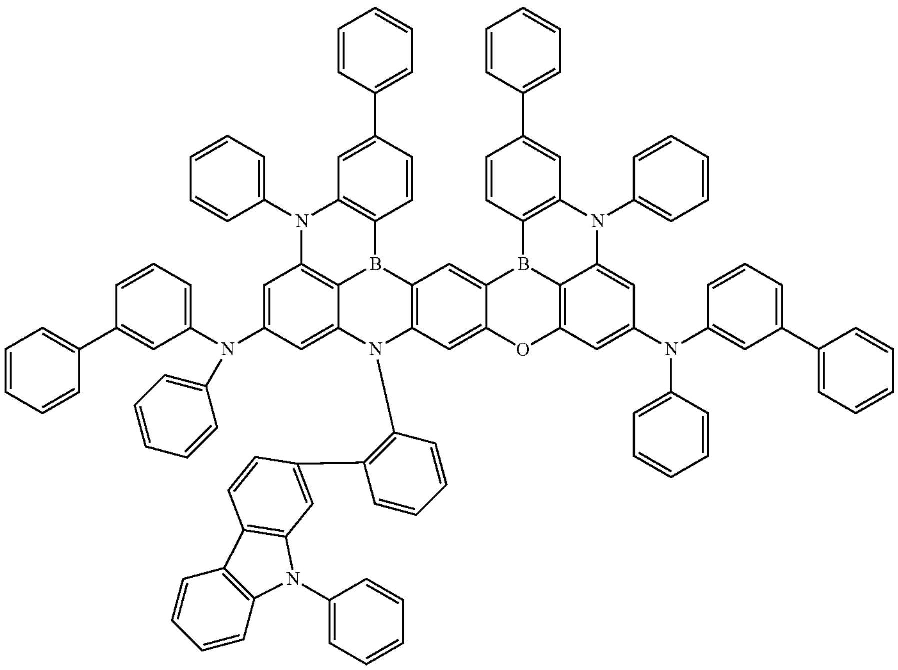
112
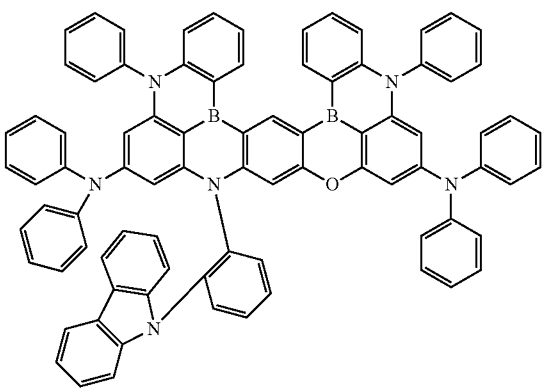
113
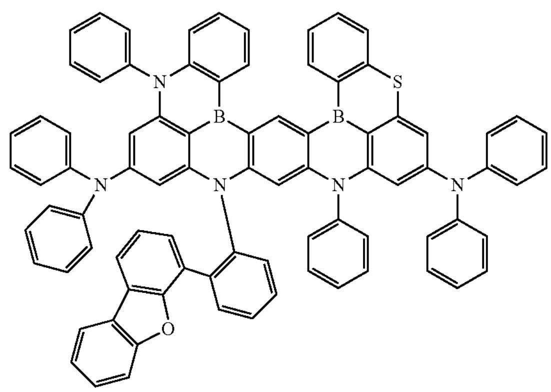
114
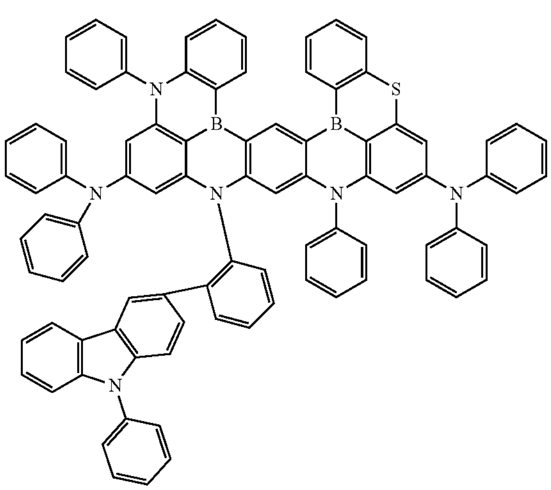
115
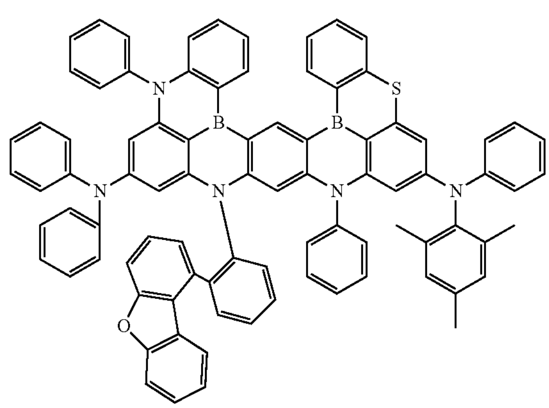

-continued
116
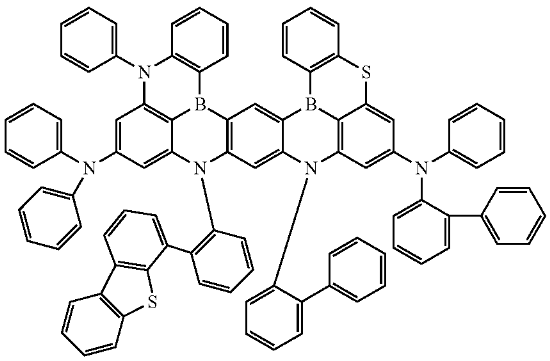
117
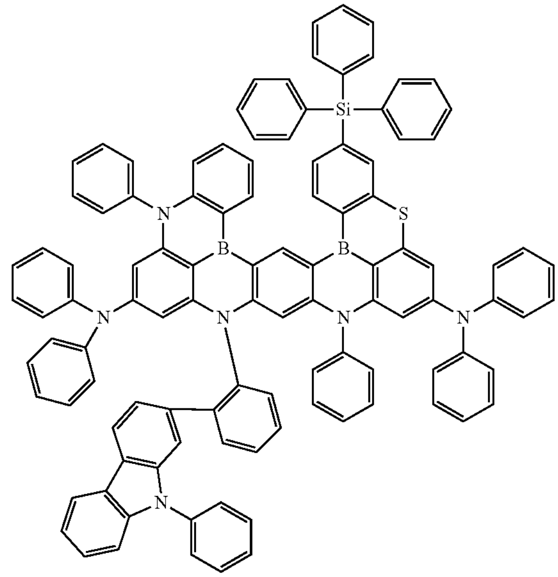
118
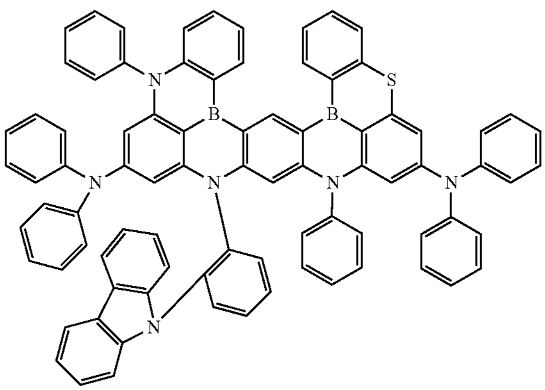
119
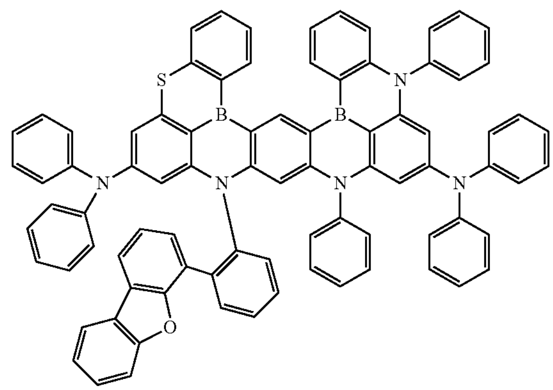
120
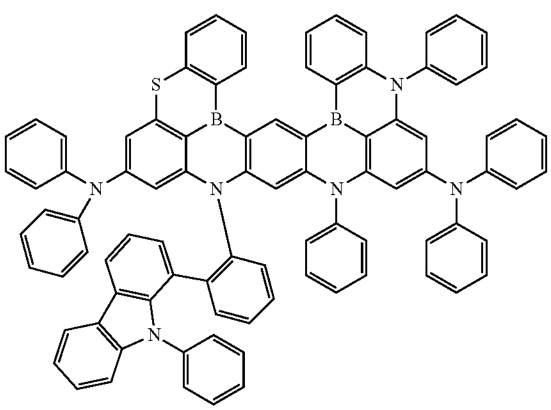
121
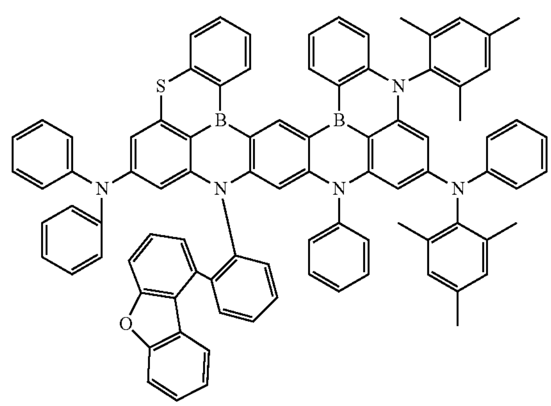

-continued
122
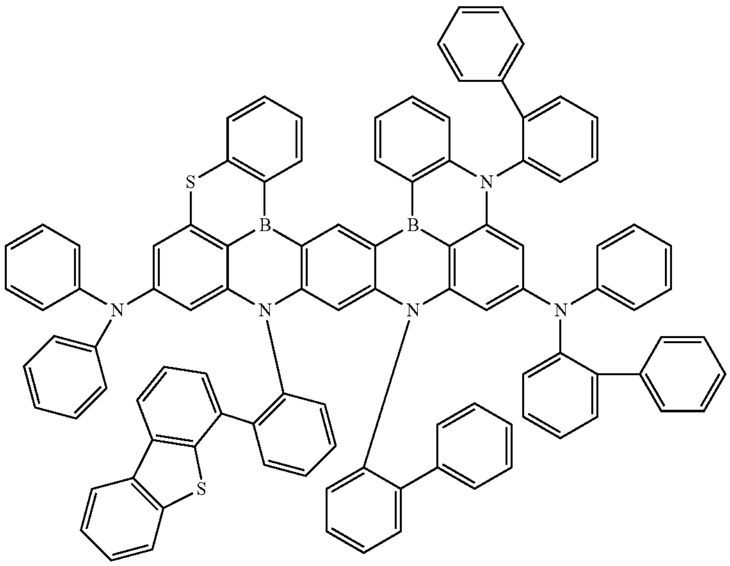
123
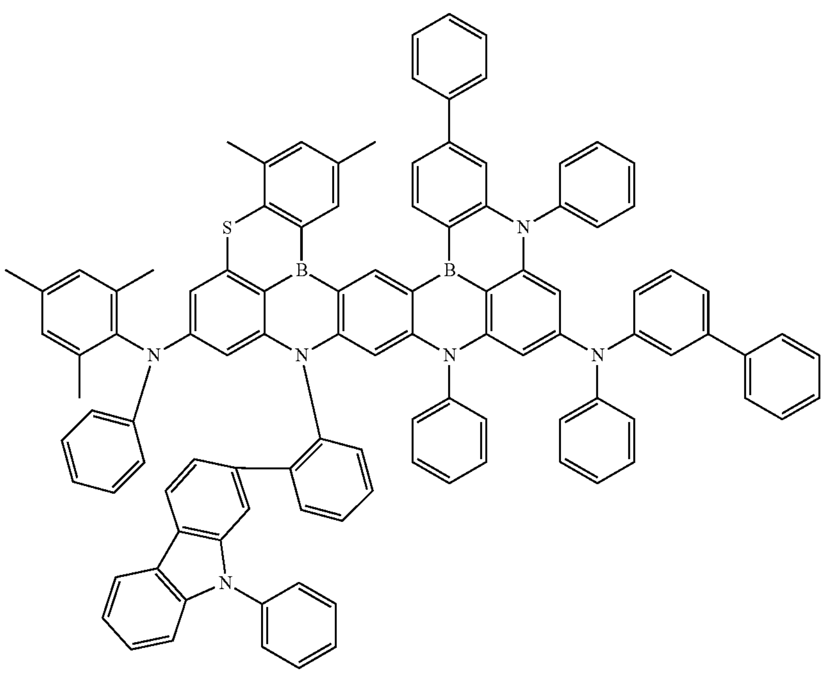

-continued
124
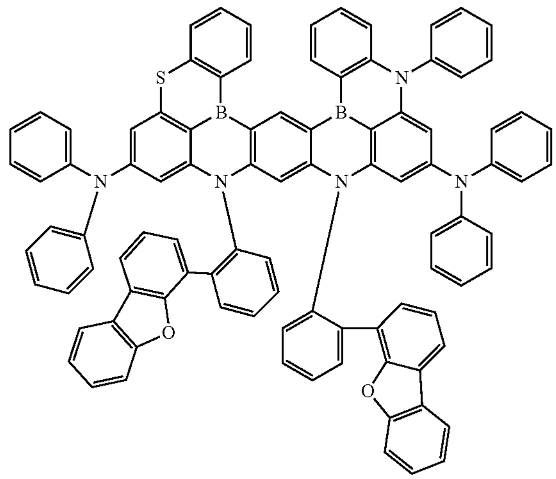
125
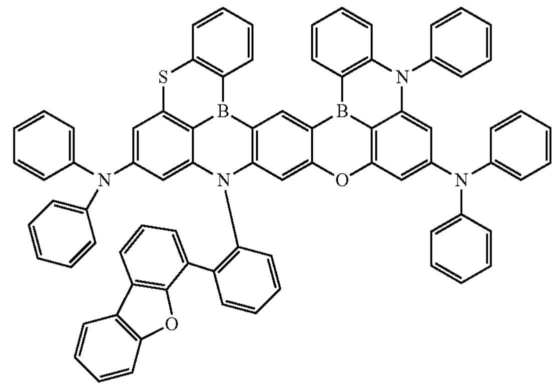
126
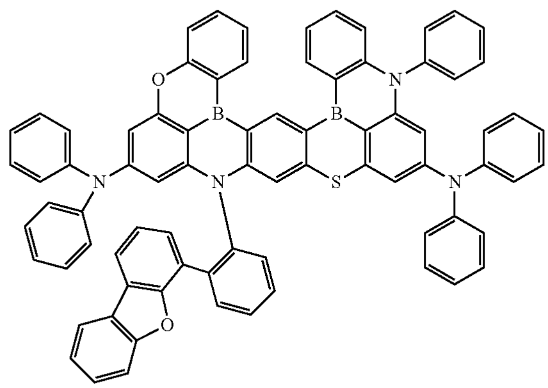
127
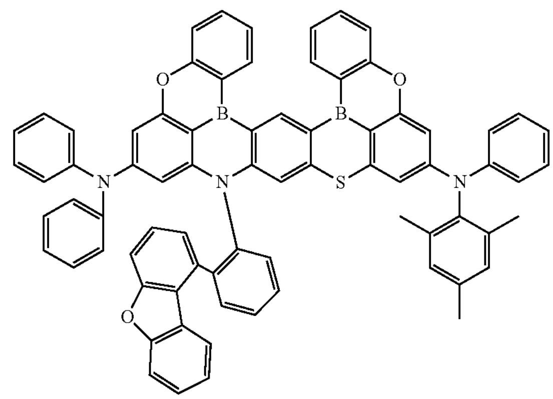
128
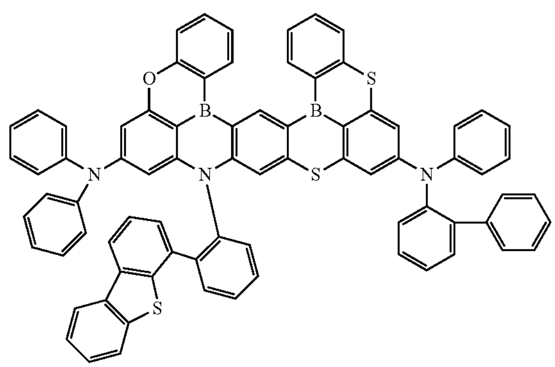
129
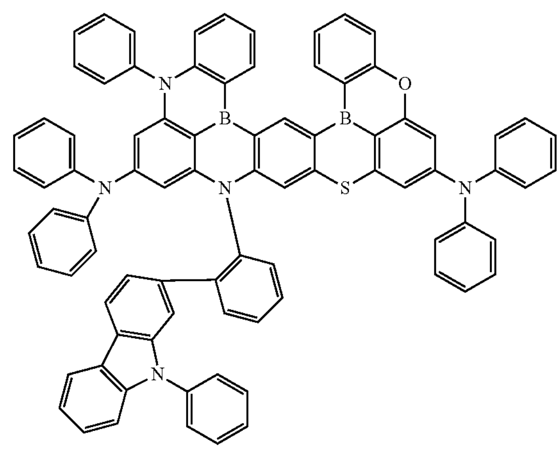

-continued
130
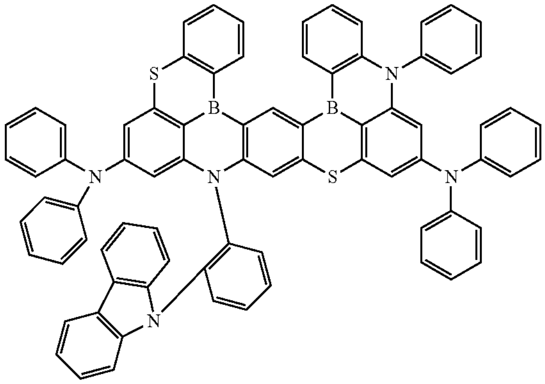
131
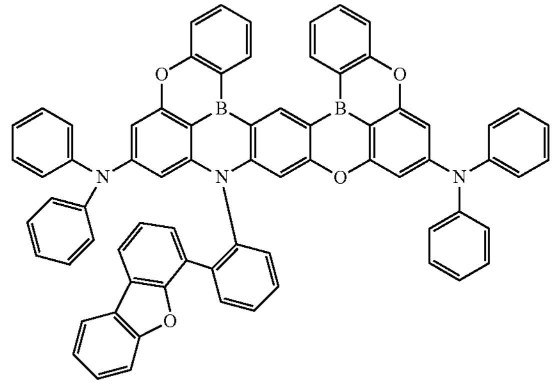
132
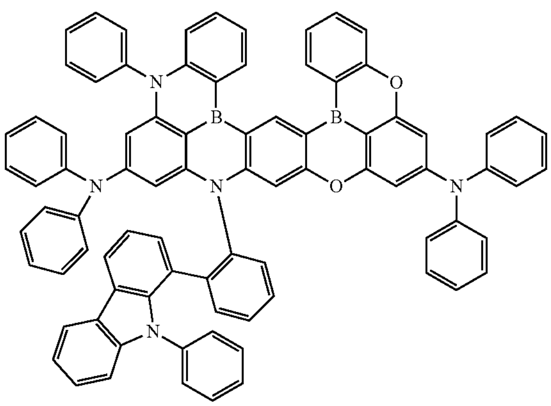
133
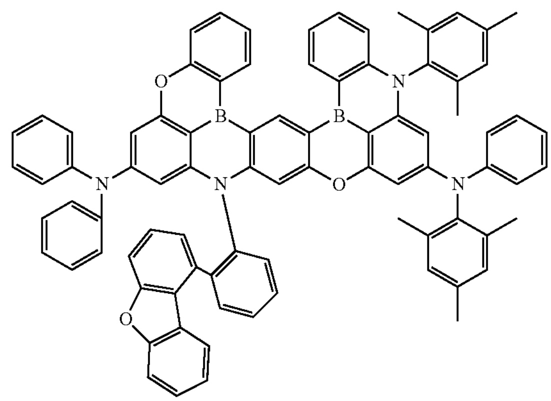
134
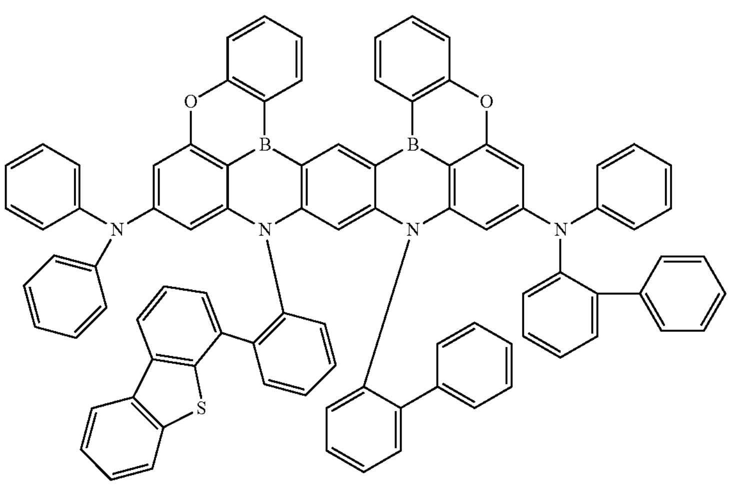

-continued
135
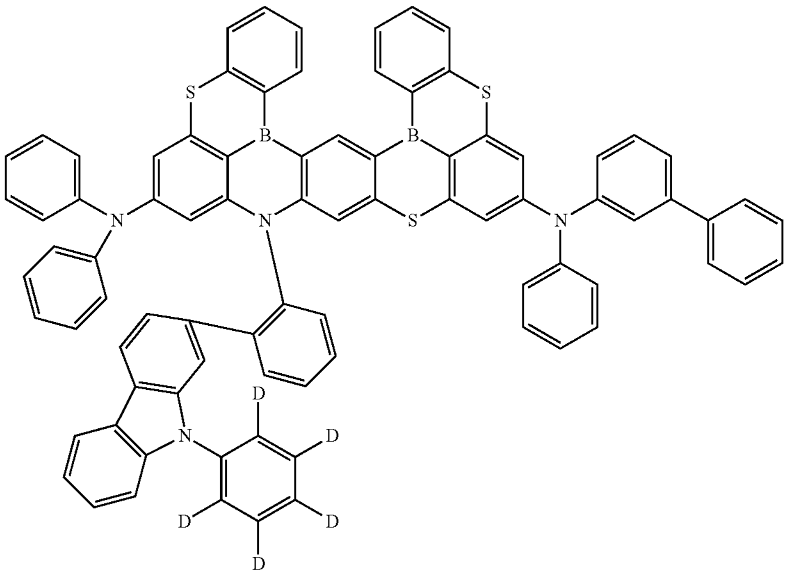
136
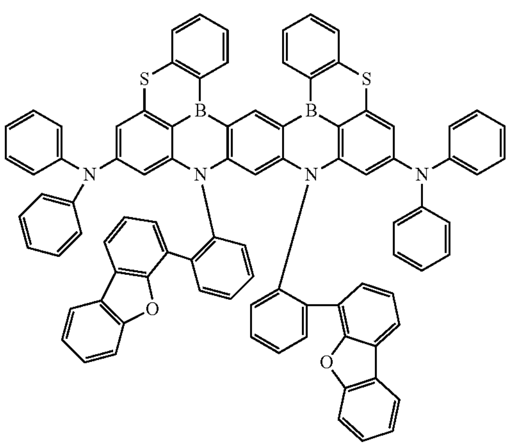
137
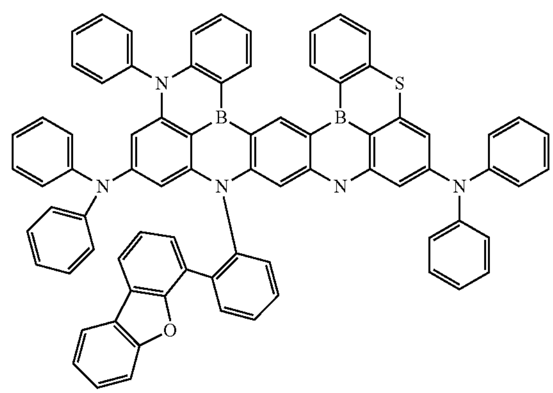
138
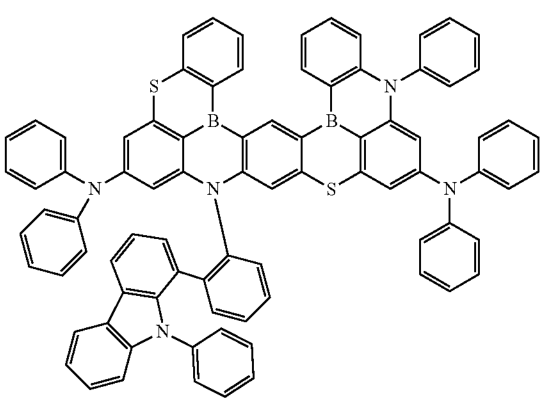
139
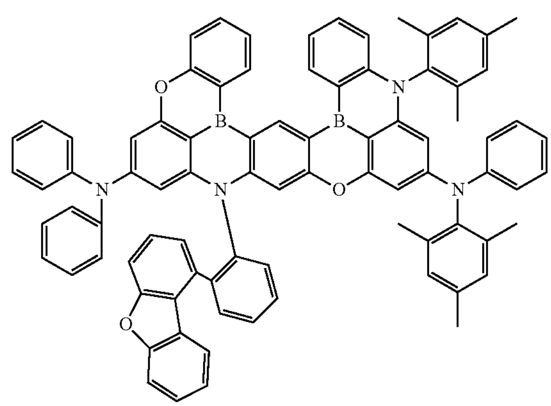

-continued
140
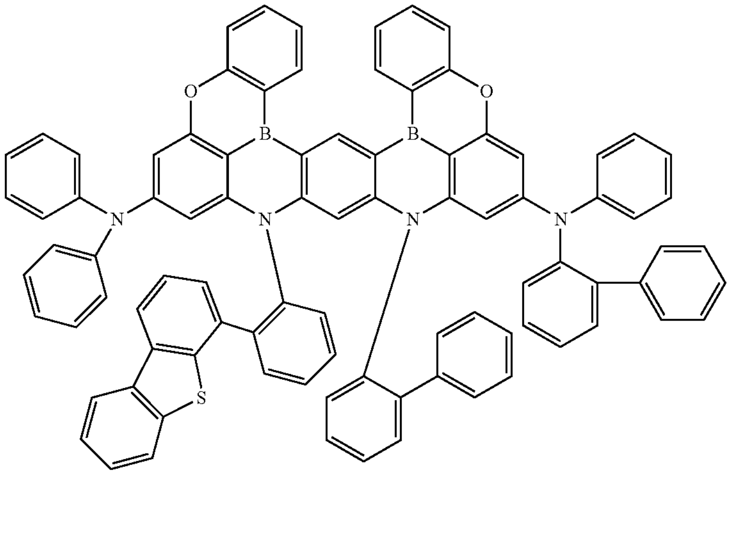
141
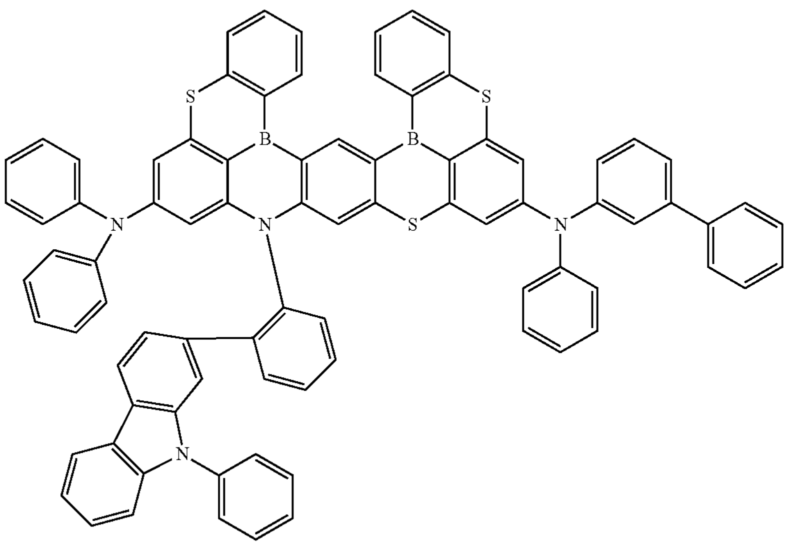
142
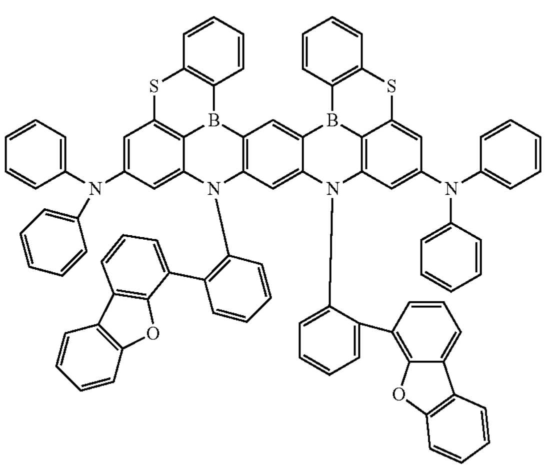
143
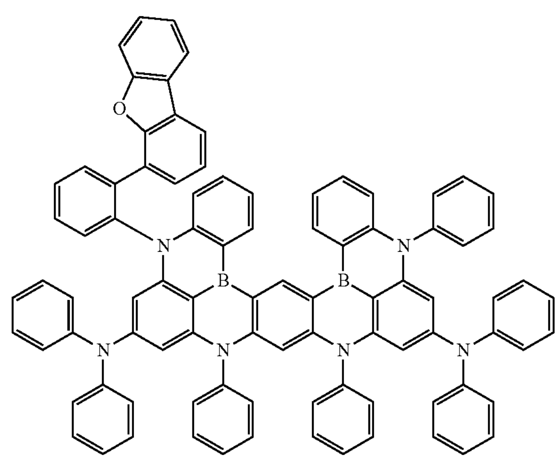

-continued
144
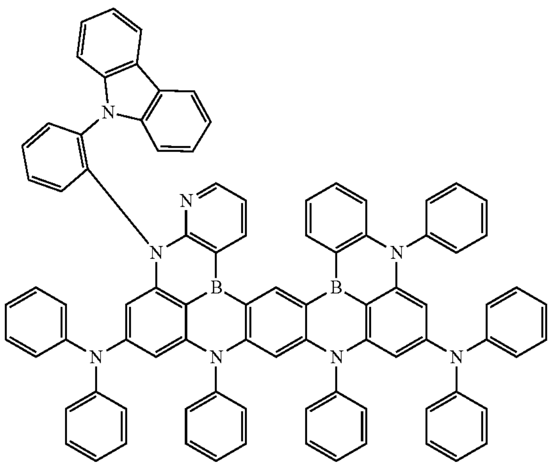
145
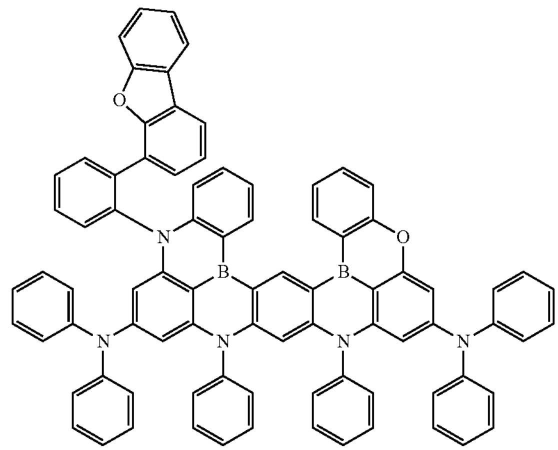
146
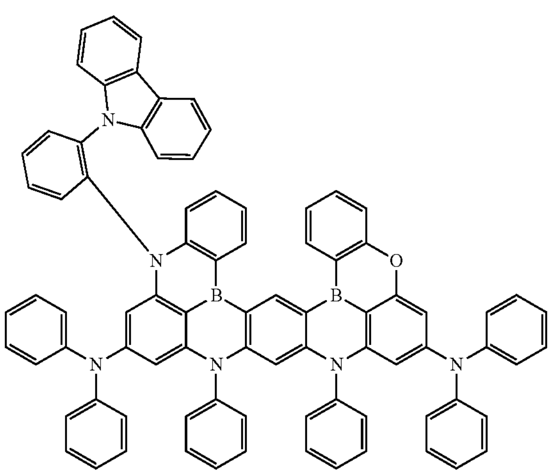
147
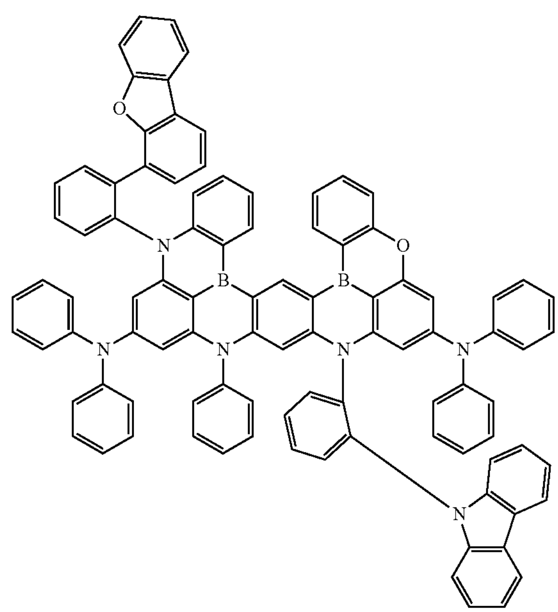

-continued
148
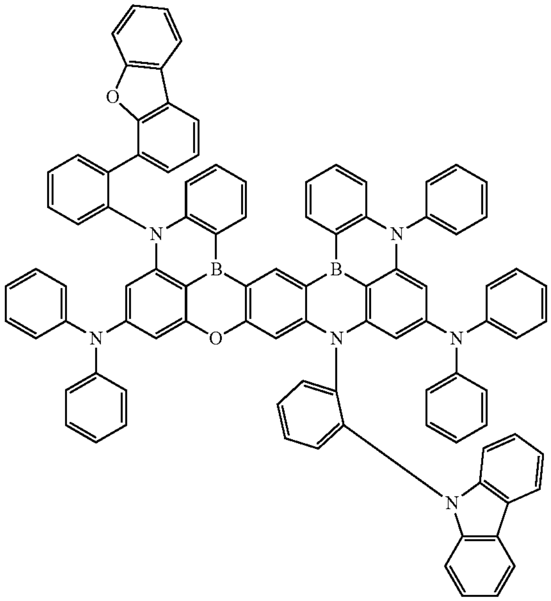
149
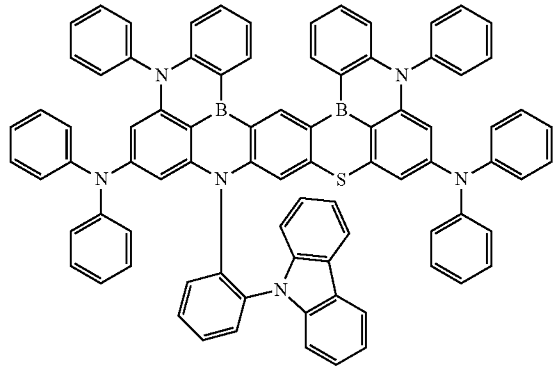
150
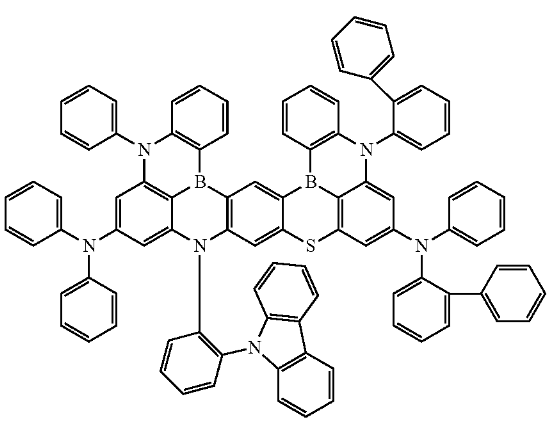
151
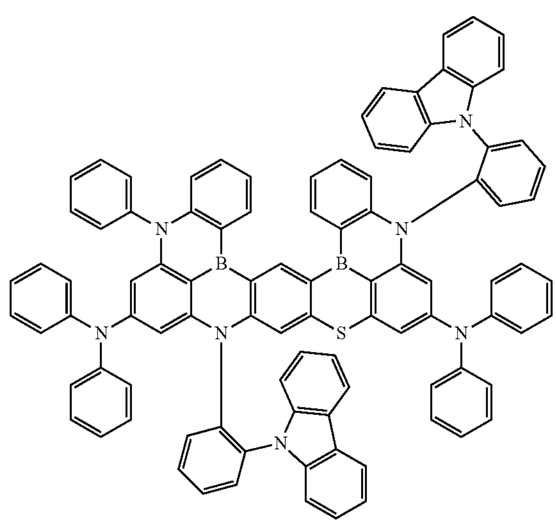

-continued
152
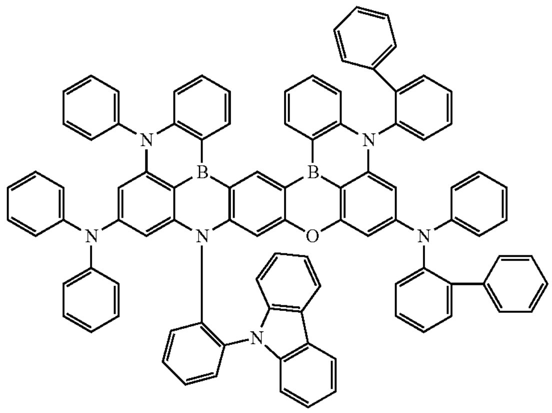
153
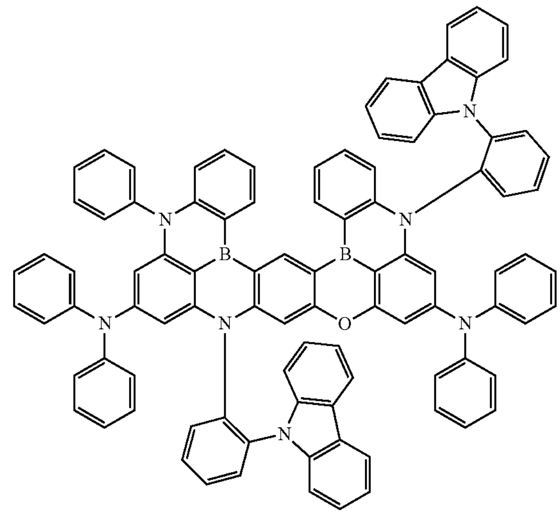
154
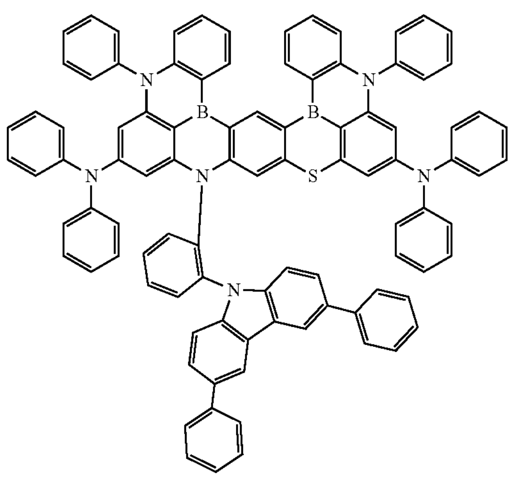
155
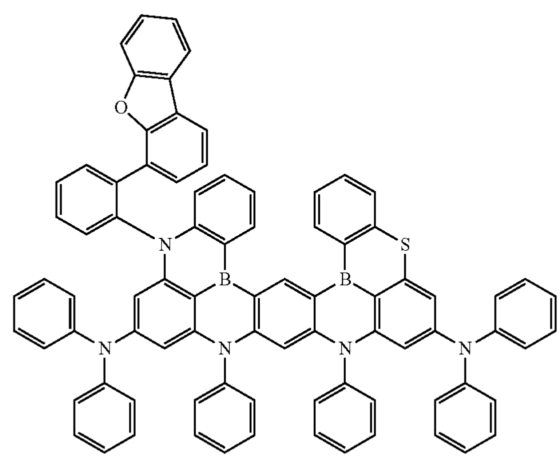
156
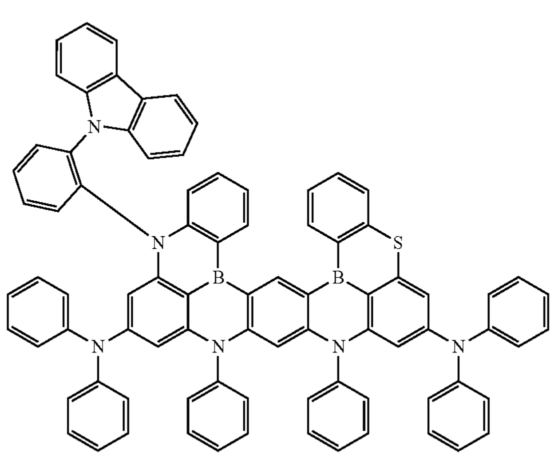
157
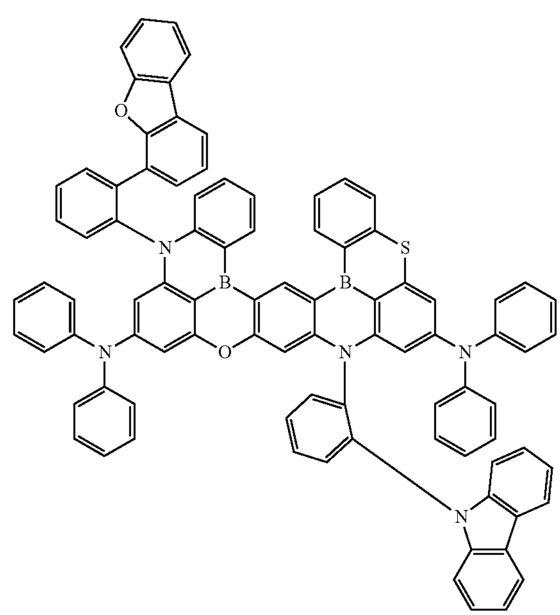

-continued
158
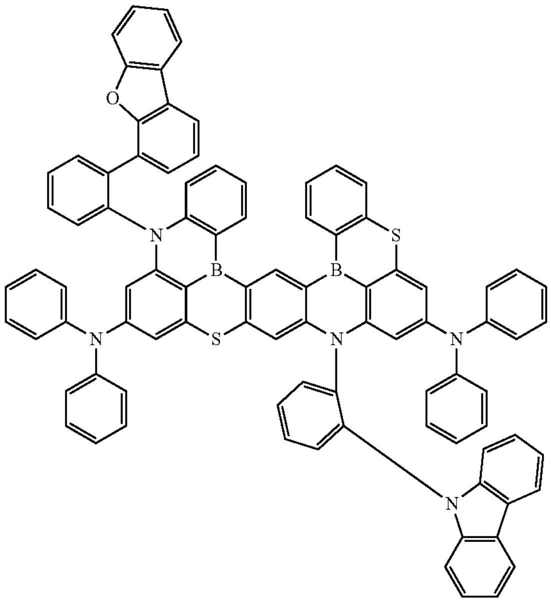
159
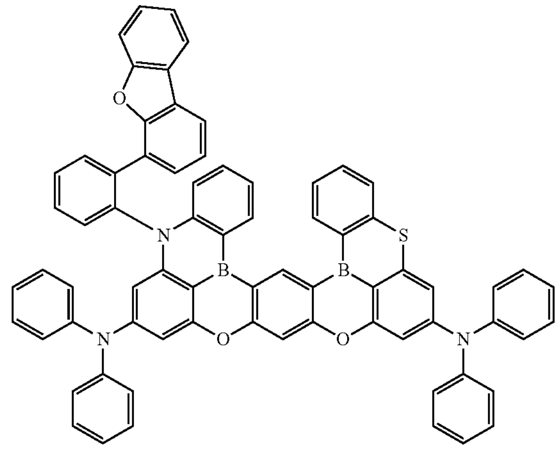
160
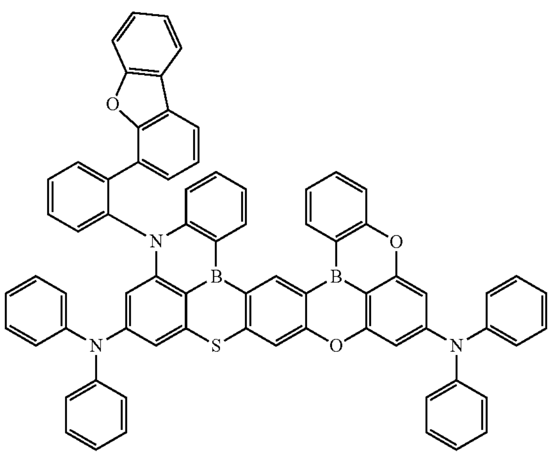
161
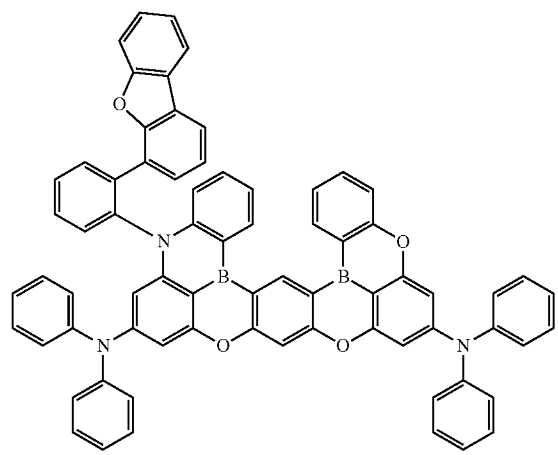
162
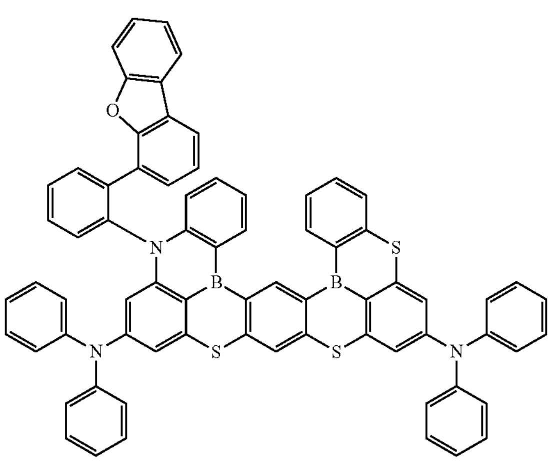
163
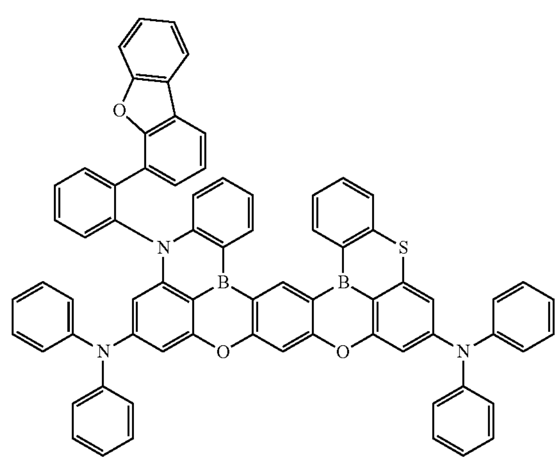

-continued
164
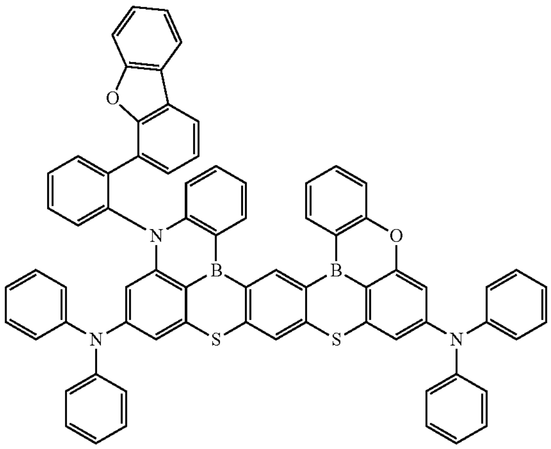
165
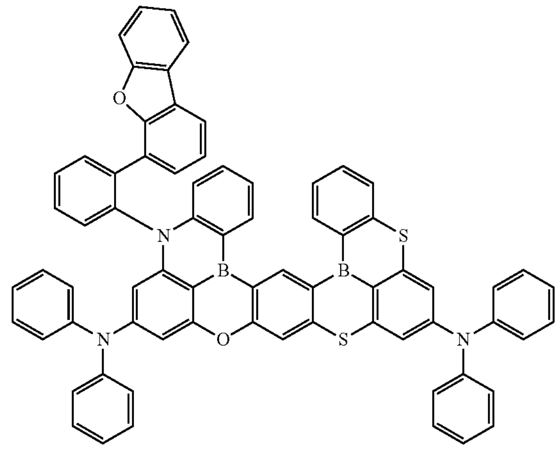
166
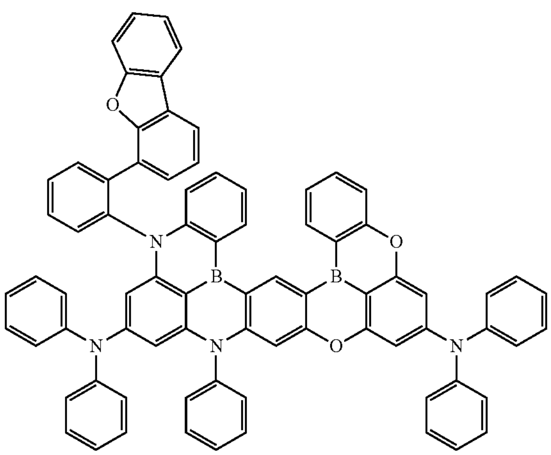
167
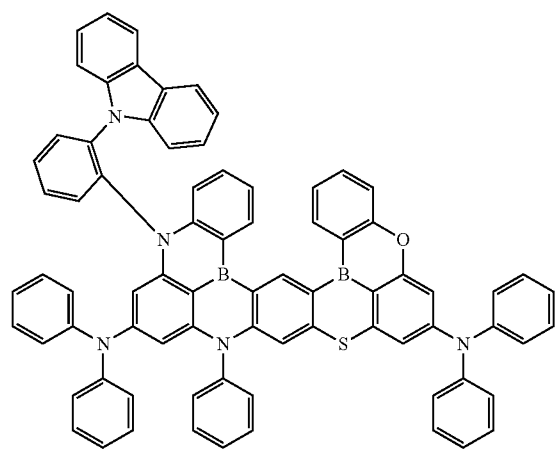
168
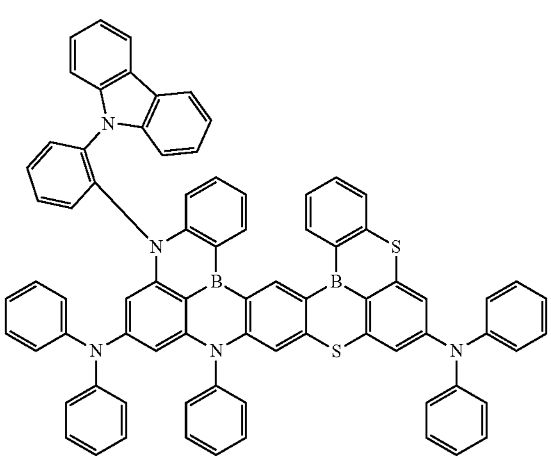
169
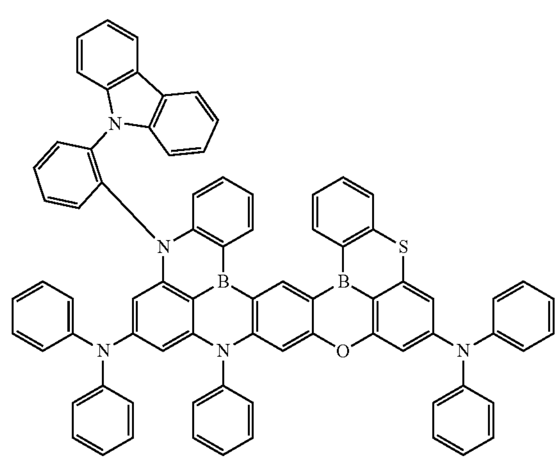

-continued
170
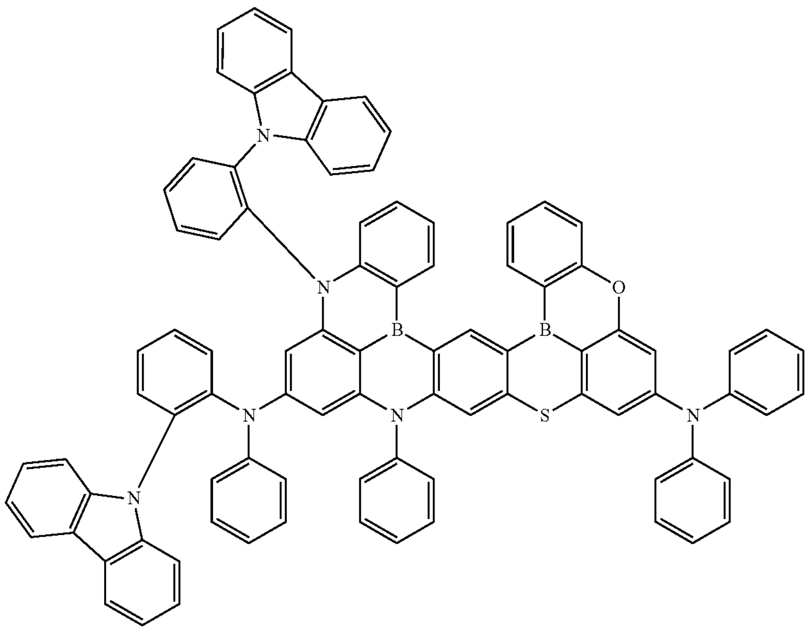
171
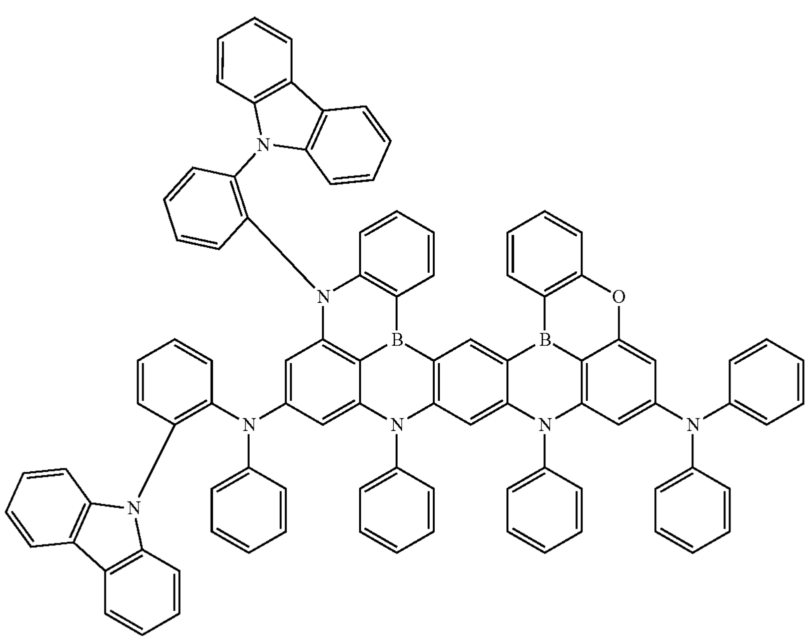

-continued
172
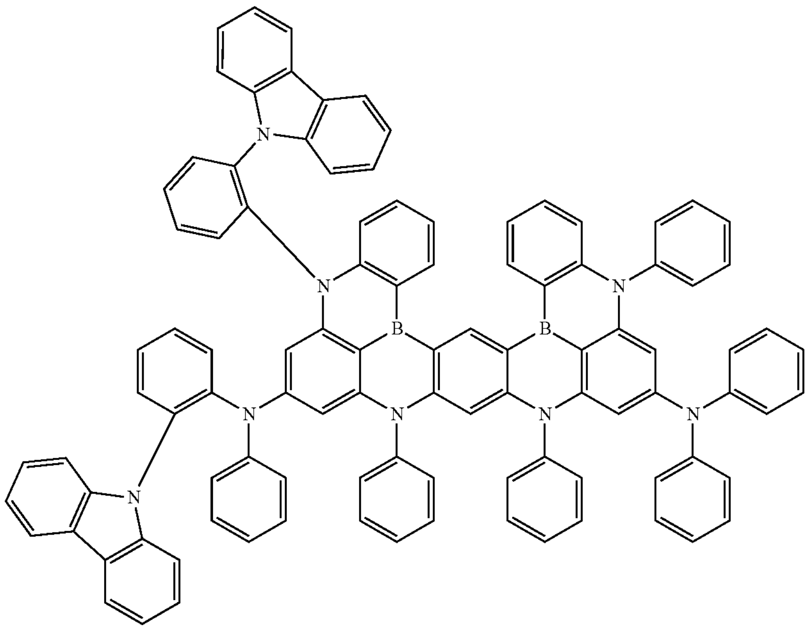
173
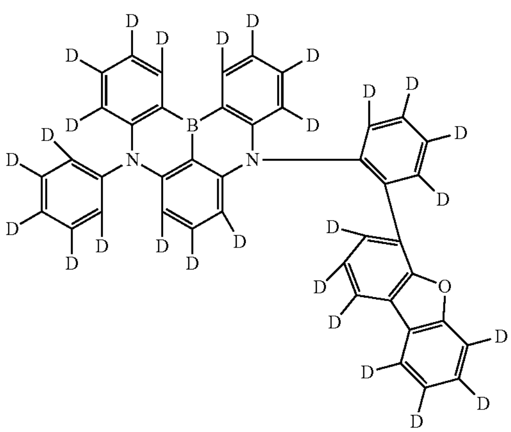
174
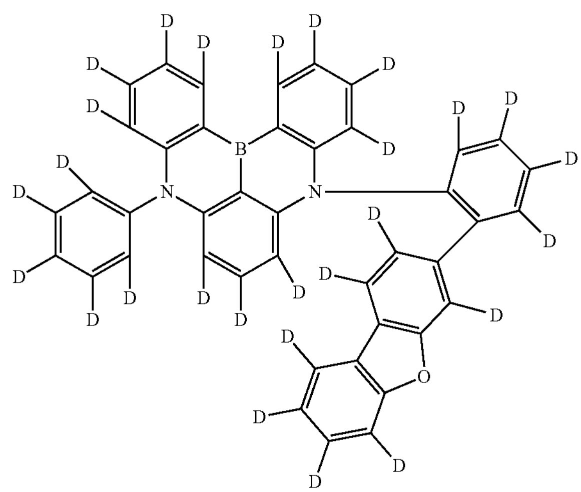
175
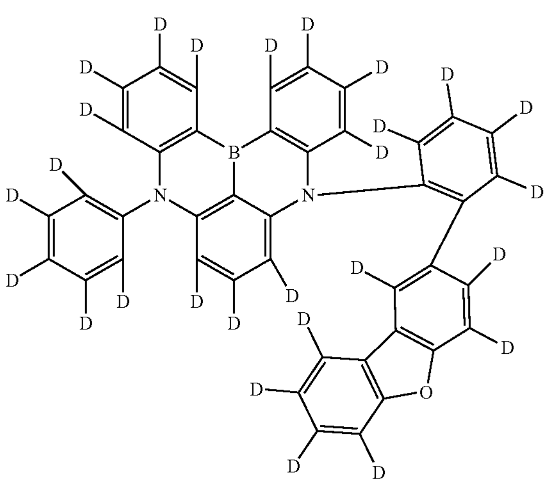
176
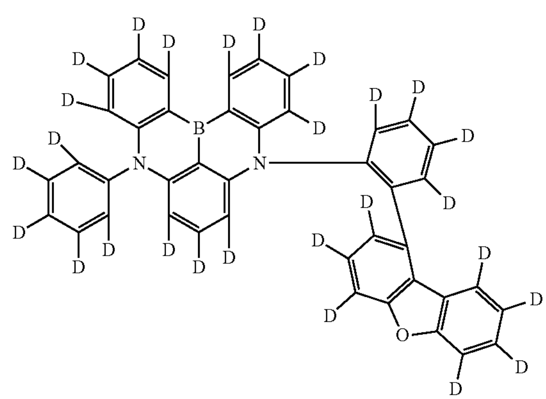

wherein in the compounds of Compound Group 1,

Ph is a phenyl group,

Mes is a mesityl group, and

D is a deuterium atom.

12. A polycyclic compound represented by Formula 1:

[Formula 1]

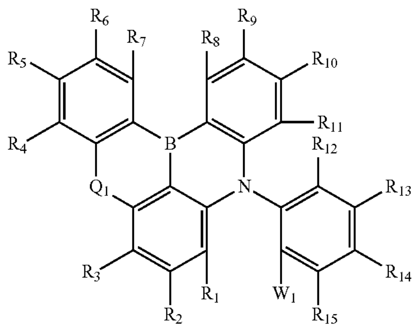

wherein in Formula 1, $W_1$ is a substituted or unsubstituted carbazole group, a substituted or unsubstituted dibenzofuran group, or a substituted or unsubstituted dibenzothiophene group, $Q_1$ is $NR_{16}$, O, or S, $R_2$ is a hydrogen atom, a deuterium atom, a substituted or unsubstituted boryl group, a substituted or unsubstituted silyl group, a substituted or unsubstituted amine group, a substituted or unsubstituted alkyl group of 1 to 20 carbon atoms, a substituted or unsubstituted aryl group of 6 to 20 ring-forming carbon atoms, or a substituted or unsubstituted heteroaryl group of 2 to 20 ring-forming carbon atoms, $R_{12}$ is a hydrogen atom, a deuterium atom, a halogen atom, a substituted or unsubstituted boryl group, a substituted or unsubstituted silyl group, a substituted or unsubstituted alkyl group of 1 to 20 carbon atoms, or a substituted or unsubstituted aryl group of 6 to 20 ring-forming carbon atoms, and $R_1$, $R_3$ to $R_{11}$, and $R_{13}$ to $R_{16}$ are each independently a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, a substituted or unsubstituted aryl group of 6 to 20 ring-forming carbon atoms, or a substituted or unsubstituted heteroaryl group of 2 to 20 ring-forming carbon atoms, or a group represented by Formula 2 is bonded to adjacent groups of $R_4$ to $R_{11}$:

[Formula 2]

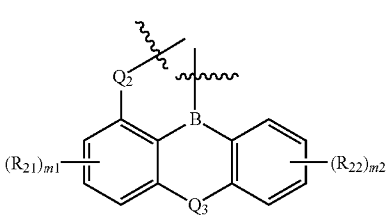

wherein in Formula 2, $Q_2$ and $Q_3$ are each independently $NR_{23}$, O, or S, m1 is an integer from 1 to 3, m2 is an integer from 1 to 4, $R_{21}$ to $R_{23}$ are each independently a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, a substituted or unsubstituted aryl group of 6 to 20 ring-forming carbon atoms, or a substituted or unsubstituted heteroaryl group of 2 to 20 ring-forming carbon atoms,

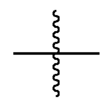

indicates a binding site to a neighboring atom, and the polycyclic compound does not include an alkyl group substituted with a deuterium atom.

13. The polycyclic compound of claim 12, wherein Formula 1 is represented by one of Formula 1-A1 to Formula 1-A4:

[Formula 1-A1]

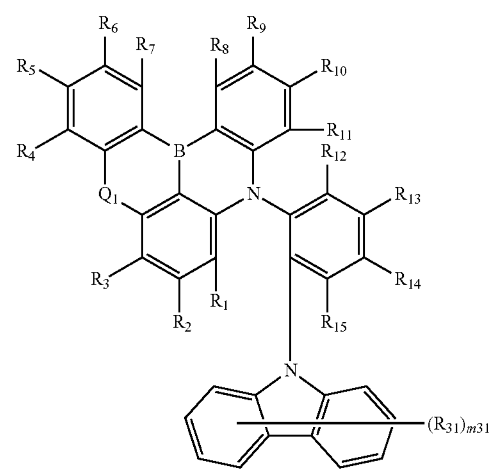

[Formula 1-A2]

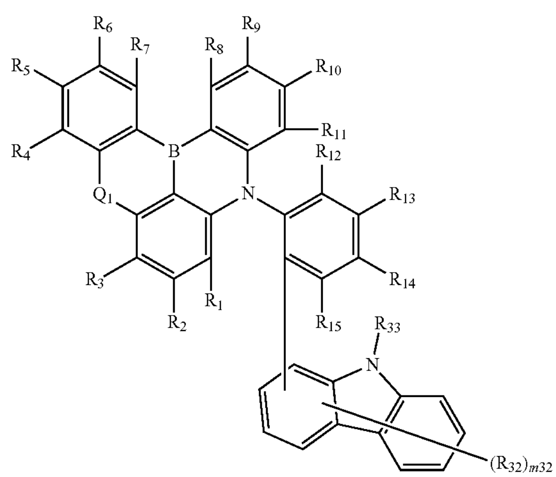

-continued

[Formula 1-A3]

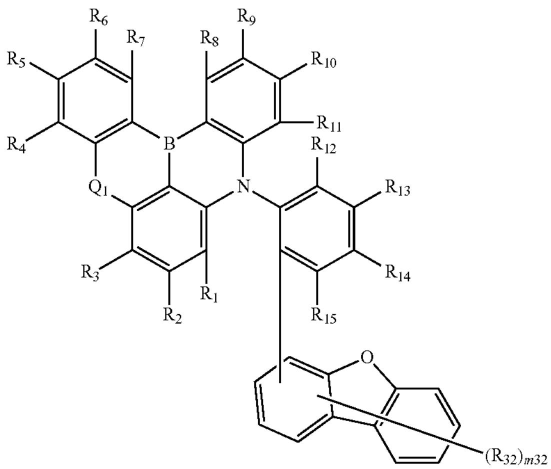

[Formula 1-A4]

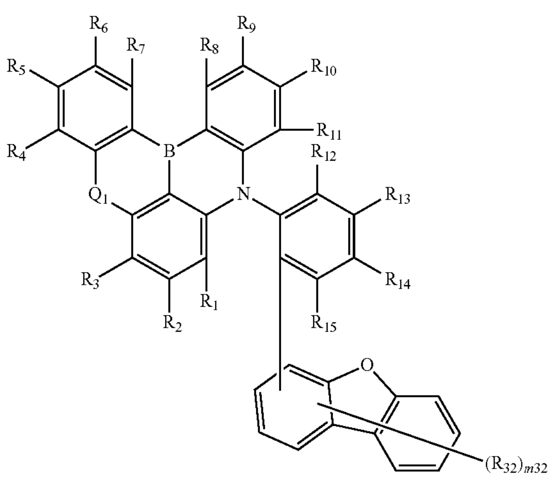

wherein in Formula 1-A1 to Formula 1-A4, m31 is an integer from 1 to 8, m32 is an integer from 1 to 7, $R_{31}$ to $R_{33}$ are each independently a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, or a substituted or unsubstituted aryl group of 6 to 20 ring-forming carbon atoms, and $Q_1$ and $R_1$ to $R_{15}$ are the same as defined in connection with Formula 1.

14. The polycyclic compound of claim 13, wherein $R_{32}$ is a hydrogen atom, a deuterium atom, a substituted or unsubstituted alkyl group of 1 to 10 carbon atoms, a substituted or unsubstituted phenyl group, an unsubstituted naphthyl group, an unsubstituted phenanthryl group, or an unsubstituted anthracenyl group.

15. The polycyclic compound of claim 12, wherein Formula 1 is represented by Formula 1-B1 or Formula 1-B2:

[Formula 1-B1]

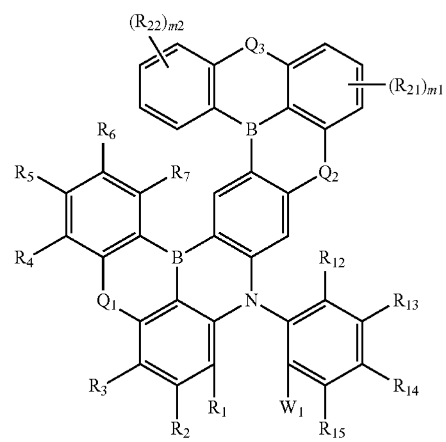

[Formula 1-B2]

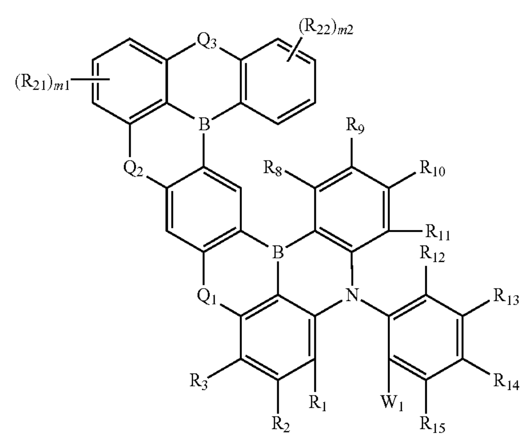

wherein in Formula 1-B1 and Formula 1-B2, $Q_1$ to $Q_3$, $R_1$ to $R_{15}$, m1, m2, $R_{21}$, $R_{22}$, and Wi are the same as defined in connection with Formula 1 and Formula 2.

16. The polycyclic compound of claim 15, wherein Formula 1-B1 is represented by one of Formula 1-B1-1 to Formula 1-B1-4:

-continued

[Formula 1-B1-1]

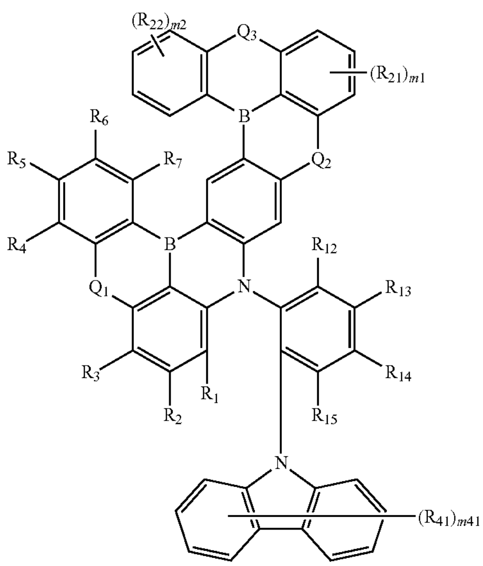

[Formula 1-B1-2]

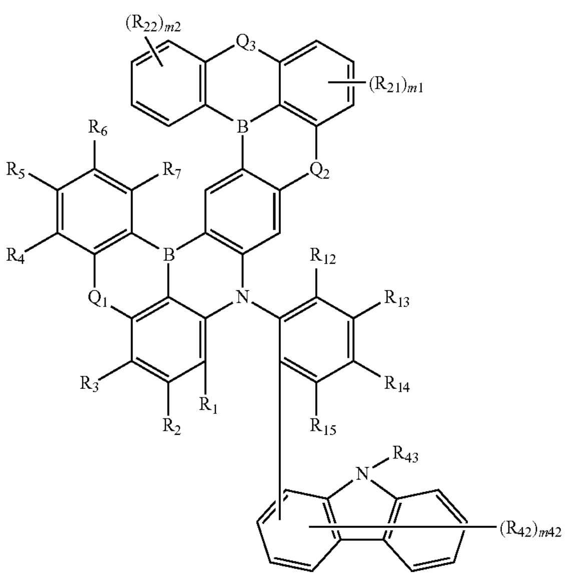

[Formula 1-B1-3]

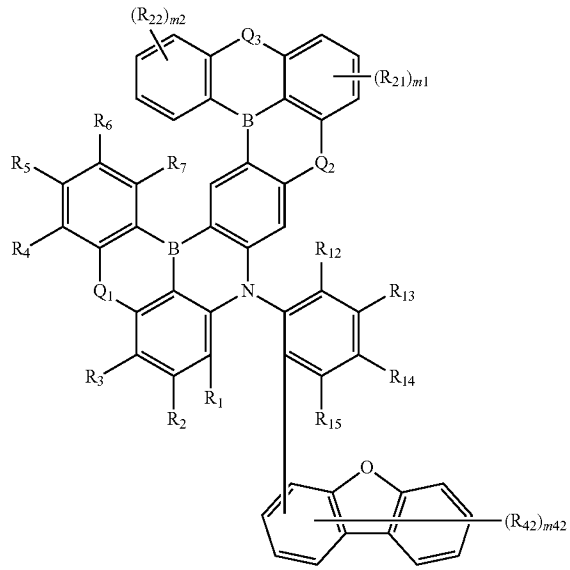

[Formula 1-B1-4]

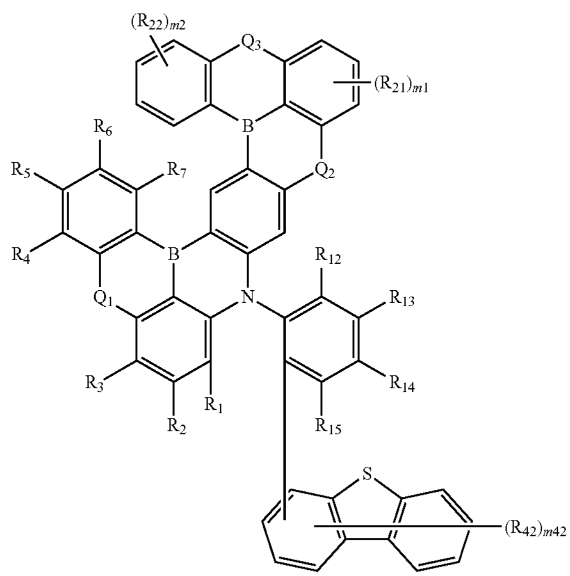

wherein in Formula 1-B1-1 to Formula 1-B1-4, m41 is an integer from 1 to 8, m42 is an integer from 1 to 7, $R_{41}$ to $R_{43}$ are each independently a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, a substituted or unsubstituted aryl group of 6 to 20 ring-forming carbon atoms, $Q_1$ to $Q_3$, $R_1$ to $R_7$, $R_{12}$ to $R_{15}$, m1, m2, $R_{21}$ and $R_{22}$ are the same as defined in connection with Formula 1 and Formula 2.

17. The polycyclic compound of claim 15, wherein Formula 1-B2 is represented by one of Formula 1-B2-1 to Formula 1-B2-4:

[Formula 1-B2-1]

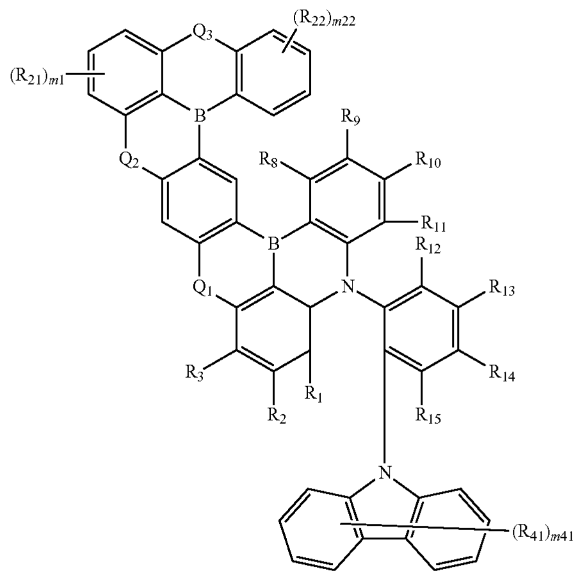

[Formula 1-B2-2]

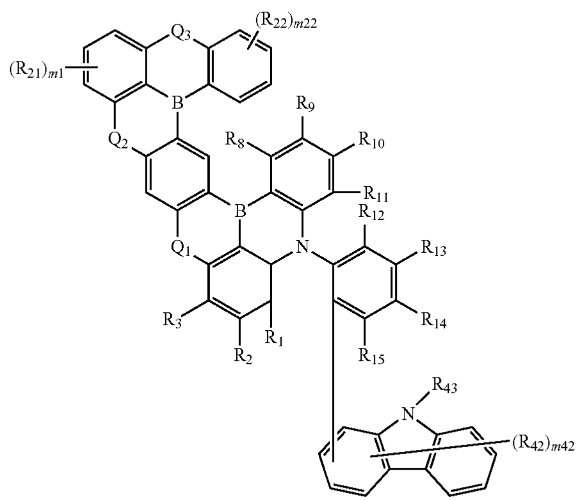

[Formula 1-B2-3]

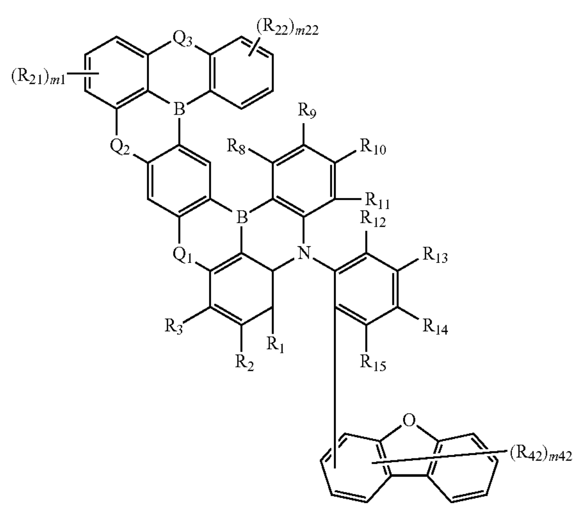

-continued

[Formula 1-B2-4]

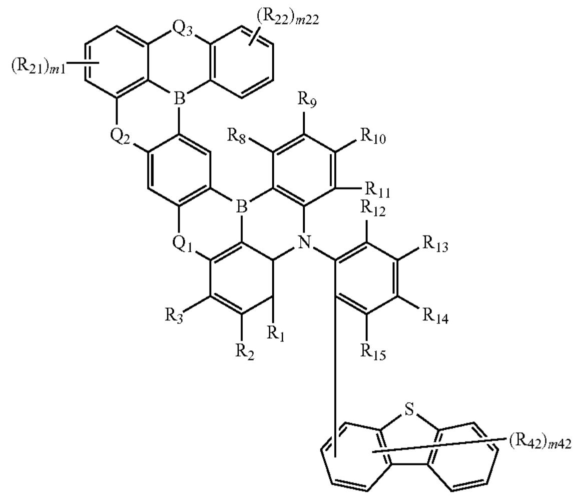

wherein in Formula 1-B2-1 to Formula 1-B2-4, m41 is an integer from 1 to 8, m42 is an integer from 1 to 7, $R_{41}$ to $R_{43}$ are each independently a hydrogen atom, a deuterium atom, a halogen atom, a substituted or unsubstituted boryl group, a substituted or unsubstituted silyl group, a substituted or unsubstituted amine group, a substituted or unsubstituted alkyl group of 1 to 20 carbon atoms, or a substituted or unsubstituted aryl group of 6 to 20 ring-forming carbon atoms, $Q_1$ to $Q_3$, $R_1$ to $R_3$, $R_8$ to $R_{15}$, m1, m2, $R_{21}$ and $R_{22}$ are the same as defined in connection with Formula 1 and Formula 2.

18. The polycyclic compound of claim 12, wherein $R_2$ is represented by one of $R_{2-1}$ to $R_{2-5}$:

$R_{2-1}$

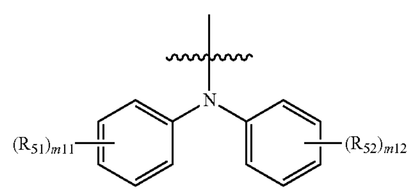

$R_{2-2}$

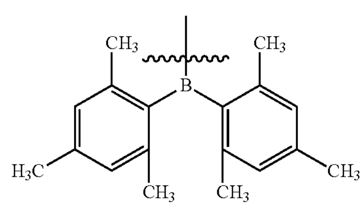

$R_{2-3}$

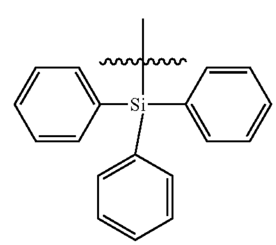

-continued

R2-4

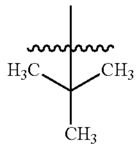

R2-5

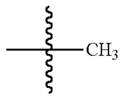

wherein in $R_{2-1}$, m11 and m12 are each independently an integer from 0 to 5, $R_{51}$ and $R_{52}$ are each independently a methyl group, a phenyl group, a carbazole group, or a dibenzofuran group, and wherein in $R_{2-1}$ to $R_{2-5}$,

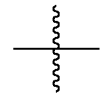

indicates a binding site to a neighboring atom.

19. The polycyclic compound of claim 12, wherein the polycyclic compound represented by Formula 1 is a material emitting thermally activated delayed fluorescence.

20. The polycyclic compound of claim 12, wherein the polycyclic compound is selected from Compound Group 1:

[Compound Group 1]

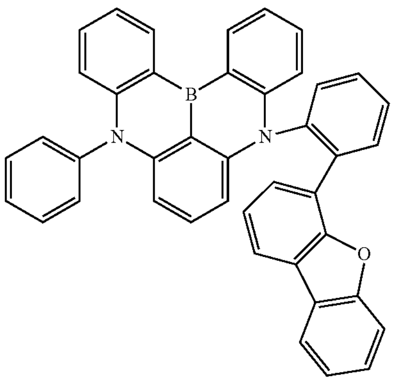

1

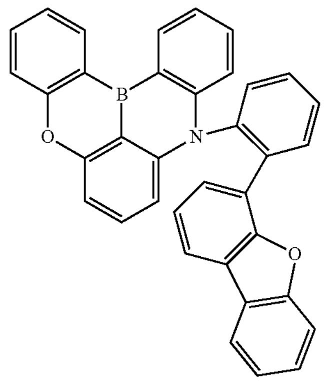

2

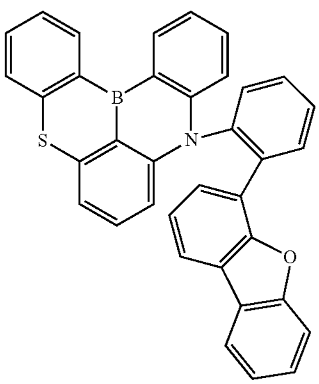

3

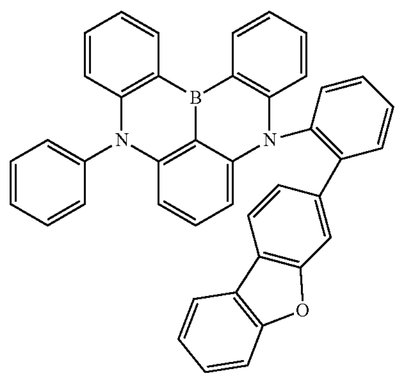

4

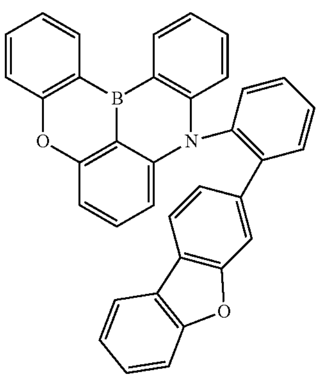

5

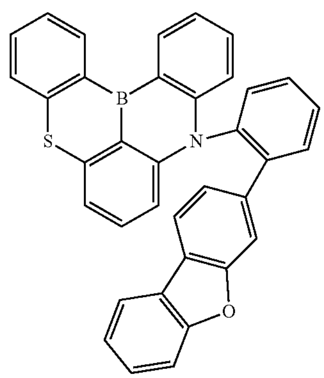

6

-continued
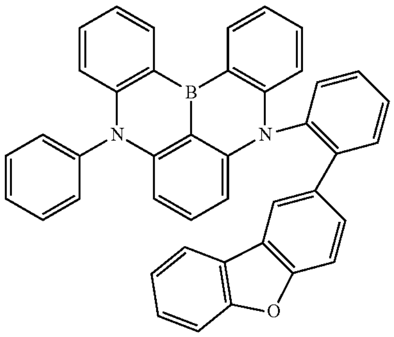
7
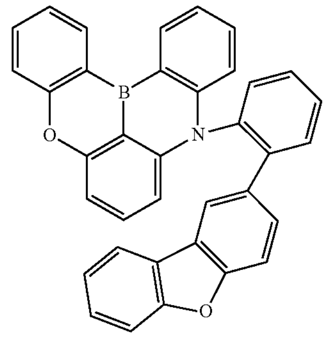
8
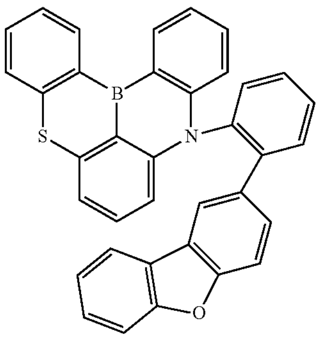
9
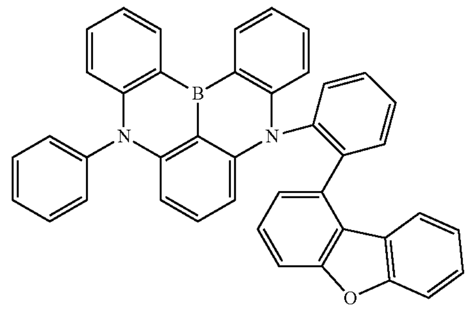
10
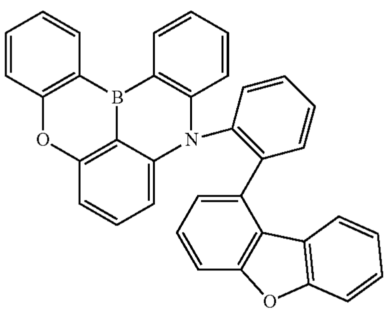
11
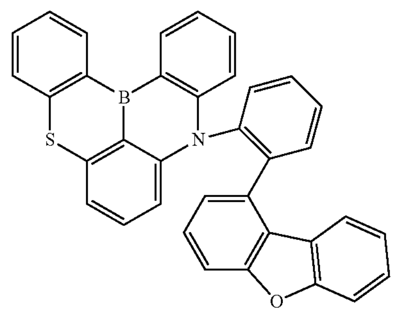
12
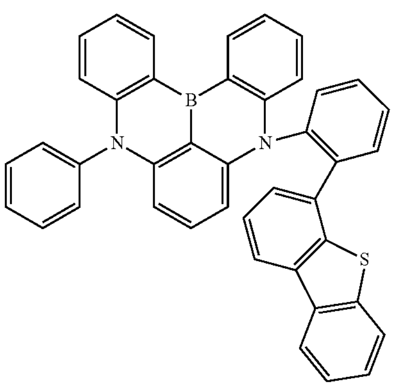
13
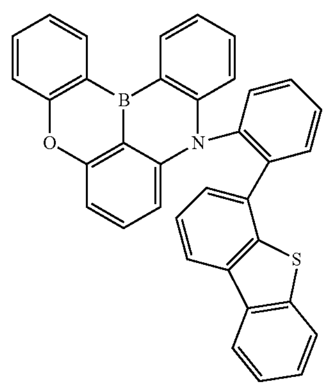
14

-continued
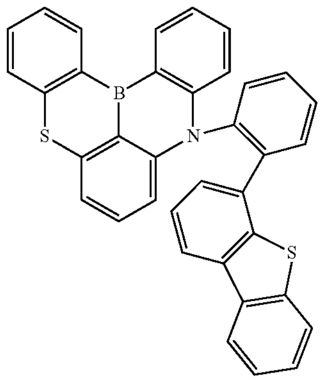
15
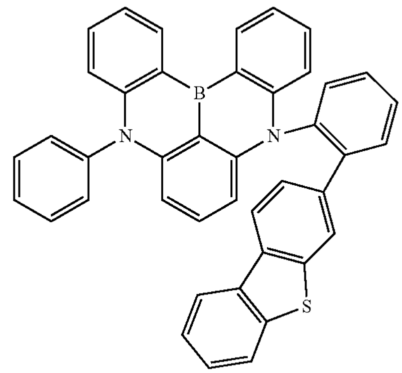
16
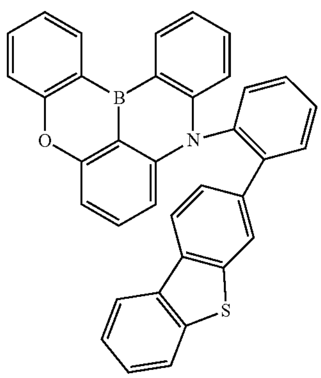
17
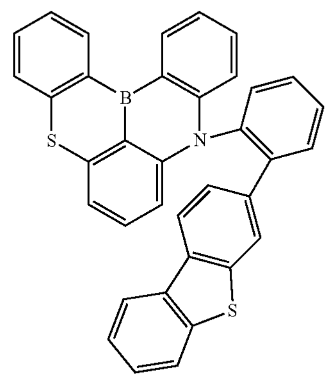
18
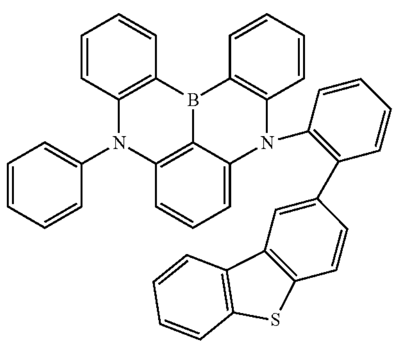
19
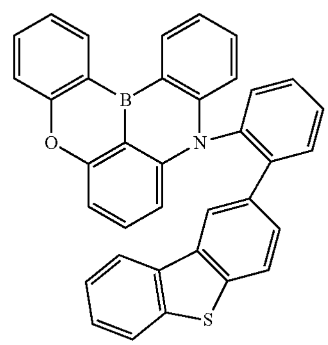
20
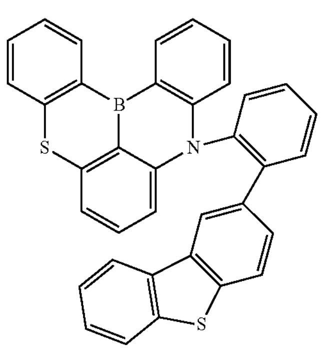
21
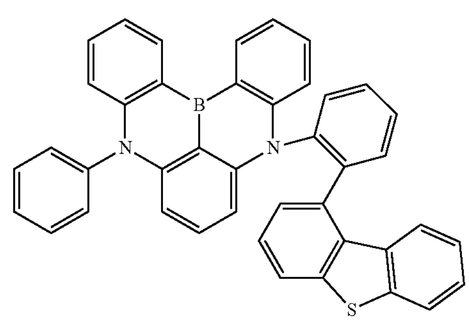
22

-continued
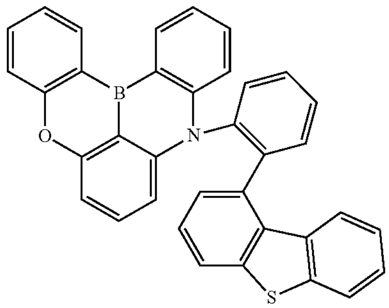
23
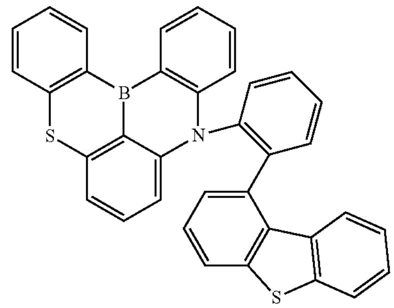
24
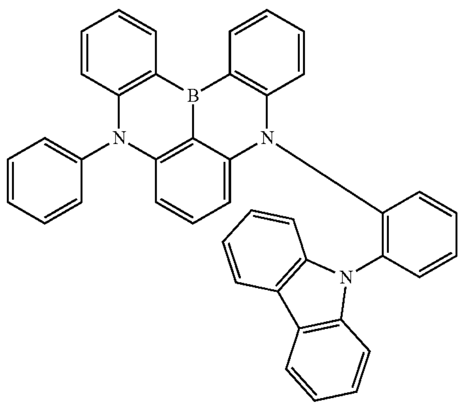
25
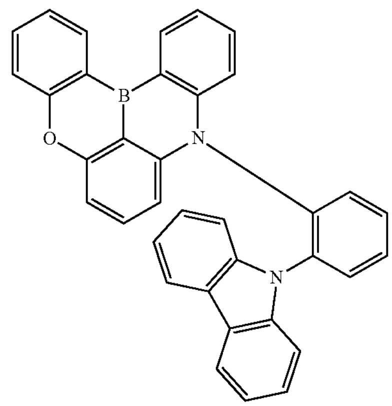
26
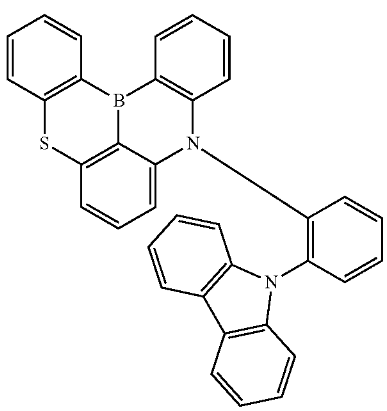
27
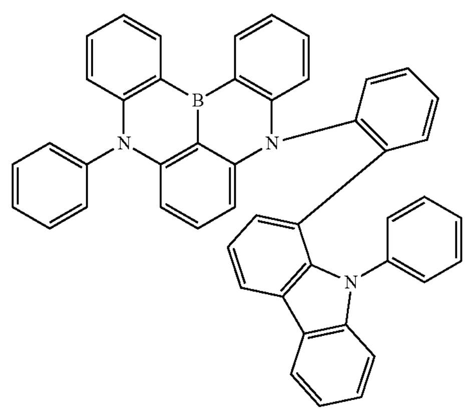
28
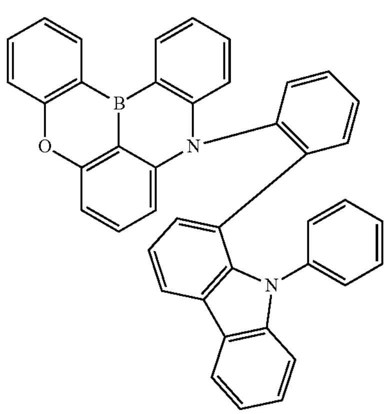
29
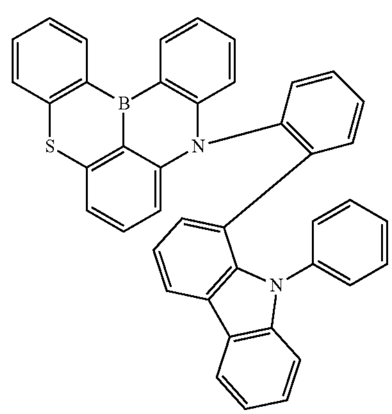
30

-continued
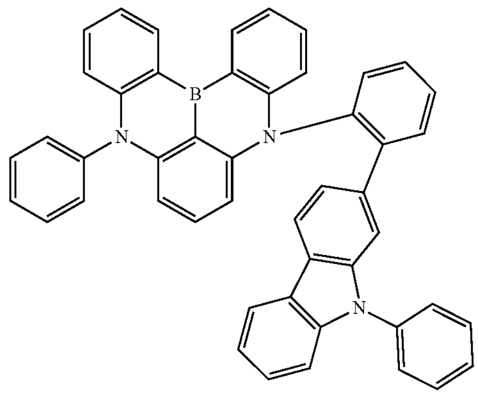
31
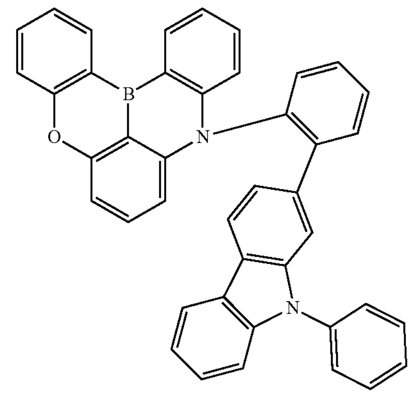
32
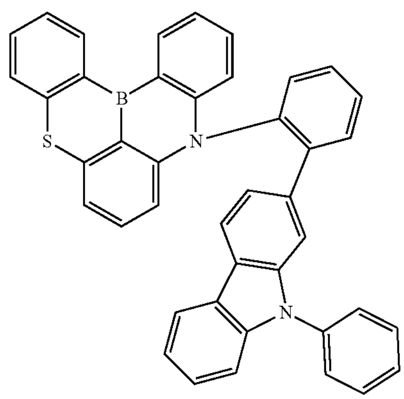
33
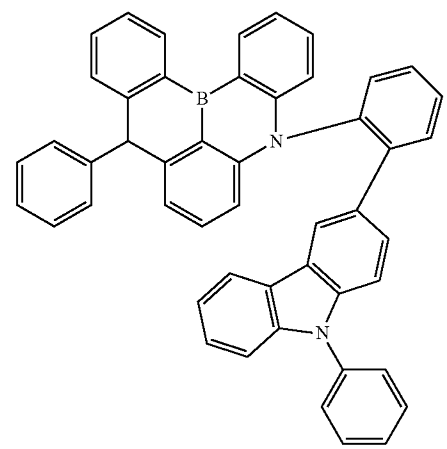
34
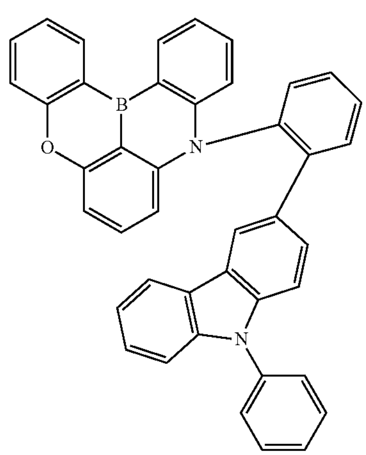
35
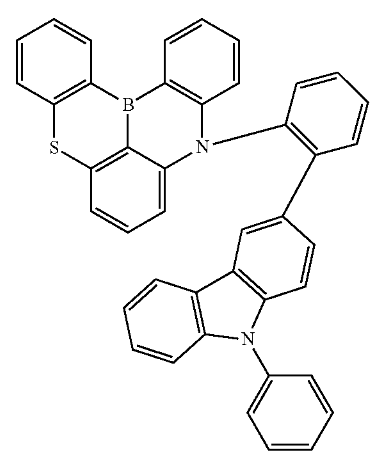
36

-continued
37
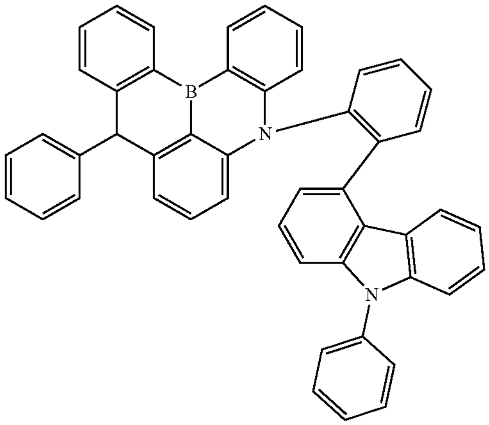
38
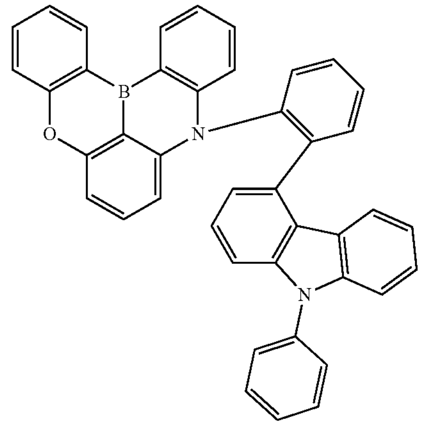
39
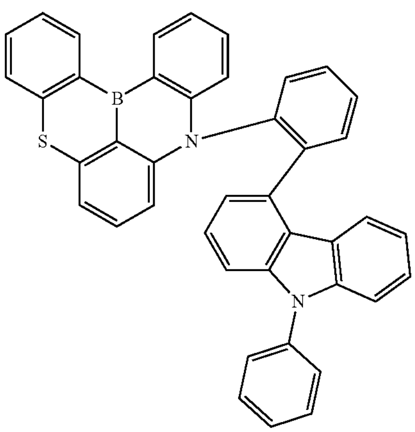
40
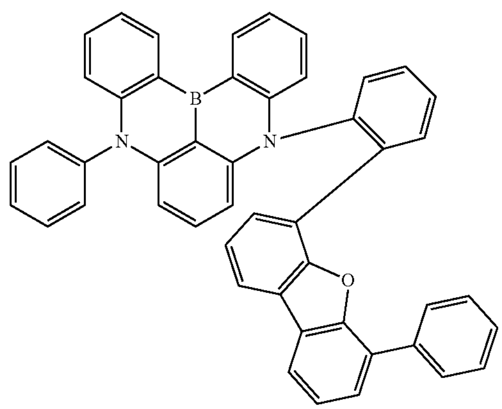
41
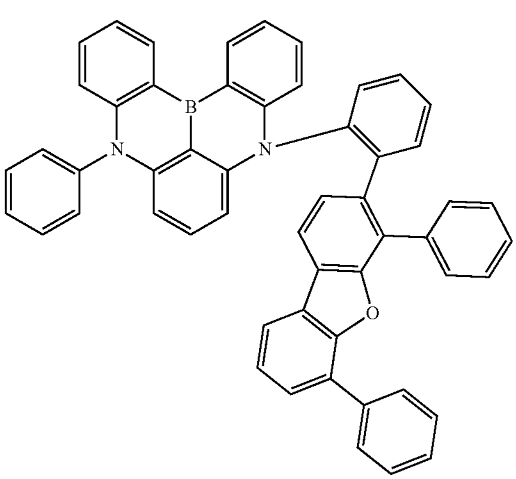
42
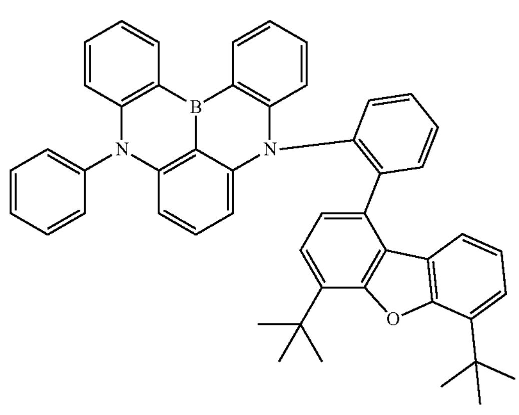

-continued
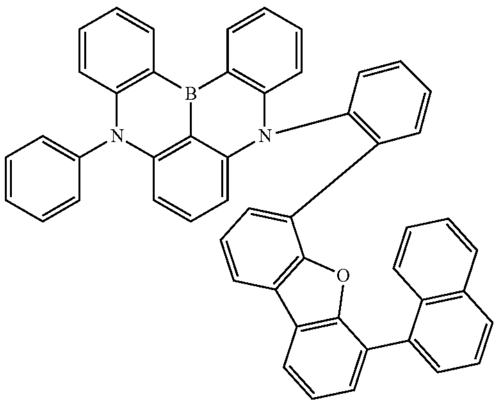
43
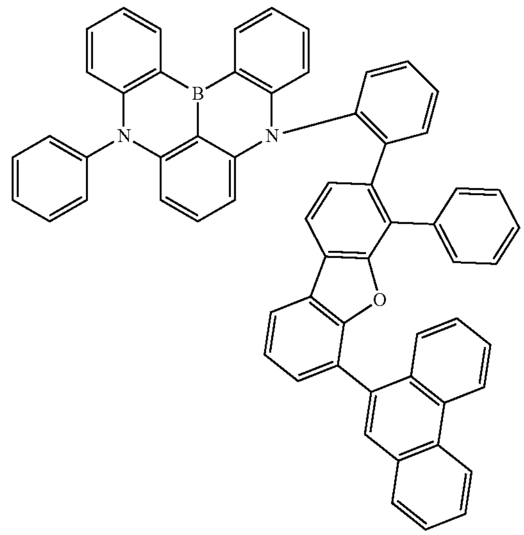
44
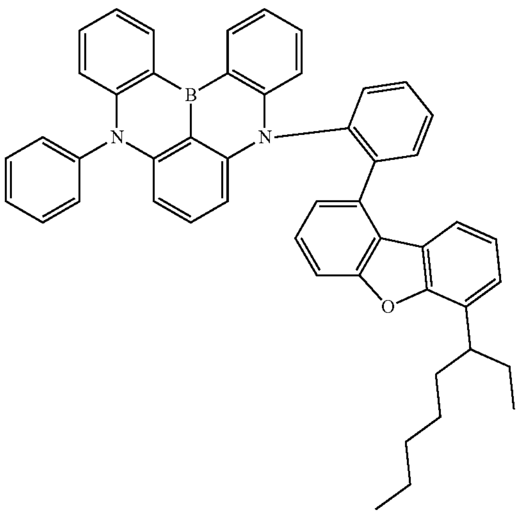
45
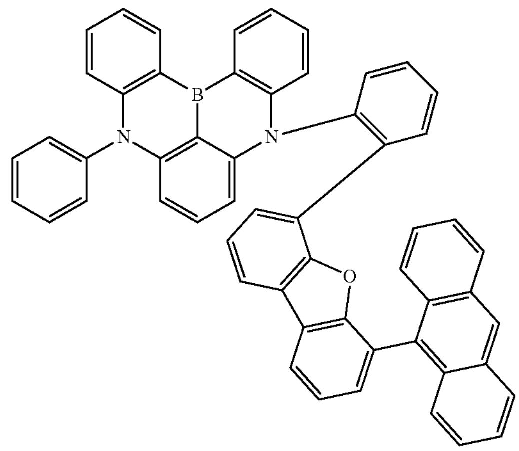
46
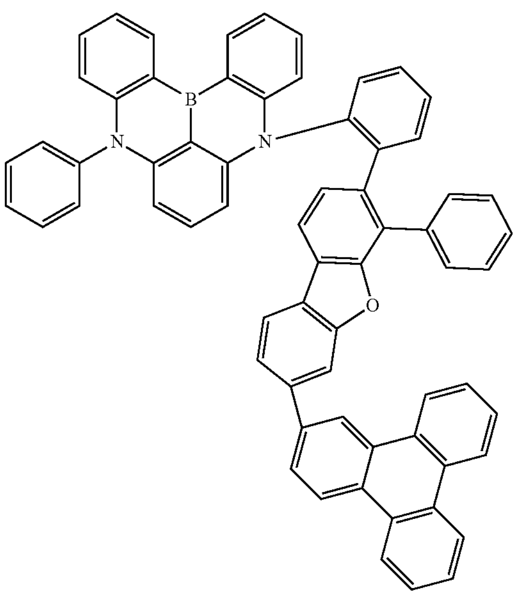
47
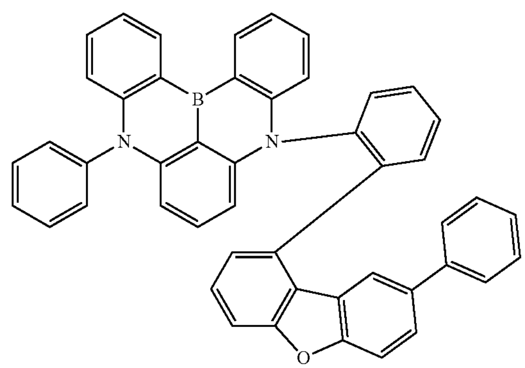
48

-continued
49
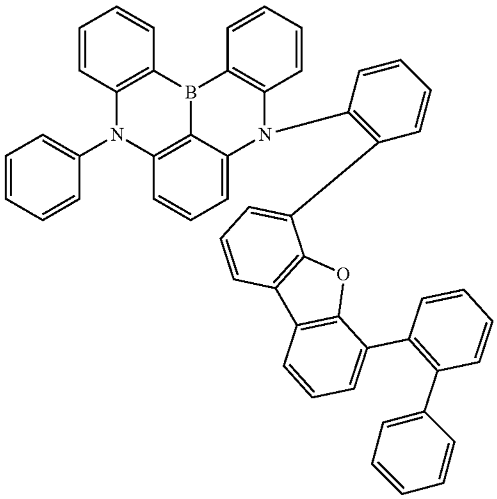
50
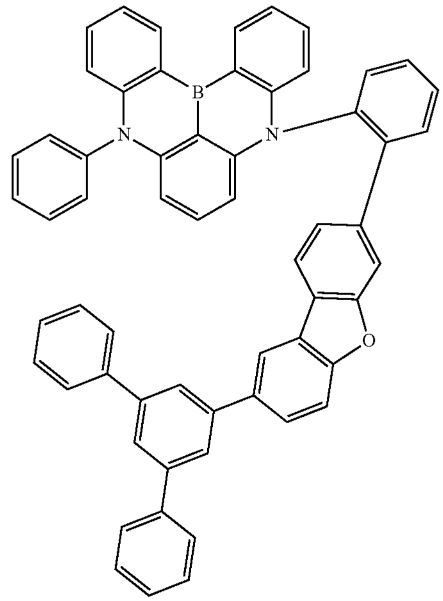
51
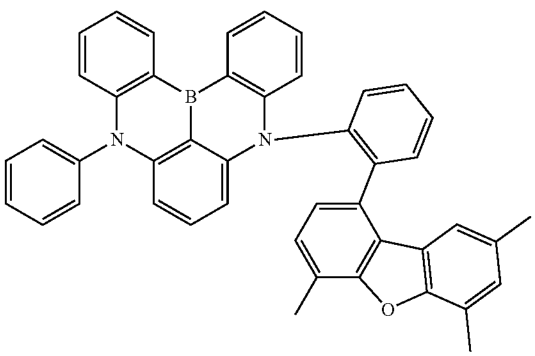
52
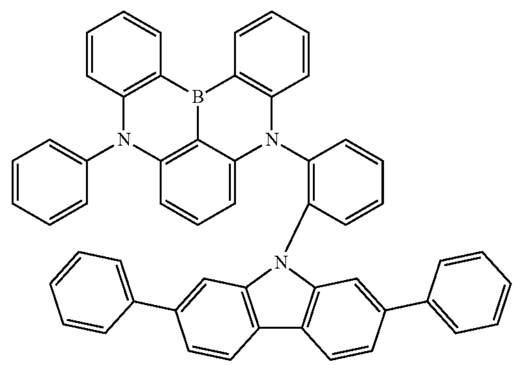
53
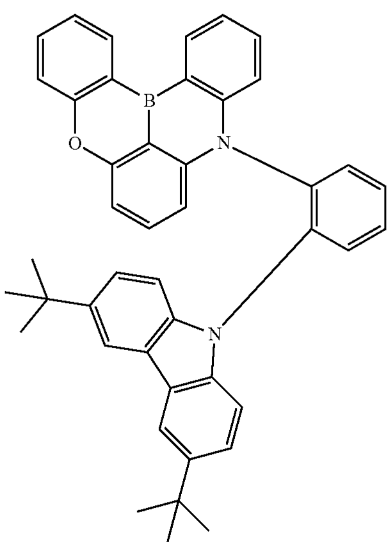
54
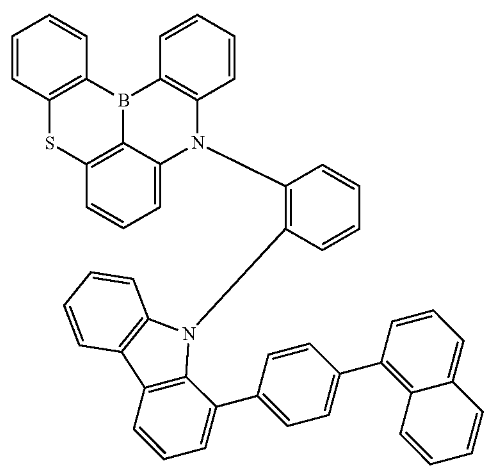

-continued
55
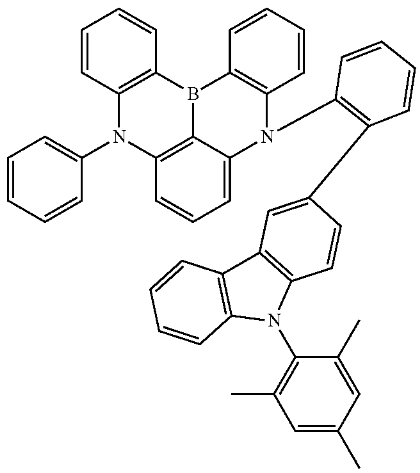
56
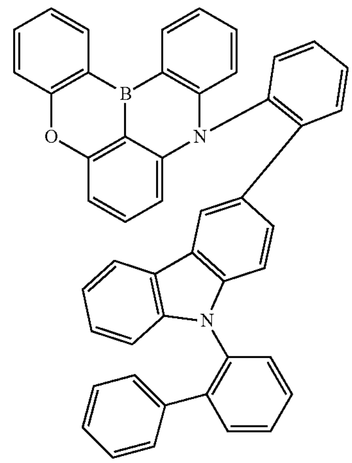
57
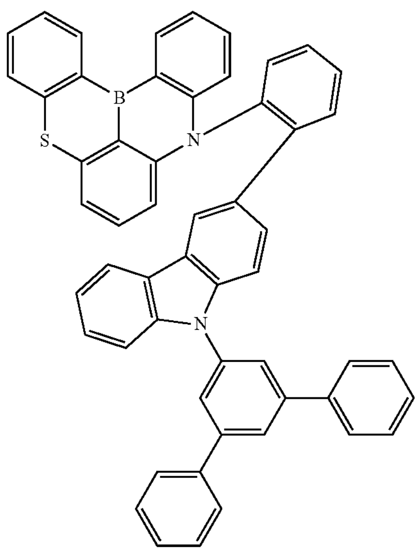
58
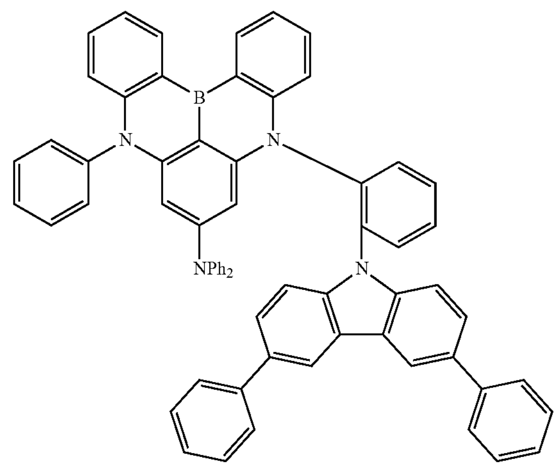
59
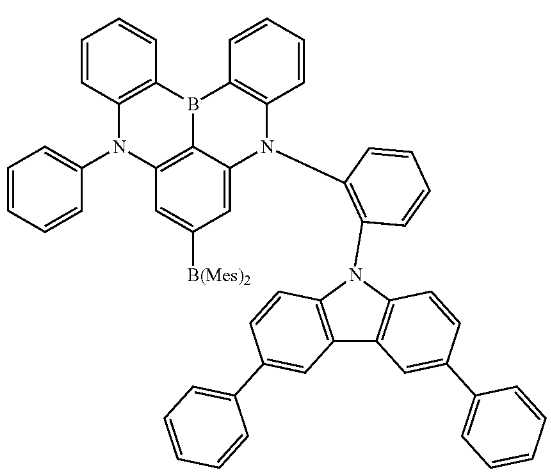
60
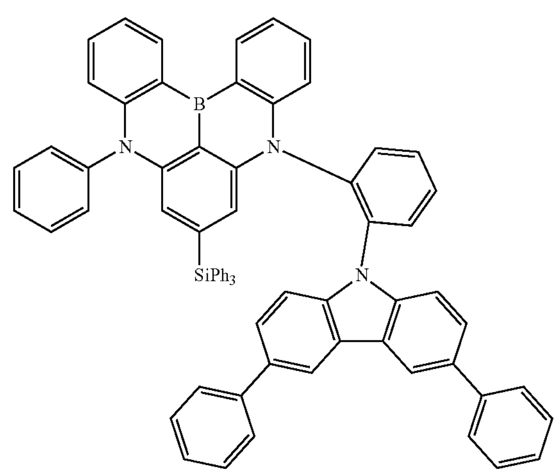

-continued
61
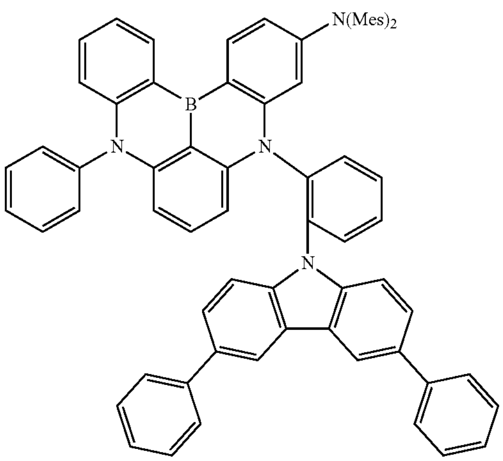
62
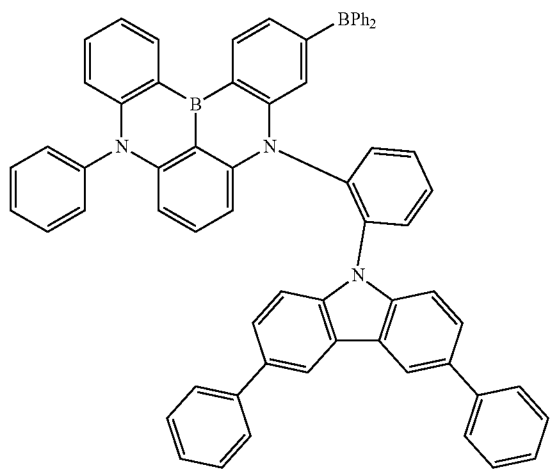
63
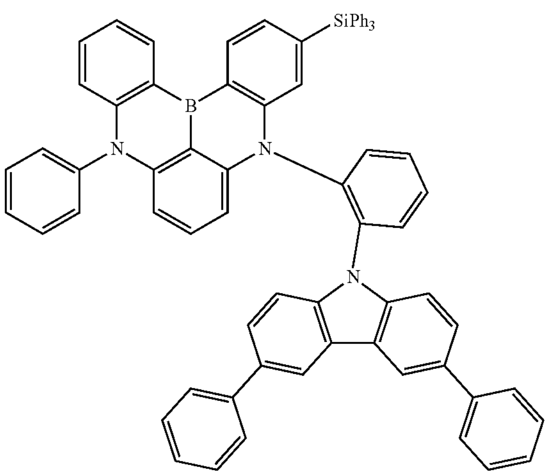
64
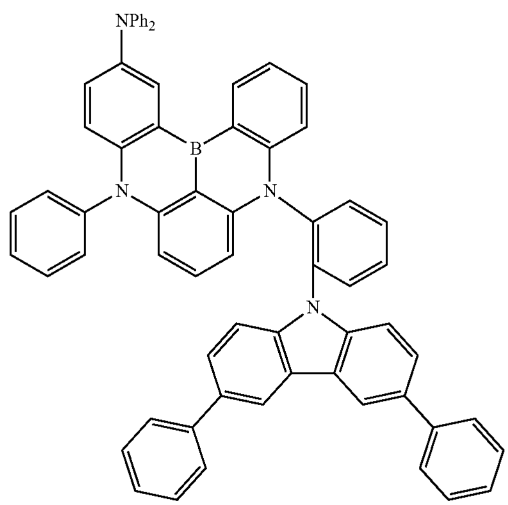
65
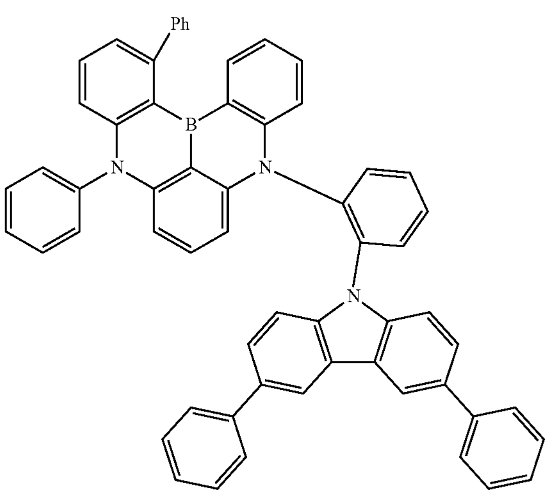
66
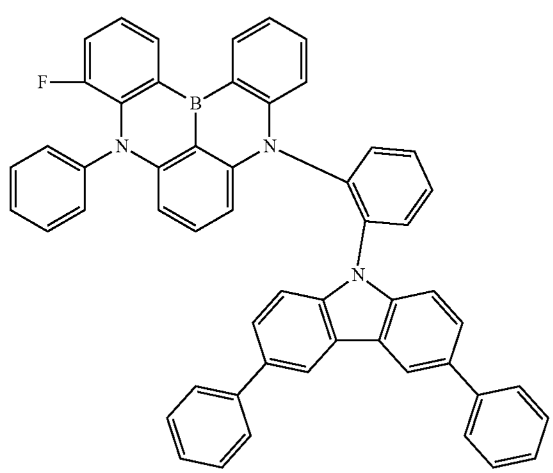

-continued
67
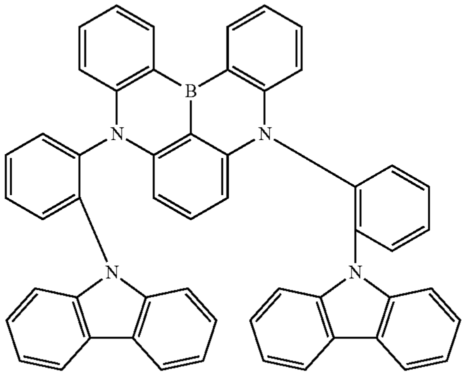
68
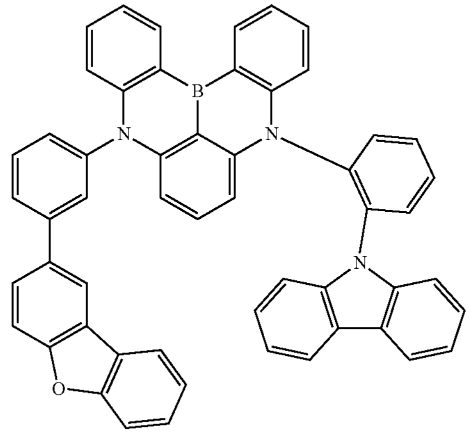
69
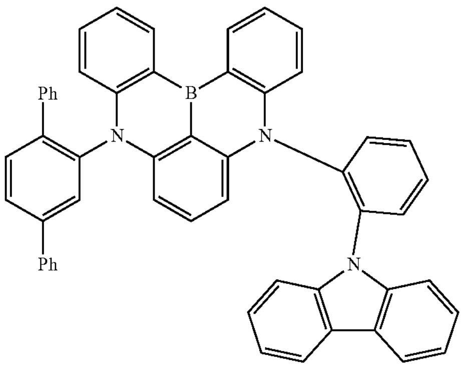
70
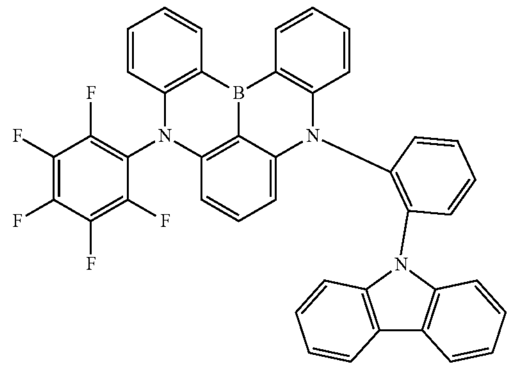
71
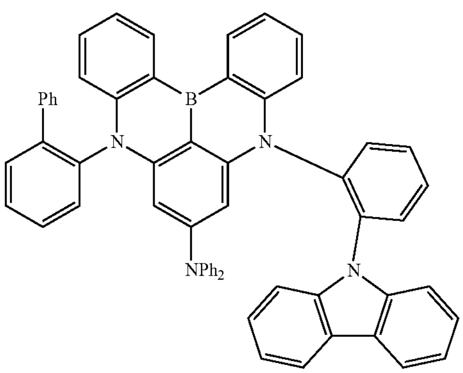
72
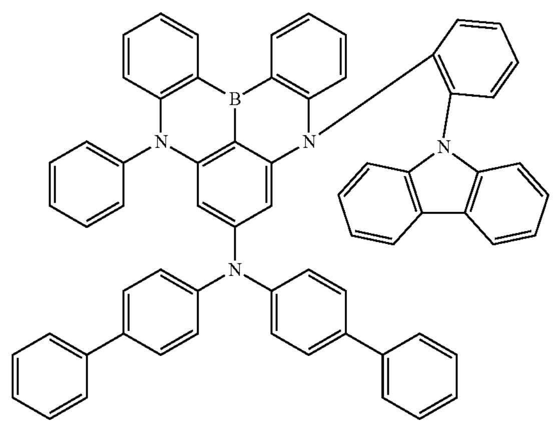
73
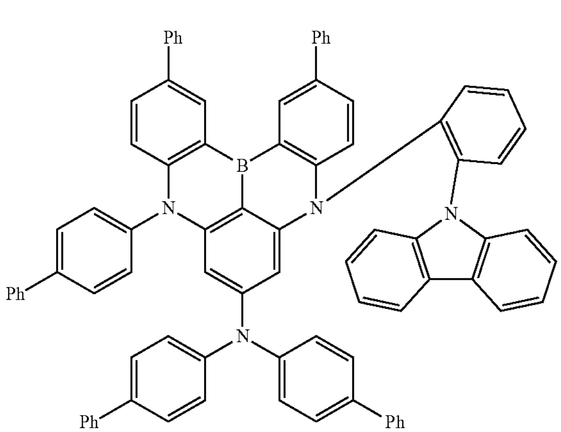
74
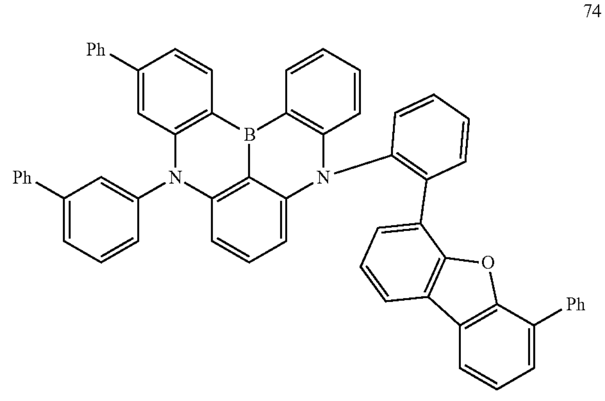

-continued
75
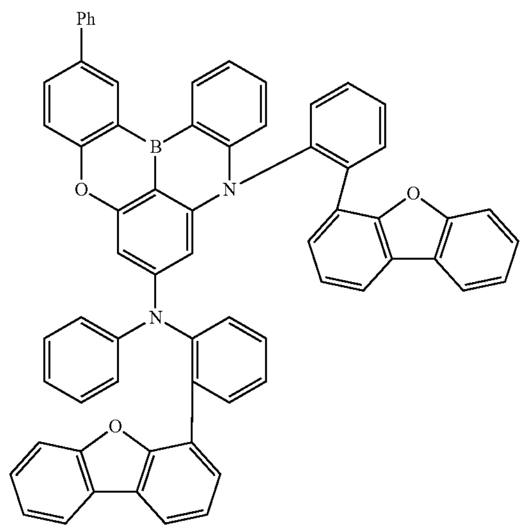
76
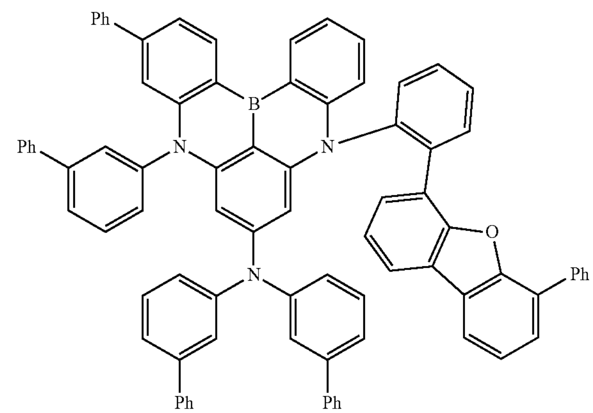
77
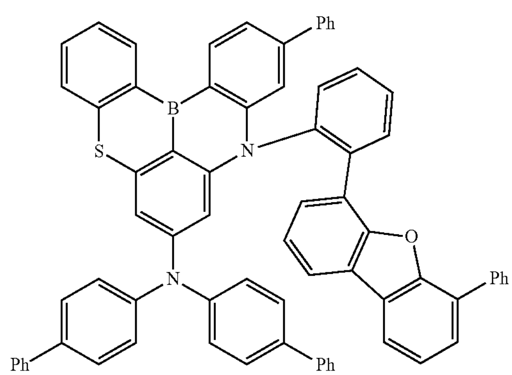
78
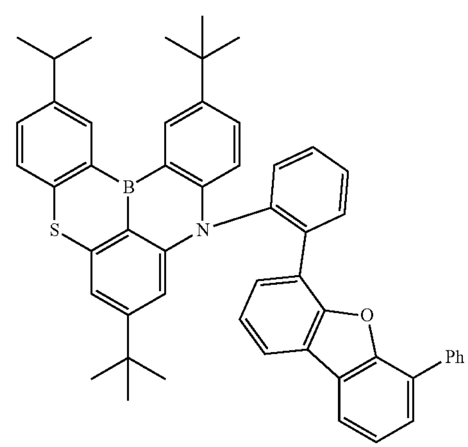
79
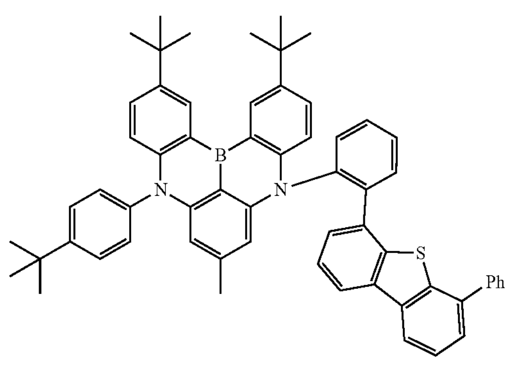
80
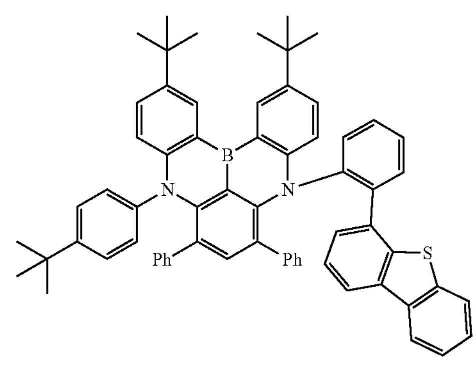

-continued
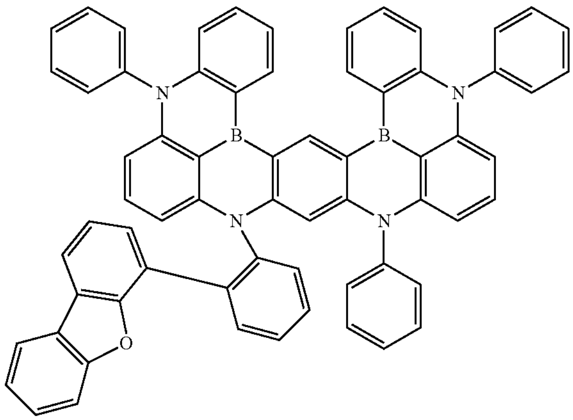
81
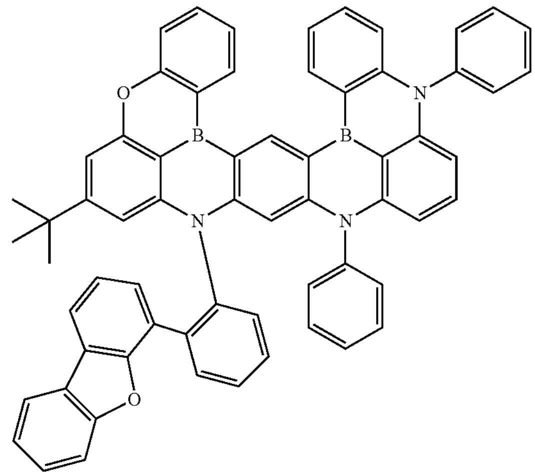
82
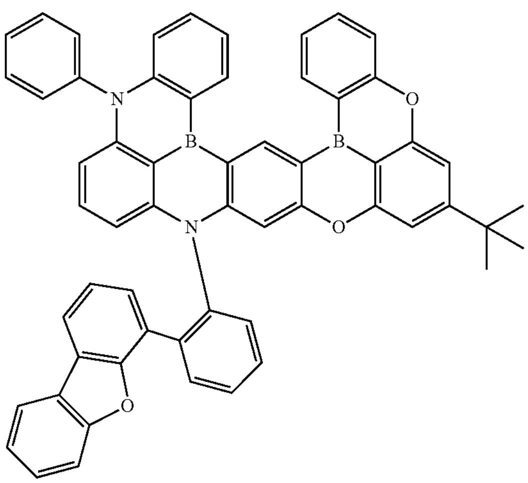
83
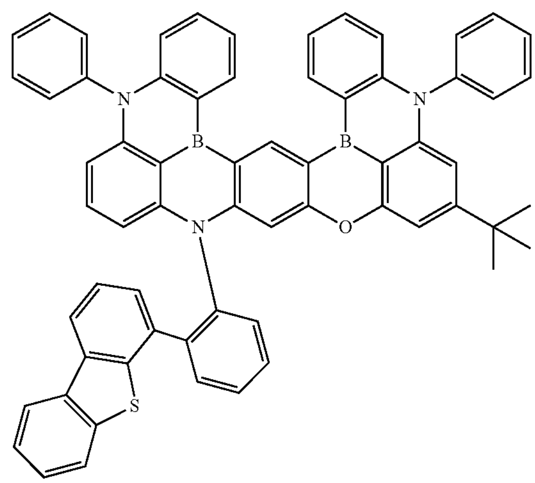
84
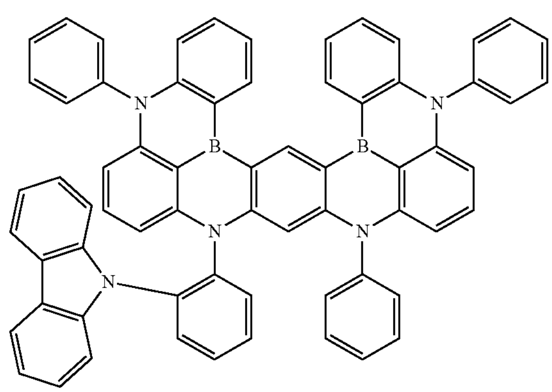
85
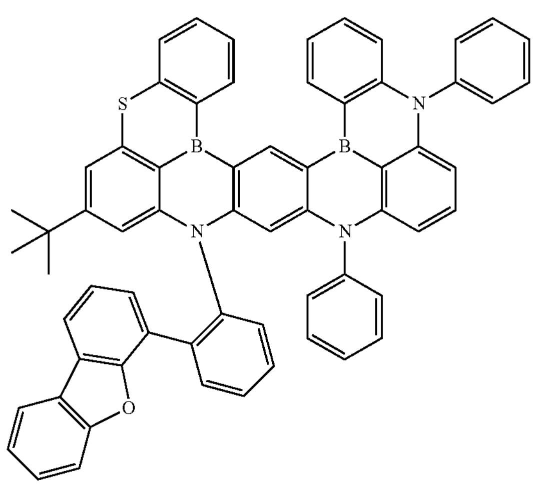
86

-continued
87
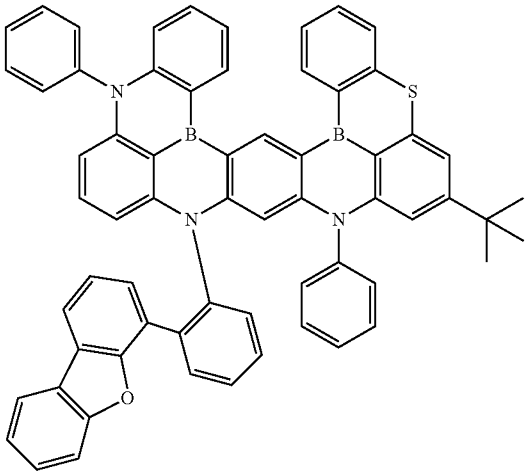
88
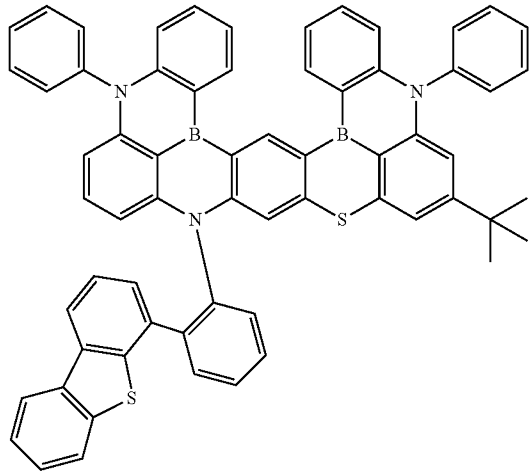
89
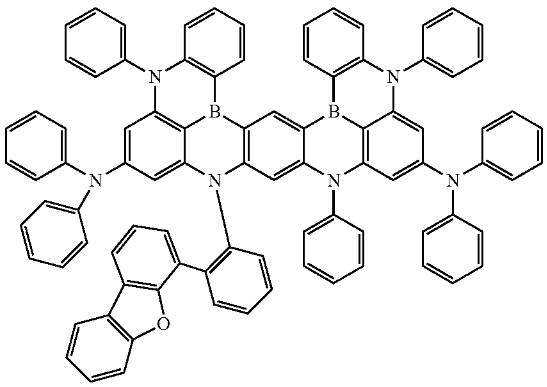
90
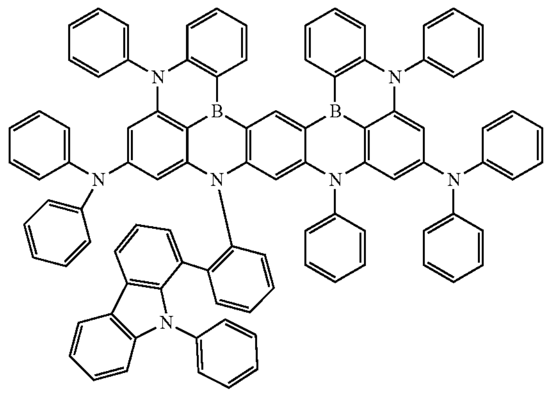
91
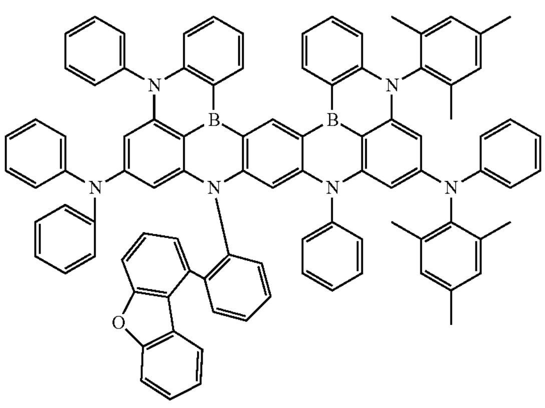
92
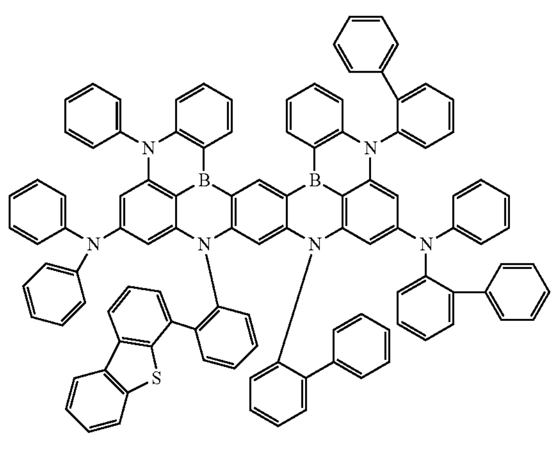

-continued
93
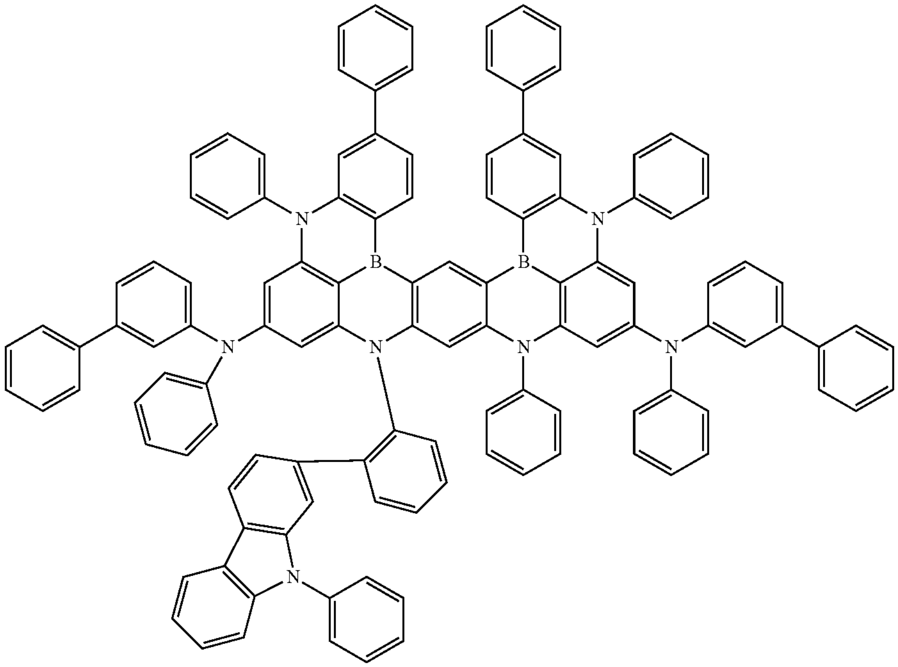
94
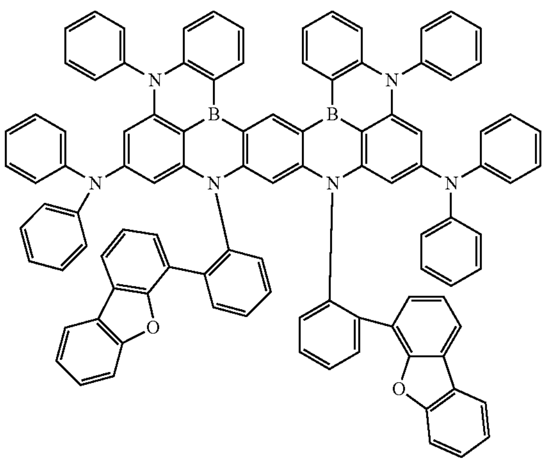
95
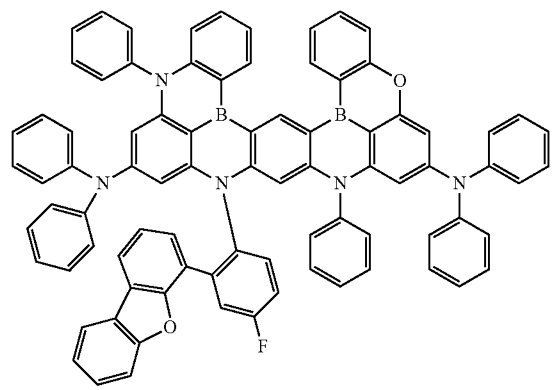
96
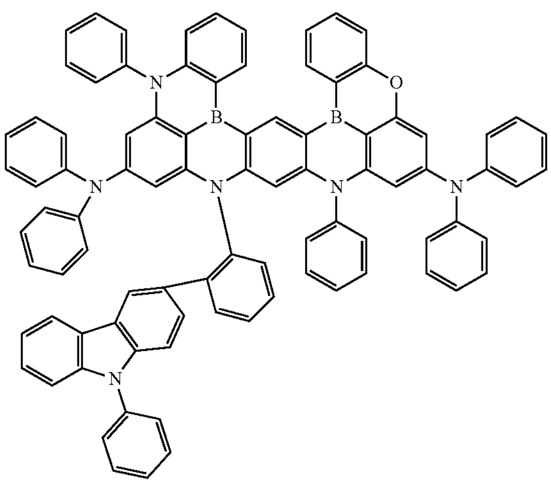
97
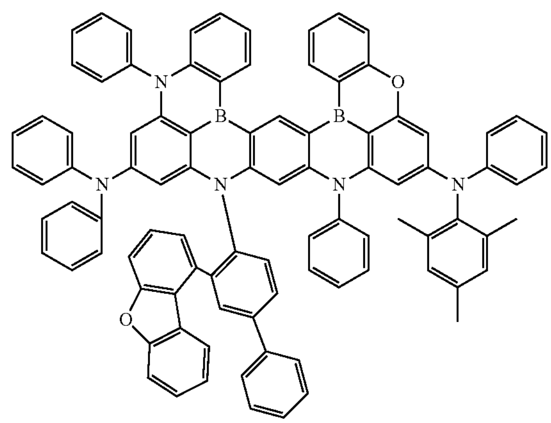

-continued
98
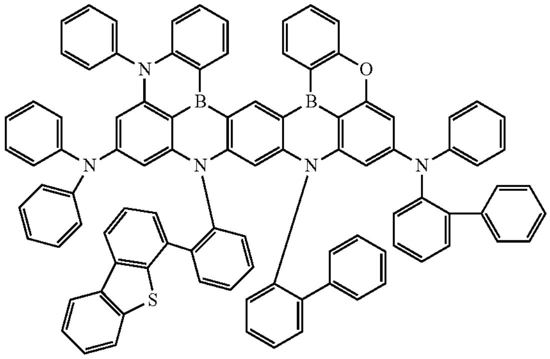
99
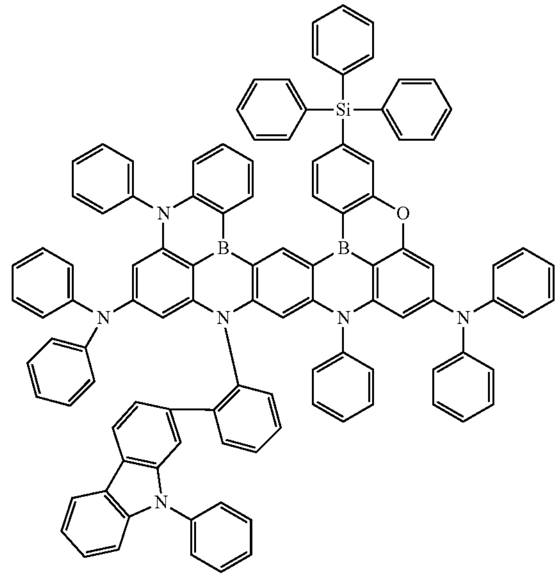
100
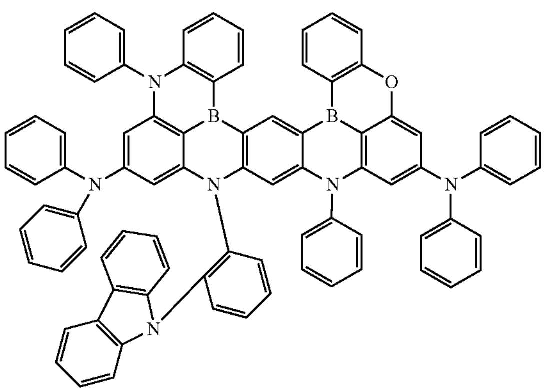
101
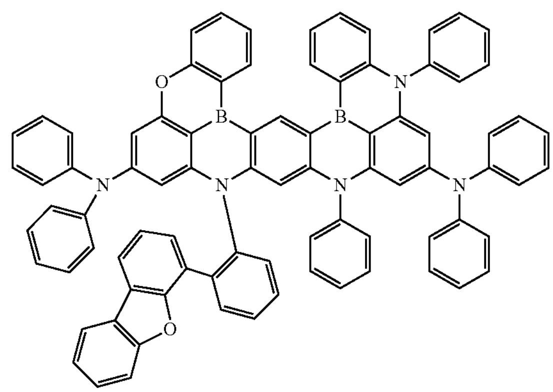
102
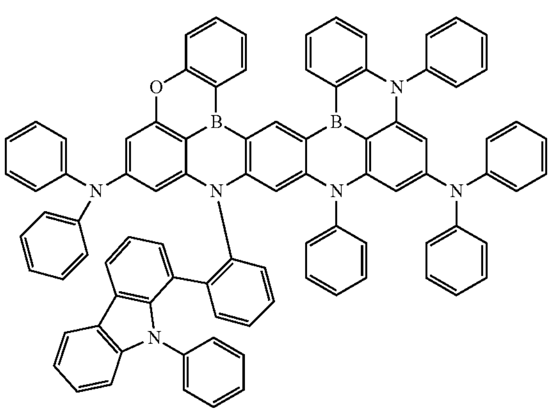
103
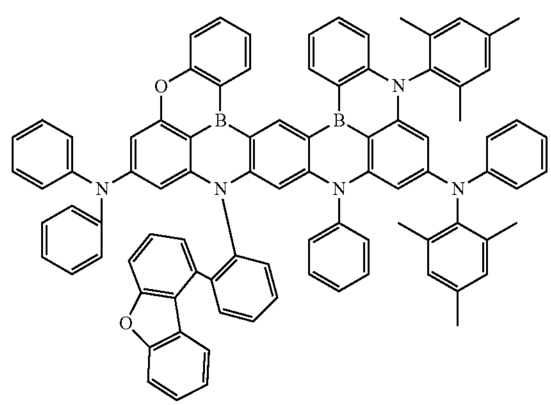

-continued
104
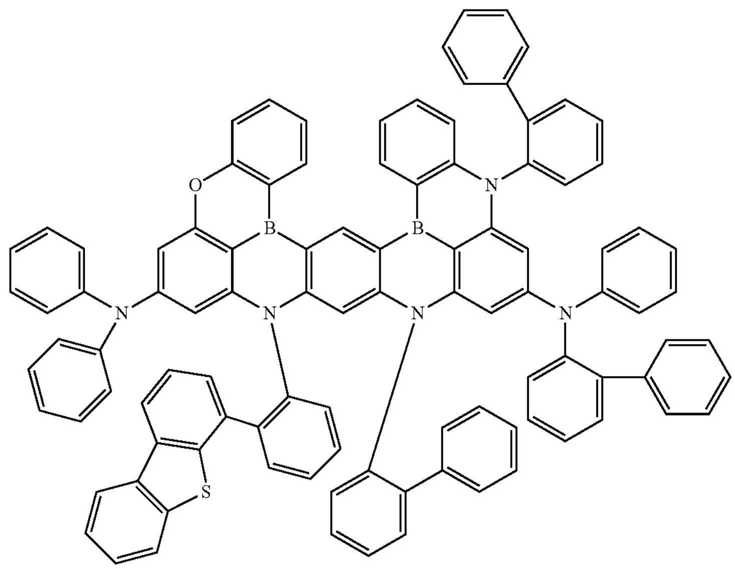
105
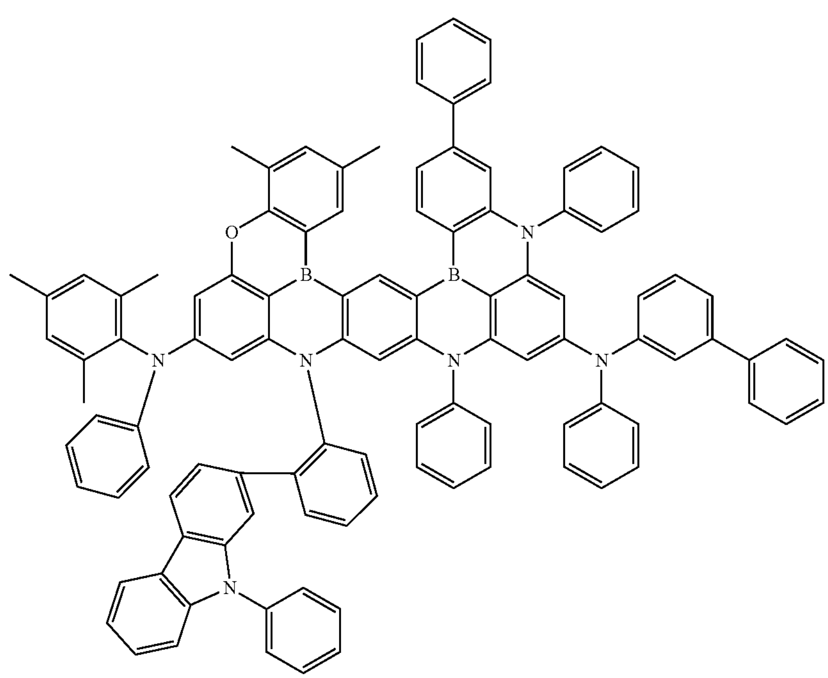

-continued
106
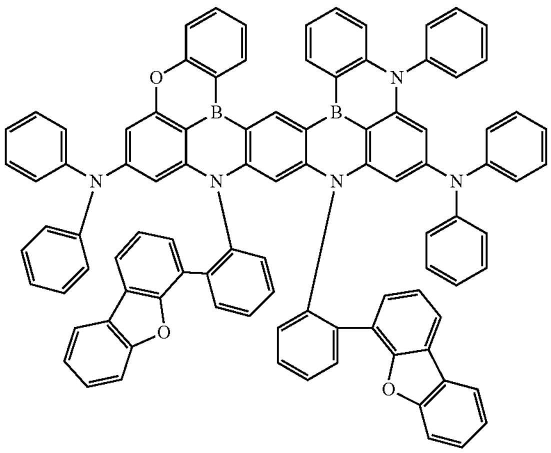
107
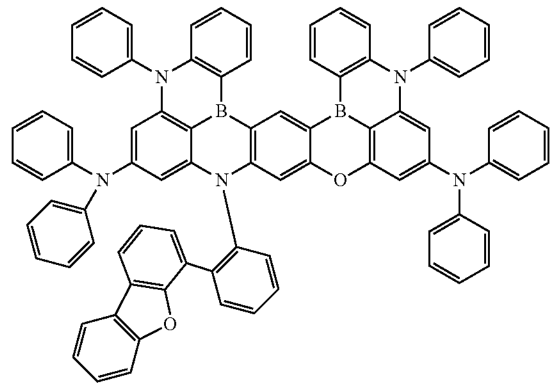
108
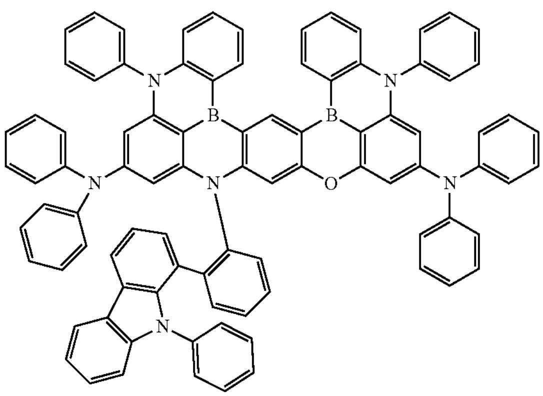
109
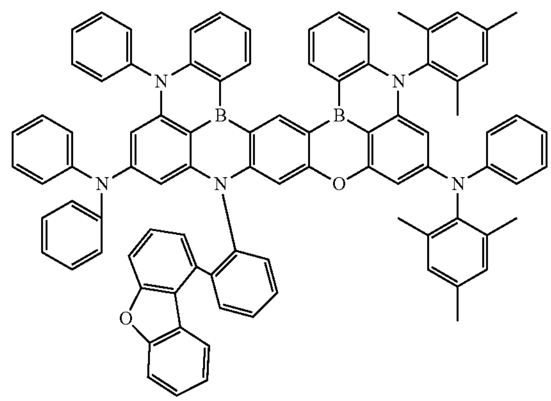
110
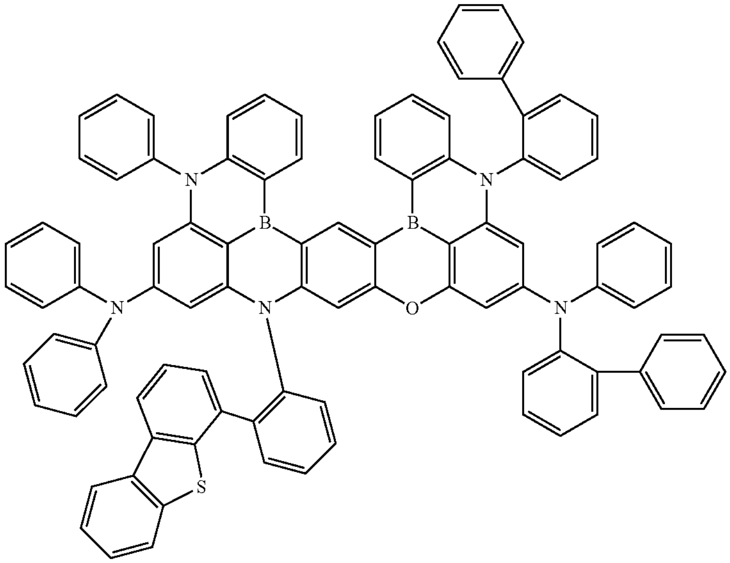

-continued
111
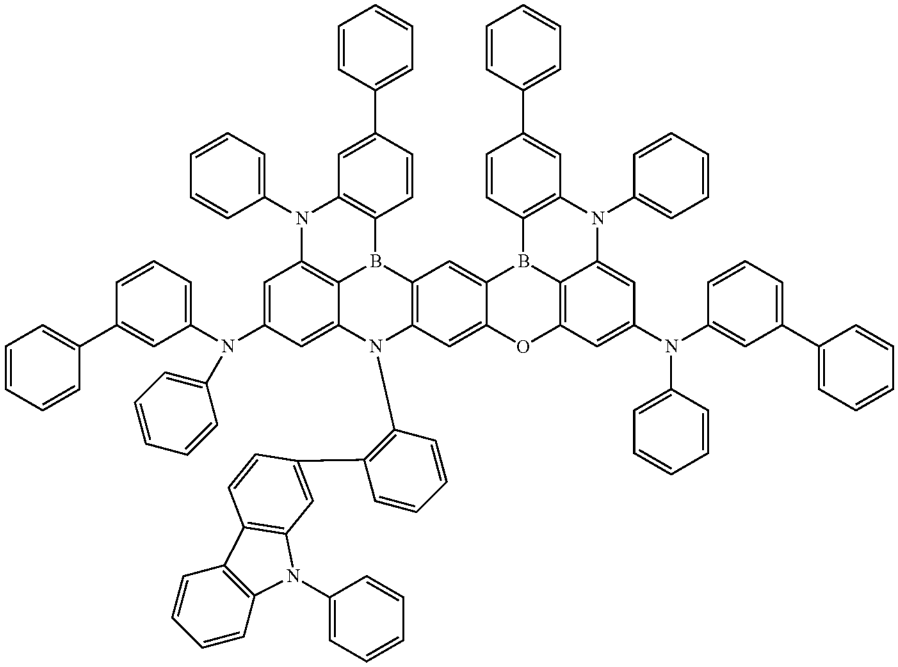
112
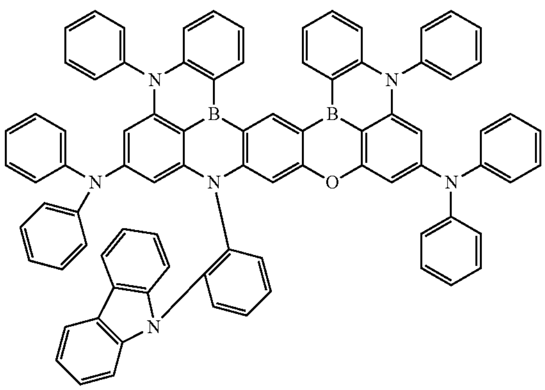
113
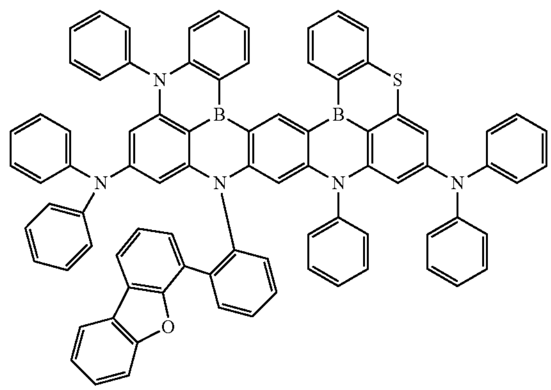
114
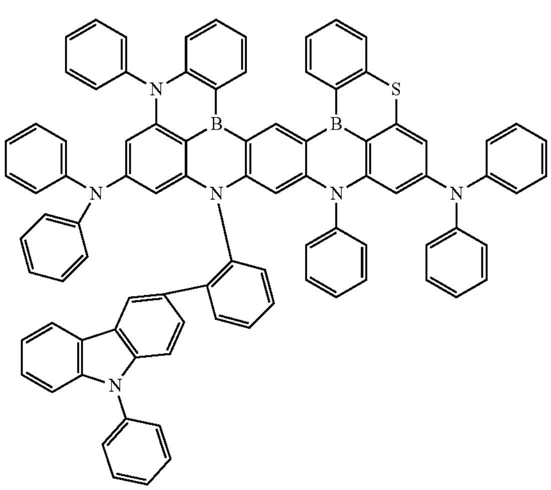
115
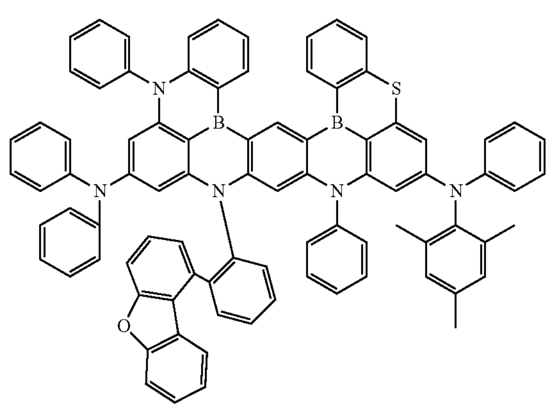

-continued
116
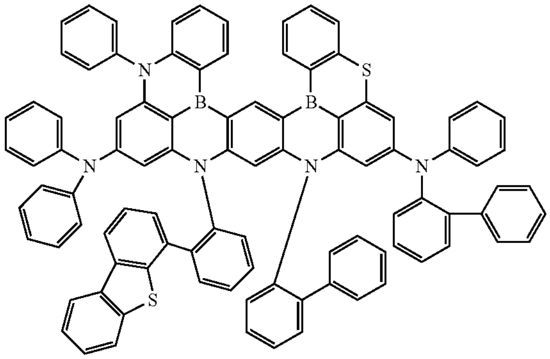
117
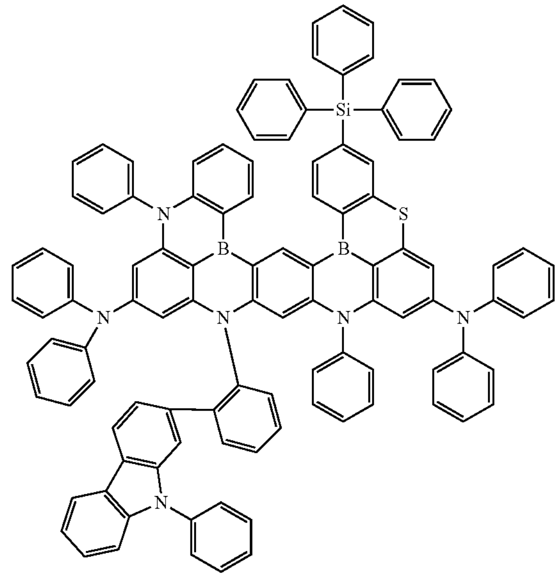
118
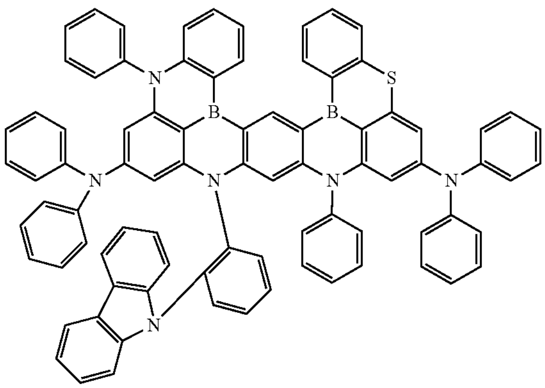
119
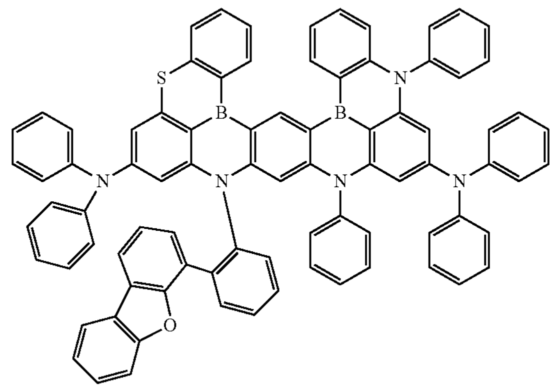
120
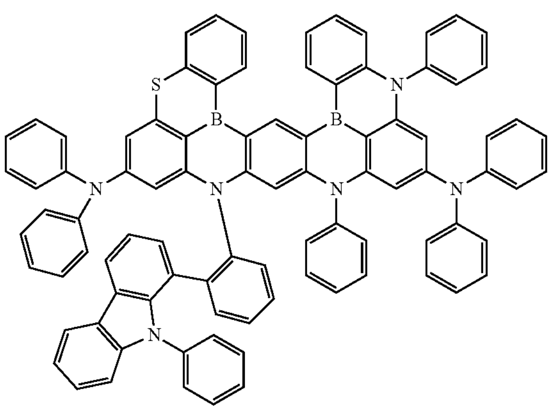
121
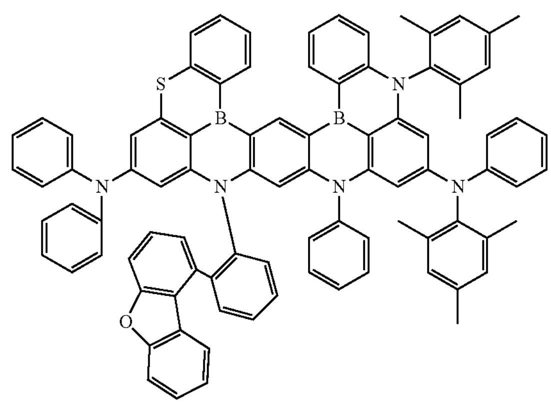

-continued
122
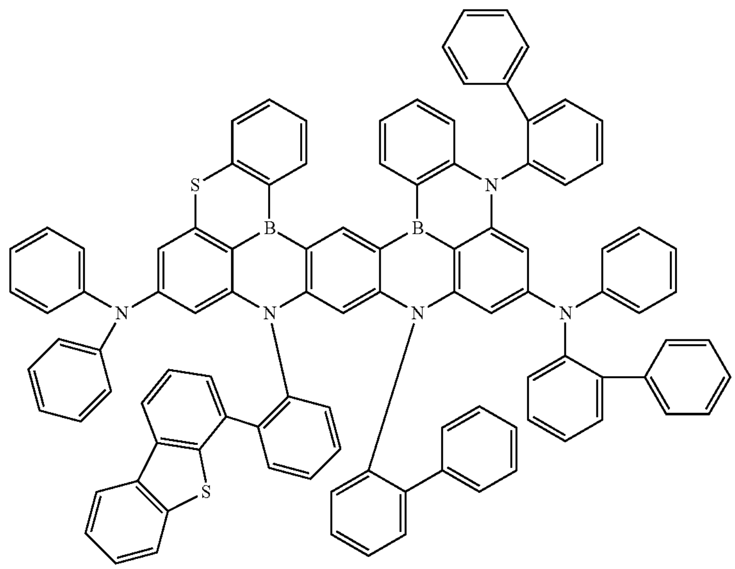
123
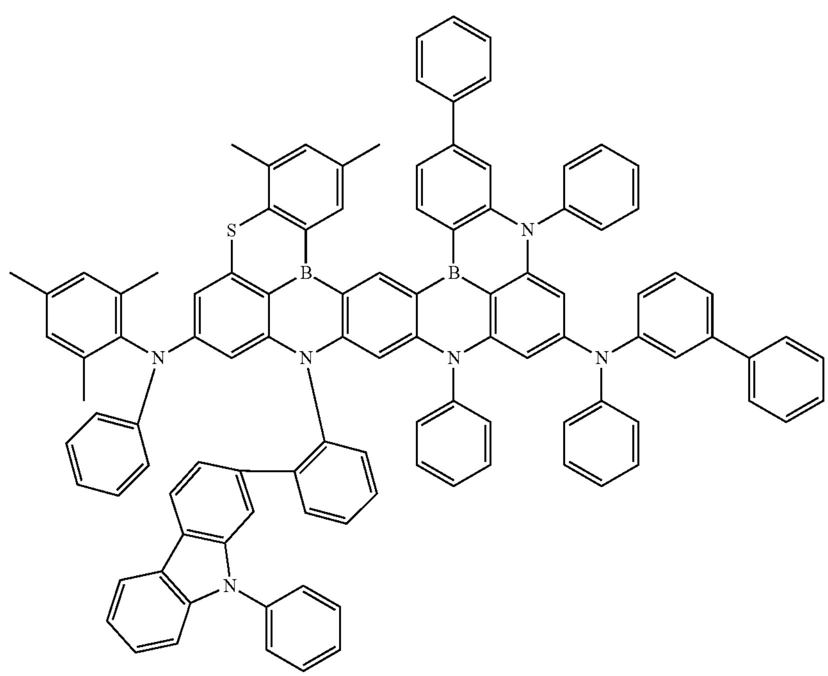

-continued
124
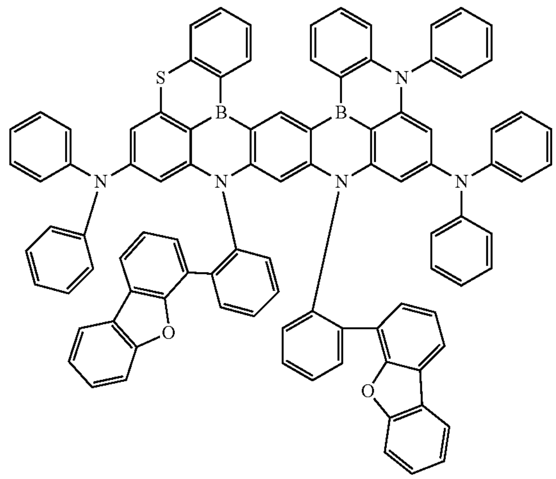
125
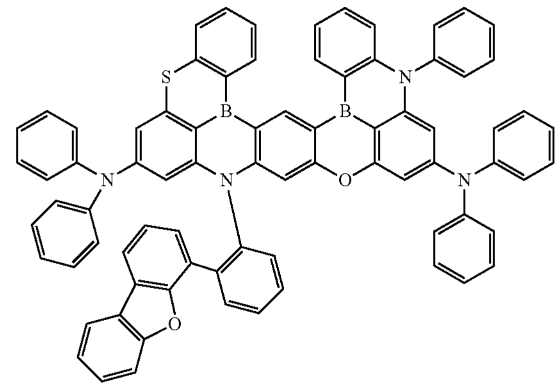
126
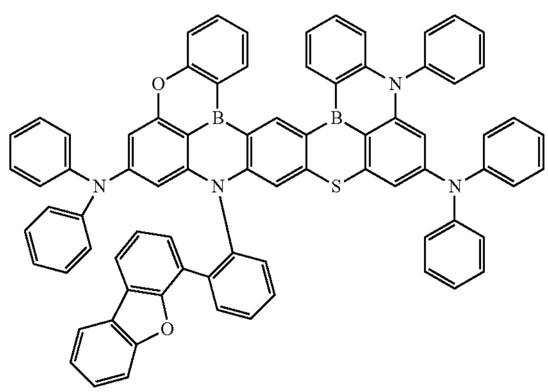
127
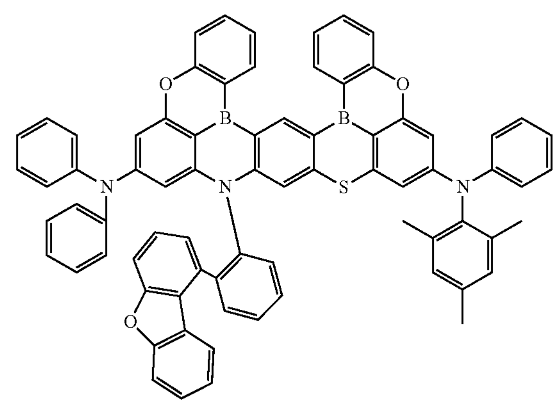
128
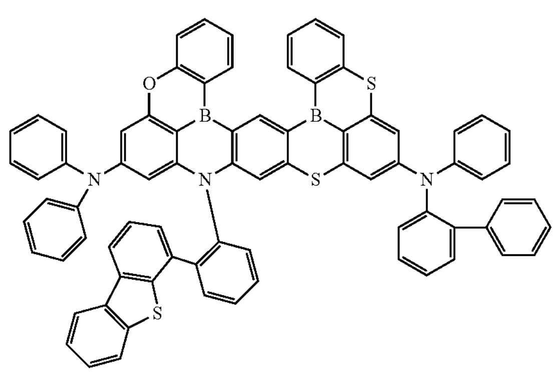
129
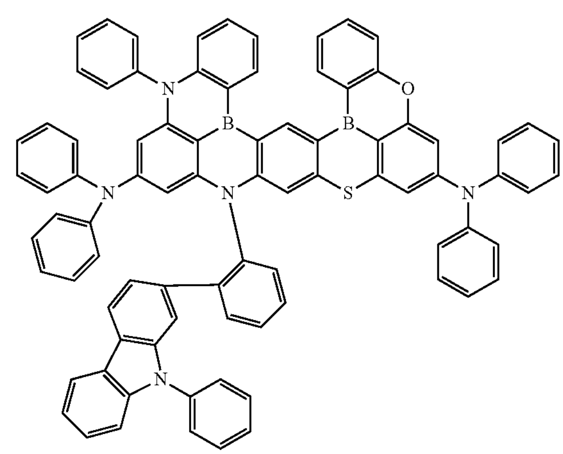

-continued
130
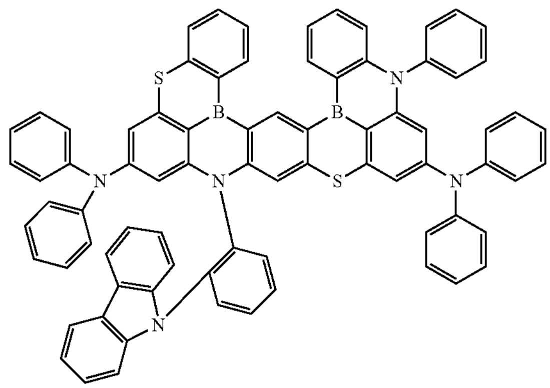
131
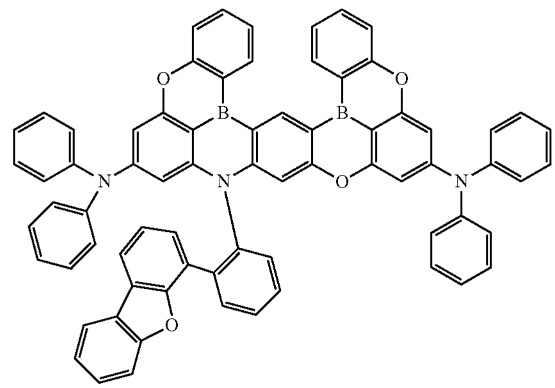
132
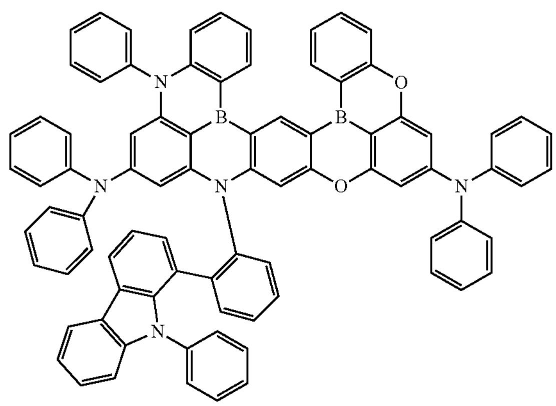
133
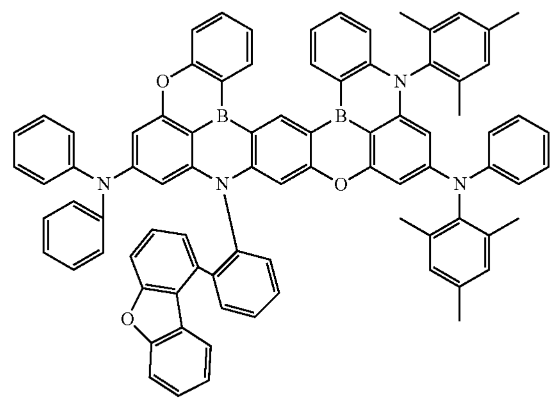
134
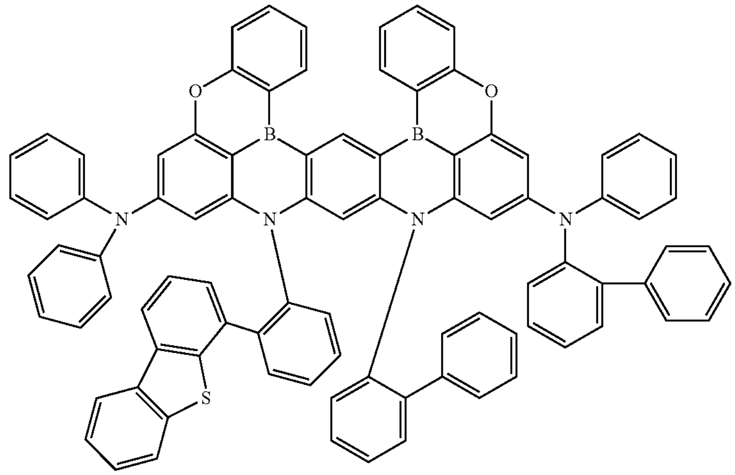

-continued
135
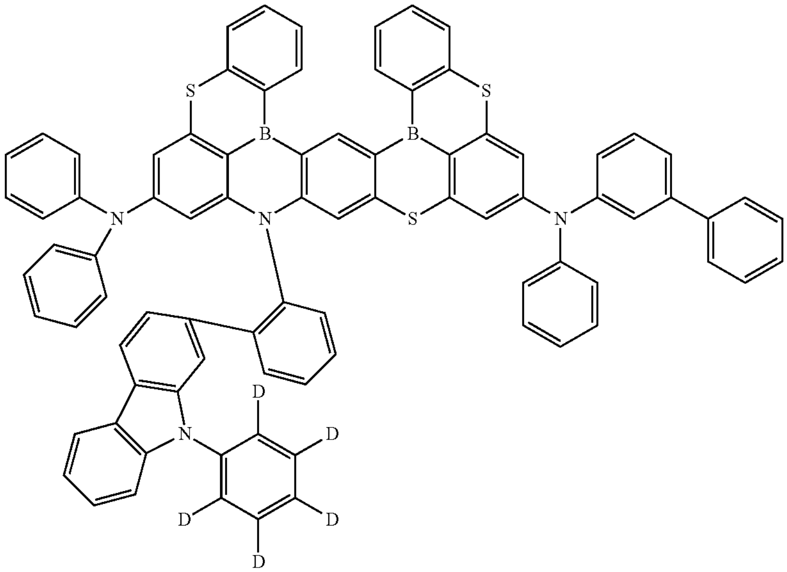
136
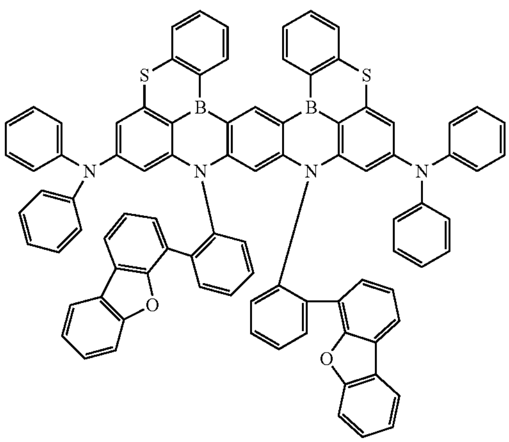
137
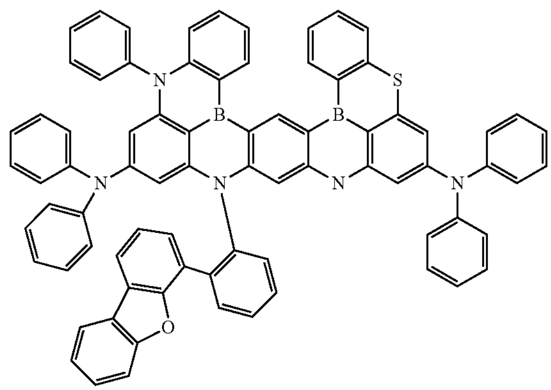
138
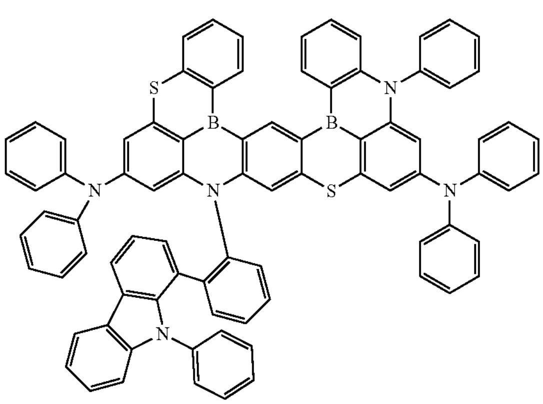
139
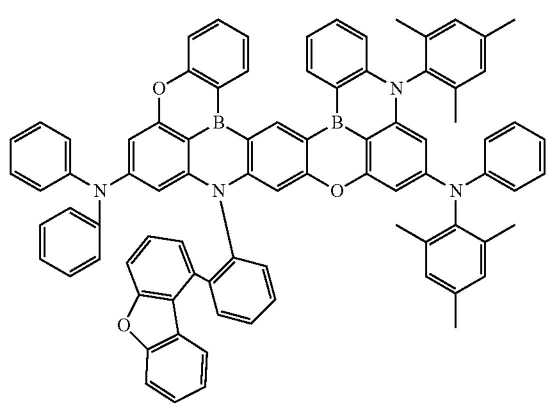

-continued
140
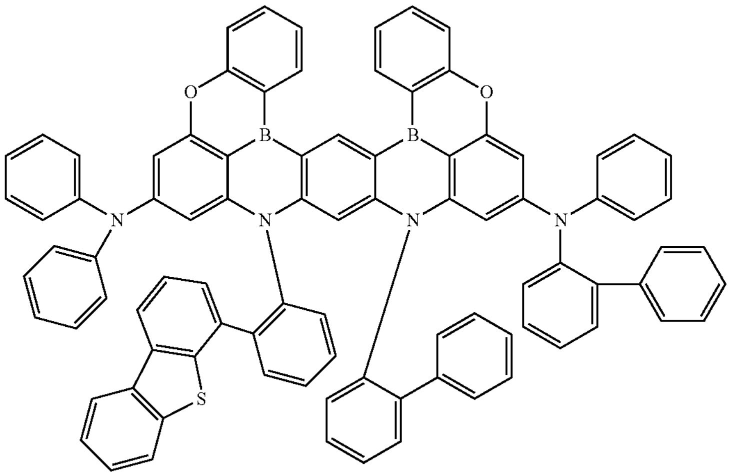
141
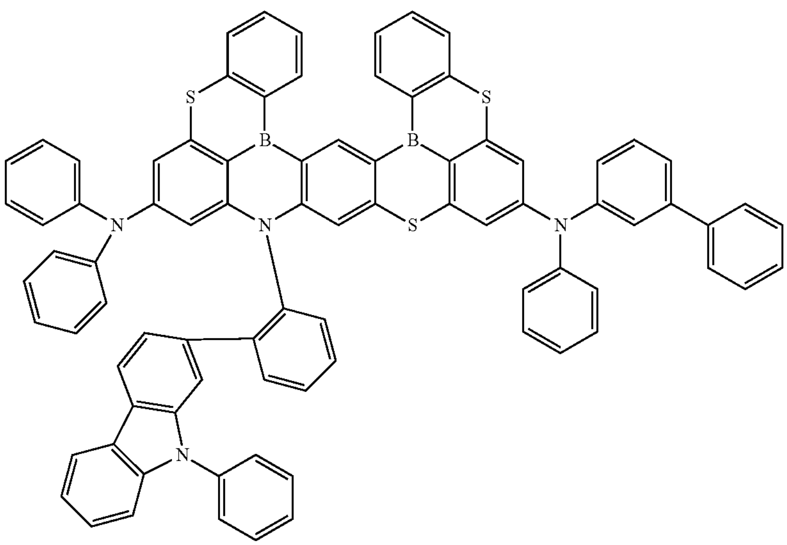
142
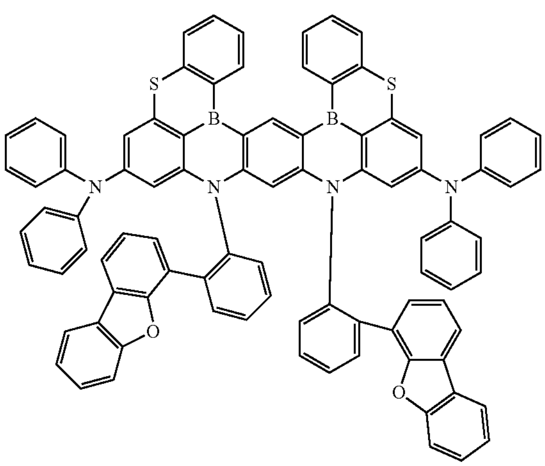
143
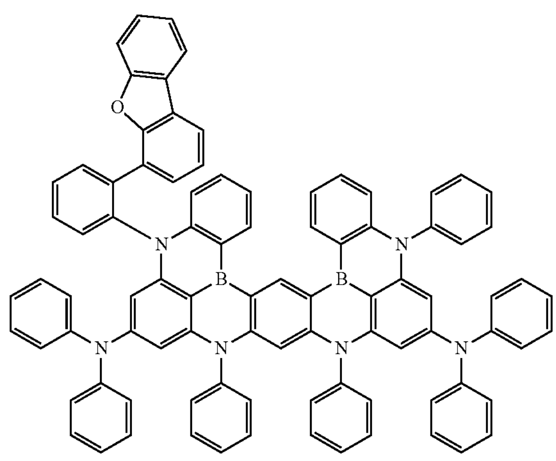

-continued
144
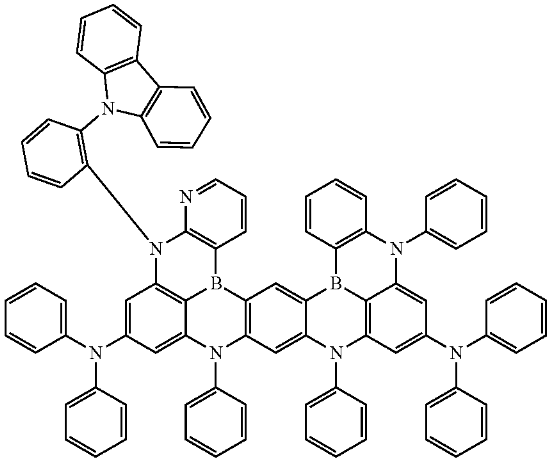
145
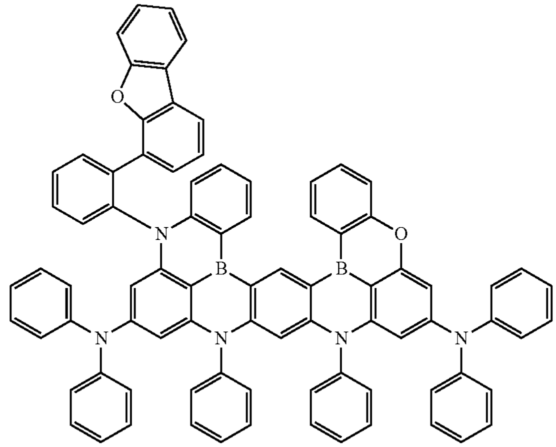
146
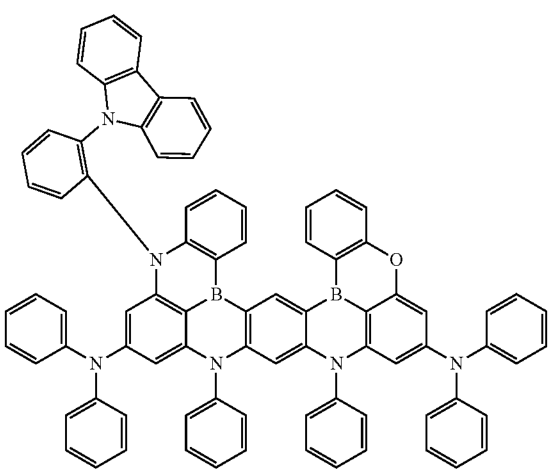
147
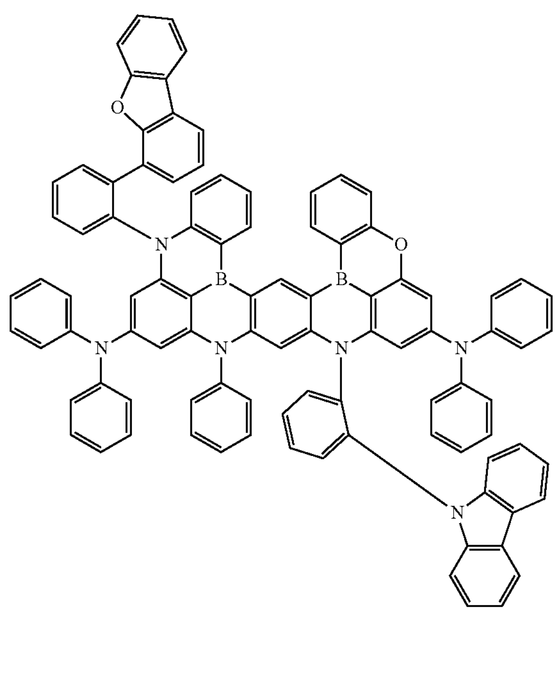

-continued
148
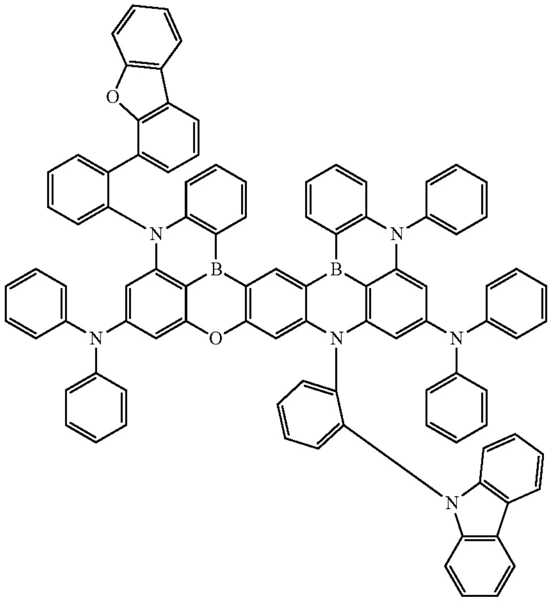
149
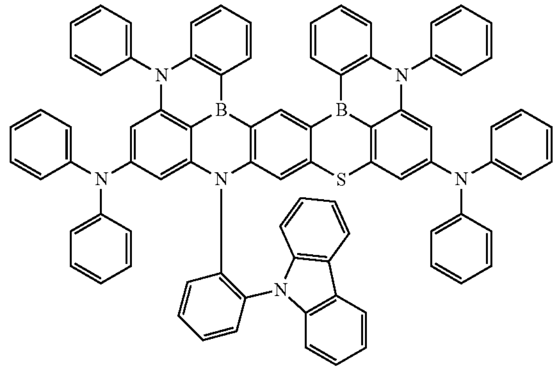
150
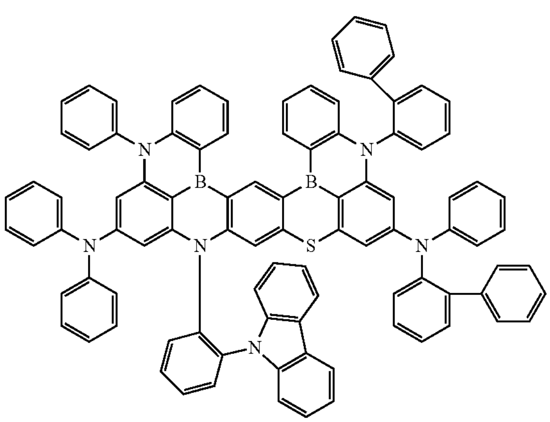
151
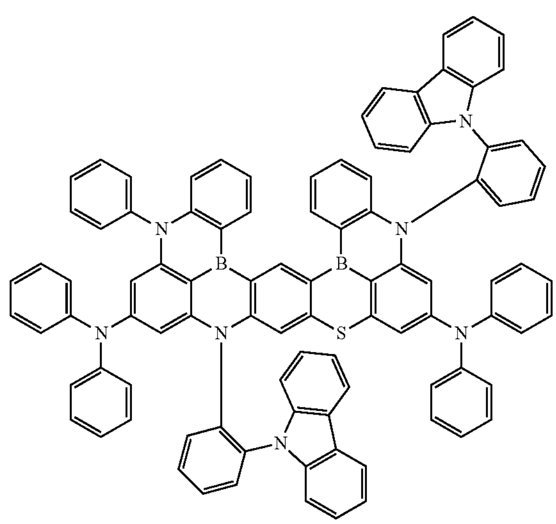

-continued
152
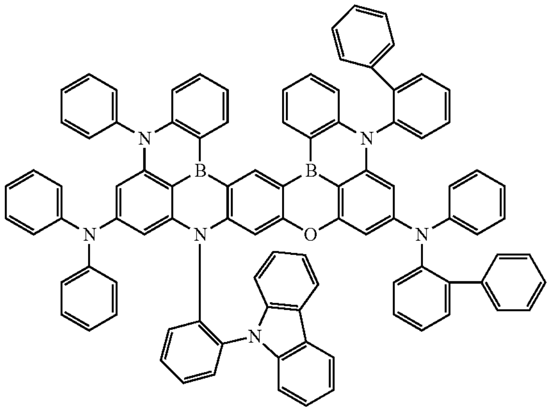
153
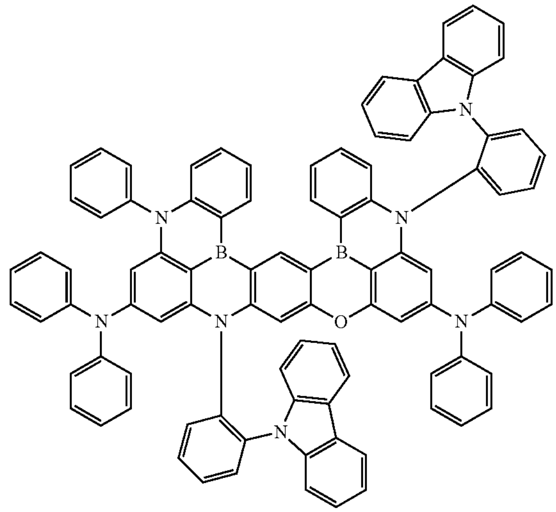
154
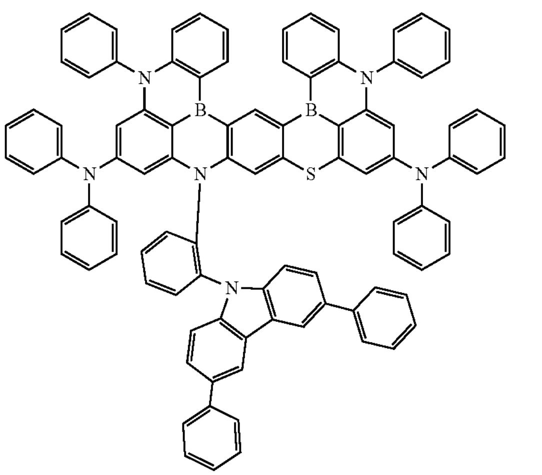
155
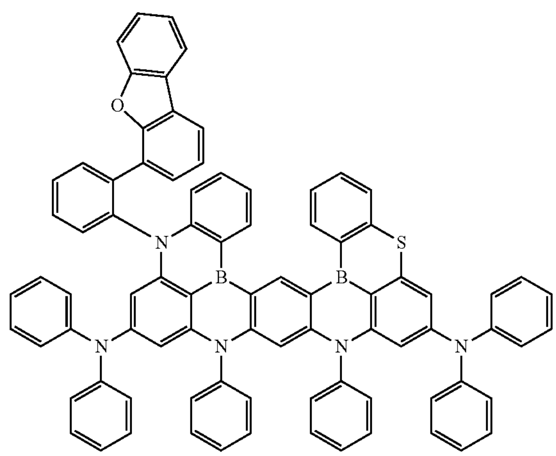
156
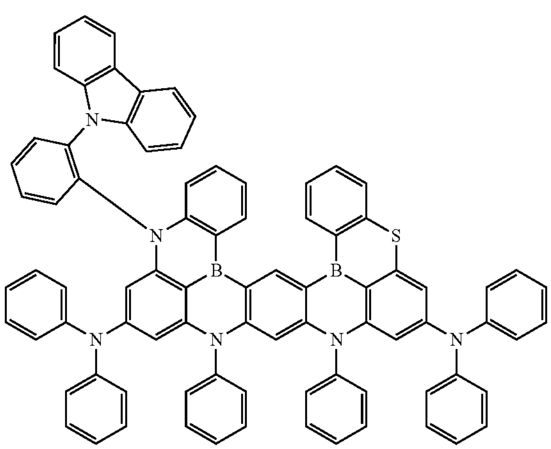
157
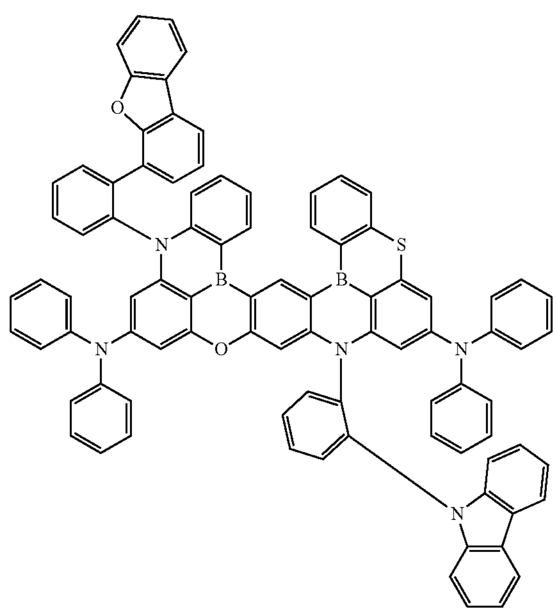

-continued
158
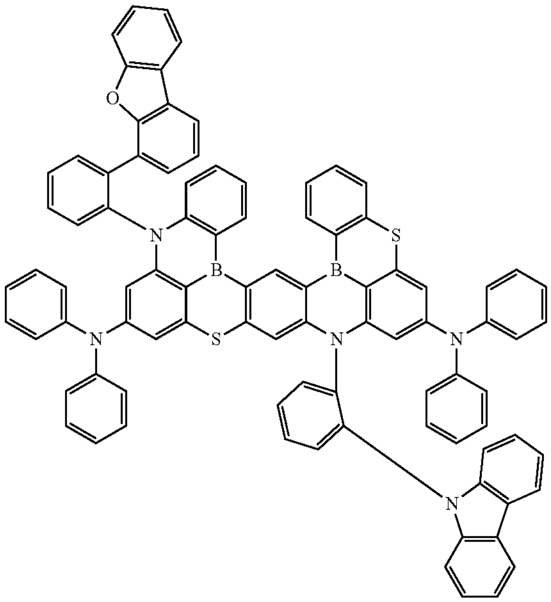
159
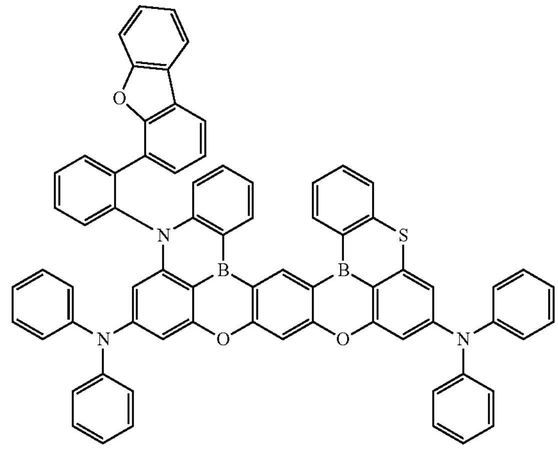
160
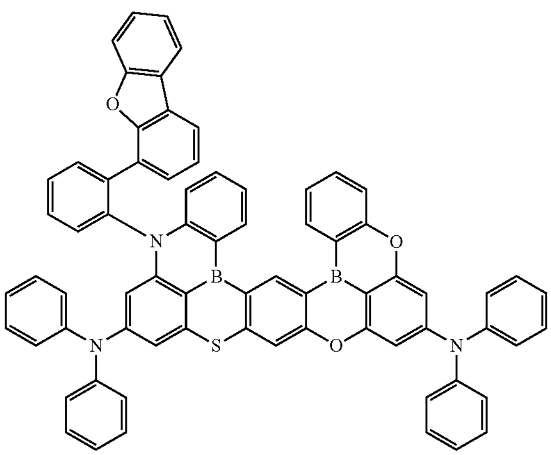
161
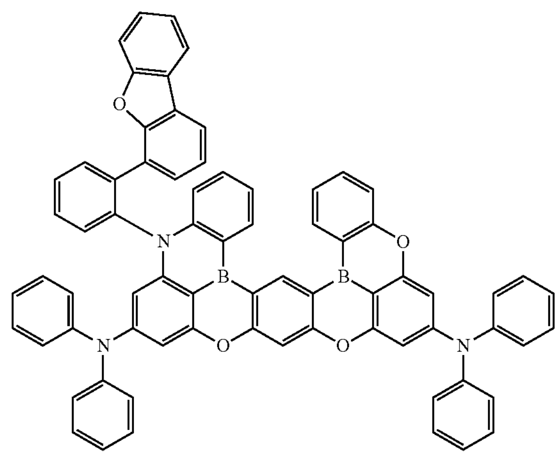
162
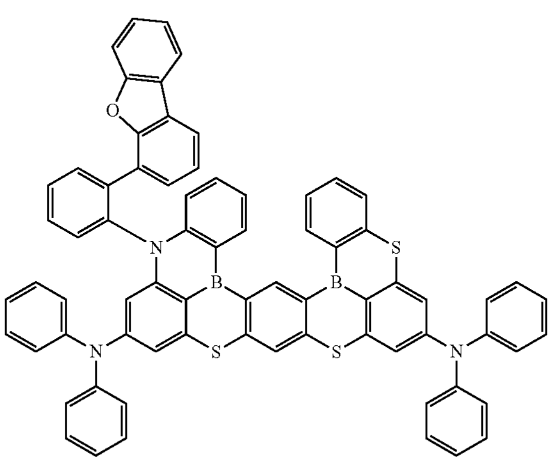
163
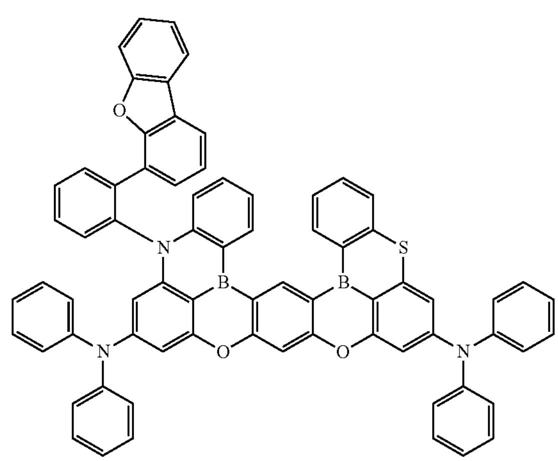

-continued
164
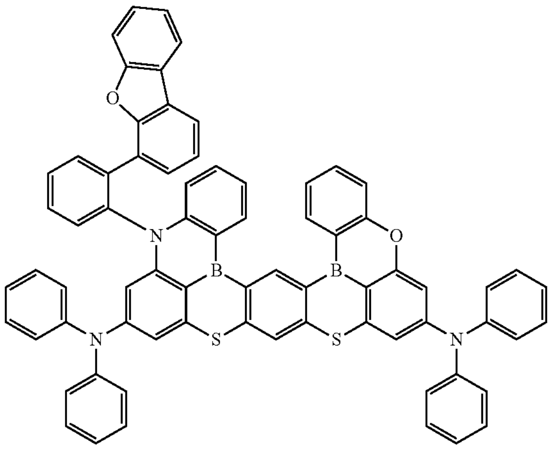
165
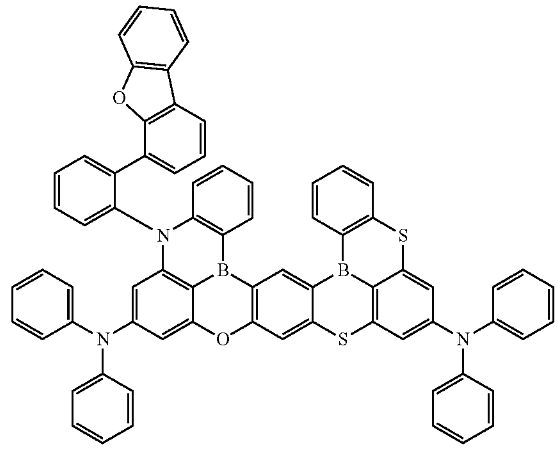
166
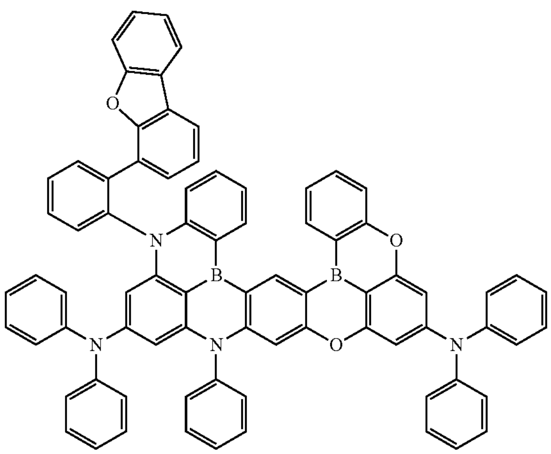
167
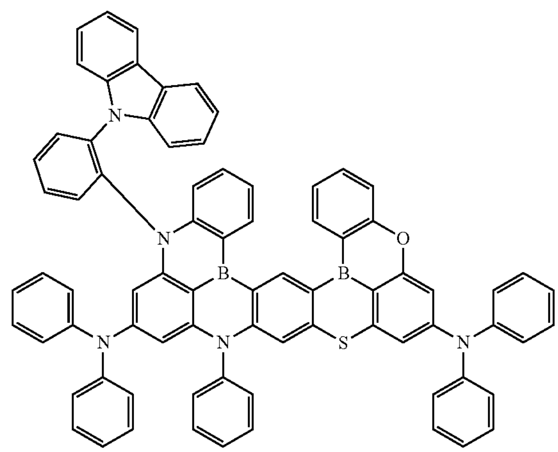
168
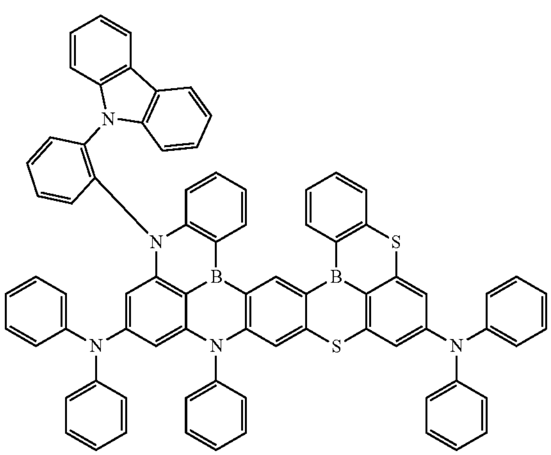
169
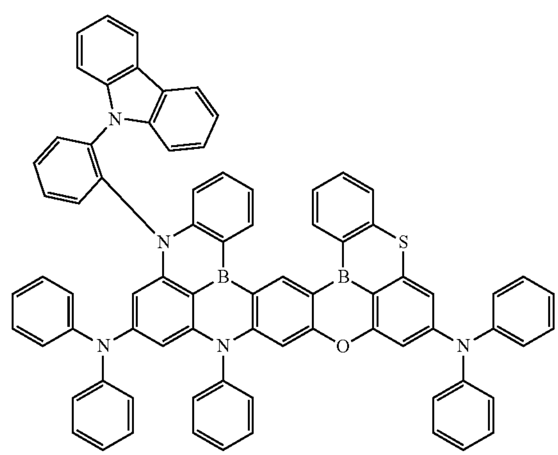

-continued
170
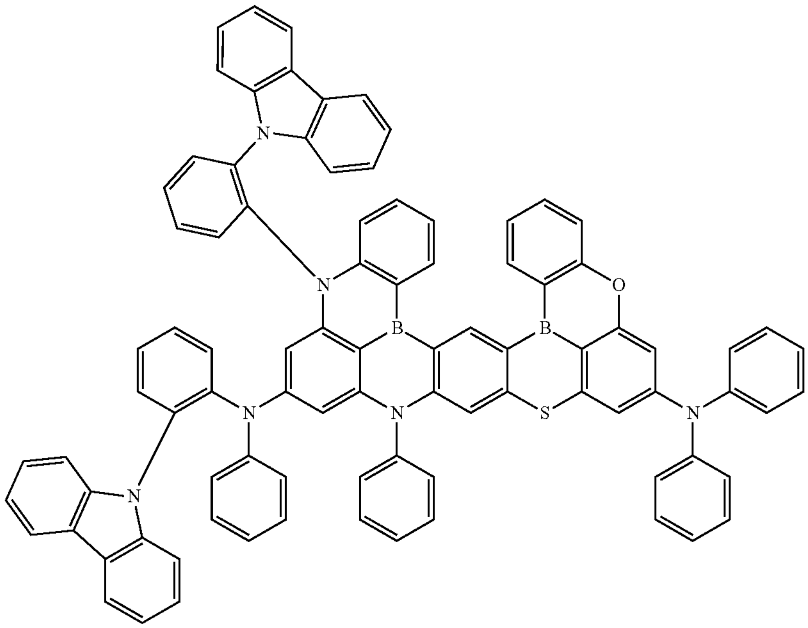
171
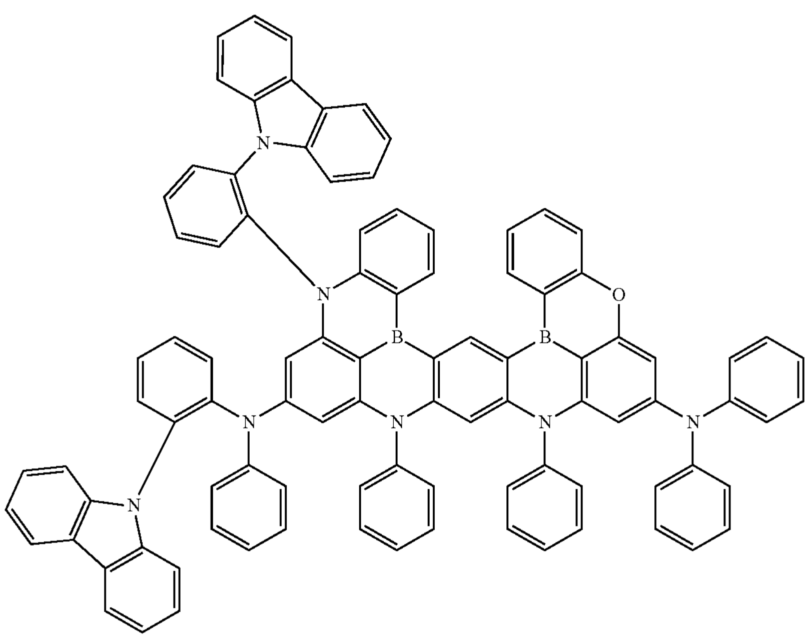

-continued
172
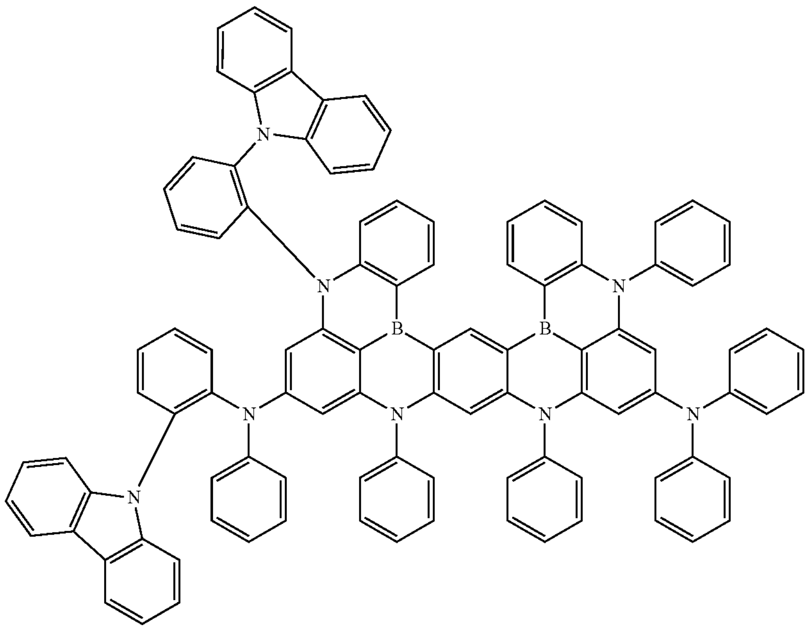
173
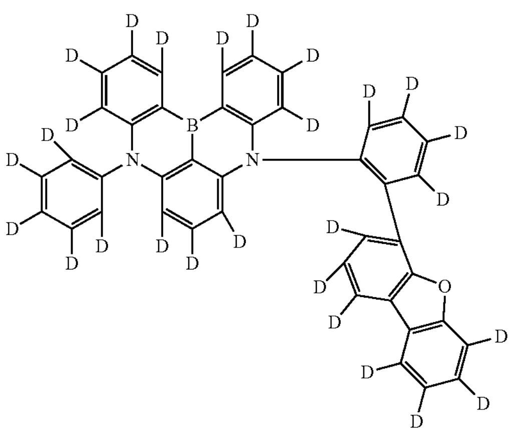
174
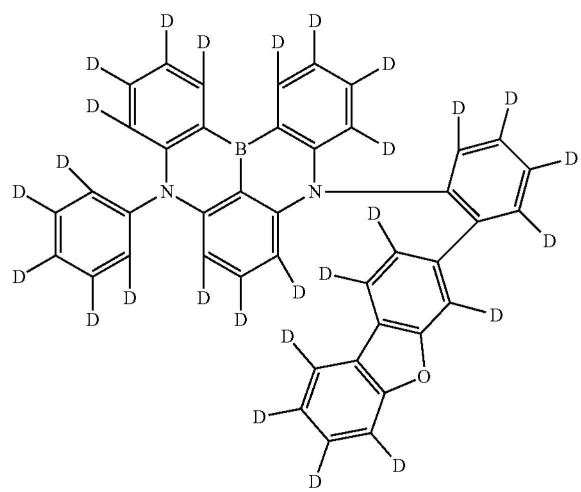
175
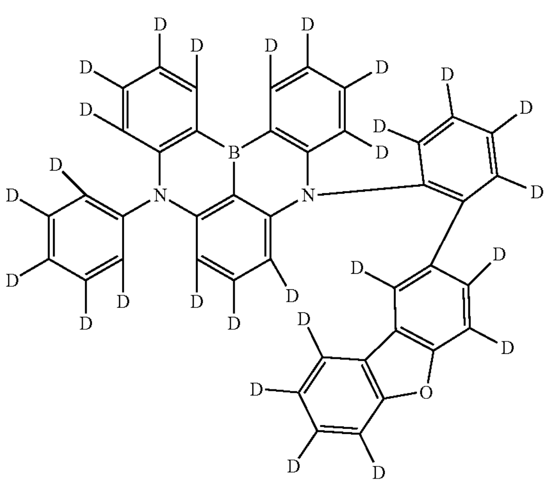
176
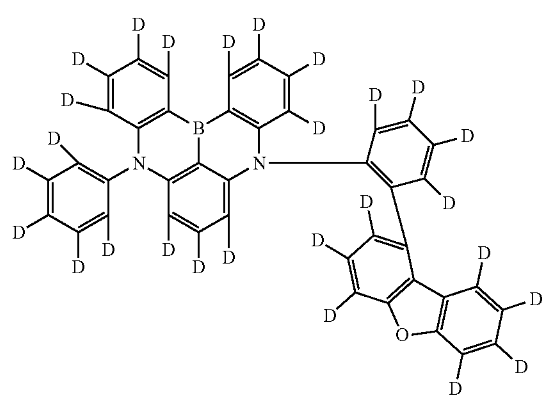

wherein in the compounds of Compound Group 1,
Ph is a phenyl group,
Mes is a mesityl group, and
D is a deuterium atom.

* * * * *